United States Patent
Horst et al.

(10) Patent No.: US 6,233,702 B1
(45) Date of Patent: May 15, 2001

(54) SELF-CHECKED, LOCK STEP PROCESSOR PAIRS

(75) Inventors: Robert W. Horst, Saratoga; David J. Garcia, Los Gatos, both of CA (US); William Patterson Bunton, Austin, TX (US); William F. Bruckert, Austin, TX (US); Daniel L. Fowler, Georgetown, TX (US); Curtis Willard Jones, Jr., Austin, TX (US); David Paul Sonnier, Austin, TX (US); William Joel Watson, Austin, TX (US); Frank A. Williams, Austin, TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 08/485,055

(22) Filed: Jun. 7, 1995

(51) Int. Cl.[7] .................................................. G06F 11/00
(52) U.S. Cl. ............................................. 714/48; 714/11
(58) Field of Search ...................... 395/182.09; 371/67.1, 371/68.1, 68.2; 714/1, 2, 6, 10, 11, 12, 13, 25, 37, 43, 48

(56) References Cited

U.S. PATENT DOCUMENTS

| | | | |
|---|---|---|---|
| 3,665,173 | 5/1972 | Bouricius et al. | 235/153 |
| 3,814,921 | * 6/1974 | Nibby et al. | 371/40.2 |
| 3,848,116 | 11/1974 | Moder et al. | 235/153 |
| 3,864,670 | 2/1975 | Inoue et al. | 395/575 |
| 3,883,798 | 5/1975 | Huber et al. | 235/153 |
| 4,012,717 | 3/1977 | Censier et al. | 340/172.5 |
| 4,030,074 | 6/1977 | Giorcelli | 364/200 |
| 4,200,226 | 4/1980 | Piras | 371/9 |
| 4,228,496 | 10/1980 | Katzman et al. | 364/200 |
| 4,251,873 | 2/1981 | Joby | 364/741 |
| 4,298,929 | * 11/1981 | Capozzi | 395/411 |

(List continued on next page.)

FOREIGN PATENT DOCUMENTS

| | | | |
|---|---|---|---|
| 0 120 384 | 3/1984 | (EP) | G06F/11/16 |
| WO 81/00925 | 4/1981 | (WO) | G06F/15/16 |
| WO 92/05487 | 4/1992 | (WO) | G06F/11/20 |

OTHER PUBLICATIONS

Robert Cook, William Sisson, Thomas Storey, and Wing Toy, "Design of a Self–Checking Microprogram Control," pp. 255–261, Mar., 1973, IEEE Transactions on Computers, vol. C–22, No. 3.

Daniel P. Siewiorek, "Fault Tolerance in Commercial Computers," pp. 26–37, Jul. 1990.

Daniel P. Siewiorek and Robert S. Swarz, "Reliable Computer Systems Design and Evaluation," pp. 621–636, 1982, Digital Press, Second Edition.

*Primary Examiner*—Nadeem Iqbal
(74) *Attorney, Agent, or Firm*—Oppenheimer Wolff & Donnelly, LLP

(57) ABSTRACT

A multiprocessor system includes a number of sub-processor systems, each substantially identically constructed, and each comprising a central processing unit (CPU), and at least one I/O device, interconnected by routing apparatus that also interconnects the sub-processor systems. A CPU of any one of the sub-processor systems may communicate, through the routing elements, with any I/O device of the system, or with any CPU of the system.

Communications between I/O devices and CPUs is by packetized messages. Interrupts from I/O devices are communicated from the I/O devices to the CPUs (or from one CPU to another CPU) as message packets.

CPUs and I/O devices may write to, or read from, memory of a CPU of the system. Memory protection is provided by an access validation method maintained by each CPU in which CPUs and/or I/O devices are provided with a validation to read/write memory of that CPU, without which memory access is denied.

13 Claims, 34 Drawing Sheets

U.S. PATENT DOCUMENTS

| | | | |
|---|---|---|---|
| 4,350,225 | 9/1982 | Sakata et al. | 187/29 |
| 4,358,823 | 11/1982 | McDonald et al. | 371/68 |
| 4,371,754 | 2/1983 | De et al. | 179/18 |
| 4,453,215 | 6/1984 | Reid | 364/200 |
| 4,486,826 | 12/1984 | Wolff et al. | 364/200 |
| 4,520,439 * | 5/1985 | Liepa | 395/411 |
| 4,541,094 | 9/1985 | Stiffler et al. | 371/68 |
| 4,628,508 | 12/1986 | Sager et al. | 371/9 |
| 4,654,857 | 3/1987 | Samson et al. | 371/68 |
| 4,823,256 | 4/1989 | Bishop et al. | 364/200 |
| 4,907,228 | 3/1990 | Bruckert et al. | 371/68.3 |
| 4,916,704 | 4/1990 | Bruckert et al. | 371/68.3 |
| 4,918,695 * | 4/1990 | Scheuneman et al. | 371/51.1 |
| 5,005,174 * | 4/1991 | Bruckert et al. | 395/182.09 |
| 5,091,847 | 2/1992 | Herbermann | 395/575 |
| 5,099,485 | 3/1992 | Bruckert et al. | 371/68.3 |
| 5,146,573 * | 9/1992 | Sato et al. | 395/416 |
| 5,157,663 | 10/1992 | Major et al. | 371/9.1 |
| 5,165,023 | 11/1992 | Gifford | 395/325 |
| 5,218,676 | 6/1993 | Ben-Ayed et al. | 395/200 |
| 5,313,475 * | 5/1994 | Cromer et al. | 371/40.1 |
| 5,369,651 * | 11/1994 | Marisetty | 371/40.1 |
| 5,422,837 * | 6/1995 | Boothroyd et al. | 395/800 |
| 5,435,000 * | 7/1995 | Boothroyd et al. | 395/308 |
| 5,440,724 * | 8/1995 | Boothroyd et al. | 371/22.5 |

* cited by examiner

HADC PACKET FIELDS
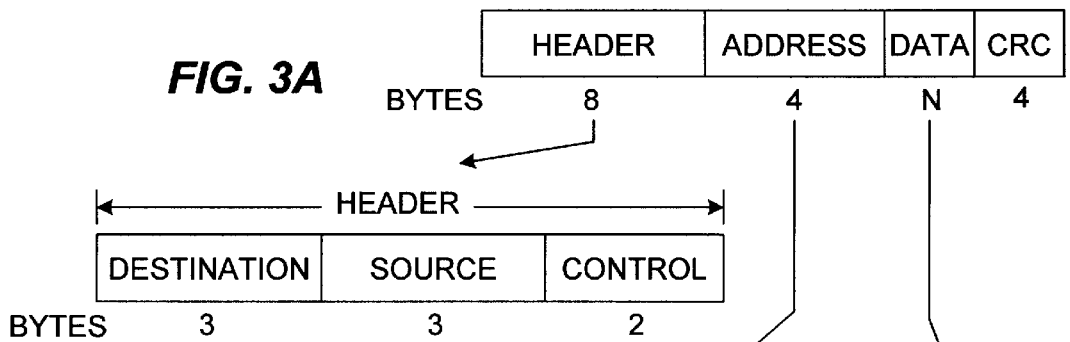
FIG. 3A
FIG. 3B
FIG. 3C
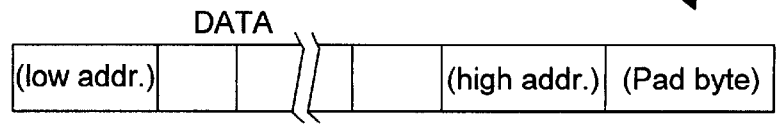
FIG. 3D
HAC PACKET FIELDS
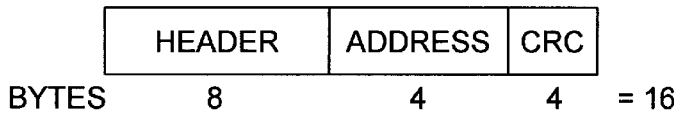
FIG. 4A
HDC PACKET FIELDS
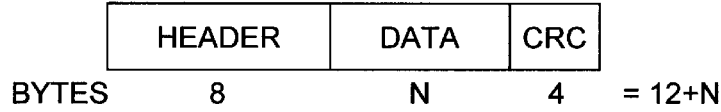
FIG. 4B
HC PACKET FIELDS
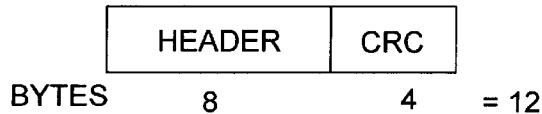
FIG. 4C

COMMAND/DATA SYMBOL

| CDC | CDB | CDA | CD5 | CD4 | CD3 | CD2 | CD1 | CD0 |
|-----|-----|-----|-----|-----|-----|-----|-----|-----|

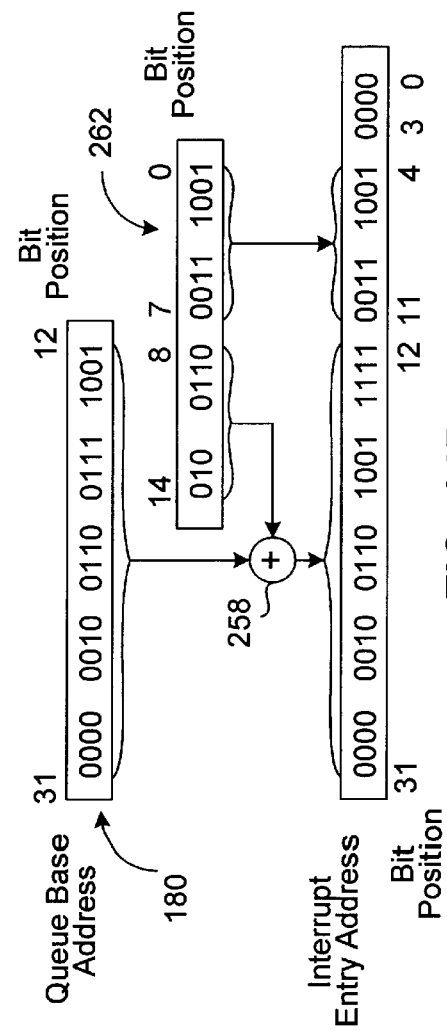

rc0/1 - request complete channel 0/1
ec - error cause: 1=timeout, 0=NAK
eo/1 - error on channel 0/1 el - end of link
it - interrupt upon timeout or NAK
ic - interrupt upon completion
cs - checksum data packet

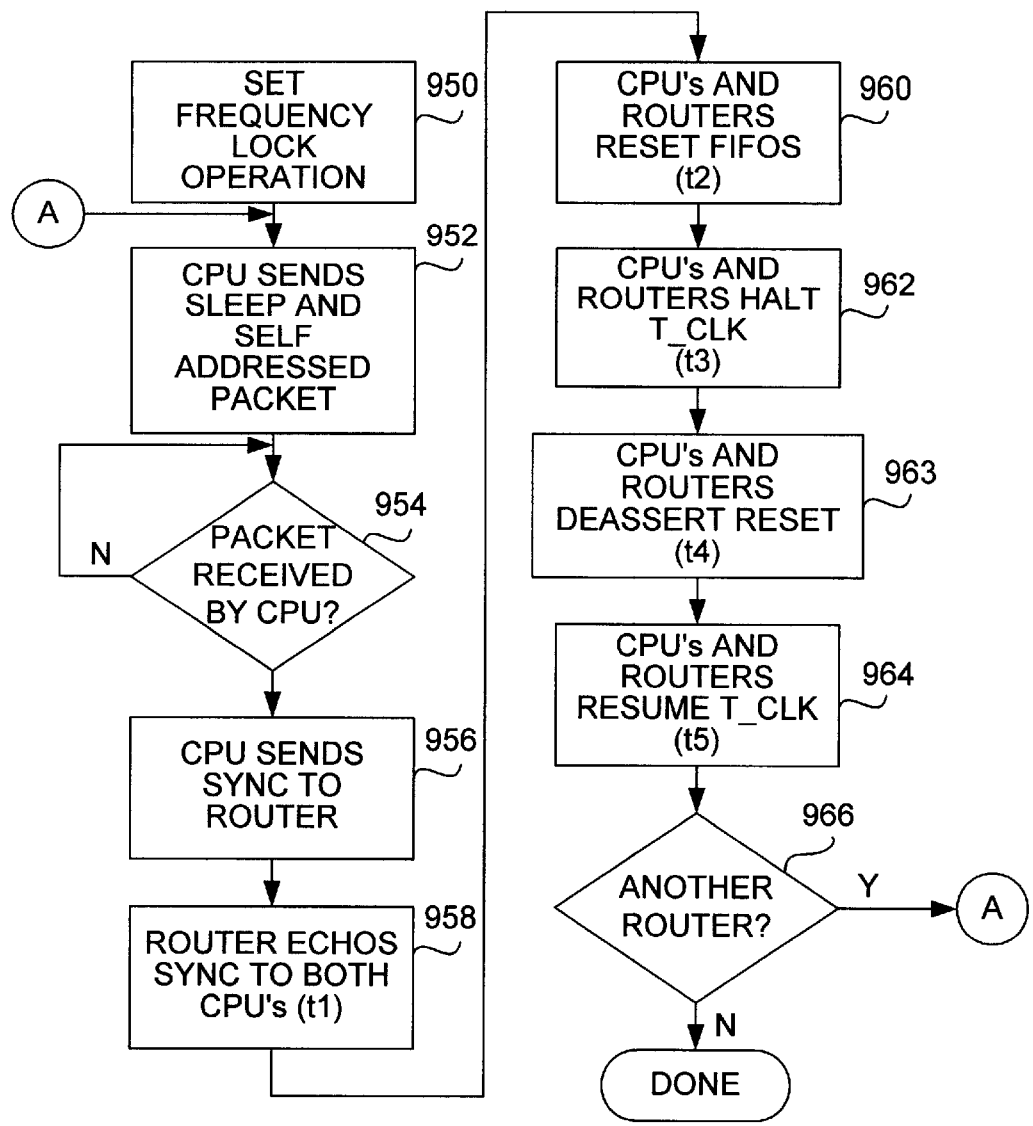
FIG. 31A
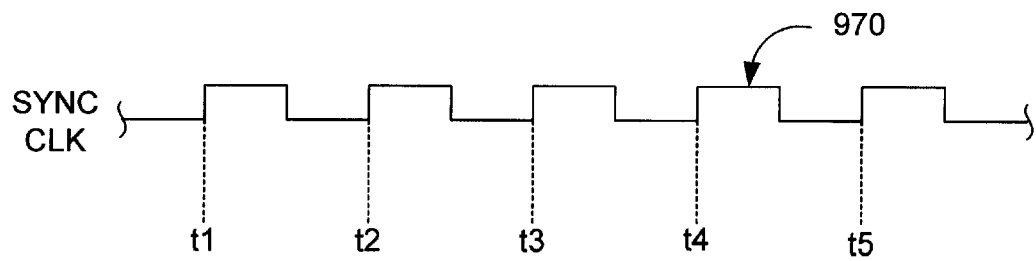
FIG. 31B

SELF-CHECKED, LOCK STEP PROCESSOR PAIRS

The disclosed invention is related to the commonly assigned, co-pending application Ser. Nos. 08/485,217, 08/482,618, 08/481,749, 08/474,772, 08/485,053, 08/473,541, 08/474,770, 08/472,222, 08/477,807, 08/484,281, 08/482,628, 08/479,473, 08,485,062, 08/485,446, and 08/483,748 filed concurrently herewith.

BACKGROUND OF THE INVENTION

The present invention is directed generally to data processing systems, and more particularly to a multiple processing system and a reliable system area network that provides connectivity for interprocessor and input/output communication. Further, the system is structured to exhibit fault tolerant capability.

Present day fault tolerant computing evolved from specialized military and communications systems to general purpose high availability commercial systems. The evolution of fault tolerant computers has been well documented (see D. P. Siewiorek, R. S. Swarz, "The Theory and Practice of Reliable System Design," *Digital Press,* 1982, and A. Avizienis, H. Kopetz, J. C. Laprie, eds., "The Evolution of Fault Tolerant Computing," *Vienna: Springer-Verlag,* 1987). The earliest high availability systems were developed in the 1950's by IBM, Univac, and Remington Rand for military applications. In the 1960's, NASA, IBM, SRI, the C. S. Draper Laboratory and the Jet Propulsion laboratory began to apply fault tolerance to the development of guidance computers for aerospace applications. The 1960's also saw the development of the first AT&T electronic switching systems.

The first commercial fault tolerant machines were introduced by Tandem Computers in the 1970's for use in on-line transaction processing applications (J. Bartlett, "A Nonstop Kernal," in proc. *Eighth Symposium on Operating System Principles,* pp. 22–29, Dec. 1981). Several other commercial fault tolerant systems were introduced in the 1980's (O. Serlin, "Fault—Tolerant Systems in Commercial Applications," *Computer,* pp. 19–30, August 1984). Current commercial fault tolerant systems include distributed memory multi-processors, shared-memory transaction based systems, "pair-and-spare" hardware fault tolerant systems (see R. Freiburghouse, "Making Processing Fail-safe," *Mini-micro Systems,* pp. 255–264, May 1982; U.S. Pat. No. 4,907,228 is also an example of this pair-and-spare technique, and the shared-memory transaction based system.), and triple-modular-redundant systems such as the "Integrity" computing system manufactured by Tandem Computers Incorporated of Cupertino, Calif., assignee of this application and the invention disclosed herein.

Most applications of commercial fault tolerant computers fall into the category of on-line transaction processing. Financial institutions require high availability for electronic funds transfer, control of automatic teller machines, and stock market trading systems. Manufacturers use fault tolerant machines for automated factory control, inventory management, and on-line document access systems. Other applications of fault tolerant machines include reservation systems, government data bases, wagering systems, and telecommunications systems.

Vendors of fault tolerant machines attempt to achieve both increased system availability, continuous processing, and correctness of data even in the presence of faults. Depending upon the particular system architecture, application software ("processes") running on the system either continue to run despite failures, or the processes are automatically restarted from a recent checkpoint when a fault is encountered. Some fault tolerant systems are provided with sufficient component redundancy to be able reconfigure around failed components, but processes running in the failed modules are lost. Vendors of commercial fault tolerant systems have extended fault tolerance beyond the processors and disks. To make large improvements in reliability, all sources of failure must be addressed, including power supplies, fans and inter-module connections.

The "NonStop," and "Integrity" architectures manufactured by Tandem Computers Incorporated, (both respectively illustrated broadly in U.S. Pat. No. 4,228,496 and U.S. Pat. Nos. 5,146,589 and 4,965,717, all assigned to the assignee of this application; NonStop and Integrity are registered trademarks of Tandem Computers Incorporated) represent two current approaches to commercial fault tolerant computing. The NonStop system, as generally shown in the above-identified U.S. Pat. No. 4,278,496, employs an architecture that uses multiple processor systems designed to continue operation despite the failure of any single hardware component. In normal operation, each processor system uses its major components independently and concurrently, rather than as "hot backups". The NonStop system architecture may consist of up to 16 processor systems interconnected by a bus for interprocessor communication. Each processor system has its own memory which contains a copy of a message-based operating system. Each processor system controls one or more input/output (I/O) busses. Dual-porting of I/O controllers and devices provides multiple paths to each device. External storage (to the processor system), such as disk storage, may be mirrored to maintain redundant permanent data storage.

This architecture provides each system module with self-checking hardware to provide "fail-fast" operation: operation will be halted if a fault is encountered to prevent contamination of other modules. Faults are detected, for example, by parity checking, duplication and comparison, and error detection codes. Fault detection is primarily the responsibility of the hardware, while fault recovery is the responsibility of the software.

Also, in the Nonstop multi-processor architecture, application software ("process") may run on the system under the operating system as "process-pairs," including a primary process and a backup process. The primary process runs on one of the multiple processors while the backup process runs on a different processor. The backup process is usually dormant, but periodically updates its state in response to checkpoint messages from the primary process. The content of a checkpoint message can take the form of complete state update, or one that communicates only the changes from the previous checkpoint message. Originally, checkpoints were manually inserted in application programs, but currently most application code runs under transaction processing software which provides recovery through a combination of checkpoints and transaction two-phase commit protocols.

Interprocessor message traffic in the Tandem Nonstop architecture includes each processor periodically broadcasting an "I'm Alive" message for receipt by all the processors of the system, including itself, informing the other processors that the broadcasting processor is still functioning. When a processor fails, that failure will be announced and identified by the absence of the failed processor's periodic "I'm Alive" message. In response, the operating system will direct the appropriate backup processes to begin primary execution from the last checkpoint. New backup processes may be started in another processor, or the process may be run with no backup until the hardware has been repaired. U.S. Pat. No. 4,817,091 is an example of this technique.

Each I/O controller is managed by one of the two processors to which it is attached. Management of the controller is periodically switched between the processors. If the managing processor fails, ownership of the controller is automatically switched to the other processor. If the controller fails, access to the data is maintained through another controller.

In addition to providing hardware fault tolerance, the processor pairs of the above-described architecture provide some measure of software fault tolerance. When a processor fails due to a software error, the backup processor frequently is able to successfully continue processing without encountering the same error. The software environment in the backup processor typically has different queue lengths, table sizes, and process mixes. Since most of the software bugs escaping the software quality assurance tests involve infrequent data dependent boundary conditions, the backup processes often succeed.

In contrast to the above-described architecture, the Integrity system illustrates another approach to fault tolerant computing. Integrity, which was introduced in 1990, was designed to run a standard version of the Unix ("Unix" is a registered trademark of Unix Systems Laboratories, Inc. of Delaware) operating system. In systems where compatibility is a major goal, hardware fault recovery is the logical choice since few modifications to the software are required. The processors and local memories are configured using triple-modular-redundancy (TMR). All processors run the same code stream, but clocking of each module is independent to provide tolerance of faults in the clocking circuits. Execution of the three streams is asynchronous, and may drift several clock periods apart. The streams are re-synchronized periodically and during access of global memory. Voters on the TMR Controller boards detect and mask failures in a processor module. Memory is partitioned between the local memory on the triplicated processor boards and the global memory on the duplicated TMRC boards. The duplicated portions of the system use self-checking techniques to detect failures. Each global memory is dual ported and is interfaced to the processors as well to the I/O Processors (IOPs). Standard VME peripheral controllers are interfaced to a pair of busses through a Bus Interface Module (BIM). If an IOP fails, software can use the BIMs to switch control of all controllers to the remaining IOP. Mirrored disk storage units may be attached to two different VME controllers. In the Integrity system all hardware failures are masked by the redundant hardware. After repair, components are reintegrated on-line.

The preceding examples illustrate present approaches to incorporating fault tolerance into data processing systems. Approaches involving software recovery require less redundant hardware, and offer the potential for some software fault tolerance. Hardware approaches use extra hardware redundancy to allow full compatibility with standard operating systems and to transparently run applications which have been developed on other systems.

Thus, the systems described above provide fault tolerant data processing either by hardware (e.g, fail-functional, employing redundancy) or by software techniques (fail-fast, e.g., employing software recovery with high data integrity hardware). However, none of the systems described are believed capable of providing fault tolerant data processing, using both hardware (fail-functional) and software (fail-fast) approaches, by a single data processing system.

Computing systems, such as those described above, are often used for electronic commerce: electronic data interchange (EDI) and global messaging. Today's demands upon such electronic commerce, however, is demanding more and more throughput capacity as the number of users increases and messages become more complex. For example, text-only e-mail, the most widely used facility of the Internet, is growing significantly every year. The Internet is increasingly being used to deliver image, voice, and video files. Voice store-and-forward messaging is becoming ubiquitous, and desktop video conferencing and video-messaging are gaining acceptance in certain organizations. Each type of messaging demand successively more throughput.

In such environments, parallel architectures are being used, interconnected by various communication networks such as local area networks (LANS), and the like.

A key requirement for a server architecture is the ability to move massive quantities of data. The server should have high bandwidth that is scalable, so that added throughput capacity can be added as data volume increases and transactions become more complex.

Bus architectures limit the amount of bandwidth that is available to each system component. As the number of components on the bus increases less bandwidth is available to each.

In addition, instantaneous response is a benefit for all applications and a necessity for interactive applications. it requires very low latency, which is a measure of how long it takes to move data from the source to the destination. Closely associated with response time, latency affects service levels and employee productivity.

SUMMARY OF THE INVENTION

The present invention provides a multiple-processor system that combines both of the two above-described approaches to fault tolerant architecture, hardware redundancy and software recovery techniques, in a single system.

Broadly, the present invention includes a processing system composed of multiple sub-processing systems. Each sub-processing system has, as the main processing element, a central processing unit (CPU) that in turn comprises a pair of processors operating in lock-step, synchronized fashion to execute each instruction of an instruction stream at the same time. Each of the sub-processing systems further include an input/output (I/O) system area network system that provides redundant communication paths between various components of the larger processing system, including a CPU and assorted peripheral devices (e.g., mass storage units, printers, and the like) of a sub-processing system, as well as between the sub-processors that may make up the larger overall processing system. Communication between any component of the processing system (e.g., a CPU and a another CPU, or a CPU and any peripheral device, regardless of which sub-processing system it may belong to) is implemented by forming and transmitting packetized messages that are routed from the transmitting or source component (e.g., a CPU) to a destination element (e.g., a peripheral device) by system area network structure comprising a number of router elements that are interconnected by a bus structure (herein termed the "TNet") of a plurality of interconnecting Links. The router elements are responsible for choosing the proper or available communication paths from a transmitting component of the processing system to a destination component based upon information contained in the message packet. Thus, the routing capability of the router elements provide the I/O system of the CPUs with a communication path to peripherals, but permits it to also be used for interprocessor communications.

As indicated above, the processing system of the present invention is structured to provide fault-tolerant operation through both "fail-fast" and "fail-functional" operation. Fail-fast operation is achieved by locating error-checking capability at strategic points of the system. For example, each CPU has error-checking capability at a variety of points in the various data paths between the (lock-step operated) processor elements of the CPU and its associated memory. In particular, the processing system of the present invention conducts error-checking at an interface, and in a manner, that makes little impact on performance. Prior art systems typically implement error-checking by running pairs of processors, and checking (comparing) the data and instruction flow between the processors and a cache memory. This technique of error-checking tended to add delay to the accesses. Also, this type of error-checking precluded use of off-the-shelf parts that may be available (i.e., processor/cache memory combinations on a single semiconductor chip or module). The present invention performs error-checking of the processors at points that operate at slower rates, such as the main memory and I/O interfaces which operate at slower speeds than the processor-cache interface. In addition, the error-checking is performed at locations that allow detection of errors that may occur in the processors, their cache memory, and the I/O and memory interfaces. This allows simpler designs for the memory and I/O interfaces as they do not require parity or other data integrity checks.

Error-checking of the communication flow between the components of the processing system is achieved by adding a cyclic-redundancy-check (CRC) to the message packets that are sent between the elements of the system. The CRC of each message packet is checked not only at the destination of the message, but also while en route to the destination by each router element used to route the message packet from its source to the destination. If a message packet is found by a router element to have an incorrect CRC, the message packet is tagged as such, and reported to a maintenance diagnostic system. This feature provides a useful tool for fault isolation. Use of CRC in this manner operates to protect message packets from end to end because the router elements do not modify or regenerate the CRC as the message packet passes through. The CRC of each message packet is checked at each router crossing. A command symbol—"This packet Good" (TPG) or "This Packet Bad" (TPB)—is appended to every packet. A maintenance diagnostic processor can use this information to isolate a link or router element that introduces an error, even if the error was transient.

The router elements are provided with a plurality of bi-directional ports at which messages can be received and transmitted. As such, they lend themselves well to being used for a variety of topologies, so that alternate paths can be provided between any two elements of a processing system (e.g., between a CPU and an I/O device), for communication in the presence of faults, yielding a fault-tolerant system. Additionally, the router logic includes the capability of disabling certain ports from consideration as an output, based upon the router port at which a message packet is received and the destination of the message packet. A router that receives a message packet containing a destination address that indicates an unauthorized port as the outgoing port of the router for that message packet will discard the message packet, and notify the maintenance diagnostic system. Judicious use of this feature can prevent a message packet from entering a continuous loop and delay or prevent other message packets from doing so (e.g., by creating a "deadlock" condition, discussed further below).

The CPUs of a processing system are capable of operating in one of two basic modes: a "simplex mode" in which each CPU (of a pair) operates independently of the other, or a "duplex "mode in which pairs of CPUs operate in synchronized, lock-step fashion. Simplex mode operation provides the capability of recovering from faults that are detected by error-checking hardware (cf, U.S. Pat. No. 4,228,496 which teaches a multiprocessing system in which each processor has the capability of checking on the operability of its sibling processors, and of taking over the processing of a processor found or believed to have failed). When operating in duplex mode, the paired CPUs both execute an identical instruction stream, each CPU of the pair executing each instruction of the stream at substantially the same time.

Duplex mode operation provides a fault tolerant platform for less robust operating systems (e.g., the UNIX operating system). The processing system of the present invention, with the paired, lock-step CPUs, is structured so that faults are, in many instances masked (i.e., operating despite the existence of a fault), primarily through hardware.

When the processing system is operating in duplex mode, each CPU pair uses the I/O system to access any peripheral of the processing system, regardless of which (of the two, or more) sub-processor system the peripheral may be ostensibly a member of. Also, in duplex mode, message packets bound for delivery to a CPU pair are delivered to both CPUs of the pair by the I/O system at substantially the same time in order to maintain the synchronous, lock-step operation of the CPU pair. Thus, a major inventive aspect of the invention provides duplex mode of operation with the capability of ensuring that both CPUs of a lock-step pair receive I/O message packets at the same time in the same manner. In this regard, any router element connected to one CPU of a duplex pair is connected to both CPU elements of the pair. Any router so connected, upon receiving a message for the CPU pair (from either a peripheral device such as a mass storage unit or from a processing unit), will replicate the message and deliver it to both CPUs of the pair using synchronization methods that ensure that the CPUs remain synchronized. In effect, the duplex CPU pair, as viewed from the I/O system and other duplex cpu pairs, is seen as a single CPU. Thus, the I/O system, which includes elements from all sub-processing systems, is made to be seen by the duplex CPU pair as one homogeneous system in which any peripheral device is accessible.

Another important and novel feature of the invention is that the versatility of the router elements permits clusters of duplex mode operating subsystem pairs to be combined to form a multiprocessor system in which the CPU of any one is actually a pair of synchronized, lock-step CPUS.

Yet another important aspect of the present invention is that interrupts issuing from an I/O element are communicated to the CPU (or CPU pair in the case of duplex mode) in the same manner as any other information transfer: by message packets. This has a number of advantages: interrupts can be protected by CRC, just as are normal I/O message packets. Also, the requirement of additional signal lines dedicated to interrupt signaling for simultaneously delivery to both CPUs is obviated; delivering interrupts via the message packet system ensures that they will arrive at duplexed CPUs in synchronized fashion, in the same manner as I/O-message packets. Interrupt message packets will contain information as to the cause of the interrupt, obviating the time-consuming requirement that the CPU(s) read the device issuing the interrupt to determine the cause, as is done at present. Further, as indicated above, the routing elements can provide multiple paths for the interrupt packet delivery, thereby raising the fault-tolerant capability of the system. In addition, using the same messaging system to communicate data between I/O units and the CPUs and to communicate interrupts to the CPUs preserves the ordering of I/O and interrupts; that is, an I/O device will wait until an I/O is complete before an interrupt message is sent.

A further novel aspect of the invention is the implementation of a technique of validating access to the memory of any CPU. The processing system, as structured according to the present invention, permits the memory of any CPU to be accessed by any other element of the system (i.e., other CPUs and peripheral devices). This being so, some method of protecting against inadvertent and/or unauthorized access must be provided. In accordance with this aspect of the invention, each CPU maintains an access validation and translation (AVT) table containing entries for each source external to the CPU that is authorized access to the memory of that CPU. Each such AVT table entry includes information as to the type of access permitted (e.g., a write to memory), and where in memory that access is permitted. Message packets that are routed through the I/O system are created, as indicated above, with information describing the originator of the message packet, the destination of the message packet, what the message contains (e.g., data to be written at the destination, or a request for data to be read from the destination), and the like. In addition to permitting the router elements to route the message packet to its ultimate destination expeditiously, the receiving CPU uses the information to access the AVT table for the entry pertaining to the source of the message packet, and check to see if access is permitted, and if so what type and where the receiving CPU chooses to remap (i.e., translate) the address. In this manner the memory of any CPU is protected against errant accesses. The AVT table is also used for passing through interrupts to the CPU.

The AVT table assures that a CPUs memory is not corrupted by faulty I/O devices. Access rights can be granted form memory ranging in size from 1 byte to a range of pages. This fault containment is especially important in I/O, because the system vendors of systems usually have much less control over the quality of hardware and software of third-party peripheral suppliers. Problems can be isolated to a single I/O device or controller rather than the entire I/O system.

A further aspect of the invention involves the technique used by a CPU to transmit data to the I/O. According to this aspect of the invention, a block transfer engine is provided in each CPU to handle input/output information transfers between a CPU and any other component of the processor system. Thereby, the individual processor units of the CPU are removed from the more mundane tasks of getting information from memory and out onto the TNet network, or accepting information from the network. The processor unit of the CPU merely sets up data structures in memory containing the data to be sent, accompanied by such other information as the desired destination, the amount of data and, if a response is required, where in memory the response is to be placed when received. When the processor unit completes the task of creating the data structure, the block transfer engine is notified to cause it to take over, and initiate sending of the data, in the form of message packets. If a response is expected, the block transfer engine sets up the necessary structure for handling the response, including where in memory the response will go. when and if the response is received, it is routed to the expected memory location identified, and notifies the processor unit that the response was received.

Further aspects and features of the present invention will become evident to those skilled in this art upon a reading of the following detailed description of the invention, which should be taken in conjunction with the accompanying drawings.

BRIEF DESCRIPTION OF THE DRAWINGS

FIGS. 3A–3D and 4A–4C illustrate the construction of the various message packets used to convey information such as inputoutput data via the area network I/O system shown in FIG. 2;

FIGS. 13A, 13B, and 13C illustrate aspects the AVT table entries for normal and interrupt requests;

FIG. 14B illustrates the process used to form a memory address for a queue entry;

FIG. 31A shows a flow diagram, and FIG. 31B illustrates a portion of SYNC CLK, both of which are used to reset and synchronize the clock synchronization FIFOs of the CPUs and routers of the processing system of FIG. 1A that receive information from each other;

DETAILED DESCRIPTION OF THE INVENTION

Overview

Figure 1A:
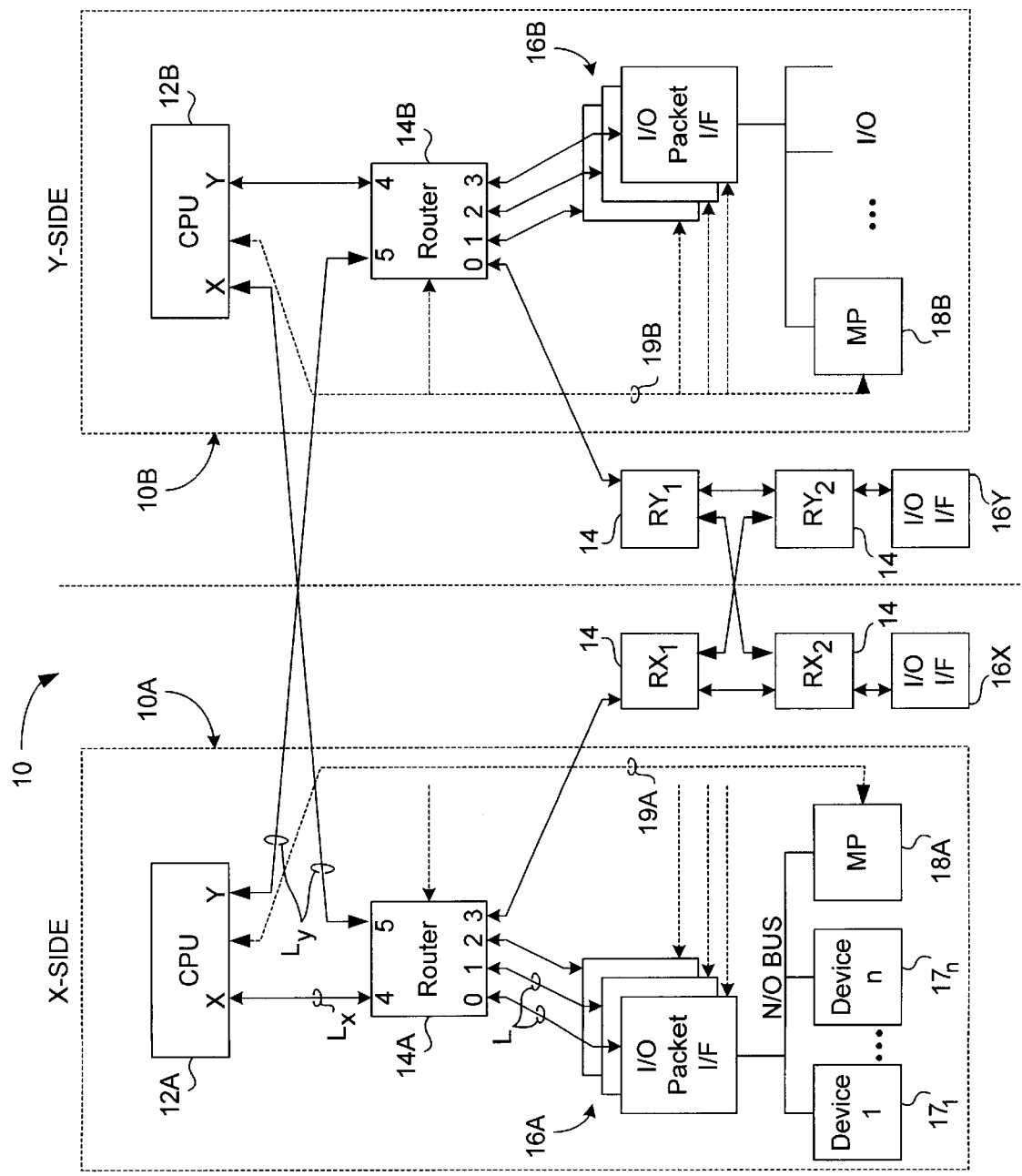
FIG. 1A illustrates a processing system constructed in accordance with the teachings of the present invention.

Turning now to the figures and, for the moment, principally FIG. 1A, there is illustrated a data processing system, designated with the reference 10, constructed according to the various teachings of the present invention. As FIG. 1A shows, the data processing system 10 comprises two sub-processor systems 10A and 10B each of which are substantially the same in structure and function. Accordingly, it should be appreciated that, unless noted otherwise, a description of any one of the sub-processor systems 10 will apply equally to any other sub-processor system 10.

Continuing with FIG. 1A therefore, each of the sub-processor systems 10A, 10B is illustrated as including a central processing unit (CPU) 12, a router 14, and a plurality of input/output (I/O) packet interfaces 16 each of which, in turn, is coupled to a number (n) of I/O devices 17 by an native input/output (NIO) bus. At least one of the I/O packet interfaces 16 will also have coupled thereto a maintenance processor (MP) 18.

The MP 18 of each sub-processor system 10A, 10B connects to each of the elements of that sub-processor system via an IEEE 1149.1 test bus 17 (shown in phantom in FIG. 1A; not shown in FIGS. 1B and 1C for reasons of clarity) and an on-line access port (OLAP) interface that, for each element, contains registers used by the MP 18 for communicating status and control information between the element and the MP 18. The MP 18 can also communicate with the CPUs 12, as FIG. 1A illustrates, by creating and sending message packets. (Actually, it is the I/O packet interface 16 that creates and sends a packet in response to a request therefor from the MP 18.)

The CPU 12, the router 14, and the I/O packet interfaces 16 are interconnected by "TNet" Links L, providing bi-directional data communication. Each TNet Link L comprises two uni-directional 10-bit sub-link busses. Each TNet sub-link conveys 9 bits of data and an accompanying clock signal. As FIG. 1A further illustrates, TNet Links L also interconnect the sub-processor systems 10A and 10B to one another, providing each sub-processor system 10 with access to the I/O devices of the other as well as inter-CPU communication. As will be seen, any CPU 12 of the processing system 10 can be given access to the memory of any other CPU 12, although such access must be validated—an important aspect of the invention. In a somewhat similar fashion, the memory of a CPU 12 is also accessible to the peripheral devices, usually as the result of an operation initiated by a CPU. These accesses are also validated to prevent corruption of the memory of a CPU 12 by a wayward peripheral device 17.

Preferably, the sub-processor systems 10A/10B are paired as illustrated in FIG. 1A (and FIGS. 1B and 1C, discussed below), and each sub-processor system 10A/10B pair (i.e., comprising a CPU 12, at least one router 14, and at least one I/O packet interface 16 with associated I/O devices).

Each CPU 12 has two I/O ports, an X port and a Y port, whereat message packets are transmitted and/or received. The X port of a CPU 12 (e.g., CPU 12A) connects, by a TNet Link L to a router (14A) of the corresponding sub-processor system (e.g., 10A). Conversely, the Y port connects the CPU (12A) to the router (14B) of the companion sub-processor system (10B). This latter connection not only provides a communication path for access by a CPU (12A) to the I/O devices of the other sub-processor system (10B), but also to the CPU (12B) of that system for inter-CPU communication.

Information is communicated between any element of the processing system 10 and any other element (e.g., CPU 12A of sub-processor system 10A) of the system and any other element of the system (e.g., an I/O device associated with an I/O packet interface 16B of sub-processor system 10B) via message "packets." Each message packet is made up of a number of 9-bit symbols which may contain data or be a command symbol. Message packets are synchronously transmitted on the TNet Links L, in bit-parallel, symbol-serial fashion, accompanied by a transmitter clock that is provided by the component transmitting the message packet. Clocks between the communicating elements (i.e., a sender and a receiver) may be operated in one of two modes: a "near frequency" mode, or a "frequency locked" mode.

When operating in near frequency, the clock signals used by the transmitting element and the receiving element are separate, and locally generated, although they are constrained to be of substantially the same frequency—within a predetermined tolerance. For this reason, a unique method of receiving the symbols at the receiver, using a clock synchronization first-in-first-out (CS FIFO) storage structure (described more fully below), has been developed. The CS FIFO operates to absorb any skew that may develop between the clock signals of the receiver and transmitter of a message packet as a result of near frequency operation. Near frequency operation is used when transmitting symbols from one router 14 to another, or between a router 14 and an I/O Packet Interface 16, or between routers 14 and CPUs 12 which are operating in simplex mode (described below).

Frequency locked operation means just that: the frequencies of the clock signals of the transmitter and receiver units are locked, although not necessarily in phase. Frequency locked clock signals are used to transmit symbols between the routers 14A, 14B and the CPUs 12 of paired sub-processor systems (e.g., sub-processor systems 10A, 10B, FIG. 1A). Since the clocks of the transmitting and receiving element are not phase related, a clock synchronization FIFO is again used—albeit operating in a slightly different mode from that used for near frequency operation.

Each router 14 is provided with 6 bi-directional TNet ports, 0–5, each of which is substantially identically structured, with one exception: the two ports (4, 5) used to connect to a CPU 12 are structured somewhat differently. This difference, as will be seen, is due to the fact that pairs of the sub-processor systems 10 can be operated in a synchronized, lock-step mode, called duplex mode, in which each CPU 12 operates to execute the same instruction at the same time from the same instruction stream. When in duplex mode, it is important that incoming I/O from any one I/O device be supplied to both CPUs 12 at virtually the same time.

Thus, for example, a message packet received at port 3 of the router 14A will be duplicated by the router 14A and transmitted from the router ports 4, 5 so that the same symbol is communicated to the CPUs 12 at substantially the same time. It is in this manner that the ports 4, 5 may vary from the other ports 0–3 of the router 14.

FIG. 1A illustrates another feature of the invention: a cross-link connection between the two sub-processor systems 10A, 10B through the use of additional routers 14 (identified in FIG. 1A as routers $RX_1$, $RX_2$, $RY_1$, and $RY_2$). As FIG. 1A illustrates, the added routers $RX_1$, $RX_2$, $RY_1$, and $RY_2$ form a cross-link connection between the sub-processors 10A, 10B (or, as shown, "sides" X and Y, respectively) to couple them to I/O Packet Interfaces 16X, 16Y. The cross-connecting Links between the routers $RX_1$, $RY_2$ and $RY_1$–$RX_2$ provide the cross-link path from one side (X or Y) to the other in much the same manner as does the cross-link connections Ly between CPUs 12A, 12B and routers 14B, 14A. However, the cross-link provided by the routers $RX_1$, $RX_2$, $RY_1$, and $RY_2$ allow the I/O devices (not shown) that may be connected to the I/O Packet Interfaces 16X, 16Y to be routed to one side (X or Y) or the other.

As shown in FIG. 1A, the routers $RX_2$ and $RY_2$ provide the I/O packet interface units 16x and 16y with a dual ported interface. Of course, it will now be evident that the I/O packet interfaces 16X, 16Y could be themselves structured to have dual ports as an alternative to the cross-link connection provided by the dual-port connections formed by the routers $RX_2$ and $RY_2$ and those dual-ports to connect to the routers $RX_1$, $RY_1$.

Figure 1B:
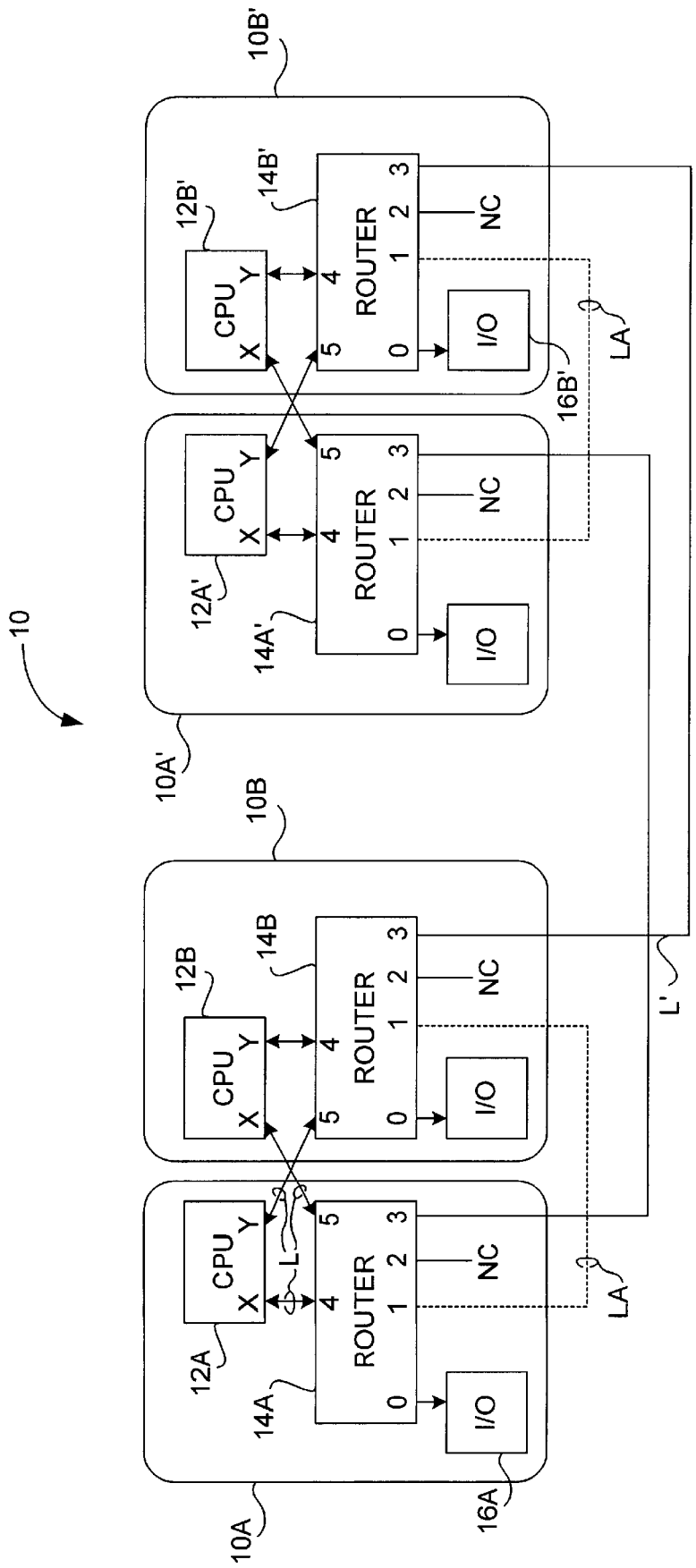
FIGS. 1B and 1C illustrate two alternate configurations of the processing system of FIG. 1A, employing clusters or arrangements of the processing system of FIG. 1A.
Figure 1C:
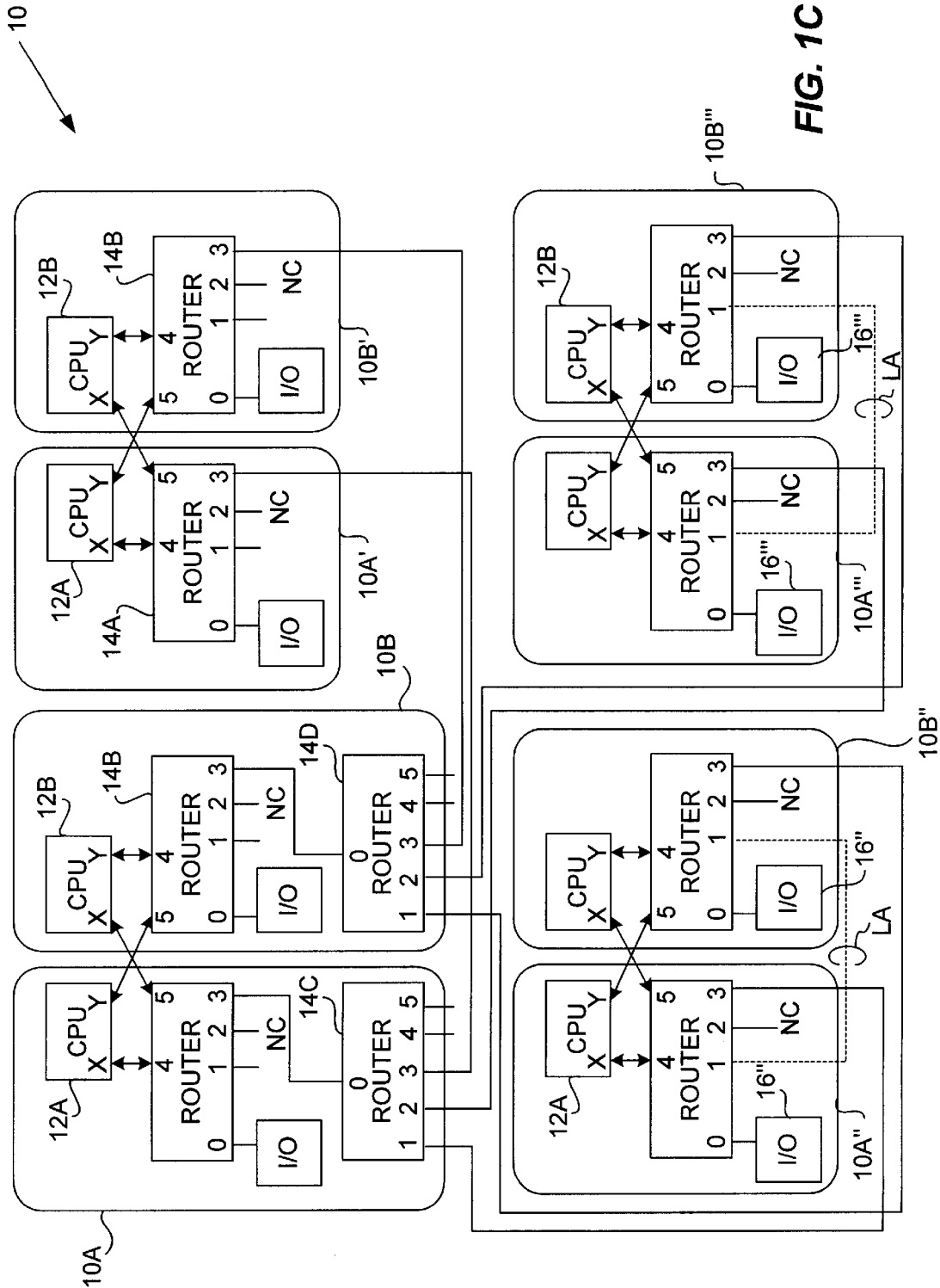

As will become evident when the structure and design of the routers 14 are understood, they lend themselves to being used in a manner that can extend the configuration of the processing system 10 to include additional sub-processor systems such as illustrated in FIGS. 1B and 1C. In FIG. 1B, for example, one port of each of the routers 14A and 14B is used to connect the corresponding sub-processor systems 10A and 10B to additional sub-processor systems 10A' and 10B' forming thereby a larger processing system comprising clusters of the basic processing system 10 of FIG. 1.

Similarly, in FIG. 1C the above concept is extended to form an eight sub-processor system cluster, comprising sub-processor systems pairs 10A/10B, 10A'/10B', 10A"/10B", and 10A'''/10B'''. In turn, each of the sub-processor systems (e.g., sub-processor system 10A) will have essentially the same basic minimum configuration of a CPU 12, a router 14, and I/O connected to the TNet by a I/O packet interface 16, except that, as FIG. 1C shows, the sub-processor systems 10A and 10B include additional routers 14C and 14D, respectively, in order to extend the cluster beyond sub-processor systems 10A'/10B' to the sub-processor systems 10A"/10B" and 10A'''/10B'''. As FIG. 1C further illustrates, unused ports 4 and 5 of the routers 14C and 14D may be used to extend the cluster even further.

Due to the design of the routers 14, as well as the method used to route message packets, together with judicious use of the routers 14 when configuring the topology of the system 10, any CPU 12 of processing system 10 of FIG. 1C can access any other "end unit" (e.g., a CPU or I/O device) of any of the other sub-processor systems. Two paths are available from any CPU 12 to the last router 14 connecting to the I/O packet interface 16. For example, the CPU 12B of the sub-processor system 10B' can access the I/O 16''' of sub-processor system 10A''' via router 14B (of sub-processor system 10B'), router 14D, and router 14B (of sub-system 10B''') and, via link LA, router 14A (sub-system 10A'''), OR via router 14A (of sub-system 10A'), router 14C, and router 14A (sub-processor system 10A'''). Similarly, CPU 12A of sub-processor system 10A'' may access (via two paths) memory contained in the CPU 12B of sub-processor 10B to read or write data. (Memory accesses by one CPU 12 of another component of the processing system requires, as will be seen, the components seeking access to have authorization to do so. In this regard each CPU 12 maintains a table containing entries for each component having authorization to access that CPU's memory, usually limiting that access to selected sections of memory, and the type of access permitted. Requiring authorization in this manner prevents corruption of memory data of a CPU by erroneous access.)

The topology of the processing system shown in FIG. 1B is achieved by using port 1 of the routers 14A, 14B, and auxiliary TNet links LA, to connect to the routers 14A', 14B' of sub-processor systems 10A', 10B'. The topology thereby obtained establishes redundant communication paths between any CPU 12 (12A, 12B, 12A', 12B') and any I/O packet interface 16 of the processing system 10 shown in FIG. 1B. For example, the CPU 12A' of the sub-processor system 10A' may access the I/O 16A of sub-processor system 10A by a first path formed by the router 14A' (in port 4, out port 3), router 14A (in port 3, out port 0), and associated interconnecting TNet Links L. If, however, router 14A' is lost, CPU 12A' may access I/O 16A by the path formed by router 14B' (in port 4, out port 3), router 14B (in port 3, out port 1), link LA, and router 14A (in port 1, out port 0).

Note that the topology of FIG. 1B also establishes redundant communication paths between any pair of CPUs 12 of system 10, providing a means for fault tolerant inter-CPU communication.

FIG. 1C illustrates an extension of the topology of that shown in FIG. 1B. By interconnecting one port of each router 14 of each sub-processor pair, and using additional auxiliary TNet links LA (illustrated in FIG. 1C with the dotted line connections) between the ports 1 of the routers 14 (14A'' and 14B'') of sub-processor systems 10A'', 10B'' and 10A''', 10B''', two separate, independent data paths can be found between any CPU 12 and any I/O packet interface 16. In this fashion, any end unit (i.e., a CPU 12 or an I/O packet interface 16) will have at least two paths to any other end unit.

Providing alternate paths of access between any two end units (e.g., between a CPU 12 and any other CPU 12, or between any CPU 12 and any I/O packet interface 16, in the system 10—FIG. 1C) is an important concept. The loss of any fault domain will not disrupt communications between any two of the remaining fault domains. Here, a fault domain could be a sub-processor system (e.g., 10A). Thus, if the sub-processor system 10A were brought down because of a failure without the electrical power being supplied, without the auxiliary TNet link LA between the routers 14A''' and 14B''', the CPU 12B of the sub-processor system 10B would have lost access to the I/O packet interface 16''' (via router 14A, router 14C, router 14A''', to I/O packet interface 16'''). With the auxiliary connection LA between the routers 14A''' and 14B''', even with the loss of the router 14A (and router 14C) by loss of the sub-processor system 10A, communications between the CPU 12B is still possible via the route of router 14B, router 14D, router 14B''', the auxiliary connection LA to router 14A''', and finally to the I/O packet interface 16'''.

CPU Architecture

Figure 2:
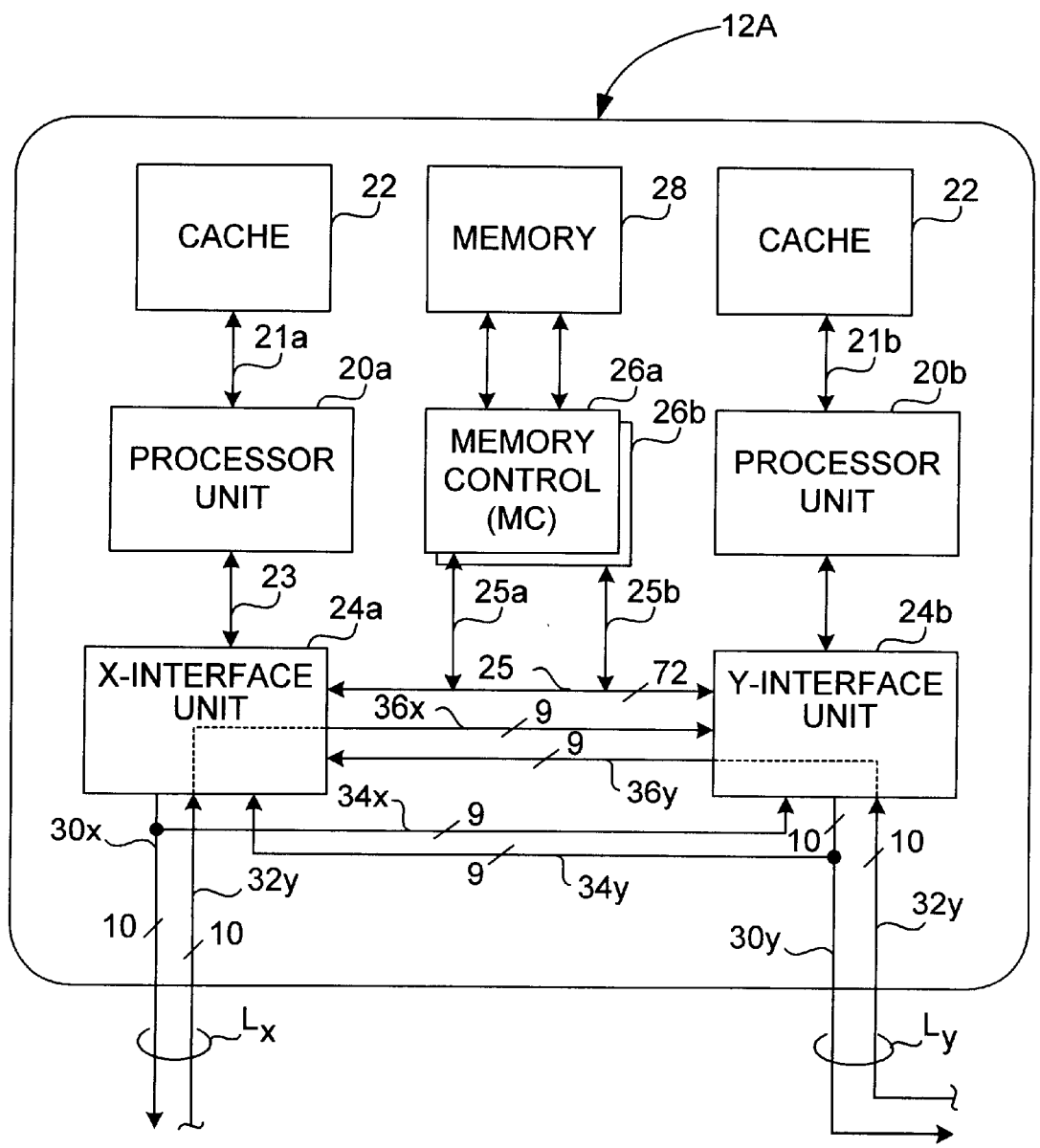
FIG. 2 illustrates, in simplified block diagram form, the central processing unit (CPU) that forms a part of each sub-processor system of FIGS. 1A–1C.

Turning now to FIG. 2, the CPU 12A is illustrated in greater detail. Since both CPUs 12A and 12B are substantially identical in structure and function, only the details of the CPU 12A will be described. However, it will be understood that, unless otherwise noted, the discussion of CPU 12A will apply equally to CPU 12B. As FIG. 2 shows, the CPU 12A includes a pair of processor units 20a, 20b that are configured for synchronized, lock-step operation in that both processor units 20a, 20b receive and execute identical instructions, and issue identical data and command outputs, at substantially the same moments in time. Each of the processor units 20a and 20b is connected, by a bus 21 (21a, 21b) to a corresponding cache memory 22. The particular type of processor units used could contain sufficient internal cache memory so that the cache memory 22 would not be needed. Alternatively, cache memory 22 could be used to supplement any cache memory that may be internal to the processor units 20. In any event, if the cache memory 22 is used, the bus 21 is structured to conduct 128 bits of data, 16 bits of error-correcting code (ECC) check bits, protecting the data, 25 tag bits (for the data and corresponding ECC), 3 check bits covering the tag bits, 22 address bits, 3 bits of parity covering the address, and 7 control bits.

The processors 20a, 20b are also respectively coupled, via a separate 64-bit address/data bus 23 to X and Y interface units 24a, 24b. If desired, the address/data communicated on each bus 23a, 23b could also be protected by parity, although this will increase the width of the bus. (Preferably, the processors 20 are constructed to include RISC R4000 type microprocessors, such as are available from the MIPS Division of Silicon Graphics, Inc. of Santa Clara, Calif.)

The X and Y interface units 24a, 24b operate to communicate data and command signals between the processor units 20a, 20b and a memory system of the CPU 12A, comprising a memory controller (MC) 26 (composed of two MC halves 26a and 26b) and a dynamic random access memory array 28. The interface units 24 interconnect to each other and to the Mcs 26a, 26b by a 72-bit address/command bus 25. However, as will be seen, although 64-bit double-words of data (accompanied by 8 bits of ECC) are written to the memory 28 by the interface units 24, one interface unit 24 will drive only one word (e.g., the 32 most significant portion) of the doubleword being written while the other interface unit 24 writes the other word of the double word (e.g., the least significant 32-bit portion of the doubleword). In addition, on each write operation the interface units 24a, 24b perform a cross-check operation on the data not written by that interface unit 24 with the data written by the other to check for errors; on read operations the addresses put on the bus 25 are also cross-checked in the same manner. The particular ECC used for protecting both the data written to the cache memory 22 as well as the (main) memory 28 is conventional, and provides single-bit error correction, double-bit error detection.

Conceptually, each doubleword contains an "odd" and an "even" word. One of Mcs 26 will write the odd words to memory, while the other writes the even words. Further, the Mcs 26 will write two doublewords at a time, together with the 8-bit error-correcting code (ECC) for that doubleword. In addition, the ECC check bits are formed to not only cover the doubleword, but also the address of the memory location at which the doubleword is written. When later accessed, the ECC is used to correct single bit errors, and detect double bit errors, that may have occurred in data, at the same time checking that the doubleword accessed corresponds to the address of the location from which the doubleword was stored.

Interface units 24a, 24b of the CPU 12A form the circuitry to respectively service the X and Y (I/O) ports of the CPU 12A. Thus, the X interface unit 24a connects by the bi-directional TNet Link Lx to a port of the router 14A of the processor system 10A (FIG. 1A) while the Y interface unit 24b similarly connects to the router 14B of the processor system 10B by TNet Link Ly. The X interface unit 24a handles all I/O traffic between the router 14A and the CPU 12A of the sub-processor system 10A. Likewise, the Y interface unit 24b is responsible for all I/O traffic between the CPU 12A and the router 14B of companion sub-processor system 10B.

The TNet Link Lx connecting the X interface unit 24a to the router 14A (FIG. 1) comprises, as above indicated, two 10-bit buses $30_x$, $32_x$, each carrying a clock signal, and 9 bits of data. The bus $30_x$ carries transmitted data to the router 14A; the bus $32_x$ carries data incoming from the router 14A. In similar fashion, the Y interface unit 24b is connected to the router 14B (of the sub-processor system 10B) by two 10-bit busses: $30_y$ (for outgoing transmissions) and $32_y$ (for incoming transmissions), together forming the TNet Link Ly.

The X and Y interface units 24a, 24b are synchronously operated in lock-step, performing substantially the same operations at substantially the same times. Thus, although only the X interface unit 24a actually transmits data onto the bus $30_x$, the same output data is being produced by the Y interface unit 24b, and used for error-checking. The Y interface unit 24b output data is coupled to the X interface unit 24a by a cross-link $34_y$ where it is received by the X interface unit 24a and compared against the same output data produced by the X interface unit. In this way the outgoing data made available at the X port of the CPU 12a is checked for errors.

In the same fashion, the output data transmitted from the port of the CPU 12A is checked. The output data from the Y interface unit 24b is coupled to the Y port by a 10-bit bus $30_y$, and also to the X interface unit 24a by the 9-bit cross-link $34_y$ where is checked with that produced by the X interface unit.

As mentioned, the two interface units 24a, 24b operate in synchronous, lock-step with one another, each performing substantially the same operations at the same time. For this reason, data received at the X and/or Y ports of the CPU 12A must be received by both interface units 24a, 24b to maintain the two interface units in this lock-step mode. Thus, data received by one interface unit 24a, 24b is passed to the other, as indicated by the dotted lines and 9-bit cross-link connections $36_x$ (communicating incoming data being received at the X port by the X interface unit 24a to the Y interface unit 24b) and $36_y$ (communicating data received at the Y port by the Y interface unit 24b to the X interface unit 24a).

Certain more robust operating systems are structured with a fault-tolerant capability in the context of a multiprocessor system. Multiprocessor systems of this type provide a fault tolerant environment by enabling the software to recover from faults detected by hardware or software. For example, U.S. Pat. No. 4,817,091 teaches a multiprocessor system in which each processor periodically messages each of the processors of the system (including itself), under software control, to thereby provide an indication of continuing operation. Each of the processors, in addition to performing its normal tasks, operates as a backup processor to another of the processors. In the event one of the backup processors fails to receive the messaged indication from a sibling processor, it will take over the operation of that sibling (now thought to be inoperative), in addition to performing its own tasks. Other fault tolerant techniques, using less robust software or operating systems (i.e., without the innate ability to recover from detected faults) are designed with hardware and logic that operates to recover from detected errors.

The present invention is directed to providing a hardware platform for both types of software. Thus, when a robust operating system is available, the processing system 10 can be configured to operate in a "simplex" mode in which each of the CPUs 12A and 12B operates in independent fashion. The CPUs 12 are constructed with error-checking circuitry at critical points in various of the CPU internal data paths. The routers 14 provide interprocessor communications between the various CPUs 12 that may be interconnected in the system 10, as well as providing a communication route from any CPU of the system to any device controlled by the I/O packet interface 16. When an error is detected, the responsibility of recovery from that error is left, in most instances, to software.

Figure 5:
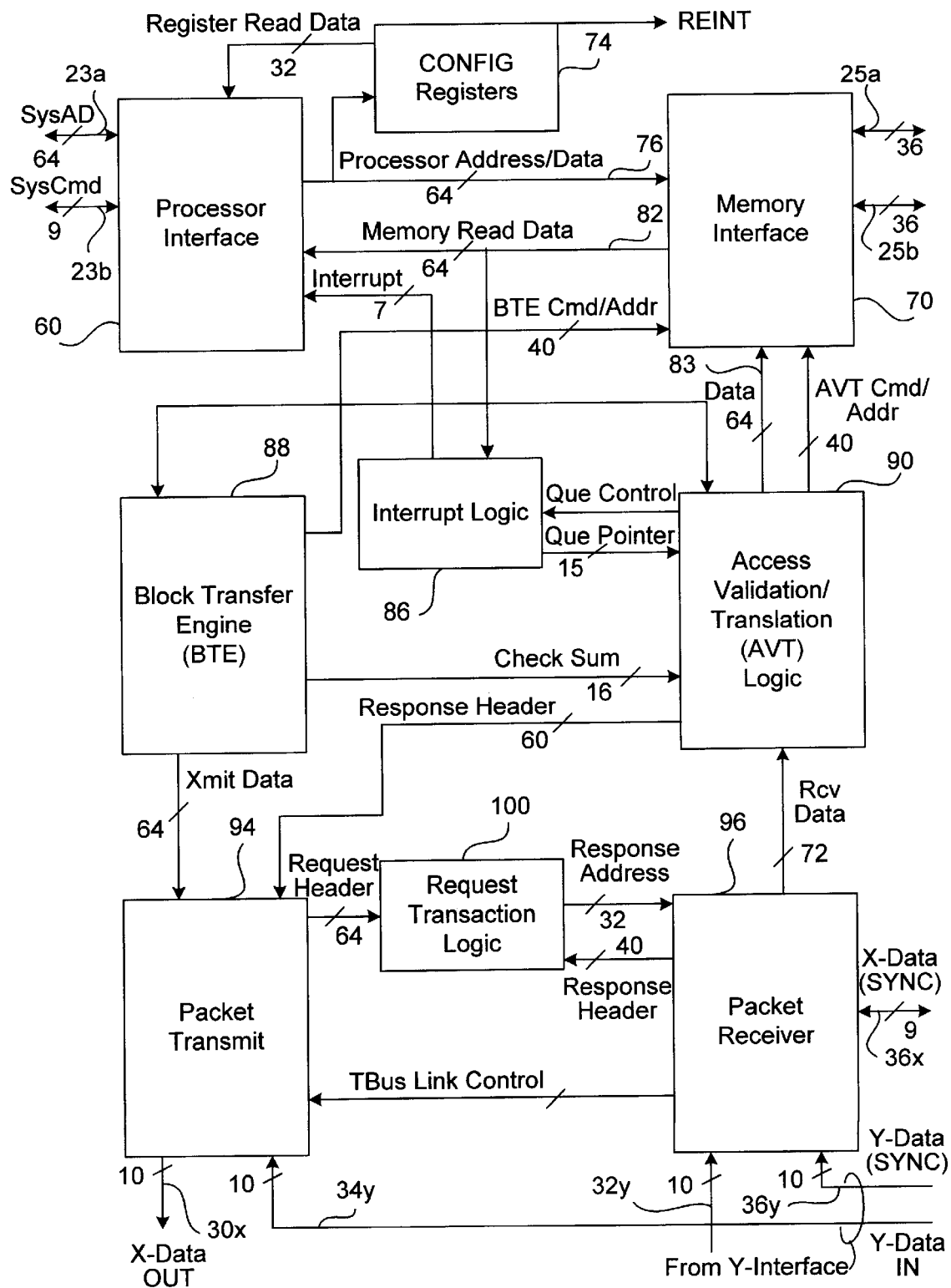
FIG. 5 illustrates the interface unit that forms a part of the CPUs of FIG. 2 to interface the processor and memory with the I/O area network system.

Alternatively, for less robust operating systems and software, the processing system 10 provides a hardware-based fault-tolerance by being configured to operate in a "duplex" mode in which a pair of CPUs (e.g., CPUs 12A, 12B) are coupled together as shown in FIG. 1A, to operate in synchronized, lock-step fashion, executing the same instructions at the substantially the same moment in time. Thus, each CPU operates as a check on the other. In the event one of the CPUs 12 develops a fault, it will "fail-fast" and shut down before the error is permitted to spread and corrupt the rest of the system. The other CPU 12 continues operation to perform the task(s) of the two. Duplex mode operation, then, permits the system hardware to mask the effect of the fault. Data and command symbols are communicated between the various CPUs 12 and I/O packet interfaces 16 by message packets comprising 9-bit data and command symbols. In order to simplify the design of the CPU 12, the processors 20 are precluded from communicating directly with any outside entity (e.g., another CPU 12 or a an I/O device via the I/O packet interface 16). Rather, as will be seen, the processor will construct a data structure in memory and turn over control to the interface units 24. Each interface unit 24 includes a block transfer engine (BTE; FIG. 5) configured to provide a form of direct memory access (DMA) capability for accessing the data structure(s) from memory and for transmitting them via the appropriate X or Y port for communication to the destination according to information contained in the message packet.

The design of the processing system 10 permits a memory 28 of a CPU to be read or written by outside sources (e.g., CPU 12B or an I/O device). For this reason, care must be taken to ensure that external use of a memory 28 of a CPU 12 is authorized. Thus, access to the memory 28 is protected by an access validation mechanism that permits or precludes access by examining such factors as where did the access request come from, the type of access requested, the location of the requested access, and the like. Access validation is implemented by access validation table (AVT) logic that will be described during discussion of FIGS. 11–13, below.

Various aspects of the invention utilize the configuration of the data and command packets that are transmitted between the I/O packet interfaces 16 and CPUs 12 via the routers 14. Accordingly, before continuing with the description of the construction of the processing system 10, it would be of advantage to understand first the configuration of the data and command symbols and packets transmitted on the TNet links L and routed by the routers 14.

Packet Configurations

Four basic message packet types are used to communicate command symbols and data between the CPUs 12 and peripheral devices 17 of a system. FIGS. 3A–3D illustrate the construction of one message packet type (FIG. 3A), together with a break-down of the fields of that packet (FIGS. 3B–3D); FIGS. 4A–4C illustrate the construction of the other three packet types. The message packet type used to communicate write data on the TNet area network is identified as the HADC packet, and is illustrated in FIG. 3A. As shown, the HADC packet has four fields: 8-byte header field, a 4-byte data address field, an N-byte data field (where, preferably, N is a maximum of 64, although it will be evident that larger amounts of data can be moved by a single packet), and a 4-byte cyclic redundancy check (CRC) field.

Figure 21A:
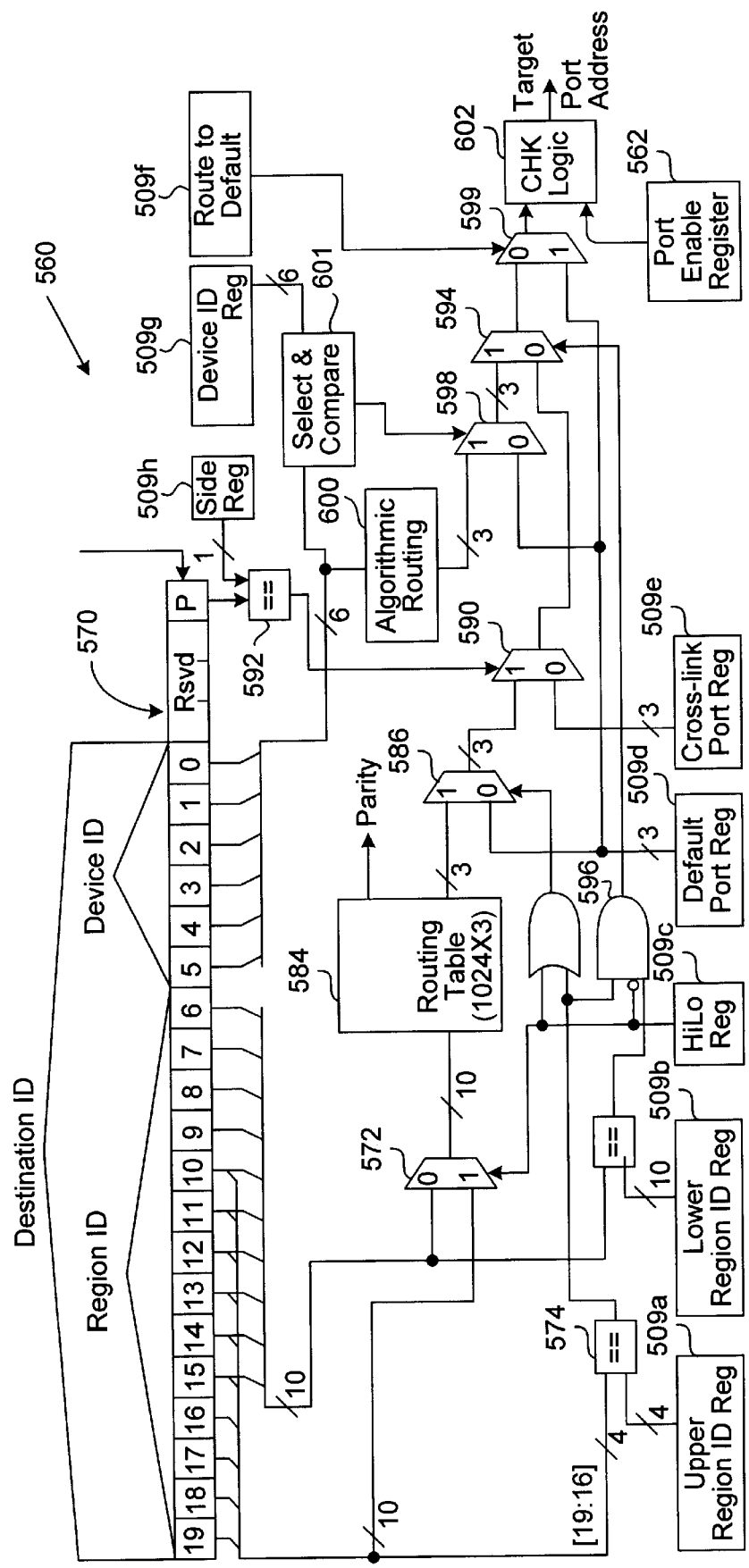
FIG. 21A is a block diagram illustration of the target port selection logic of the input port shown in FIG. 20A.

The header field, illustrated in greater detail in FIG. 3B, includes a 3-byte Destination ID, identifying the ultimate destination of the message packet; a 3-byte Source ID that identifies the source or sender of the message packet and, the type of transaction (e.g., a read or write operation), and the type of message packet (e.g., whether it is a request for data, or a response to a data request). The Destination ID contains four sub-fields: a 14-bit sub-field that contains a Region ID to specify a "region" in which the destination of the message is located; a 6-bit sub-field containing a Device ID, specifying the destination device (e.g., a device 17, a CPU 12, or perhaps an MP18) within the identified region; and a path select (P) bit used to select between two paths; and 3 bits reserved for future expansion. Similarly, the Source ID has three sub-fields; a 14-bit region ID, identifying the region of the sender; a 6-bit Device ID, identifying the sending device within that region; and a 4-bit type sub-field that, as mentioned, identifies the type of transaction. In addition, the control field specifies the amount of data contained in the accompanying data field of the message packet in terms of the number of 9-bit command/data "symbols." (Each symbol is an 8-bit byte of data coded as a 9-bit quantity to protect against single-bit errors that could make a data byte appear as a command symbol, or vice-versa, as will be seen below.) The Region and Device fields of either cumulatively and uniquely identify the destination and source, respectively, of the message packet. The bit reserved as a Path Select bit operates to identify one or the other of two "sides" X or Y (as illustrated in FIG. 1A) containing the destination of the message packet. The Path Select bit will be discussed further below in connection with memory access validation (FIGS. 11 and 12) and the port selection operation of the router (FIG. 21A). The remaining 3 bits are reserved for future expansion as needed.

The 4-byte data Address field is illustrated in greater detail in FIG. 3C. The Address field, in the case of an HADC packet, identifies the virtual location of the destination whereat the accompanying N bytes of data will be written. For example, if the source of the message packet is an I/O device 17, containing data to be written to the memory 28 of a CPU 12, the data address field will contain an address identifying the location in memory 28 at which the data is to be written. (As will be seen, for CPUs the data address is translated by the AVT logic (FIG. 11) to a physical address that is actually used to access the memory 28. I/O packet interfaces 16 have similar validation and translation mechanisms.) When the Address field identifies a memory location of a CPU 12, the field comprises two sub-fields: the 20 most significant bits of the Address field form a 20 bit memory page number; the remaining 12 bits form an offset into the memory page. The page number is used by the AVT logic (FIG. 11) as an index into a table containing entries that contain validation information.

As indicated, the HADC message packet operates to communicate write data between the end units (e.g., CPU 12) of the processing system 10. Other message packets, however, may be differently constructed because of their function and use. Thus, FIG. 4A illustrates an HAC message packet comprising only header, address, and CRC fields. The HAC packet is used to transmit read data requests to a system component (e.g., an I/O device 17).

FIG. 4B illustrates an HDC type of message packet, having an 8-byte header field, an N-byte data field (again, N is up to 64, although it could be any integer number), and a 4-byte CRC field. The HDC message packet is to communicate responses to read requests, which include the return of the data requested.

FIG. 4C illustrates an HC message packet, comprising only an 8-byte header, and a 4-byte CRC. The HC message packet is used to acknowledge a request to write data.

Interface Unit

The X and Y interface units 24 (i.e., 24a and 24b—FIG. 2) operate to perform three major functions within the CPU 12: to interface the processors 20 to the memory 28; to provide an I/O service that operates transparently to, but under the control of, the processors; and to validate requests for access to the memory 28 from outside sources.

Regarding first the interface function, the X and Y interface units 24a, 24b operate to respectively communicate processors 20a, 20b to the memory controllers (Mcs 26a, 26b) and memory 28 for writing and reading data in a manner that includes fail-fast checking of the data read/written. For example, write operations have the two interface units 24a, 24b cooperating to cross-check the data to be written to ensure its integrity (and at the same time, the interface units 24 will operate) to develop an error correcting code (ECC) that covers, as will be seen, not only the data written to the memory 28, but the memory address of the location at which that data is written, so that when later retrieved (read), not only is the proper data retrieved, but it is known to have been retrieved from the appropriate address.

With respect to I/O access, the processors 20 are not provided with the ability to communicate directly with the input/output systems; rather, they must write data structures to the memory 28 and then pass control to the interface units 24 which perform a direct memory access (DMA) operation to retrieve those data structures, and pass them onto the TNet for communication to the desired destination. (The address of the destination will be indicated in the data structure itself.)

The third function of the X and Y interface units 24, access validation to the memory 28, uses an address validation and translation (AVT) table maintained by the interface units. The AVT table contains an address for each system component (e.g., an I/O device 17, or a CPU 12) permitted access, the type of access permitted, and the physical location of memory at which access is permitted. The table also is instrumental in performing address translation, since the addresses contained in the incoming message packets are virtual addresses. These virtual addresses are translated by the interface unit to physical addresses recognizable by the memory control units 26 for accessing the memory 28.

Referring to FIG. 5, illustrated is a simplified block diagram of the X interface unit 24a of the CPU 12A. The companion Y interface unit 24b (as well as the interface units 24 of the CPU 12B, or any other CPU 12) is of substantially identical construction. Accordingly, it will be understood that a description of the interface unit 24a will apply equally to the other interface units 24 of the processing system 10.

As FIG. 5 illustrates, the X interface unit 24a includes a processor interface 60, a memory interface 70, interrupt logic 86, a block transfer engine (BTE) 88, access validation and translation logic 90, a packet transmitter 94, and a packet receiver 96.

Processor Interface

The processor interface 60 handles the information flow (data and commands) between the processor 20a and the X interface unit 24a. A processor bus 23, including a 64 bit address and data bus (SysAD) 23a and a 9 bit command bus 23b, couples the processor 20a and the processor interface 60 to one another. While the SysAD bus 23a carries memory address and data, in conventional time-shared fashion, the command bus 23b carries command and data identifier information (SysCmd), identifying and qualifying commands carried at substantially the same time on the SysAD bus 23a. The processor interface 60 operates to interpret commands issued by the processor unit 20a in order to pass reads/writes to memory or control registers of the processor interface. In addition, the processor interface 60 contains temporary storage (not shown) for buffering addresses and data for access to the memory 28 (via the memory controllers 26). Data and command information read from memory is similarly buffered en route to the processor unit 20a, and made available when the processor unit is ready to accept it. Further, the processor interface 60 will operate to generate the necessary interrupt signalling for the X interface unit 24a.

The processor interface 60 is connected to a memory interface 70 and to configuration registers 74 by a bi-directional 64 bit processor address/data bus 76. The configuration registers 74 are a symbolic representation of the various control registers contained in other components of the X interface unit 24a, and will be discussed when those particular components are discussed. However, although not specifically illustrated in FIG. 5, due to the fact that various of the configuration registers 74 are spread throughout other of the logic that is used to implement the X interface 24a, the processor address/data bus 76 is likewise coupled to read or write to those registers.

Configuration registers 74 are read/write accessible to the processor 20a; they allow the X interface unit to be "personalized." For example; one register identifies the node address of the CPU 12A, which is used to form the source address of message packets originating with the CPU 12A; another, readable only, contains a fixed identification number of the interface unit 24, and still other registers define areas of memory that can be used by, for example, the BTE 88 (whereat data structures and BTE command/control words are located), the interrupt logic 86 (pointing to interrupt queues that contain information about externally generated interrupts received via message packets), or the AVT logic 90. Still other registers are used for interrupt posting by the interrupt logic 86. Many of the registers will be discussed further below when the logic components (e.g., interrupt logic 86, AVT logic 90, etc.) employing them are discussed.

The memory interface 70 couples the X interface unit 24a to the memory controllers 26 (and to the Y interface unit 24b; see FIG. 2) by a bus 25 that includes two 36 bi-directional bit buses 25a, 25b. The memory interface operates to arbitrate between requests for memory access from the processor unit 20, the BTE 88, and the AVT logic 90. In addition to memory accesses from the processor unit 20a, the memory 28 may also be accessed by components of the processing system 10 to, for example, store data requested to be read by the processor unit 20a from an I/O unit 17, or memory 28 may also be accessed for I/O data structures previously set up in memory by the processor unit. Since these accesses are all asynchronous, they must be arbitrated, and the memory interface 70 performs this arbitration.

Data and command information accessed from the memory 28 is coupled from the memory interface to the processor interface 60 by a memory read bus 82, as well as to an interrupt logic 86, block transfer engine (BTE) 88, and access validation and translation (AVT) logic 90. As discussed in more detail below, data is written to the memory is 28 in doubleword quantities. However, while the memory interfaces 70 of both the X and Y interface units 24a and 24b formulate and apply the (64-bit) doubleword to the bus 25, each memory interface 70 is responsible for writing only 32 bits of that 64-bit doubleword quantity; the 32 bits that are not written by the memory interface 70 are coupled to the memory interface by the companion interface unit 24 where they are compared with the same 32 bits for error.

Digressing for the moment, in the system of FIGS. 1A–1C interrupts are transmitted as message packets, rather than using the prior art technique of dedicated signal lines to communicate specific interrupt types. When message packets containing interrupt information are received, that information is conveyed to the interrupt logic 86 for processing and posting for action by the processor 20, along with any interrupts generated internal to the CPU 12A. Internally generated interrupts will set a bit in a register 71 (internal to the interrupt logic 86), indicating the cause of the interrupt. The processor 20 can then read and act upon the interrupt. The interrupt logic is discussed more fully below.

The BTE 88 of the X interface unit 24a operates to perform direct memory accesses, and provides the mechanism that allows the processors 20 to access external resources. The BTE 88 can be set-up by the processors 20 to generate I/O requests, transparent to the processors 20 and notify the processors when the requests are complete. The BTE logic 88 is discussed further below.

Requests for memory access contained in incoming messages packets are verified by the AVT logic 90. Verification of the access request is made according to a variety of permissions, including the identity of the source of the request, the type of access requested. In addition, the AVT logic will translate the memory address (contained in the received message packet as a virtual address) at which access is desired to a physical memory address that can be used to make the actual access when the request is properly verified. The AVT logic 90 is also discussed in greater detail below.

The BTE logic 88 operates in conjunction with the AVT logic 90 to provide the packet transmitter 94 with the data and/or command symbols to be sent. The packet transmitter 94, in turn, assembles the information received from the BTE and AVT logic 88, 90 in message packet form, buffering them until they can be transmitted. In addition, the BTE and AVT logic 88, 90 also operate with the packet receiver 96 to receive, interpret and handle incoming message packets, buffering them as necessary, and converting them to the 8-byte wide format necessary for storing in the memory 28.

Outgoing message packets containing processor originated transaction requests (e.g., a read request asking for a block data from an I/O unit) are monitored by the request transaction logic (RTL) 100. The RTL 100 provides a time-out counter for outbound requests that checks to see if the request is responded to within a predetermined period of time; if not, the RTL will generate an interrupt (handled and reported by the interrupt logic 86) to inform the processor 20 that the request was not honored. In addition, the RTL 100 will validate responses. The RTL 100 holds the address for the response, and forwards this address to the BTE 88 when the response is received so that the response can be placed in memory 28 (by the DMA operation of the BTE 86) at a location known to the processor 20 so that it can locate the response.

Each of the CPUs 12 are checked a number of way, as will be discussed. One such check is an on-going monitor of the operation of the interface units 24a, 24b of each CPU. Since the interface units 24a, 24b operate in lock-step synchronism checking can be performed by monitoring the operating states of the paired interface units 24a, 24b by a continuous comparison of certain of their internal states. This approach is implemented by using one stage of a state machine (not shown) contained in the unit 24a of CPU 12A, and comparing each state assumed by that stage with its identical state machine stage in the interface unit. 24b. All units of the interface units 24 use state machines to control their operations. Preferably, therefore, a state machine of the memory interface 70 that controls the data transfers between the interface unit 24 and the MC 26 is used. Thus, a selected stage of the state machine used in the memory interface 70 of the interface unit 24a is selected. An identical stage of a state machine of one of the interface unit 24b is also selected. The two selected stages are communicated between the interface units 24a, 24b and received by a compare circuit contained in both interface units 24a, 24b. As the interface units operate lock-step with one another, the state machines will likewise march through the same identical states, assuming each state at substantially the same moments in time. If an interface unit encounters an error, or fails, that activity will cause the interface units to diverge, and the state machines will assume different states. The time will come when the selected stage communicated to the compare circuits from the state machines will also differ. This difference will cause the compare circuits to issue a "lost sync" error signal that will bring to the attention of the CPUs 12A (or 12B) that the interface units 24a, 24b of that CPU are no longer in lock-step, and to act accordingly. An example of this technique can be seen in U.S. Pat. No. 4,672,609 to Humphrey, et. al. and assigned to the assignee of this application.

Figure 8:
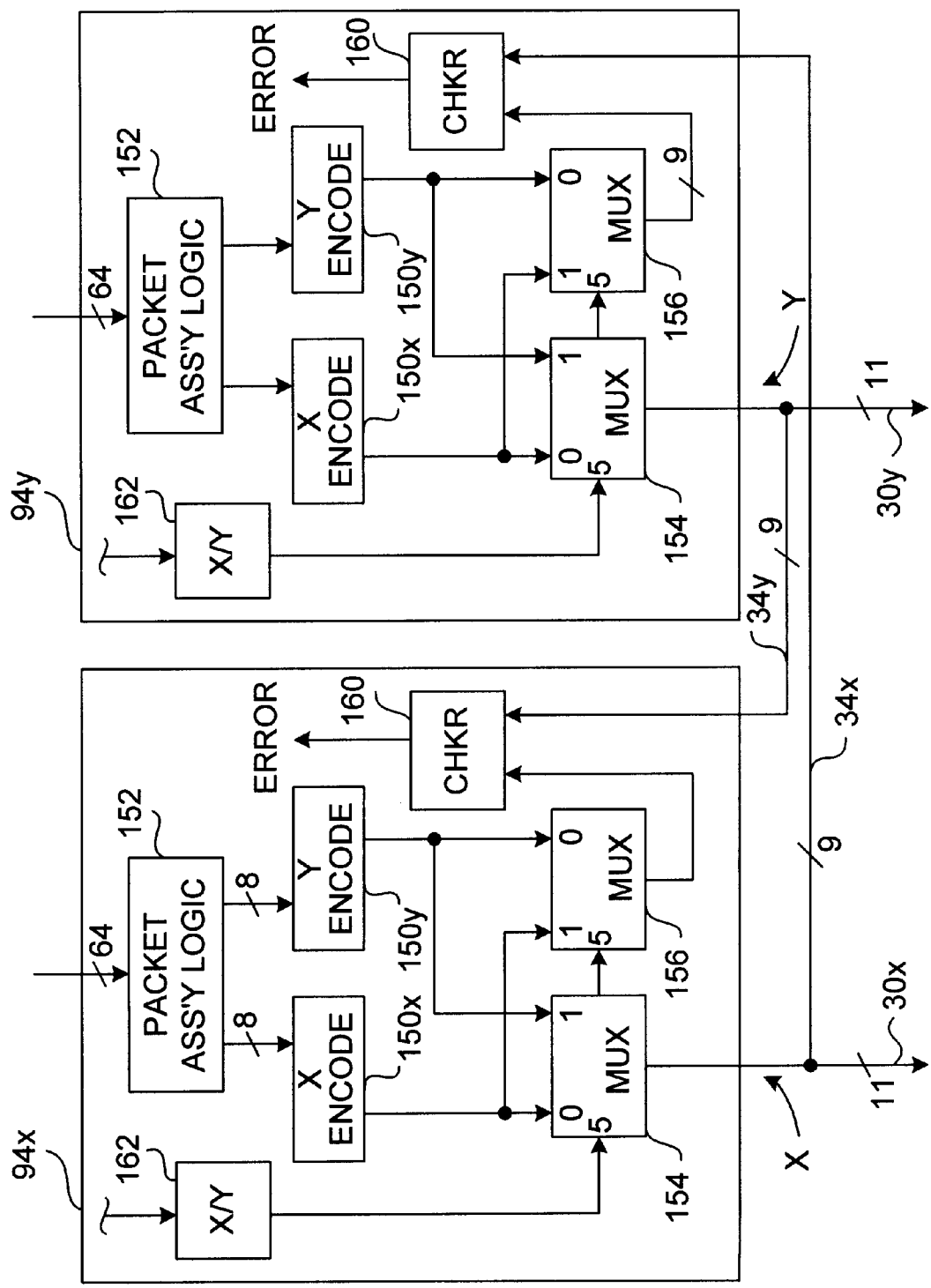
FIG. 8 illustrates the cross-connections for error-checking outbound transmissions from the two interface units of a CPU.

Returning to FIG. 5, the packet receiver 96 of the X interface of CPU 12A functions to service only the X port, receiving only those message packets transmitted by the router 14A of the sub-processor system 10A (FIG. 1A). The Y port is serviced by the Y interface unit 24b to receive message packets from the router 14B of the companion sub-processor system 10B. However, both interfaces (as well as Mcs 26 and processor 20), as has been indicated, are basically mirror images of one another in that both are substantially identical in both structure and function. For this reason, message packet information, received by one interface unit (e.g., 24a) must be passed for processing also to the companion interface unit (e.g., 24b). Further, since both interface units 24a, 24b will assemble the same message packets for transmission from the X or the Y ports, the message packet being transmitted by the interface unit (e.g., 24b) actually being communicated from the associated port (e.g., the Y port) will also be coupled to the other interface unit (e.g., 24a) for cross-checking for errors. These features are illustrated in FIGS. 6 and 8.

Packet Receiver

Figure 6:
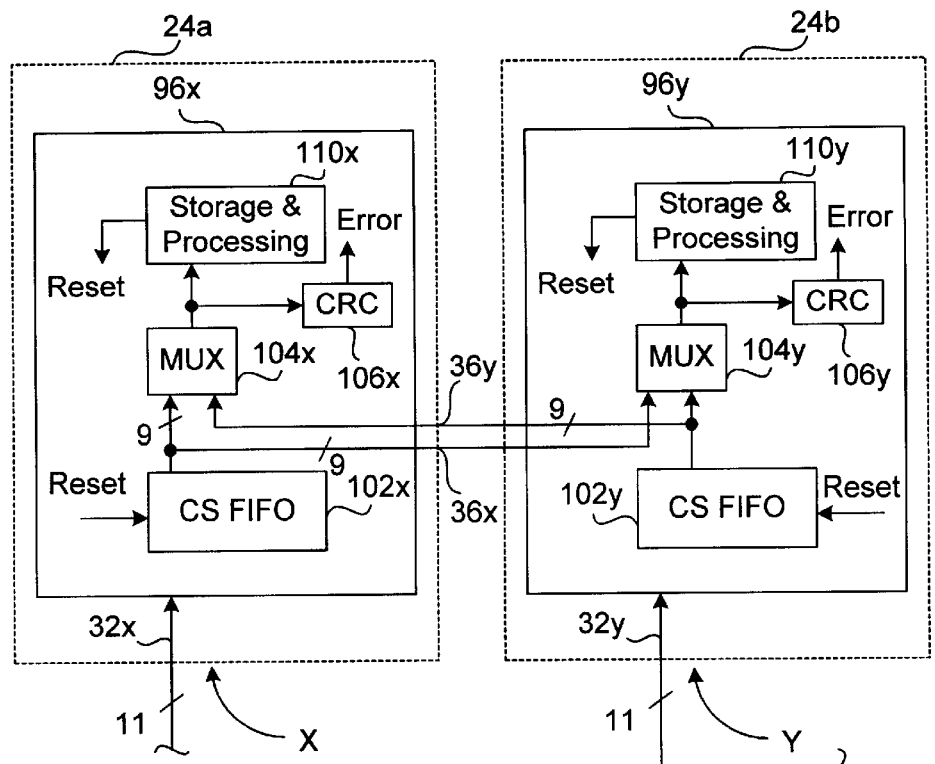
FIG. 6 is a block diagram, illustrating a portion of packet receiver of the interface unit of FIG. 5.

Referring now to FIG. 6, the receiving portions of the packet receivers 96 (96x, 96y) of the X and Y interface units 24a, 24b are broadly illustrated. As shown, each packet receiver 96x, 96y has a clock sync (CS) FIFO 102 coupled to receive a corresponding one of the TNet Links 32. The CS FIFOs 102 operate to synchronize the incoming command/data symbols to the local clock of the packet receiver 96, buffering them, and then passing them on to a multiplexer (MUX) 104. Note, however, that information received at the X port and the packet receiver 96x of the X interface 24a is, in addition to being passed to the MUX 104x, coupled to the MUX 104y of the packet receiver 96y of the Y interface unit 24b by the cross-link connection $36_x$. In similar fashion, information received at the Y port is coupled to the X interface unit 24a by the cross-link connection $36_y$. In this manner, the command/data symbols of information packets received at one of the X, Y ports by the corresponding X, Y, interface unit 24a, 24b is passed to the other so that both will process and communicate the same information on to other components of the interface units 24 and/or memory 28.

Continuing with FIG. 6, depending upon which port X, Y is receiving a message packet, the MUXs 104 will select either the output of one or the other of the CS FIFOs 102x, 102y for communication to the storage and processing logic 110 of the interface unit 24. The information contained in each 9-bit symbol is an 8-bit byte of command or data information, the encoding of which is discussed below with respect to FIG. 9. The storage and processing logic 110 will first translate the 9-bit symbols to 8-bit data or command bytes, and organize the bytes as 64 bit doublewords, passing the doublewords so formed to an input packet buffer (not specifically shown). The input packet buffer temporarily holds the received information until it can be passed to the memory interface 70, as well as to the AVT logic 90 and/or the BTE 88.

The packet receivers 96 each include a CRC checker logic 106 for checking the CRC of the message packet. Note, in particular, that each CRC checker logic 106 is located so that regardless which port (X or Y) receives the message packet, both receivers 96x, 96y will check the CRC of the received message packet. This feature has a fault isolation feature. Even though checked at this receiving stage, A CRC error indication from one receiver but not the other will indicate a problem in the interface between the two receivers, or in the logic of the receiver issuing the error. Thus, the fault can at least initially be isolated to that portion of the path from the output of the receiving CS FIFO.

Not shown is the fact that the outputs of the CS FIFOs 102x, 102y are also coupled to a command decode unit in addition to the MUX 104. The command decode unit operates to recognize command symbols (differentiating them from data symbols in a manner that is described below), decoding them to generate therefrom command signals that are applied to a receiver control unit, a state machine-based element that functions to control packet receiver operations.

Figure 14A:
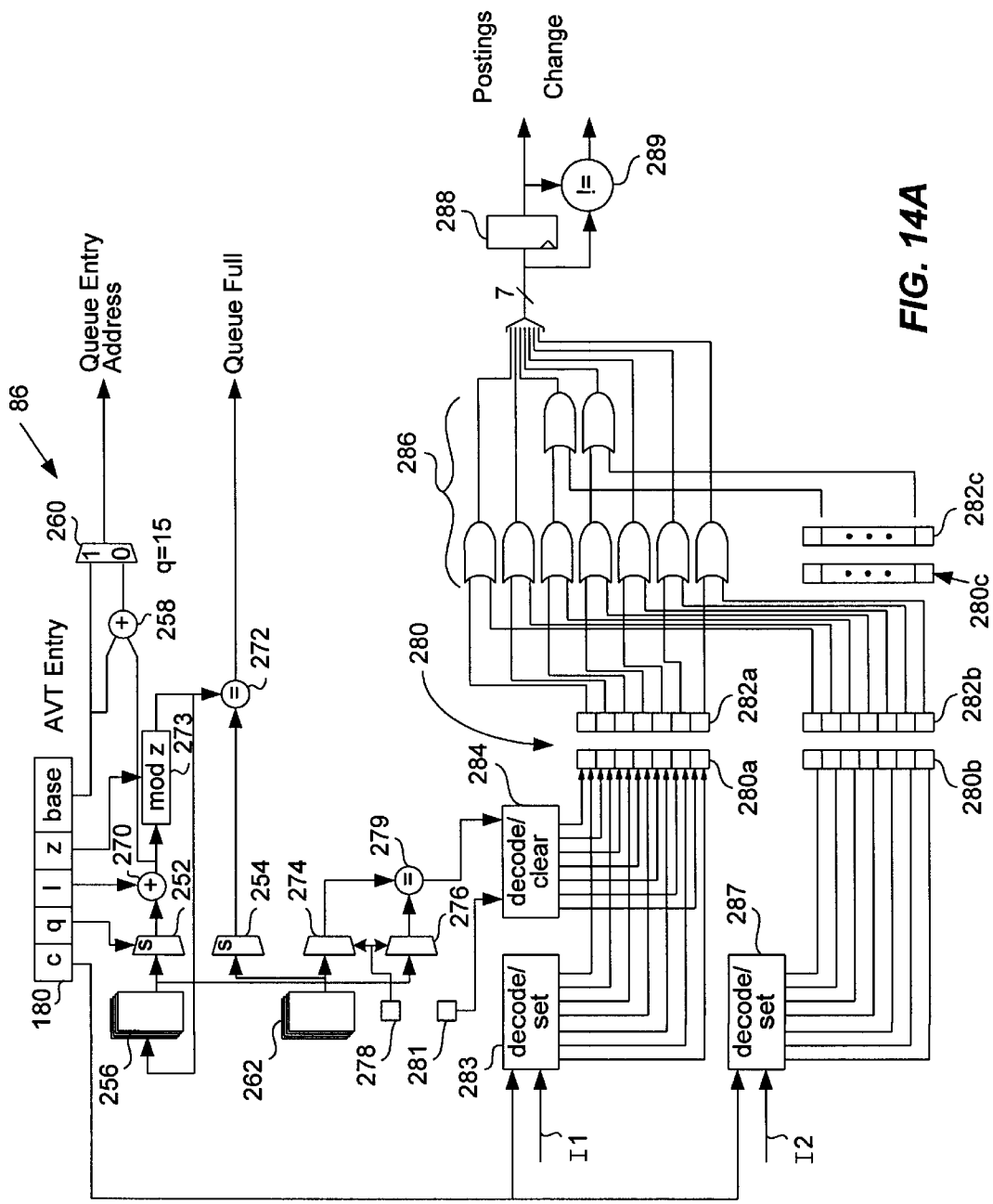
FIG. 14A illustrates the logic for posting interrupt requests to queues in memory and to the processor units of the CPU of FIG. 2.

As indicated above, the packets are error protected by a cyclic redundancy check (CRC) value. Thus, when the CRC information of the received packet appears at the output of the MUX 104, the receiver control portion of the storage control unit enables CRC check logic 106 to calculate a CRC symbol while the data symbols are being received to subsequently compare the generated quantity to the CRC received with the message packet. If there is mismatch, indicating that a possible error has occurred during transmission to the packet receiver 96, CRC check logic 106 will issue an error interrupt signal (BADCRC) that is used to set an interrupt register (interrupt register 280; FIG. 14A) and the packet is discarded. The packet header, however, is saved in an interrupt queue for later examination.

As will be discussed further below, CS FIFOs are found not only in the packet receivers 96 of the interface units 24, but also at each receiving port of the routers 14 and the I/O packet interfaces 16. However, the CS FIFOs used to receive symbols from the TNet links L that connect the CPUs 12A, 12B and the routers 14A, 14B (i.e., ports 1 and 2) are somewhat different from those used on the other ports of routers 14, and any other router 14 not directly connected to a CPU 12. To put it another way, the CS FIFOs used to communicate symbols between elements using frequency locked clocking are different from those used to communicate symbols between elements using near frequency clocking.

The discussion below also will reveal that the CS FIFOs play an important part in transferring information on the TNet links L between elements operating in near-frequency mode (i.e., the clock signals of the transmitting and receiving elements are not necessarily the same, but are expected to be within a predetermined tolerance). But, the CS FIFOs play an even more important part, and perform a unique function, when a pair of sub-processor systems are operating in duplex mode and the two CPUs 12A and 12B of the sub-processor systems 10A, 10B operate in synchronized, lock-step, executing the same instructions at the same time. When operating in this latter mode, it is imperative that information transmitted from any one of the routers 14A or 14E to the CPUs 12A and 12B be received by both CPUs at essentially the same times in order to maintain synchronous, lock-step operation. This, unfortunately, is not an easy task since it is very difficult to ensure that the clocking regime of the routers 14A and 14B are exactly synchronized to those of the CPUs 12A and 12B—even when using frequency locked clocking. In the packet receivers 96 of the CPUs 12 it is the function of the CS FIFOs 102 to accommodate the possible difference between the clock of router 14 used to transmit symbols to a CPU 12 and the clock used by an interface unit 24 to receive those symbols.

Figure 7A:
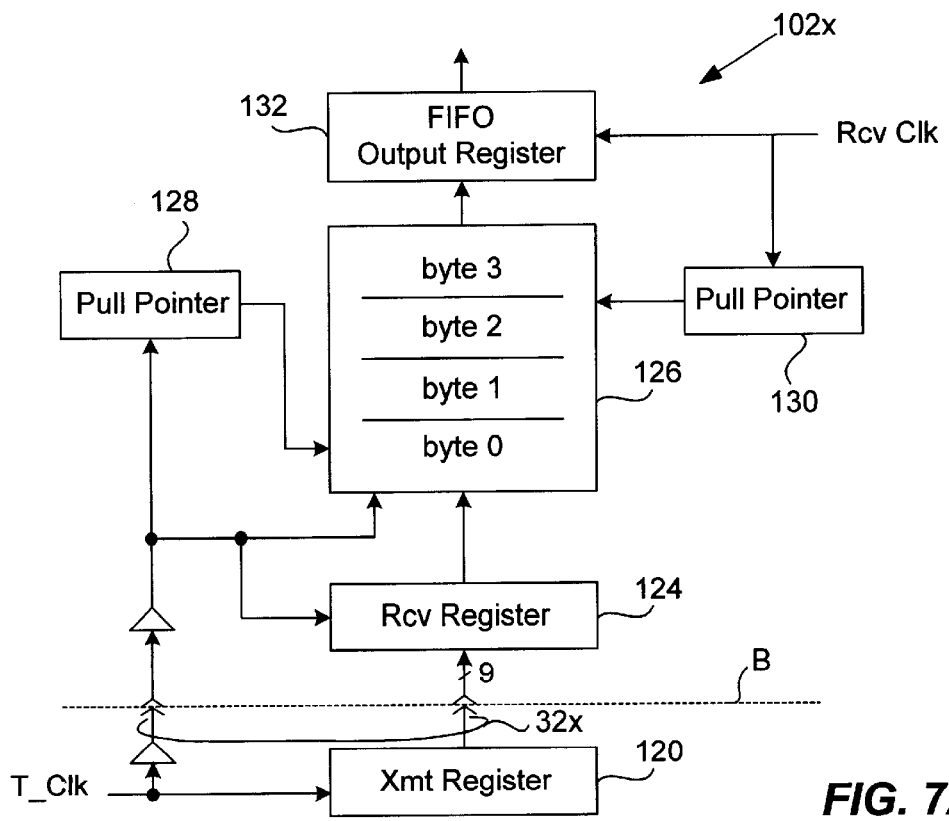
FIG. 7A diagrammatically illustrates the clock synchronization FIFO (CS FIFO) used by the packet receiver section packet receiver shown in FIG. 6.
Figures 7B, 9:
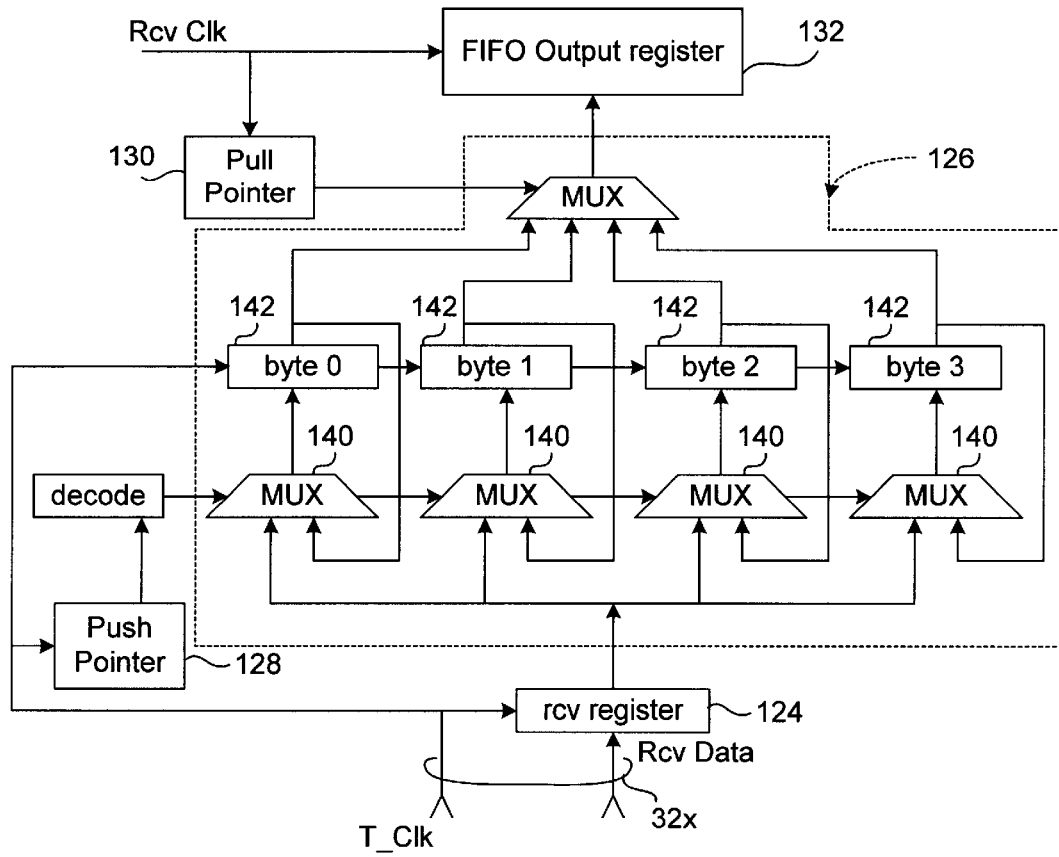
FIG. 7B is an block diagram of a construction of the clock synchronization FIFO structure shown in FIG. 7A.
FIG. 9 illustrates an encoded (8B to 9B) data/command symbol.

The structure of the CS FIFO 102 is diagrammatically illustrated, for discussion purposes, in FIG. 7A; a preferred structure of the CS FIFO is shown in FIG. 7B. Again, it should be understood that when reference is made herein to a CS FIFO, it is intended to refer to a structure having the function and operation that will be described with reference to FIG. 7A, and the structure shown in FIG. 7B, unless otherwise indicated. The discussion of the CS FIFO of FIG. 7A is intended, therefore, to be general in nature, and should be understood as such. Further, as noted above, although certain of the CS FIFOs that are used for frequency locked operation differ from those used in near frequency operation, the following discussion will apply to both. Following that discussion will be a discussion of the modifications that must be made to the general construction of the CS FIFO for operation in a near frequency environment.

Shown in FIG. 7A is the CS FIFO 102x of the packet receiver 96x. The CS FIFO 102y is of substantially identical construction and operation so that the following discussion of CS FIFO 102x will be understood as applying equally to CS FIFO 102y. In FIG. 7A, the CS FIFO 102x is shown coupled by the TNet Link 32$_x$ to receive 9-bit command/data symbols transmitted from a transmit (Xmt) register 120 of router 14A (FIG. 1A) and an accompanying transmit clock (T_Clk) also from the router. (The dotted line B in FIG. 7A symbolizes the clock boundary between the transmitting entity (router 14A) at one end of the corresponding TNet Link 32$_x$ and the receiving entity, packet receiver 96x of CPU 12A. The CS FIFO 102x, therefore, receives the 9-bit symbols at a receive (Rcv) register 124, where they are temporarily held (e.g., for one T_Clk period) before being passed to a storage queue 126. The storage queue 126 is shown as including four locations for ease of illustration and discussion. However, it will be evident to those skilled in this art that additional storage locations can provided, and may in fact be necessary or desirable.

Received symbols are "pushed" onto the CS FIFO 102x (from the Rcv register 124) at locations of the storage queue 126 identified by a push pointer counter 128. Push pointer counter 128 is preferably in the form of a binary counter, clocked by the T_Clk. Received symbols are then sequentially "pulled" from locations of the storage queue 126 identified by a pull pointer counter 130, and passed to a FIFO output register 132. A local clock signal, "Rcv Clk," is used to pull symbols from the storage queue 126 and FIFO output register 130, is produced by an internally-generated (to the CPU 12A) signal. Symbols from the FIFO output register 132 go to the MUX 104x.

According to the protocol used for TNet transmissions, a constant stream of symbols is always being transmitted from all transmitting ports (e.g., the X and Y ports of CPU 12a, any of the transmitting ports of the router 14A or I/O interface 16—FIG. 1A); they may be either actual command/data symbols (i.e., a packet) or IDLE symbols—except during certain situations (e.g., reset, initialization, synchronization and others discussed below). As explained above, each symbol held in the transmit register 120 of the router 14A will be coupled to the Rcv register 124, and stored in the storage queue 126, with the clock signal provided by the router 14A, T_Clk. Conversely, symbols are pulled from the storage queue 126 synchronous with the locally produced clock, Rcv Clk. These are two different clock signals, albeit at substantially the same frequency. However, as long as there is sufficient time (e.g., a couple of clocks) between a symbol entering the CS FIFO 102x and that same symbol being pulled from the CS FIFO, there should be no metastability problems. When the incoming clock signal (T_Clk) and Rcv Clk are operated in frequency locked mode, the CS FIFO 102X should never overflow or underflow.

Initializing the CS FIFO 102X is as follows. At the outset, the router 14A will transmit IDLE symbols for each pulse of the transmit clock signal, T_Clk, ultimately filling the Rcv register 124, the storage queue 126, and the FIFO output register 132 with IDLE symbols, resetting the CS FIFO 102x to an idle condition. The push pointer counter 128 and pull pointer counter 130 will be reset upon receipt (and detection) of a SYNC command symbol. Receipt of the SYNC signal will cause the push pointer counter 128 to be set to point to a specific location of the storage queue 126. At the same time, the pull pointer counter 130 will similarly be set to point at a location of the storage queue 126 spaced from that of the push pointer counter by preferably two storage locations. Thereby, a nominal two-clock delay is established between a symbol entering the storage queue 126 and that same symbol leaving the storage queue, allowing each symbol entering the storage queue 126 to settle before it is clocked out and passed to the storage and processing units 110x (and 110y) by the MUX 104x (and 104y). Since the transmit and receive clocks are phase-independent, a nominal two-clock delay includes an error of plus or minus some predetermined amount so that the allowed reset skew is expected to be less than or equal to one clock.

FIG. 7B illustrates one implementation of the CS FIFO 102x, showing the storage queue 126 as being formed by multiplexer/latch combinations 140, 142, each combination forming a storage location of the storage queue 126. The latches 142 are clocked each pulse of the T_Clk. The push pointer counter 128 is decoded by a decoder 144 to cause one of the multiplexers 140 to select the output of the rcv register 124 to be coupled to its associated latch 142. The latch is loaded with the T_Clk, and the push pointer counter incremented to cause another of the multiplexers 140 to communicate the Rcv register to an associated latch 142. Those latches 142 not selected to receive the output of the rcv register 124 receive and load instead the latch's content with the T_Clk.

At substantially the same time, the pull counter 130 selects the content of one of the latches, via a multiplexer 146, to be transferred to and loaded by the FIFO output register 132—with each Rcv Clk; the pull pointer counter is, at the same time, updated (incremented).

The CS FIFO 102x is structured to implement frequency locked clocking (i.e., T_Clk and Rcv Clk are substantially the same in frequency, but not necessarily phase) which is used only when a pair of CPUs 12 are functioning in duplex mode, and only for transmissions between the routers 14A, 14B and the paired CPUs 12A, 12B (FIG. 1). The other ports of the routers 14 (and I/O interfaces 16) not communicating with CPUs 12 (functioning in duplex mode) operate to transmit symbols with near frequency clocking. Even so, clock synchronization FIFOs are used at these other ports to receive symbols transmitted with near frequency clocking, and the structure of these clock synchronization FIFOs are substantially the same as that used in frequency locked environments, i.e., that of CS FIFOs 102. However, there are differences. For example, the symbol locations of the storage queue 126 are nine bits wide; in near frequency environments, the clock synchronization FIFOs use symbol locations of the queue 126 that are 10 bits wide, the extra bit being a "valid" flag that, depending upon its state, identifies whether the associated symbol is valid or not. This feature is described further in this discussion.

A router 14 may often find itself communicating with devices (e.g., other routers or I/O interfaces 16) in other cabinets which will be running under the aegis of other clock sources that are the same nominal frequency as that of the router 14 to transmit or receive symbols, but have slightly different real frequencies. This is the near frequency situation, and this form of clocking for symbol transfers is seen at all ports of a router 14 except those port which connect directly to a CPU 12 when in duplex mode. In near frequency mode, the clock signals (e.g., the clock used to transmit symbols at one end, and the clock used to receive symbols at the other end) may drift slowly with one eventually gaining a cycle over the other. When this happens, the two pointers (the push and pull pointer counter 128, 130, respectively) of the CS FIFO 102 will either point to one symbol location of the storage queue 126 closer or one symbol location farther apart from one another, depending upon which entity (transmitter or receiver) has the faster clock source. To handle this clock drift, the two pointers are effectively re-synchronized periodically.

When the CPUs 12 are paired and operating in duplex mode, all four interface units 24 operate in lock-step to, among other things, transmit the same data and receive data on the same clock (T_Clk and Rcv Clk), frequency locked clocking is needed and used. When CPUs 12 are operated in simplex mode, each independent of the other, clocking need only be near frequency.

The interface unit 24 receives a SYNC CLK signal that is used in combination with a SYNC command symbol to initialize and synchronize the Rcv register 124 to the transmitting router 14. When using either near frequency or frequency-lock clocking modes for symbol transfers, the CS FIFO 102X preferably begin from some known state. Incoming symbols are examined by the storage and processing units 110 of the packet receivers 96. The storage and processing units look for, and act upon as appropriate, command symbols. Pertinent here is that when the packet receiver 96 receives a SYNC command symbol it will be decoded and detected by the storage and processing unit 110.

Detection of the SYNC command symbol by the storage and processing unit 110 causes assertion of a RESET signal. The RESET signal, under synchronous control of the SYNC CLK signal, is used to reset the input buffers (including the clock synchronization buffers) to predetermined states, and synchronize them to the routers 14.

The synchronization of the CS FIFOs 102 of the interface units 24 those of one or both routers 14A, 14B is discussed more fully below in the section discussing synchronization.

Packet Transmitter

Each interface unit 24 is assigned to transmit from and receive at only one of the X or Y ports of the CPU 12. When one of the interface units 24 transmits, the other operates to check the data being transmitted. This is an important feature of the packet transmitter because it provides a self-checking fault detection and fault containment capability to the CPU 12, even when operating in simplex mode.

This feature is illustrated in FIG. 8, which shows, in abbreviated form, the packet transmitters 94x, 94y of the X and Y interface units 24a, 24b, respectively. Both packet transmitters are identically constructed, so that discussion of one (packet transmitter 94x) will apply equally to the other (packet transmitter 94y) except as otherwise noted.

As FIG. 8 shows, the packet transmitter 94x includes a packet assembly logic 152 that receives, from the BTE 88 or AVT 90 of the associated interface unit (here, the X interface unit 24a) the data to be transmitted—in doubleword (64-bit) format. The packet assembly logic 152 will buffer the information until ready for transmission out of X or Y port of the CPU 12, perform a byte steering operation to translate the data from the doubleword format to byte format, assemble the bytes in packet format, and pass them to one of the X and Y encoders 150x, 150y. Only one of the encoders 150 will receive the bytes, depending upon which port (X or Y) will transmit the resultant message packet.

x or Y encoder 150 that receives the 8-bit bytes operates to encode it in a 9-bit command/data symbol illustrated in FIG. 9. The encoding of the three left-hand bits of the resultant 9-bit symbol is shown in the three left-most columns of Table 1, below.

TABLE 1

| 8B–9B Symbol Encoding | | | |
|---|---|---|---|
| CDC | CDB | CDA | Function |
| 0 | 0 | 0 | Command |
| 0 | 0 | 1 | Error |
| 0 | 1 | 0 | Error |
| 1 | 0 | 0 | Error |
| 0 | 1 | 1 | Data <7:6> = 00 |
| 1 | 0 | 1 | Data <7:6> = 01 |
| 1 | 1 | 0 | Data <7:6> = 10 |
| 1 | 1 | 1 | Data <7:6> = 11 |

As Table 1 illustrates, taken in conjunction with FIG. 9, the high order three bits (CDC, CDB, CDA) of the 9-bit are encoded to indicate whether the remaining, lower-order six bits of the symbol (CD5, CD4, CD3, CD2, CD1, and CD0) should be interpreted as (1) command information or (2) data. Consequently, if the three most significant bits CDC, CDB, and CDA are all zero, the 9-bit symbol is thereby identified as a command symbol, and the remaining six bits form the command. For example a command/data symbol appearing as "000cccccc" would be interpreted as a command, with the "c" bits being the command.

On the other hand, if the three most significant bits CDC, CDB, and CDA, of the command/data symbol take on any of the four values indicative of data, then they are interpreted as two bits of data which should be combined with the remaining six bits of data, obtaining therefrom a byte of data. The remaining six bits are the least significant bits of the data byte. Hence, a command/data symbol appearing as "110001101" would be interpreted a data symbol, and translated to a byte of data appearing as "10001101." It is an error if the most significant three bits take the form of 001, 010, and 100.

The three error codes that separate that data symbols from the command symbols establish a minimum Hamming distance of two between commands and data. No single bit error can change data into a command symbol or vice versa.

Further, the lower order six bits of a command symbol (as opposed to a data symbol) are encoded in the well known "three of x" code in which the six bit positions containing the command will always contain exactly three "ONEs." All unidirectional errors, as well as any odd number of errors in a command symbol will be detected. Errors in the data are detected through packet CRCs as are errors which change command symbols to data. Errors which change data to command symbols are detected by CRC and/or protocol violation errors, as described more fully below.

Which of the X or Y encoders 150 will receive the bytes of information from the packet assembly logic 152 is based upon the destination ID contained in the information to be transmitted, including the path bit (P) designating the path to take. For example, assume that the destination ID of the information suggests that it be sent via the X port of the CPU 12. The packet assembly logic 152 (of the both packet transmitters 94x, 94y) will send that information to the X encoder 150x; at the same time it will sent IDLE symbols to the Y encoder 150y. (Symbols are continually being sent from the X and Y ports: they are either symbols that make up a message packet in the process of being transmitted, or IDLE symbols, or other command symbols used to perform control function.)

The outputs of the X and Y encoders 150 are applied to a multiplexing arrangement, including multiplexers 154, 156. The output of the multiplexer 154 connects to the X port. (The interface unit 24b connects the output of the multiplexer 154 to the Y port.) The multiplexer 156 connects to checker logic 160 which also receives, via the cross-link 34y, the output of the multiplexer 154 that connects to the Y port. Note that the output of the multiplexer 154, which connects to the X port and the TNet Link 30$_x$, is also coupled by the cross-link 34$_x$ to the checker logic 160 of the packet transmitter 94y (of the interface unit 24b ).

A selection (S) input of the muliplexers receives a 1-bit output from an X/Y stage of configuration register 162. The configuration register 162 is accessible to the MP 18 via an OLAP (not shown) formed in the interface unit 24, and is written with information that "personalizes," among other things, the interface units 24 Here, the X/Y stage of the configuration register 162 configures the packet transmitter 94x of the X interface unit 24a to communicate the X encoder 150x output to the X port; the output of the Y encoder 150y is likewise coupled to the checker 160. In similar fashion the X/Y stage of the configuration register 162 of the Y packet transmitter 94y (of the Y interface 24b ) is set to a state that causes multiplexer 154 to select the output of the Y encoder 150y to the Y port; and to select the output of the X encoder 150x to be coupled to the checker 160 of packet transmitter 160 where it is compared with X port transmissions.

Briefly, operation of message packet transmission from the X or the Y port is as follows. First, as has been indicated, when there are no message packet transmissions, both X and Y encoders transmit IDLE symbols or other symbols used to perform control functions. With the X/Y stages of the configuration registers 162 of both packet transmitters 94 set as indicated above (i.e., the X encoder 150x of packet transmitter 94x communicated to the output port (X) by the multiplexer 154; the Y encoder 150y of the packet transmitter 94y communicated to the port (Y) by the multiplexer 154), IDLE symbols from the X encoder 150x (of the packet transmitter 94x) will be transmitted out the X port of the CPU 12A, and IDLE symbols produced by the Y encoder 150y (of the packet transmitter 94y) will be transmitted from the Y port. At the same time, the X port transmissions are coupled by the cross-link 34x to the checker 160 of the packet transmitter 94y, and checked with that produced by the X encoder 150x of that packet transmitter. In the same manner, the IDLE symbols outgoing the Y port are coupled from the packet transmitter 94y to the checker 160 of the packet transmitter 94x where they are checked against what is produced by the Y encoder 150y of the packet transmitter 94x.

This discussion should make evident an important fact: the packet transmitters need not be transmitting message packets in order that they be monitored for correct operation. To the contrary, even when no message packet traffic is present, the operation of the two packet interfaces 94 (and, thereby, the interface units 24 with which they are associated) are continually monitored. Should one of the checkers detect a mis-match between what is applied thereto, an ERROR signal will be asserted, resulting in an internal interrupt being posted for appropriate action by the processors 20.

Message packet traffic operates in the same manner. Assume, for the moment, that the packet assembly logic 152 of the packet transmitters 94 receive information for transmission, and that the destination ID indicates that the X port is to be used. The packet assembly logic will forward that information, a byte at a time, to the X encoder 150x of both interface units 96, which will translate each byte to encoded 9-bit form. The output of the X encoder 150x of the packet transmitter 94x will be communicated by the multiplexer 154 to the X port and to the TNet Link 30x, and to the checker 160 of the packet transmitter 94y. Meanwhile, the output of the X encoder of the packet transmitter 94y is only coupled, by the multiplexer 156, to the checker 160, where it is checked with that from the packet transmitter 94x. Again, the operation of the interface units 24a, 24b, and the packet transmitters they contain, are inspected for error.

In the same fashion, it can now be seen that the Y port message packet transmissions are monitored.

Returning for the moment to FIG. 5, if the outgoing message packet is a processor initiated transaction (e.g., a read request), the processors 20 will expect a message packet to be returned in response. Thus, when the BTE 88 transfers the data to be sent from the memory 28 to the packet transmitter 94, it will set a request timer (not shown) in the request transaction logic 100, causing the request timer to begin marking a timeout period within which a response should be received. If and when a response to the outgoing request is received, a reply match circuit of the packet receiver 96 will determine that the message packet is a response, and reset the request timer. There is only one request timer (not shown) for each number of outstanding requests to a destination. Each time the BTE 88 initiates a transmission of a transaction, the timer is reset.

If, on the other hand, the response is not received within the time allotted, the request timer will issue a timeout signal to the interrupt logic (FIG. 14A) to thereby notify the processors 20 of the absence of a response to a particular transaction (e.g., a read request). If multiple outstanding requests are desired to be managed, additional ones of the request timers—one for each outstanding request—could be used.

Although outside access to the memory 28 of the CPU 12A is provided, it is not without protection. Externally generated requests for access to memory 28 are granted and allowed only if authorized according to certain criteria, including the identification of the source of the request, the type of access requested (e.g., a read or a write), the memory area of the access, to name just a few. Also, the area of memory of the memory unit 28 desired to be accessed are identified in the message packets by virtual or I/O memory address (thereby permitting virtual storage methods to be used). Determination of authorization, and if permitted, access, which requires that these virtual addresses be translated to physical addresses of the memory 28. Finally, interrupts generated by units or elements external to the CPU 12A, are transmitted via message packets to interrupt the processors 20, which are also written to memory 28 when received. All this is handled by the interrupt logic and AVT logic 86, 90.

The AVT logic unit 90 utilizes a table (maintained by the processor 20 in memory 28) containing AVT entries for each possible external source permitted access to the memory 28. Each AVT entry identifies a specific source element or unit and the particular page (a page being nominally 4K (4096) bytes), or portion of a page, of memory to which access is granted that source element or unit. If more than one page is to be accessed by an element external to the CPU 12, there must be an AVT entry for each page desired to be accessed by the element. In addition, each AVT entry contains information as to the type or types of memory operations (e.g., write, read, or both) permitted. The AVT table is not needed, and therefor not used, for "expected" memory accesses. Expected memory accesses are those initiated by the CPU 12 (i.e., processors 20) such as a read request for information from an I/O device. These latter memory accesses are handled by a transaction sequence number (TSN) assigned to each processor initiated request. At about the time the read request is generated, the processors 20 will allocate an area of memory for the data expected to be received in response to the read request. The address for this area is stored in a register file (not shown) maintained by the request transaction logic 100 when the read request is sent, and the pointer into the register file for the address is the TSN.

Thus, the response to the read request will return with the data, and use the TSN that it carries to obtain the address of the buffer area of memory to store the returned data.

Access validation is discussed more fully in the following section.

The memory array 28 is, in effect, divided into two halves that are each managed by the memory controllers 26a, 26b each of which manages one-half of each 64 bit doubleword written to or read from memory 28. Memory controllers 26a, and 26b are, in turn, respectively coupled to the memory interfaces 70 of each interface unit 24a, 24b. The 64-bit doublewords are written to the memory 28 with the upper 32 bits (and associated ECC) being written by the "upper" MC 26a, and the lower 32 bits (and associated ECC) written by the "lower" MC 26b. The Mcs 26a, 26b each receive 32 bits of data and 4 ECC check bits respectively from the memory interfaces 70 (70a, 70b) of each of the interface units 24a, 24b (FIG. 5).

Figure 10:
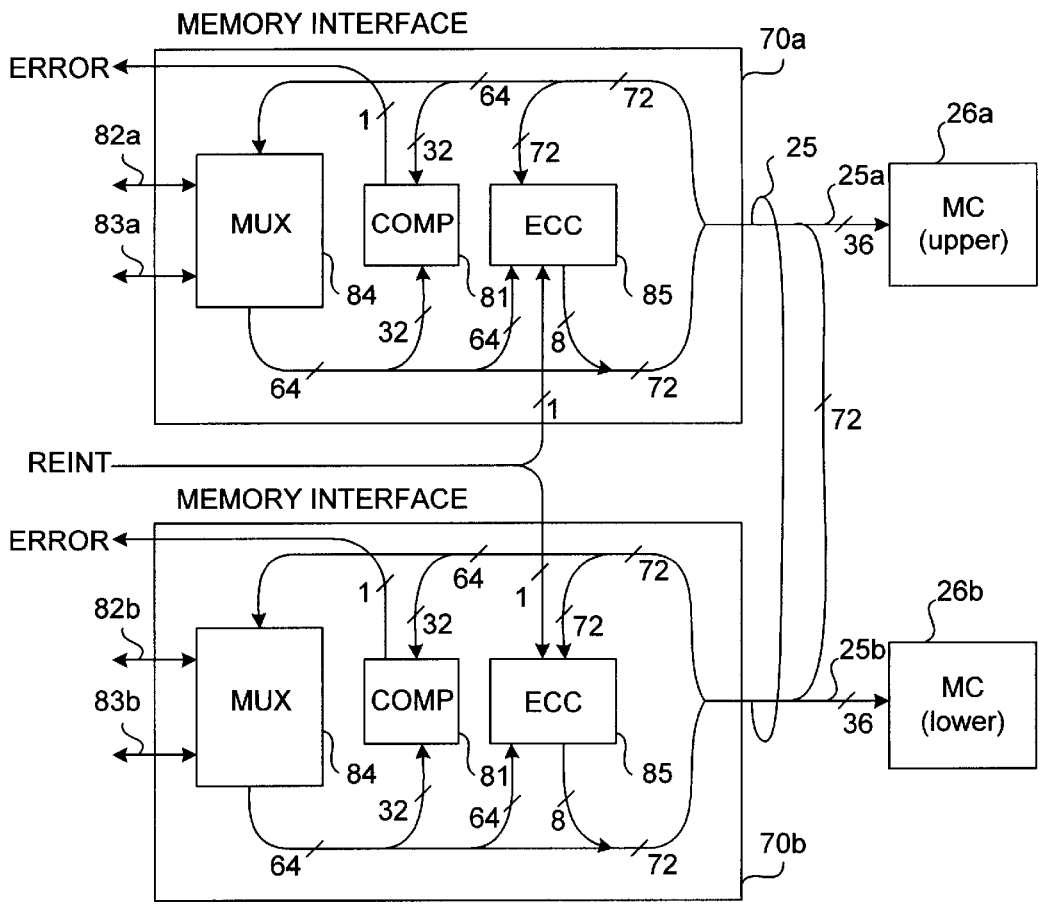
FIG. 10 illustrates the method and structure used by the interface unit of FIG. 5 to cross-check for errors data being transferred to the memory controllers for data error checking.

Referring to FIG. 10, each memory interface 70 receives, from either the bus 82 from the processor interface 60 or the bus 83 from AVT logic 90 (see FIG. 5), of the associated interface unit 24, 64 bits of data to be written to memory. The busses 76 and 83 are applied to a multiplexer (MUX) 84 that selects which is to be coupled to the MCAD bus 25.

Although each memory interface 70a, 70b receives the same, and entire, 64 bits to be written to memory, each transfers only one-half of those 64 bits of data (and four of the eight bits of ECC check bits that each generates) to the Mcs 26a, 26b. The 32 bits (and 4 of the 8 bits of ECC produced by the ECC logic 85) not used to drive the Mcs 26 are coupled from each memory interface 70 to the other for cross-checking between them. Thus, for example, the memory interface 70a (of interface unit 24a) will drive the MC 26a with the "upper" 32 bits of the 64 bits of data only (and 4 bits of an 8-bit ECC check word). At the same time memory interface 70a receives the "lower" 32-bits of data from its companion memory interface 70b, and compares that with its own lower 32 bits by compare logic 81. An ERROR signal is asserted if a mis-compare is detected.

In similar fashion the companion memory interface 70b will be provided with a 64-bit double word to be written to the memory 28, but only the lower 32 bits (and 4 bits of the generated ECC check bits) are used. The memory interface receives the upper 32 bits from the memory interface 70a, and compares them with its own upper 32 bits at the compare logic 81, issuing an ERROR signal if a mis-compare results.

Additional error-checking is performed on read operations by ECC check circuits 85 of each memory interface 70. Each 64-bit doubleword returned from the MC 26 is received by both memory interfaces 70, together with eight ECC check bits. The data and ECC check bits are applied to the ECC logic 85 of each memory interface 70, developing a syndrome for checking the integrity of the data in conventional fashion. If a single-bit error is detected, the ECC logic 85 will effect correction; if an uncorrectable error is detected, the ECC logic will issue an error signal (not shown) that will result in setting a state of the interrupt register 280 (FIG. 18), and cause operations to freeze.

The particular ECC check implemented by the ECC logic 85 of each memory interface uses 8 check bits for SEC-DED-SbED across up to a 112-bit field. The code is an odd column weight code, meaning that any single error will produce an odd number of syndrome bits. Of the 112 possible bits, 64 are data and 8 are check bits, leaving 40 bits unused.

Access Validation

As previously indicated, components of the processing system 10 external to the CPU 12A (e.g., devices of the I/O packet interfaces 16, or CPU 12B) can directly access the memory 28, but not without qualification. Access validation, as implemented by the AVT logic 90 of the interface units 24, operates to prevent the content of the memory 28 from being corrupted by erroneously or inadvertently writing over good data with other data that should not be written to those memory locations. Similarly, access validation also provides protection against an access that may inadvertently read the wrong memory locations, thereby supplying erroneous data to the entity or system element requesting the data being read. For these and similar reasons an access validation method is provided to ensure that a memory access is being properly made, i.e., that the proper device is writing to, or reading from, the appropriate memory locations. If an incoming memory request (i.e., a read or write) is validated, the address of the memory location, as carried by the address field of the message packet carrying the request, is translated by the AVT logic to a memory address.

Accesses to the memory 28 are validated by the AVT logic 90 of each interface unit 24 (FIG. 5), using all of six checks: (1) that the CRC of the message packet carrying the request is error free, (2) that the destination (e.g., CPU 12A) identified in the message packet is that of the receiver, (3) that the source of the request as identified in the message packet is a correct source, (4) that the type of access sought is permitted for the source requesting access, (5) that access to the location of memory 28 whereat access is sought is permitted for the source, and (6) that the transfer size of the access is within predetermined bounds. The first check is made at the packet receiver 96 by the CRC logic checker 106, as discussed above. If the received message packet is found to have a bad CRC (or it is tagged with a "This Packet Bad" (TPB) command symbol, see below) the packet is discarded, and access is denied.

The Destination ID contained in the message packet header is compared against the destination ID assigned the receiving element to ensure that the packet's destination is correct (i.e., if received by a CPU, that the proper CPU 12 is designated as the destination). A mismatch indicates that the packet has somehow been misdirected, and the packet is again discarded, and, of course, access again denied.

The remaining checks are made by keeping, in memory 28, an access validation (AVT) entry (FIG. 13A) for each system element granted at least some form of access to the memory of the element whose memory is being accessed. The Address field of the incoming packet is used as a pointer to the memory location containing the AVT entry for the system element identified in the Source ID. The AVT logic uses the validation information of the AVT entry to determine what access is permitted the identified source of the message packet.

Thus, the source ID field of the received message packet is used to determine if the creator of the packet is permitted access to the memory 28 of the CPU 12. This check involves comparing the Source ID field of the packet header to a portion of a AVT entry (Source ID) to determine whether the particular source should be granted access to the particular receiver's facilities.

The type field of the packet, identifying the type of access being sought (e.g., a read or write of memory), is checked to determine if the type of access being sought is permitted the source identified by the message packet, or if the packet is an unsolicited response (which is deleted as an error).

Finally, the memory location sought, and the size of any transfer, are checked to see if they also are permitted the particular message packet source.

Figure 11:
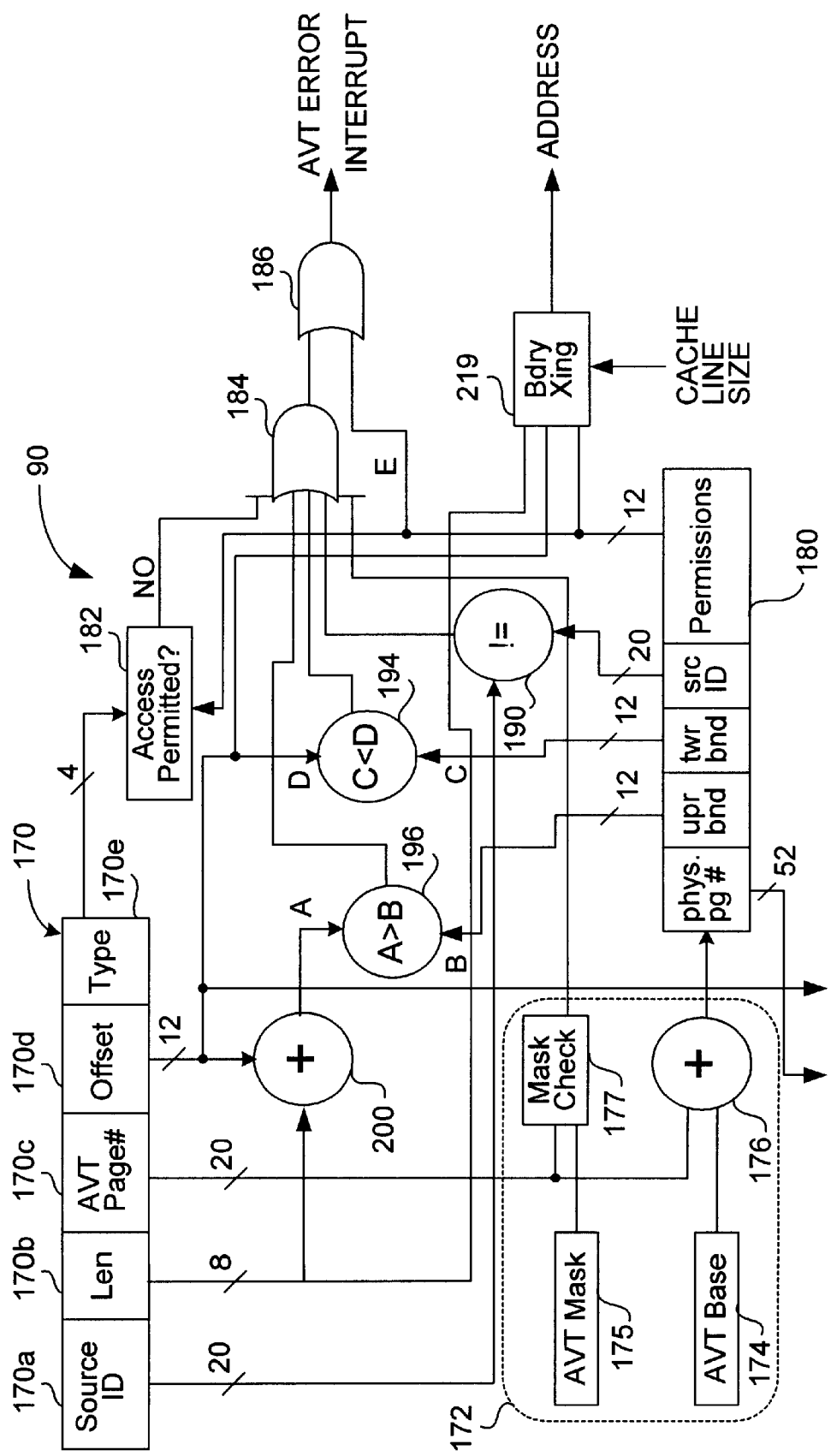
FIG. 11 is a block diagram representation of the implementation of the access validation and translation (AVT) table used to screen and grant read and/or write access to memory of a CPU of FIG. 2 to other (external to the CPU) components of the processing system.

The access validation mechanism of the interface unit 24a, AVT logic 88, is shown in greater detail in FIG. 11. Incoming message packets seeking access to the memory space of the CPU 12 will have selected portions of their headers transferred from the packet receiver 96 (FIG. 5) to an AVT input register 170 of the AVT logic 90. The AVT input register 170 will receive from the incoming message packet, therefore, the Source ID, the length (Len) field, identifying the amount of data to be written to or read from memory 28, the 20-bit portion of the Address field (FIGS. 3A and 3C) that identifies an AVT entry an address (AVT Page #), pointing to the entry in memory 28 containing the AVT table entry, the offset 12-bit into the memory page to which the AVT entry points, and the type of access sought (Type). These values are respectively contained in register segments 170a, 170b, . . . , 170e of the AVT input register 170.

The AVT page number field contained in the AVT input register segment 170c is coupled to AVT address logic 172 where it is combined with the content of an AVT base register 174 by combinational logic 176 to produce the address of the AVT entry needed for validation. The AVT base register 174 contains the starting address in memory of the entire AVT table. Using the address developed, the AVT address logic 172 will access memory 28 for that AVT entry, which is then loaded into the AVT entry register 180.

The AVT address logic 172 also contains an AVT mask register 175 for detecting AVT page number addresses that do not fall within the address range assigned to the AVT table. The rules are such that if any bit position of the AVT mask register 175 is a 0, the corresponding bit of the AVT page number address must also be 0; if not, the mask check logic 177 will detect a mask error and operate to deny access to memory 28. The AVT entry address generation and mask operation are better illustrated in FIG. 12.

Figure 12:
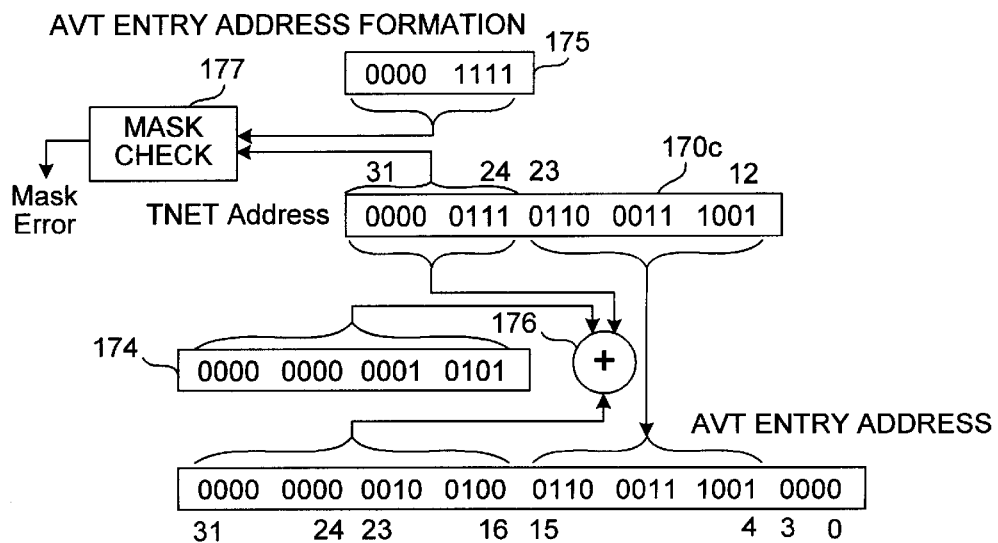
FIG. 12 is a block diagram that diagrammatically illustrates the formation of an address used to access an AVT table entry.

As FIG. 12 diagrammatically illustrates, the high-order 8 bit portion of the 20-bit AVT page number value in register segment 170c is summed with the content of the AVT base register 174 to produce the high-order portion (bits 16–31) of the AVT table entry address. At the same time, the remaining (lower order) 12 bits of the from the register segment 170c form directly a portion of the AVT entry address. Since AVT entries are quadword quantities, they are located on quadword boundaries; hence, the low order 4 bits of the AVT entry address will always be zero, as shown.

FIG. 12 also illustrates the mask operation. The high order two bytes of the AVT page number address are compared to the mask contained in the mask register 175. If a bit position of the mask register containing a 0 detects a corresponding bit position of the high order two bytes with a "1," the mask register will assert a "Mask Error" signal that will deny access to the memory 28, and generate and post an interrupt to the interrupt logic 86 (FIG. 5) for action by the processor 20.

The mask operation permits the size of the table of AVT entries to be varied. The content of the AVT mask register 175 is accessible to the processor 20, permitting the processors 20 to optionally select the size of the AVT entry table. A maximum AVT table size allows verification (and translation) of any 32 bit TNet address; that is, a maximum size AVT entry table can verify and translate 220 different page addresses. A minimum size AVT table allows verification and translation of any 24 bit TNet address (i.e., those TNet addresses whose high order 8 bits are zero). A minimum AVT table can verify and translate $2^{12}$ different page addresses.

Therefore, since an AVT table entry is 16 bytes, a maximum size AVT table will require 16 megabytes of dedicated memory space. However, the mask operation performed by the content of the AVT mask register 175 and AVT address logic 172 allows the AVT size to be matched to the needs of the system. A processing system 10 that includes a larger number of external elements (e.g., the number of I/O devices in the system is large) will need a wide range of TNet addresses, and corresponding AVT entries, and must dedicate a larger amount of the memory space of memory 28 to the AVT entries. Conversely, a smaller processing system 10, with a smaller number of external elements will not have such a large TNet address requirement so that a smaller AVT table can be used, conserving memory space. In a smaller system, therefore, the higher order bits are not (or, more accurately, should not) be used.

When a smaller AVT table is in order, the high order bits of the TNet address should be ZERO; any attempt to seek an AVT table entry with a TNet address that is out of the range for the particular system is an error. It is the function of the mask logic, using the content of the mask register 175, to detect such errors. Thus, the allowable size of the AVT table extent at the time for any the CPU 12 (or any other system element using this validation technique) is indicated by the content of the mask register 175 by bit positions being set to a logic "ONE." Bit positions of the mask register 175 that are set to a logic "ZERO" indicate an nonexistent TNet address, outside the limits of the processing system 10. A received packet with a TNet address outside the allowable TNet range will have bit positions set to a logic ONE where they should be ZERO. The AVT address logic 172 will detect this out-of-range TNet address, and cause an AVT error interrupt to issue.

It will now be evident to those skilled in this art that in addition to being able to vary the size of the AVT table needed to be maintained in the memory 28, as discussed above, the technique illustrated in FIG. 12 also allows the AVT table to be located in the memory 28 with some flexibility. FIG. 12 shows the AVT table can be located on a power of $2^{17}$ (128K) boundary.

Each AVT entry is a 128-bit quadword that includes those fields illustrated in FIG. 11 as being held in the AVT entry register 180 during the validation process. AVT entries have two basic formats: normal and interrupt. The format of a normal AVT entry is illustrated in FIG. 13A (and, to an extent, in FIG. 11, by showing the content of the AVT entry register 180); the interrupt format is illustrated in FIG. 13C. Before continuing with a discussion of the AVT logic 90, an understanding of the meaning and content of an AVT entry may be of help.

Turning then to FIG. 13A, the normal AVT entry is shown as including a 52-bit Physical Page Number field. The content of this field identifies the physical address of the page of memory 28 within which access will be permitted the requesting source of the message packet. (Typically, each memory page comprises 4K (4096) byte memory locations.) The content of the Physical Page Number field will be concatenated with the content of the 12-bit Offset field 170d held in the AVT input register 170 (drawn from the address field of the message packet seeking validation). The result is the entire physical address of the location within the memory 28 at which data will be written or read—if validation is permitted.

While access may be granted to all memory locations of a particular 4K page, access may also be limited to only portions of that page. For implementing the latter limitations the AVT entry includes two 12-bit fields (Upper Bound, Lower Bound; FIG. 13A) that define the upper and lower bounds within the identified page of memory 28 to which access will be permitted. In particular, the Lower Bound field of the AVT entry specifies the offset with the memory page of the byte with the lowest value to which this AVT table entry applies. The Upper bound field specifies the offset within the memory page of the byte with the highest address to which the AVT entry applies. Attempts to access memory locations which pass this value (e.g., the offset value 170d plus the content of the Len field 170b of the AVT input register 170) will result in an error being posted to the processor via an interrupt.

A 12-bit "Permissions" field is included in t AVT entry to specify the permissions granted to the requesting source corresponding to AVT entry. The Permissions field is illustrated in FIG. 13B, wherein the certain the Permissions sub-fields (E, PEX, PEY, I, C, W, R, and B) identify the following qualifications to memory access:

E: (Error Enable) Erroneous accesses directed through this AVT entry are reported (to the interrupt logic) only if this field is set to one of two particular states (e.g., a "ONE").

PEX: (Path enable X) The state of this 1-bit field is set to a "ONE" to enable message packets received with the "path" bit in the header equal to zero to use this AVT entry (if all other applicable permissions are also met). If this bit is set to a "ZERO," access will be denied message packets to which the AVT entry applies received over the "x path" (path=0). Denials are logged as interrupts with the interrupt logic, and reported to the processor 20—if the E field is set to a state ("ONE") that enables error-reporting.

PEY: (Path Enable Y) This 1-bit field operates in the same manner as the PEX field, except that it applies to message packets received with the path bit set to one.

I: (Interrupt) If this bit is set (e.g., to a "ONE"), the other fields (Upper Bound, etc.) gain new definitions for processing interrupt writes and managing interrupt queues. This is discussed in more detail below in connection with the description of the interrupt logic 86.

C: (Cache Coherency) This is a two bit field, encoded to specify how write requests to the memory 28 will be handled. Set to one state, the requested write operation will be processed normally; set to a second state, write requests specifying addresses with a fractional cache line included at the upper or lower bound of the AVT entry mapped area of memory are written to the cache coherency queue maintained by an interrupt handler 250 (FIG. 14A), described below. This allows the CPU 12 to manage write transfers into a user data structure or buffer area in the memory 28 which does not have full cache line alignment set to a third state, all write requests accessing this AVT entry are written to the cache coherency queue. Set to the fourth state, the physical memory locations referenced by this AVT entry are accessed using hardware coherency mechanisms.

W: (Write Access) The state of this 1-bit field grants or denies write access to memory to the requesting source—within memory area identified by the Lower and Upper Bound fields.

R: (Read Access) The state of this 1-bit field determines whether the requesting source has access to memory for read operations—within the specified memory area.

B: (Barrier Access) The state of this 1-bit field determines whether the requesting source has access to memory for barrier operations (discussed below)—within the specified memory area.

Finally, a 20-bit "Source ID" field of the AVT entry identifies the particular source to which the permission information of the AVT entry applies.

Returning now to the AVT logic illustrated in FIG. 11, once the address of the AVT entry has been formed, the entry is accessed and temporarily stored in the AVT table entry register 180. The content of the Permissions field, as contained in the AVT entry register 180, is compared with the type of access being requested, as specified by the Type field held in the AVT entry register by access logic 184. If the access requested does not match that permitted, access is denied, and the access logic 184 will assert error signal ("No") to cause an AVT Error Interrupt signal to be generated via the error generation logic comprising OR gate 184 and AND gate 186. Access will be denied if the type of access sought is not one of the Permissions.

The Source ID field of the accessed AVT entry (identified as the "src ID" value in the AVT entry register 180), specifies the source that corresponds to the AVT entry being used, and is compared to the Source ID contained in the requesting message packet by compare logic 190. Again, a mis-match will result in the compare logic 190 causing an AVT Error Interrupt to be generated, and access denial.

At the same time, the Lower Bound field of the AVT entry (represented in FIG. 11 as "lwr bnd" in the AVT entry register 180) is applied to compare logic 194 where it is compared to the Offset value in the AVT input register segment 170d. If the Offset value is less than that contained in the Lower Bound field of the AVT entry, indicating that access is outside the authorized page portion, the comparator 194 will initiate a signal that, via the OR gate 184 and AND gate 186, generates an AVT Error Interrupt, and deny access to the memory 28.

Similarly, compare logic 196 will compare the Upper Bound field ("upr bnd" in AVT entry register 180) with the sum of the Len field (i.e., the number of data bytes to be written) and the Offset—from adder logic 200—to determine if the amount of data to be written (if a write operation is requested) will exceed the amount of memory space allocated the requesting source (as defined by the Lower and Upper Bound fields of the entry).

If an access request is validated, the Physical Page Number (phys pg #) content of the AVT entry register 180 is used, together with the Offset from the AVT input register 170, as explained above in connection with FIG. 12, to address the memory location whereat the access will take place.

The communication of message packets between elements of the system 10 (e.g., a device 17 and a CPU 12; FIG. 1) is also employed in a novel way that, among other things, distributes interrupts to request activity, or to inform of an activity, or to notify the occurrence of errors. Thus, interrupt message delivery uses the TNet network system in the same manner as other inter-element communication, and involves a three stage progression: (1) creation and dispatch of the interrupt message packet from a source element; (2) propagation of the interrupt message packet through the TNet network to its destination; and, (3) interpretation and "posting" for action at the destination. Any system element may be the recipient of an interrupt message packet. If the destination is a CPU, the interrupt message packet is, in effect, a normal "write" request in which the Destination ID field of the message packet header (FIG. 3B) identifies the CPU, and the Address field selects the AVT entry (Interrupt Descriptor) containing the instructions on how the interrupt message packet is to be handled.

Authorization to initiate interrupt activity must also be validated by the AVT logic 88. Thus, a received message packet containing an interrupt will also have data that explains the interrupt. That interrupt data is to be written to a specific queue (interrupt queue) in memory 28, with signalling provided the processors 20 to indicate that an interrupt has been received and "posted," and ready for servicing by the processors 20. Since the interrupt queues are at specific memory locations, the processor can obtain the interrupt data when needed.

An AVT interrupt entry for an interrupt may be one of two types: a multi-entry queued interrupt, or a single-entry queued interrupt. The format for both types of AVT interrupt entries are basically same, and that format is illustrated in FIG. 13C.

An AVT interrupt entry for a multi-entry queued interrupt is used for received message packets that were either constructed originally to deliver an interrupt, or became an interrupt en route due to some exception detected by a router 14, or the receiving CPU (e.g., bad CRC). These entries are used by the AVT logic 90 to validate the message packet in much the same way as described above, and by the interrupt logic 86 (FIGS. 5 and 14A) to identify a circular queue in memory 28 at which the header, and accompanying data, of the interrupt message packet will be stored. In addition, the interrupt logic 86 will set a bit in an interrupt or "cause" register 280 (FIG. 14A; to be discussed more fully below) to signal receipt and/or creation of a multi-entry interrupt.

An AVT interrupt entry for a single-entry queued interrupt works in substantially the same way, except that the interrupt data structure to which the AVT interrupt entry directs the message packet information for storage is a fixed (though modifiable) location in memory 28.

Both AVT interrupt entry types (multi-entry and single entry interrupts) have the quad-word (128 bits) format illustrated in FIG. 13C. A 64-bit segment ("Queue Base Addr") of the AVT interrupt entry is used as a pointer to the location in memory 28 of the interrupt queue at which interrupt data will be written. The interrupt queue is structured in the form of a FIFO so that interrupt data is received and inserted at the tail of the FIFO queue by the interrupt logic 86, and extracted from the head of the queue by the processor 20 when servicing the interrupt.

The AVT interrupt entry also includes a 20-bit segment ("Source ID") containing source ID information, identifying the external unit seeking attention by the interrupt process. If the source ID information of the AVT interrupt entry does not match that contained in the header of the incoming message packet (Source ID; FIG. 3B), as determined by the comparison performed by the comparator 190 (FIG. 11), access to the interrupt queue is denied, and an AVT error interrupt is generated.

A 12-bit "Permissions" segment of the AVT interrupt entry contains the same permissions information as described above in connection with normal AVT entries. Typically, however, the message packet delivering an interrupt will be structured as a write request, seeking to write the interrupt data it carries to memory 28, i.e., the interrupt queue as described below. Thus, a proper AVT interrupt entry will have the Write Access bit (W) set to allow the interrupt data to be written to the interrupt queue set up in memory 28. The interrupt bit (I) of the Permissions field, when set, identifies the AVT interrupt entry as one for validating and handling an interrupt message packet.

Finally, four, one-byte segments ("c," "q," "l," and "z") of the AVT interrupt entry respectively identify (1) the "class" of the interrupt that is used to determine the interrupt level set in the processor 20 (described more fully below); (2) a queue number that is used to select, as will be seen, a register whose content indicates where in the particular queue (identified by the Queue Base Address field) the interrupt data is to be written; (3) the size or amount of storage available at each queue location in terms of the number of doublewords that can be stored thereat; and (4) the number of bits in a queue tail counter used to identify where in the queue the data will be written. The Queue Base Addr, and c, q, l, and z segments are used by the interrupt logic 86 to point to the location in memory 28. The interrupt logic 86 includes four "tail" counters each of which point to one of four queues at which interrupt data can be inserted. The particular one of the four counters is selected by the content of the q segment of the AVT interrupt entry. The other end of the queue, the point from which interrupt entries are withdrawn, is identified by one of four "head" counters. The size (in terms of the number of bits) of the head n/and tail counters is specified by the z sub-field, negatively biased by 9, as specified in Table 2, below. The queue tail counter size is used to determine when the tail pointer will wrap back to a value of zero. The number of words (bytes) divided by the size of each entry gives the number of queue entries. The shortest queue might have only 32 entries (4 kB queue divided by 128 byte entries), requires 4 kB while the longest queue could have as many as 32,768 entries (512 kB divided by 16 bytes per entry).

TABLE 2

| z | Interpretation |
|---|---|
| 0 | 512 Doublewords (4K Bytes) |
| 1 | 1K Doublewords (8K Bytes) |
| 2 | 2K Doublewords (16K Bytes) |
| 3 | 4K Doublewords (32K Bytes) |
| 4 | 8K Doublewords (64K Bytes) |
| 5 | 16K Doublewords (128K Bytes) |
| 6 | 32K Doublewords (256K Bytes) |
| 7 | 64K Doublewords (512K Bytes) |
| 8–15 | Not used. |

The size of each interrupt entry in the interrupt queue is specified by the by 1 field, in quadwords, in the manner illustrated in Table 3, below.

TABLE 3

| 1 | Interpretation |
|---|---|
| 0 | 1 Quadword (16 bytes) |
| 1 | 2 Quadwords (32 bytes) |
| 2 | 4 Quadwords (64 bytes) |
| 3 | 8 Quadwords (128 bytes) |
| 4–15 | Not used (reserved). |

Interrupt Handling

As has been indicated above, a novel feature of the present invention is the capability to use the TNet network message delivery capability to deliver interrupts to a CPU 12 for servicing. For example, an I/O unit may be unable to complete a read or write transaction issued by a CPU because of a number of reasons such as an improper address in the message packet that delivered the transaction, or receipt of the message packet with a CRC error, or noting that the received message packet had a destination address that did not identify the recipient. These and other errors, exceptions, and irregularities, noted by the I/O units, or the I/O Interface elements, can become the a condition that requires the intervention of a CPU. In prior systems such conditions are the subject matter of interrupts; and so they are here, except that such interrupts are not delivered, as has been in the past—with little or no information about the interrupting condition, and by a signal wire exclusively reserved for such purposes—but through the message system available to the I/O elements of the system. This feature not only reduces the need for extra signal lines (allowing what signal line space is available for other uses), but provides a facility that can provide much more information as to what caused the interrupt so that the CPU does not have to take the time to conduct an investigation.

According to this feature, an incoming message packet, containing an interrupt dispatch to be written to the memory 28, is first passed to the AVT logic 90 (FIG. 11) for validation. The AVT logic 90 will also determine whether the message packet is a regular I/O write request, an interrupt, or possibly an errant access to memory 28 that is prohibited. The content of the AVT base register 174 of the AVT logic 90 is used with the page number field 170c (FIG. 11) contained in the AVT input register 170 to generate a pointer for the AVT interrupt entry in main memory in the same manner as described above for normal message packets (e.g., seeking access to memory 28 for reading or writing data). The AVT entry so identified by the address formed is accessed from memory 28 and set in the AVT entry register 180 for use by the interrupt logic 86 of the interface unit 24 (FIG. 5), illustrated in greater detail in FIG. 14A.

It is interrupt logic 86 that is responsible for handling the interrupt information, once the message packet carrying that interrupt information is cleared by the AVT logic 90. The interrupt logic 86 is shown in FIG. 14A, as including a multiplexer (MUX) 252 that receives, and selects between, the contents of four queue tail registers 256. Similarly, a MUX 254 receives, and selects between, the content of four queue head registers 262. The selection input (s) of each MUX 252, 254 is coupled to receive the content of the "q" segment of the retrieved AVT entry (corresponding to the interrupt message packet) held in the AVT entry register 180. It is the q value that is used to select which one from each group of queue registers 256, 262 to use.

There can be any number of queues set up in memory to handle storage of interrupt data, although the number herein is limited to four for reasons explained below. The location within memory 28 of each such queue is specified by the queue base address value of the accessed AVT entry, and held in the entry register 180 ("phys pg #" in FIG. 11; "base" in FIG. 14A). The contents of four queue tail registers 256 each form an offset into the particular queue then specified by queue base address value. The content of the selected queue tail register 256 is combined with the queue base address by the adder 258, forming the entry point into the designated queue at which the interrupt data will be written. The four queue head and tail registers 262, 256 limit the interrupt logic 86 to handling only four queues, although it should be evident to those skilled in this art that more or fewer queues can be maintained.

The registers 256 specify the location of the "tail" of particular queues, pointing to the queue entry at which the next received interrupt data will be placed. The four queue head registers 262 specify the other end of the particular queue.

The address developed from the combination of the queue base address and the content of the selected tail queue register 256 is preferably formed to align on quadword (sixteen-byte) boundaries. This is accomplished by forcing the low-order four bits of the queue entry address to 0.

The formation of the queue entry address is diagrammatically illustrated in FIG. 14B, showing the high order seven bits of the 15 bit content of the selected tail register 256 is added to the bit positions 12–31 of the queue base address field contained in the AVT entry register 180; the result of this summation forms the high order 20 bits (bit positions 12–31) of the queue entry address. The low-order 8 bit content of the selected tail register 256 is used directly as the low-order bit positions 4–11 of the queue entry address. As discussed above, the low-order four bits (bit positions 0–3) of the queue entry address is forced to all zeros for the desired alignment.

Summarizing, message packets containing interrupt are initially handled in the same manner as other message packets in that since they are, in effect, requests for writing data to the memory 28 of the receiving CPU 12, that request must be validated by the AVT logic 90. Thus, information from the message packet is set in the AVT input register 170 and portions (fields 170c and 170d) used to locate and access from memory 28 an AVT entry. The AVT entry will be, if the message packet contained the proper information for interrupt handling, an interrupt AVT entry that is set in the AVT entry register 180 and used to verify (authenticate) the interrupt, and then, using the interrupt logic 86, store the interrupt data at the one of four circular queues specified by the base address information contained in the AVT entry. The processor(s) 20 will then be notified, and it will be up to them as to whether, and how, the interrupt will be handled.

Having stored the interrupt message packet data to the queue, the addressing must be updated in anticipation of receipt of the next message packet's interrupt data. After interrupt data is written to the selected queue, the content of the "1" field contained in the AVT table entry register 180 is combined with the selected tail queue register 256 by combiner circuit 270, the output of which is the processed by the 'mod z" circuit 273 to turn new offset into the queue at which the interrupt data of the next interrupt message packet will be stored. That new offset value is returned to the selected tail queue register 256. At the same time, the output of the combiner circuit 270 is applied to a compare circuit 272. The interrupt queries are structure to be circular in fashion with a module size of z. The mod z circuit produces an output that maintains the circularity. Since the tail queue pointer identifies the next entry point in the queue, and the head pointer identified, relative to the corresponding tail pointer, how much room is left in the queue, if these two values are equal, the queue is full. Thus, it is the compare circuit 272 that makes this determination by comparing the head pointer (supplied by the head queue register 262 selected) with the tail pointer created as a result of the last entry. If the head and tail points for the queue are now equal, the compare circuit 272 will issue a "Queue Full" warning signal which, itself, is an interrupt signal. The Queue Full warning signal becomes an "intrinsic" interrupt that is conveyed to the processor units as a warning that if the matter is not promptly handled, later-received interrupt data may be lost, because if the queue should fill, additional interrupt messages will be discarded.

Incoming message packet interrupts will cause interrupts to be posted to the processor 20 by first setting one of a number of bit positions of an interrupt register 280. Multi-entry queued interrupts are set in interrupt registers 280a for posting to the processor 20; single-entry queue interrupts use interrupt register 280b. Which bit is set depends upon the class field (c) of the AVT entry held in the AVT input register 180.

Respecting first multi-entry queued interrupts, soon after a multi-entry queued interrupt is determined, the interface unit will assert a corresponding interrupt signal (I1) that is applied to decode circuit 283. Decode circuit 283 receives and decodes the class (c) value from the AVT entry register 180 to determine which of the register positions of register 280a to set, thereby providing advance information concerning the received interrupt to the processor(s) 20, i.e., (1) the type of interrupt posted, and (2) the class of that interrupt.

Similarly, single-entry queue interrupts, when received, will cause a corresponding interrupt signal (I2) to be asserted and applied to decode logic 287, which also receives and decodes the class (c) value to determine which bit portion of register 280b to set.

The tail and head queue registers 256, 262 are also coupled to another pair of multiplexers (MUXs) 276, 274. The content of an update register 278 selects which corresponding pair of register 256, 262 will be compared to one another by a compare circuit 279. The update register is writable by the processor 20 to select a register pair for comparison. If the content of the two selected registers 256, 262 are found to be equal, indicating the corresponding queue is empty, the corresponding interrupt registers will be cleared. The class register 281 selects the interrupt bit (by class) of the interrupt register 280a that needs to be cleared.

Digressing for the moment, there are two basic types of interrupts that concern the processors 20: those interrupts that are communicated to the CPU 12 by message packets, and those that are generated by the CPU 12 itself, termed "intrinsic" interrupts. Intrinsic interrupts result from internally detected errors, such as the queue full warning signal generated by the compare circuit 272 of the interrupt logic 86. However, they may also include exceptions noted when receiving message packets not originally sent as interrupt packets. Such message packet interrupts include errors resulting from a finding that a message packet has been detected as having a bad command symbol, or the received message packet has a bad CRC (or is tagged with the TPB identifier, discussed below). These intrinsic interrupts cause particular bit positions of an intrinsic register 280c whereat intrinsic interrupts are posted to be set in the same manner as multi-entry and single entry interrupts are posted: by setting bit positions of the interrupt registers 180a, 180b. In addition, the AVT table maintained in memory 28 has the first number of entries reserved for intrinsic AVT interrupts. When an intrinsic interrupt signal is generated to set the intrinsic interrupt register 180c, it will also cause the AVT entry corresponding to the exception that caused the interrupt to be accessed and to be loaded into the AVT entry register 180 of the AVT logic 90. From thereon, the interrupt is handled in the same manner as message packet transmitted interrupts.

Associated with the each of the interrupt registers 280a, 280b, and 280c, on a bit-by-bit basis, are corresponding mask registers 282a, 282b, and 282c, respectively. Each bit position of the interrupt registers 280 (e.g., 280a) has a corresponding bit position in the mask register 282 (e.g., 282a). When the particular bit of the mask register 282 is set, recognition of the associated interrupt is inhibited.

The content of the interrupt registers 280, if passed by the content of the mask registers 282, are coupled to combinational logic 286, comprising a plurality of OR gates, where they are combined into seven interrupt "postings" (signals). The combinational logic 286 couples the seven interrupt postings to a latch 288, from which they are coupled to the processor 20 (20a, and 20b) which has an interrupt register for receiving holding the postings.

In addition, the content of the register 288 is applied to a compare circuit 289, and compared (before each clock that loads the register 288) to the input of the register 288. If there is a difference, indicating a change in interrupts (either an interrupt has been serviced, and its posting deleted by the processor 20, or a new interrupt has been posted), a "CHANGE" signal will be issued to the processor interface 60 to inform it that an interrupt posting change has occurred, and that it should communicate the change to the processor 20.

Preferably, the AVT entry register 180 is configured to operate like a single line cache, complete with a TAG and valid bit. The TAG would consist of the portion of the TNet address used to look up the AVT entry from the system memory 28. In normal operation, if the TAG doe snot match the TNet address of an incoming packet, the correct AVT entry is read from system memory 28 and read into the AVT entry register 206, replacing the old AVT entry. Those skilled in this art will recognize that other cache organizations are possible such as set-associative, fully-associate, or direct-mapped, to name a few.

Coherency

Data processing systems that use cache memory have long recognized the problem of coherency: making sure that an access to cache or main memory never returns stale data, or overwrite good (up-to-date) data. There are numerous solutions to this problem, many of which make use of extensive and complex hardware. The coherency problem also arises when data is written to memory from external (to the CPU) I/O or another CPU 12, as in the context of the system 10 (e.g., FIG. 2), data is written to the memory 28 of the CPU 12A by the CPU 12B. One solution is to ensure that incoming data is written to memory buffers such that the bounds of the buffer are aligned with cache block boundaries. This solution, however, finds application only when used with software schemes to invalidate cache blocks used for incoming data, and forcing write-back of cache blocks used for out-going data.

Thus, there exist traditional techniques for software management of coherency problems suitable for incoming read requests (from I/O, or another CPU 12), and outgoing read and write requests. However, the traditional techniques do not lend themselves to managing incoming write requests to an I/O buffer in memory 28 that is not aligned on cache block boundaries.

However, requiring alignment of the I/O buffers in memory on cache block boundaries results in a less flexible system, and a system that can be incompatible with existing (operating system) software. Therefore, the interrupt mechanism of the present invention is used to establish coherency in a manner that allows data buffers to be located in memory without concern as to whether or not the boundary of that buffer is aligned with the cache block boundaries.

In this connection, the field in the AVT table Entry register 180 (FIG. 11) defining the upper and lower boundaries (upr bnd, lwr bnd) of the area of memory 28 to which the source of the incoming packet is permitted access are applied to a boundary crossing (Bdry Xing) check unit 219. Boundary check unit 219 also receives an indication of the size of the cache block the CPU 12 is configured to operate with, the coherency bits ("c[1:0]") from the Permissions field of the AVT entry held in the AVT Entry register 180, and the Len field of the header information from the AVT input register 170. The Bdry Xing unit determines if the data of the incoming packet is not aligned on a cache boundary, and if the coherency bits ("c[1:0]") are set appropriately, will force the fetch of an address of an interrupt entry that will be used to point to the special coherency queue for storing the data and the header of the packet containing that data.

Figures 28, 29:
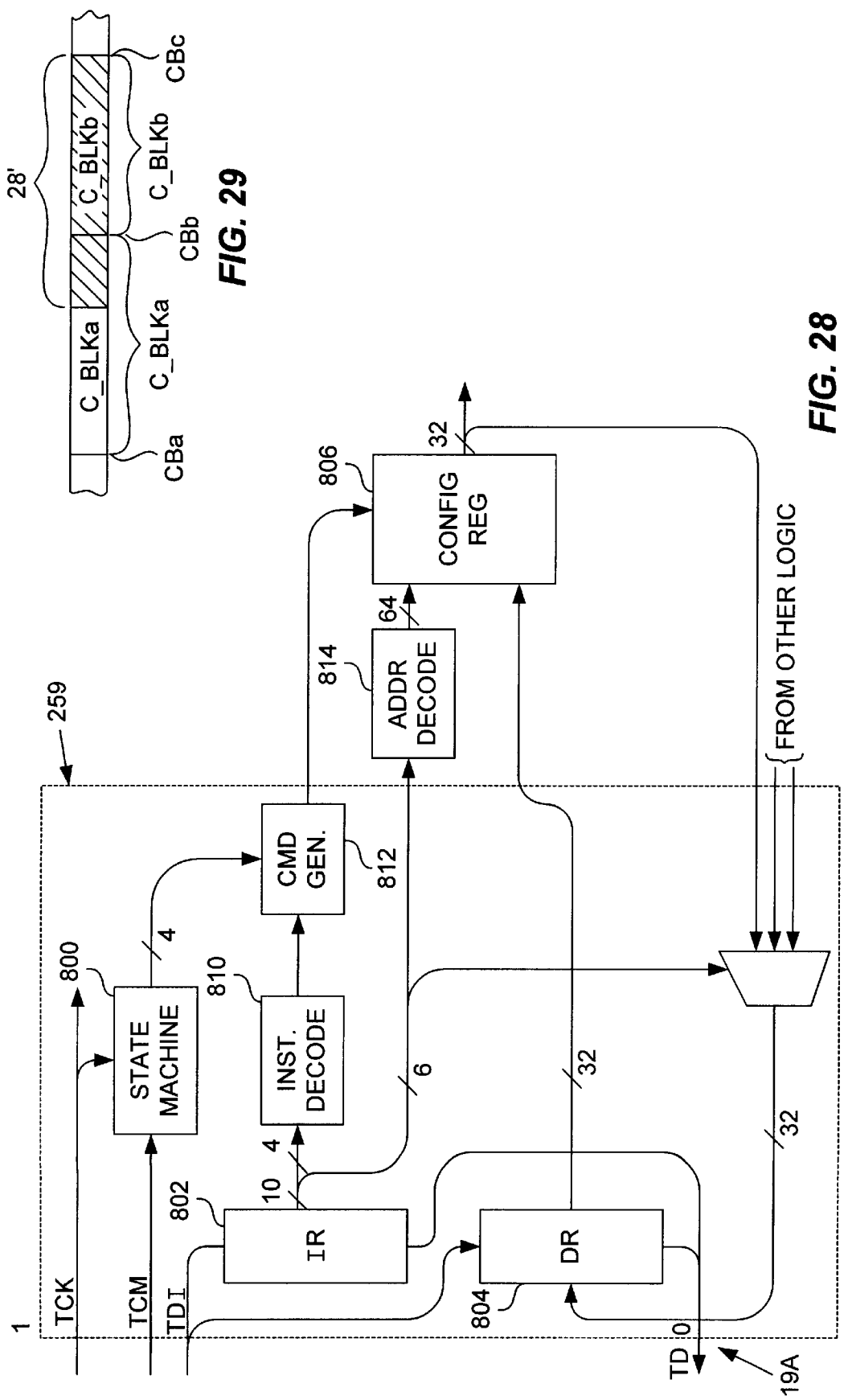
FIG. 28 illustrates the structure of the on-line access port (OLAP) used to provide access to the maintenance processor (MP) to the various elements of the system of FIG. 1A (or those of FIGS. 1B or 1C) for configuring the elements.
FIG. 29 illustrates a portion of system memory, showing cache block boundaries.

Referring for the moment to FIG. 29, there is illustrated a portion 28' of the memory space implemented by the memory 28 (FIG. 2) of a CPU 12. As FIG. 29 further illustrates, three cache boundaries $CB_a$, $CB_b$, and $CB_c$ are contained with the memory portion 28', defining two cache blocks $C\_BLK_a$ and $C\_BLK_b$. Assume that a write request message packet is received (e.g., from another CPU 12, or an I/O device), and that the data contained in that message packet, indicated by the cross-hatching, is to be written to an area of memory 28 that includes the memory portion 28'. In fact, the data that will be written will only partially write over the cache block $C\_BLK_a$, but will completely write over the cache block $C\_BLK_b$, and other cache blocks. If the cache 22 of the CPU 12 being written contains the cache block $C\_BLK_b$, or any other cache block other than cache block $C\_BLK_a$ (or the cache block containing the other end of the incoming data, if not aligned on a cache boundary), the block can be marked as "invalid," preventing it from being written back into memory and over the newly received data.

However, if the cache 22 contains the cache block $C\_BLK_a$, the boundary crossing logic 219 (if enabled by the "c" being set in the Permissions field; see FIGS. 11 and 13B) of the AVT 90 (FIG. 11) needs to detect the I/O packet partially invalidating the cache entry, and force a coherency interrupt. This results in the fetch of an interrupt descriptor, containing a pointer to a special interrupt queue, and the entire incoming TNet request packet will be written to the queue. At the same time an interrupt will be written to the queued interrupt register 280, to alert the processors 20 that a portion of the incoming data is located in the special queue.

In short, if an incoming packet has data that is to be written to memory 28, the boundary crossing logic 219 checks to see if the boundaries of the buffer at which the data will be written are aligned with the cache boundaries. If so, the data will be written as directed. If not, the packet (both header and data) is written to a special queue, and the processors so notified by the intrinsic interrupt process described above. The processors may then move the data from the special queue to cache 22, and later write the cache to memory 28 to ensure that good data is not over-written or otherwise lost, and that coherency between the cache 22 and the memory 28 is preserved.

Block Transfer Engine (BTE)

Since the processor 20 is inhibited from directly communicating (i.e., sending) information to elements external to the CPU 12A, the BTE 88 of the interface 24a (FIG. 5) of the CPU is provided for an indirect method of information transmission.

Figure 15:
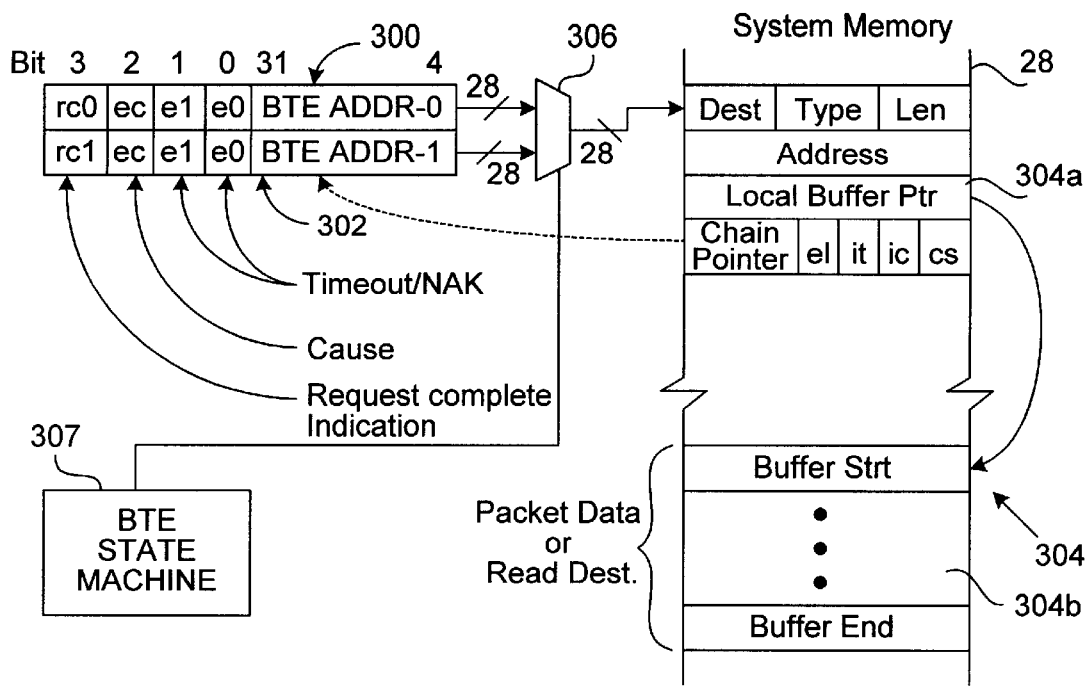
FIG. 15 is a block diagram that illustrates the data output constructs formed in the memory of the CPU of FIG. 2 by a processor unit, and containing data to be sent via the area I/O networks shown in FIGS. 1A–1C, and also illustrating the block transfer engine (BTE) unit of the interface unit of FIG. 5 that operates to access the data output constructs for transmission to the area I/O network through the packet transmitter section of FIG. 7.

The BTE 88 is the mechanism used to implement all processor initiated I/O traffic to transfer blocks of information. The BTE 88 allows creation of read and write packets with lengths up to the maximum allowed by the TNet packet definition, currently 64 bytes. The BTE 88 provides two "virtual" channels, one of which is given a higher priority than the other. Referring to FIG. 15, the BTE 88 is illustrated as including two BTE registers 300, 302 whose content is coupled to the MUX 306 (of the interface unit 24a; FIG. 5) and used to access the system memory 28 via the memory controllers 26 (not shown in FIG. 15). A portion of the registers 300, 302, contain pointers (i.e., BTE address-0 and BTE address-1) to the beginning of a BTE data structure 304 in the memory 28 of the CPU 12A (FIG. 2). The processors 20 will write a data structure 304 to the memory 28 each time information is to be sent to or retrieved from one or another of the elements external to the CPU 12A (e.g., CPU 12B or any of the I/O devices 17, 18 of the I/O packet interface 16). Each data structure is required to begin on a quadword boundary, and the BTE registers 300, 302 are writable by the processors 20 only. When a processor does write one of the BTE registers 300, 302, it does so with a word that sets the request bit (rco, rcl) to a clear state, which operates to initiate the BTE process, which is controlled by the BTE state machine 307.

The BTE registers 300, 302 also include error bits (e0, e1) that report a time-out/NAK error indication. The error bits are cleared when the corresponding BTE register is written. The error cause (ec) bit differentiates time-outs and NAKs.

When information is being transferred by the processors 20 to an external unit, the data buffer portion 304b of the data structure 304 holds the information to be transferred. When information from an external unit is received by the processors 20, the data buffer portion 304b is the location targeted to hold the read response information.

The beginning of the data structure 304, portion 304a written by the processor 20, includes an information field (Dest), identifying the external element which will receive the packet that will be sent. The portion 304a also includes an information field (TYPE) that describes the operation desired (e.g., read or write information), a length information field (Len), describing the number of bytes of data being written or requested, and an address information field (Address), identifying where at the external element (Dest) the desired data is located, or where the transmitted data is to be written. This information is used by the packet transmitter unit 120 (FIG. 5) to assemble the packet in the form shown in FIGS. 3–4.

Immediately following the address information in the data structure portion 304a is a word (Local Buffer Ptr) containing the address of where in memory the data buffer portion 304b is located. That, in turn, is immediately followed by a word containing a chain pointer, an end-of-list (el) flag to indicate that the request is complete, an interrupt upon time-out or NAK mask bit (it), an interrupt on completion indicator (ic) and a check sum (cs) request.

One data structure 304 is used for each portion of data in memory to be moved to an external element (e.g., an I/O storage device) up to the maximum 64 byte length. The BTE will operate to sequentially access memory 28, responsive to each request structure, for 64 byte segments of the data, forming a message packet for each segment, and sending that message packet on its way. The chain pointer directs the BTE to the next data structure for another 64 bytes of data, unless the end-of-list bit (el) is set, causing the operation to terminate.

If data is to be sent to a number of different external elements, each different element will require its own data structure (or structures, if more than 64 bytes is to be sent) to be set up. These individual data structures may then be chained, using the chain pointers contained in the chain pointer fields of the request structures.

The chain pointer field is used as the contents of the BTE register for subsequent data structures. For example, if a large block of data in the memory 28 is to be sent to N different external devices, a data structure is written to memory for each of the N external elements with each data structure identifying where in memory 28 the BTE logic 88 can find the data to be sent. The data for each element is accessed by the BTE logic 88, message packets formed containing the data, and communicated to the packet transmitter 120 where they are sent on to the TNet as appropriate. Then, the chain pointer contained in the data structure, if chaining to another data structure is needed, is accessed and written to the appropriate BTE register 300, 302 which initiated the action, providing the address for the next structure for the next element to receive a request packet.

An end-of-list (el) bit, when set, indicates the end of the chain, and halts the BTE processing.

The interrupt completion (ic) bit, when set, will cause the interface unit 24a to assert an interrupt (BTECmp) which sets a bit in the interrupt register 280 (FIG. 14A) to indicate completion of the previous BTE transmitted packet (not the one pointed to by the chain pointer).

The interrupt time-out (it) bit, when set, will cause the interface unit 24a to assert an interrupt signal for the processor 20 if the acknowledgement of the access times-out (i.e., if the request timer (not shown) issues a timeout signal, indicating that an expected response had not been received within the appropriate time), or elicits a NAK response (indicating that the target of the request could not process the request).

Finally, if the check sum (cs) bit is set, the data to be written to the external element is passed through the check sum generator (not shown) in the BTE 88 (interface 24a; FIG. 5) to develop a check sum quantity. The generated check sum may be written to memory, and subsequently placed in a packet of its own and sent to the destination of the message packet(s) containing the data from which the check sum was formed.

To sum up, when the processors 20 of the CPU 12A desire to send data to an external unit, they will write a data structure 304 to the memory 28, comprising identifier information in portion 304a of the data structure, and the data in the buffer portion 304b. The processors 20 will then determine the priority of the data and will write the BTE register 300, 302 with the address in the memory 28 at which the data structure 304 (i.e., the header portion 304a) can be found, at the same time clearing the request complete bit (rcl) of the BTE register 300, 302, and causing the BTE operation to begin under control of the BTE state machine 306. The Dest, TYPE, Len, and address information from the portion 304a is accessed from the memory 28 and communicated to the packet transmitter 120 where it will be placed in proper packet form. If the data structure 304 specifies that the transfer is to be a write operation, the local buffer pointer is accessed and used to locate the data buffer portion 304b. The data is then accessed, communicated to the packet transmitter 120, packetized along with the header and address information, and sent.

If the data structure 304 indicates a read request (i.e., the processors 20 are seeking data from an external unit—either an I/O device or a CPU 12), the Len and Local Buffer Ptr information are used to generate a write request to the memory 28 when the read response packet (from the external element to which a request was made) is returned. The data is held in the input packet buffer 110 of the packet receiver 100 (FIG. 5) until the local memory write operation is executed.

Responses to a processor-generated read request to an external unit are not processed by the AVT table logic 146. Rather, when the processors 20 set up the BTE data structure, a transaction sequence number (TSN) is assigned the request and included in the header field of the message packet that will be formed and sent by the BTE 88, which will be an HAC type packet (FIG. 4) discussed above. The processors 20 will also include an memory address in the BTE data structure at which the data, when received, is to be placed. When the BTE logic 88 sends the packet on its way, the memory address of the buffer location is written to a register file (not shown) is the request transaction logic 100, (FIG. 5), using the TSN as a pointer into the register file.

When the response (which will be in the form of a HDC message packet—FIG. 4B) is received-by the CPU 12, the request transaction logic 100 will use the transaction sequence number (TSN) from the header of the packet as a pointer into the register file (not shown) for the corresponding memory address of the buffer at which the data contained in the incoming message packet is to be placed in the memory 28.

In order to understand the prioritization of the BTE registers 300, 302, assume that the foregoing transfer of data from the CPU 12A to an external unit is of a large block of information. Accordingly, a number of data structures would be set up in memory 28 by the processors 20, each (except the last) including a chain pointer to additional data structures, the sum total of which comprise the data (in the data buffer portions 304b of the data structures 304) to be sent. Assume now that a higher priority request is desired to be made by the processors 20. In such a case, the associated data structure 304 for such higher priority request would be written to the memory 28, in the same form as described above. Then, the higher priority BTE register 300 would be written with the BTE address needed to locate the data structure, and the request completion indication bit (rc0) cleared.

The BTE request indicated by writing the BTE register 300 does not start immediately, however. It waits until the BTE operation initiated by the content of the BTE register 302 pauses between packets. Further BTE operations signalled by the content of the BTE register 302 are held in abeyance in favor of the BTE operation indicated by the content of the BTE register 300. That BTE operation proceeds until completed, at which time the BTE operation signaled by the content of the BTE register 302 is resumed, and allowed to be completed unless the BTE register 300 is again written with another BTE operation descriptor.

Memory Controller

Returning, for the moment, to FIG. 2, interface units 24a, 24b access the memory 28 via a pair of memory controllers (MC) 26a, 26b. The Mcs 26 provide a fail-fast interface between the interface units 24 and the memory 28 in addition to providing the control logic necessary for accessing the memory array 28 (which is implemented in dynamic random access memory (DRAM) logic). The Mcs 26 receive memory requests from the interface units 24, and execute reads and writes as well as providing refresh signals to the DRAMS that implement the memory array at 28. The two MCs 26a, 26b run in parallel to provide a 72 bit data path between the memory array 28 and the interface units 24a, 24b, which utilize an SBC-DBD-SbD ECC scheme, where b=4, on a total of 100 bits (64 data bits plus 28 address bits plus 8 check bits) of which only 72 bits (64 data and 8 check bits) are actually written to the memory 28.

Figure 16:
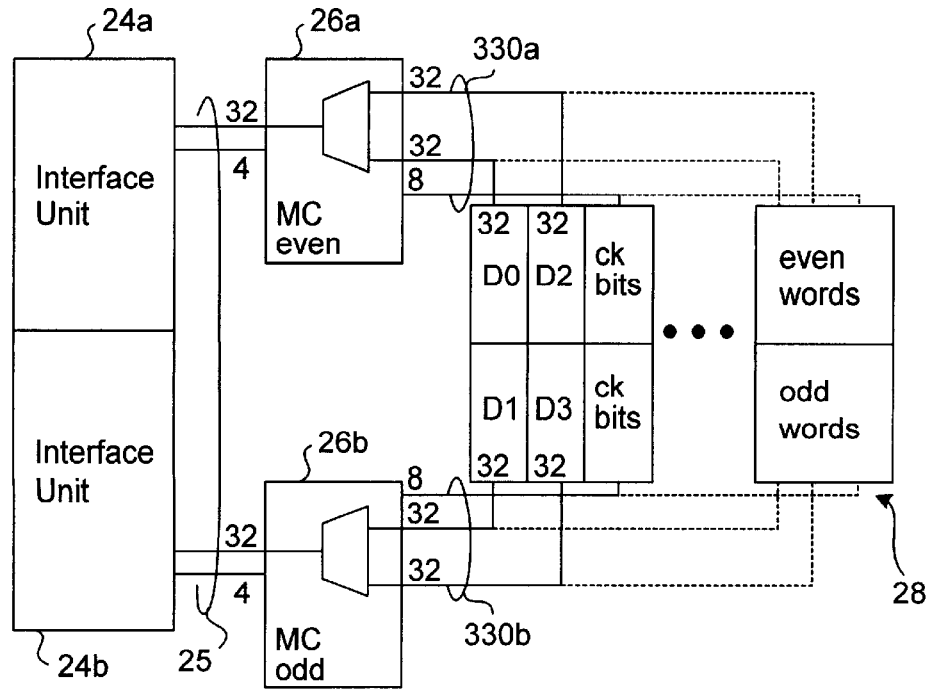
FIG. 16 illustrates the construction of the 72-bit data path formed in part by a pair of memory controllers between memory of a CPU of FIG. 2 and its interface unit for accessing from memory 72 bits of data, including two simultaneously-accessed 32-bit words at consecutive even addresses along with 8 check bits.

Referring for the moment to FIG. 16, shown are the two MCs 26a, 26b operated in parallel to fetch 144 bits of data from the memory 28. One MC (e.g., 26a) is connected to access two 32-bit words simultaneously at consecutive even addresses along with 8 check bits to form a 72-bit path 330a between the MC and the memory 28. The other MC (i.e., 26b) is connected to similarly access two 32-bit odd words along with another 8 check bits to form a second 72-bit path 330b. This arrangement allows the two MCs 26a, 26b to work together and simultaneously supply a 64-bit word to the interface units 24 with minimum latency, one-half of which (DO) comes from the MC 26a, and the other half (Dl) comes from the other MC 26b.

The interface units 24 generate and check the ECC check bits. The ECC scheme used will not only detect and correct (single-bit) data errors, but will also detect all double-bit errors and any error of up to four bits from any single DRAM. The fail-fast design checks parity on address transfers between interface 24 and MC 26 bus 25, as well as in internal registers.

From the viewpoint of the interface units 24, the memory 28 is accessed with two instructions: a "read N doubleword" and a "write N doubleword." Both of these commands come to the Mcs 26 with address and control on the first 36-bit transfer, and a byte count on the second 32-bit transfer. On writes, the MCs 26 will break down the command into either a doubleword write, or a block of doubleword writes. On reads, the requested data is returned in either a single doubleword read or a block read format. The signal called "data valid" tells the interface units 24 two cycles ahead of time that read data is being returned or not being returned.

Figure 17:
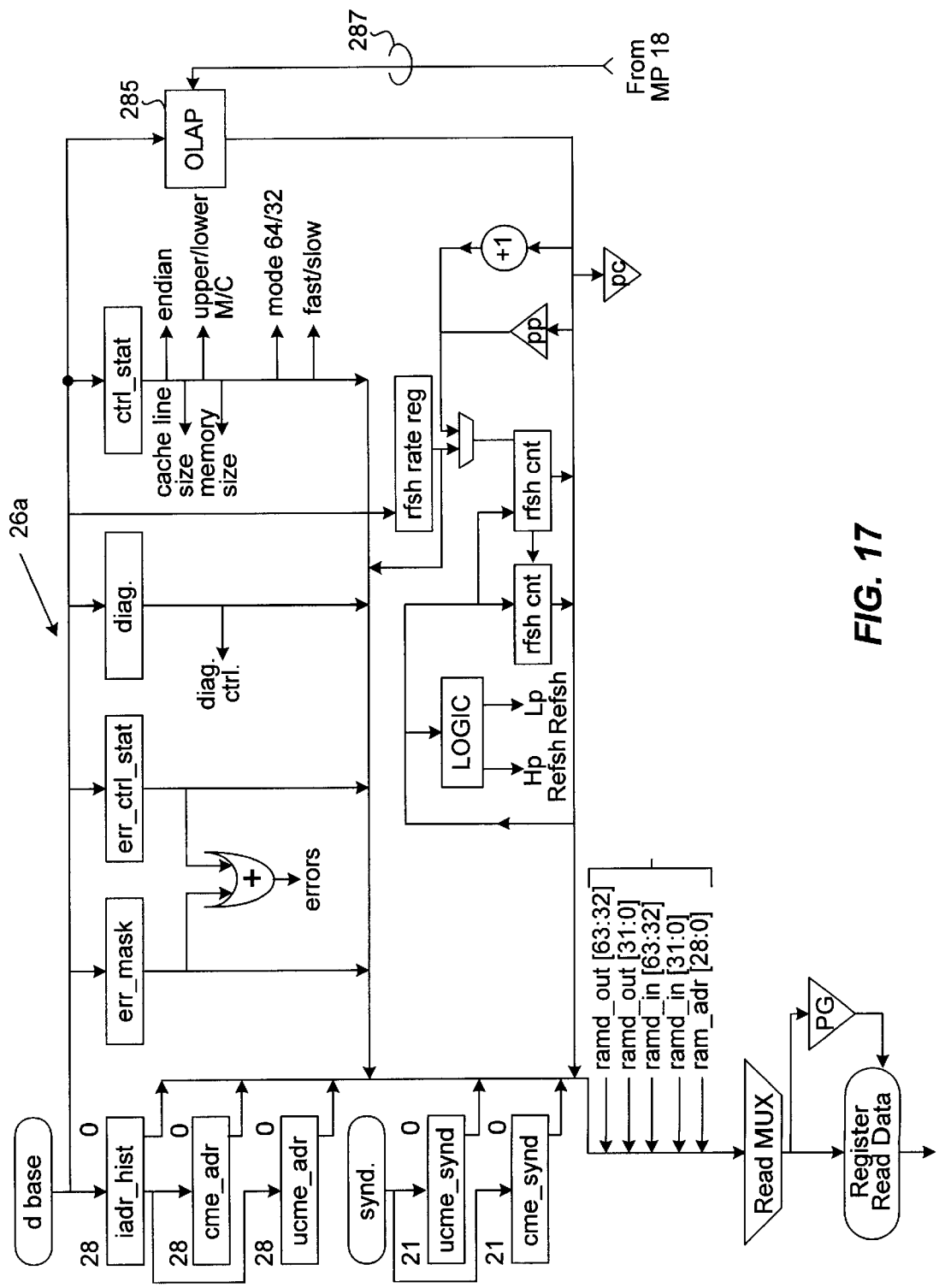
FIG. 17 is a simplified block diagram of one of the two memory controllers shown in FIG. 2, illustrating a serial access thereto through an on-line access port (OLAP)

As indicated above, the maintenance processor (MP 18; FIG. 1A) has two means of access to the CPUs 12. One is by using the TNet structure, including the routers 14, to send (or receive) packetized information. Another, albeit more limited, is through an On Line Access Port (OLAP) that is built into the various elements of the system 10 (e.g., routers 14, CPUs 12, I/O packet interfaces 16). This latter form of access is illustrated in FIG. 17 which shows an OLAP serial port 285 providing both read and write access for the MP 18 through each of the memory controllers 26. (Shown in FIG. 17 is the OLAP access to the memory controller 26a; the memory controller 26b is of substantially identical design.) At boot time the MP 18 will write a register contained in the OLAP 285 with instructions that permit the processors 20 to build an image of a sequence of instructions in the memory that will permit them (the processors 20) to commence operation, going to I/O for example to transfer instructions and data from an external (storage) device that will complete the boot process.

The OLAP 285 is also used by the processors 20 to communicate to the MP 18 error indications. For example, if one of the interface units 24 detect a parity error in data received from the memory controller 26, it will issue an error signal that will halt operation, as well as causing a bit position to be set in the OLAP 285 to inform the MP 18 of the error. The error-checking performed by the memory controller 26 (e.g., the parity checks bad on register read operations) will similarly halt operation and notify the MP 18 via the OLAP 285 that an error occurred.

The MP 18 and the various OLAPs (e.g., OLAP 285 in the MC 26a) in the system communicate through a serial bus 287 that is structured in conformance with IEEE Standard 1149.1.

Figure 18:
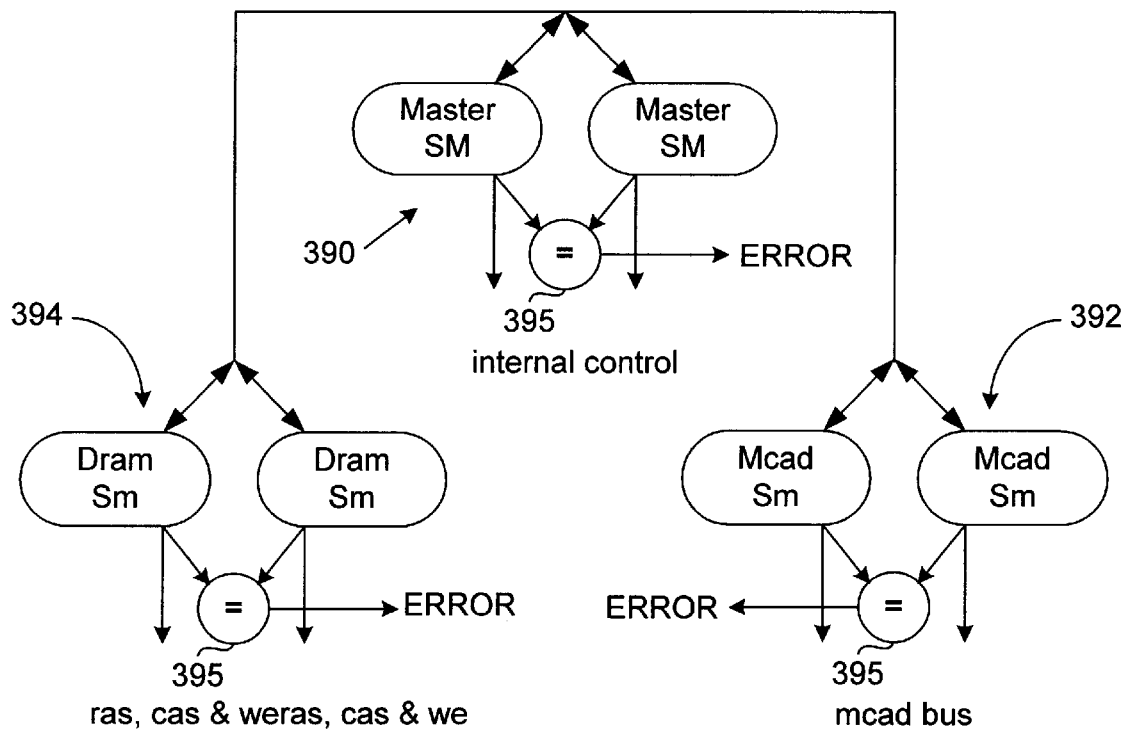
FIG. 18 illustrates, in simplified form, the state machines of the pair of memory controllers of FIG. 2 and the technique used to check one against the other for error-checking.

The architecture of the memory controllers are of generally conventional design, except for a particular form of error checking by monitoring the various state machines used in implementing the Mcs 26. As FIG. 18 illustrates, the functions of the MC 26a (the same is true for MC 26b) are controlled by three major state machines, each of which is duplicated and compared. A master state machine pair 390 operates to control the functions of the of the MC 26a itself, such as getting data and instructions from the MCAD bus 25 to the DRAM data bus for communicating data to the memory 28. The master state machine pair 390, in turn, exercises control over a memory control address/data (MCAD) state machine 392 which handles the data and address transfers on the bus 25 between the MC 26a and the corresponding interface unit 24a. The addressing and data transfers on the DRAM data bus, as well as generation and sequencing of the necessary refresh signals, are controlled by the DRAM state machine pair 394. The digital states entered by the state machine pairs 390, 392, and 394 are compared to one another by compare circuits 395. Any mis-compare will result in assertion of an ERROR signal from the compare circuit 395 detecting the mis-compare to halt operation of the CPU 12.

Packet Routing

The message packets communicated between the various elements of the processing system 10 (e.g., CPUs 12A, 12B, and devices coupled to the I/O packet interfaces 16) are "routed" by the routers 14, according to the information contained in the packet (i.e., the destination field of the header, FIG. 3B, although other of the information could also be used, such as the source field). Before discussing the construction and design of the routers 14, however, it will be of advantage to understand first the protocol used for communicating messages on the TNet links L between the CPUs 12 and the routers 14, or between the routers 14 and the I/O packet interfaces 16.

First, each TNet Link L connects to an element (e.g., router 14A) of the processing system 10 via a port that has both receive and transmit capability. Each transmit port of any element must provide a transmit clock (T_Clk) signal that is used for synchronous transmission of message packets, symbol by symbol. A symbol is transmitted on each and every clock cycle (i.e, each clock period) of the T_Clk so that the clock synchronization FIFO at the receiving end of the transmission will maintain synchronization.

Clock synchronization is dependent upon the mode in which the processing system 10 is operated. If operating in the simplex mode in which the CPUs 12A and 12B, for example, operate independently of each other, the clocking between the routers 14 and the CPUs 12 is "near frequency;" that is, the clocks used by the CPUs 12 and routers 14 that connect directly to the CPUs may drift with respect to each other. Conversely, when the processing system 10 operates in a duplex mode (e.g., the CPUs operate in synchronized, lock-step operation), the clocks between routers 14 and the CPUs 12 to which they connect are frequency locked (but not necessarily phase-locked).

The flow of data packets between the various elements of the processing system 10 is controlled by command symbols, which may appear at any time, even within a packet. As considered above (with reference to Table 1), a command symbol is identified by the most significant bits being all 0. Those command symbols are as follows.

IDLE: The IDLE command symbol is transmitted on every clock when there is no other command symbol or data packet to send. The IDLE command symbol acts as a space-filler between packets or command symbols on the TNet links.

BUSY: The BUSY command symbol is sent when the receiving device senses that it will soon be unable to accept data symbols.

FILL: The FILL command symbol is injected into a message packet by the transmitting element when the transmitting element knows that the receiving element to which it is sending symbols is busy (e.g., by receipt of a BUSY command symbol).

RALT: This command symbol is initiated by a CPU 12, or MP 18, and promulgated to all elements of the processing system 10 by the routers 14 to communicate an event requiring software action by all CPUs 12 and certain I/O devices. The HALT command symbol provides a mechanism for quickly informing all CPUs 12 in a system 10 that it is necessary to stop initiating I/O activity.

OTHER LINK BAD (OLB): When a router 14, connected to a CPU 12 and operating in duplex mode, detects an error in the command symbol or packet being received from one of the CPUs 12, and detects no errors in the command symbol or packet being received from the other of the CPUs 12, the router 14 will send an OLB command symbol to the CPU 12 which delivered the good packet or command symbol. This command symbol is also sent in response to CRC errors, command symbol errors, and protocol violation errors, in duplex mode only. OLB and TLB (described below) command symbols are sent simultaneously to the duplexed CPUs 12; that is, a TLB command symbol will be sent to the CPU 12 from which the erroneous packet or symbol was received, or the error noted, and at substantially the same time a OLB symbol is sent to the other CPU 12 of the duplexed pair.

READY: This command symbol is sent when the previously busy element is now able to accept additional data.

SKIP: This command symbol indicates a clock cycle which may be optionally skipped. This command symbol is used in conjunction with near frequency operation as an aid to maintaining synchronization between the two clock signals that (1) transfer each symbol to, and load it in each receiving clock synchronization FIFO, and (2) that retrieves symbols from the FIFO.

SLEEP: This command symbol is sent by any element of the processing system 10 to indicate that no additional packet (after the one currently being transmitted, if any) may be sent over the particular link L until a READY command symbol (described below) is received.

SOFT RESET (SRST): The SRST command symbol is used as a trigger during the processes ("synchronization" and "reintegration," described below) that are used to synchronize symbol transfers between the CPUs 12 and the routers 14A, 14B, and then to place the CPUs 12 in identical states for duplex operation.

SYNC: The SYNC command symbol is sent by a router 14 to the CPU 12 of the processing system 10 (i.e., the sub-processor systems 10A/10B) to establish frequency-lock synchronization between CPUs 12 and routers 14A, 14B prior to entering duplex mode, or when in duplex mode to request synchronization, as will be discussed more fully below. The SYNC command symbol is used in conjunction with the SRST command symbol to switch system operating modes (i.e., simplex to duplex or duplex to simplex), among other things, as discussed further below in the section on Synchronization and Reintegration.

THIS LINK BAD (TLB): When any system element receiving a symbol from a TNet link L (e.g., a router, a CPU, or an I/O unit) notes an error when receiving a command symbol or packet, it will send a TLB command symbol back to the system element which delivered the faulty packet or symbol. It is usually sent in response to CRC errors, command symbol errors, and protocol violation errors.

OWN YOU (IOY): IOY command symbols are sent only by a CPU 12 to a router 14 (and only when operating in duplex mode) to force the router 14 to select data from the sending CPU, giving ownership, in effect, to the sending CPU 12; any further data transmissions from the non-sending CPU are disregarded. The actual bit structure of the IOY command symbol is the same as that used for the Other Link Bad (OLB) command symbol—the source of the symbol determines which. If the IOY/OLB symbol is sent by a CPU 12, it is interpreted as an IOY symbol; if the IOY/OLB symbol is sent by a router, it is interpreted as a OLB. To put it another way, between the CPUs 12 and routers 14A, 14B, only CPUs send IOY command symbols and only routers send OLB command symbols.

DIVERGE (DVRG): The DVRG symbol is sent by a router, when in duplex operation, to inform the duplexed CPUs that a divergence in the data streams being received from the CPUs has been detected; that is, the router is receiving from the two CPUs 12 identical pairs of symbols that are compared to one another when pulled from the clock synchronization FIFOs . . . The DVRG command symbol signals the CPU 12 that a mis-compare has been noted. When received by the CPUs, a divergence detection process is entered whereby a determination is made by the CPUs which CPU may be failing or erroneous, and to terminate further operation of that CPU.

THIS PACKET GOOD (TPG): A command symbol following a message packet, indicating that the sender of the packet has determined that the CRC of the packet is good. See "Packet Status," below for more detail.

THIS PACKET BAD (TPB): The TPB command symbol replaces the TPG command symbol when the receiving element has determined that the CRC of the received message packet is incorrect.

Flow Control

Routers 14 have limited storage capability and, therefore, do not use any type of "store and forward" method when routing a message packet; rather, they implement what is known as "worm-hole" routing: the head of a message packet will be passed through and out the router before its tail is received. This is one reason that the command symbols described above operate to control message flow between the various elements of the processing system 10 (e.g., CPUs 12, router 14, and the like), using principally the BUSY/FILL/READY command symbols described. This flow control is referred to as "backpressure."

Whenever a particular system element determines that its receiving queue (i.e., the elastic buffer 506—FIG. 19A) is nearly full, it will avail itself of the bi-directional capability of the TNet link L on which it is receiving the incoming message packet and transmit, to the transmitting element at the other end of the TNet link L, a BUSY command symbol from the associated transmit port to tell the transmitting element to hold off further transmission. Use of the BUSY command symbol is referred to herein as asserting "backpressure." The CPUs 12 or the I/O packet interfaces 16 may assert such backpressure while waiting for internal resources to become available, if and only if such internal resources will become available independent of backpressure asserted on any particular TNet port however, an "end node" (i.e., a CPU 12 or I/O unit 17—FIG. 1) may not assert backpressure because one of its transmit ports is backpressured. Failure to observe this requirement may result in backpressure deadlocks where a receive port cannot receive because a transmit port cannot transmit, in turn because the associated receiver is asserting backpressure. Thus, only routers 14 can propagate backpressure; end nodes (CPUs 12, I/O Packet Interfaces 16) are not allowed to translate received backpressure to transmitted backpressure.

A router 14 may assert backpressure on any one of its receive ports whenever further data symbols arriving at that port cannot be buffered or forwarded. Improperly addressed packets are discarded by the router 14.

When a system element of the processing system 10 receives a BUSY command symbol on a TNet link L on which it is transmitting a message packet, the element suspends sending the packet and begins sending instead FILL command symbols until a READY command symbol is received with each clock cycle of the transmit clock T_Clk. FILL command symbols will continue to be sent. Also, if a BUSY command symbol is received on a TNet link L while the associated transmit port is not sending a packet, the element receiving the BUSY symbol will refrain from initiating a new packet transmission until it subsequently receives a READY symbol on that link. The transmit port otherwise retains the ability to transmit other command symbols (READY, BUSY, etc.).

Whenever a TNet port of an element of the processing system 10 detects receipt of a READY command symbol, it will terminate transmission of FILL command symbol at the associated transmit port, and resume sending the packet that was suspended by the earlier received BUSY command symbol, or it will terminate injecting IDLE command symbols and initiate sending a pending packet, or continue sending IDLE command symbols until a packet is available.

It should be appreciated, however, that the BUSY/READY flow control will not apply to the transmission of other command symbols. Remember, as mentioned above, that every cycle of a transmit clock, T_Clk, is accompanied by transmission of a command or data symbol. Thus, all TNet interfaces must be ready to accept a new command or data symbol on any clock cycle of the associated transmit clock, T_Clk, that the TNet interface receives.

As will be seen, all elements (e.g., router 14, CPUs 12) of the processing system 10 that connect to a TNet link L for receiving transmitted symbols will receive those symbols via a clock synchronization (CS) FIFO. For example, as discussed above, the interface units 24 of CPUS 12 include all CS FIFOs 102x, 102y (illustrated in FIG. 6). The each CS FIFO 102 are connected to receive command or data symbols from a corresponding TNet link L. The CS FIFO must provide sufficient depth to allow for speed matching, and the elastic FIFOs must provide sufficient depth for processing delays that may occur between transmission of a BUSY command symbol during receipt of a message packet, and the cessation of the incoming message packet in favor of FILL or IDLE command symbols. The elastic FIFOs 506 (FIG. 19A) in routers 14 should also provide sufficient depth to allow for the injection of BUSY and READY command symbols in the transmit path. For example, referring to FIG. 1, assume that the CPU 12A is transmitting a message packet for receipt by a one of the I/O packet interfaces 16A—via port 3 of the router 14A. At the same time, that same I/O packet interface 16A that is receiving the message packet being sent by the CPU 12A is also sending a message packet on the same (bi-directional) TNet link L to port 3 of the router 14A. Assume further that the router 14A experiences a holdup (backpressure) from the destination of the message packet being sent by I/O packet interface 16A. After a time the elastic FIFO 518 (FIG. 19A) will fill to a point that will require the router 14A to request the I/O packet interface to temporarily stop transmission of the message packet. Accordingly, the router 14A transmits a BUSY symbol from port 3 (the same port at which is receiving the message traffic from the I/O packet interface 16A. That BUSY symbol will be inserted in the symbol stream of the message packet being send through the router 14A from the CPU 12A. The insertion of a BUSY symbol in the stream of an incoming message packet will require the router 14A to store one extra symbol of the incoming packet. After the BUSY symbol is sent, the router 14A can resume transmission of the incoming message packet from the CPU 12A until such time as it can recommence receipt of the discontinued transmission of the message packet from the I/O packet interface 16A. To I/O packet interface 16A to commence retransmission of the interrupted message packet, the router 14A insert a READY signal in the symbol stream being sent from port 3, again requiring the router to store another symbol of the message packet from the CPU 12A.

This pair of BUSY/READY command symbols can be inserted by each router 14 and CPU 12 in the path between the I/O packet interfaces 16 and the CPU 12. The router 14 connected directly to the I/O packet interface 16 could inject 2n command symbols (n=number of routers in path+1) into a single packet. This implies that 2n bytes of FIFO would be required in the lowest level router 14 (closest, i.e. routers, to any I/O packet interface 16) to ensure that backpressure asserted in one direction would not require backpressure to be asserted in the opposite direction. For example, assume a I/O packet interface 16 is transmitting a packet A to a router 14 while at the same time receiving a packet B from that same router, and that router receiving the packet A cannot forward it due to backpressure. That router must inject a BUSY signal into packet B to tell the I/O packet interface 16 to stop sending packet A. The BUSY command symbol injected in packet B displaces one data symbol which increases FIFO depth by one. The subsequent removal of backpressure by injecting READY displaces another data byte in packet B. As packet A progresses to the next router, the process would be repeated. If the router 14 displaces more data bytes than the FIFO can handle, it must assert backpressure to the source of packet B.

Packet Status

Each transmitted packet will be immediately followed by a TPG or TPB command symbol, reporting the integrity of the associated packet. The system element at which a packet originates will insert the appropriate TPG or TPB command symbol. Routers 14 will validate the accompanying CRC and perform various protocol checks for all packets as they flow through from the source (i.e., I/O packet interface 16 or CPU 12A) to the destination (i.e., CPU 12A or I/O packet interface 16). If a router 14, in the path of the flow in question, detects any error on an incoming packet, and the packet concludes with a TPG command symbol (indicating that the packet is good), the router will replace the TPG command symbol with a TPB command symbol.

Errors which can cause the change of a TPG command symbol to a TPB symbol include, in addition to a failure to validate the received data by the CRC data when checked, a packet with a length greater than that allowed by the protocol used. Although any packet length can be used, here a packet is limited to 1024 symbols, including the status (TPG/TPB) symbol. If a received packet is detected as having more than this limit, the receiving router will terminate the packet with a TPB command symbol at the 1024th symbol, and disregard the remainder of the packet. This limitation on packet length is an error-checking technique to preclude a fault from occurring in a packet transmitting element that causes it to babble incessantly, and clog the TNet network.

A router 14 which receives a packet followed by a TPB command symbol will forward the TPB command symbol unmodified, irrespective of its own findings.

SLEEP Protocol:

The SLEEP protocol is initiated by a maintenance processor via a maintenance interface (an on-line access port—OLAP), described below. The SLEEP protocol provides a mechanism to quiesce one or more TNet links L at packet boundaries. It is necessary to change modes (e.g., from duplex to simplex) in order to reintegrate a slice of the system 10. Routers 14 must be idle (no packets in process) in order to change modes without causing data loss or corruption. When a SLEEP command symbol is received, the receiving element of processing system 10 inhibits initiation of transmission of any new packet on the associated transmit port which must transmit only permitted command symbols on that TNet link L. (An exception is a self-addressed AtomicWrite message packet, discussed below in the section dealing with reintegration.) Any packet being transmitted when the SLEEP command symbol is received will be transmitted normally until complete. The transmit port associated with the receive port at which the SLEEP command symbol was received will continue, however, transmitting permitted command symbols (e.g., BUSY, READY, IDLE, FILL), but may not initiate a new packet for transmission until a READY command symbol is received at its associated receive port.

HALT Protocol:

The HALT command symbol provides a mechanism for quickly informing all CPUs 12 in a processing system 10 that is necessary to terminate I/O activity (i.e., message transmissions between the CPUs 12 and the I/O packet interfaces 16, or message transmission between different CPUs 12). Each router 14 has a system HALT enable configuration register which can be set by MP 18 through the OLAP 285' (FIG. 19A) so that when a HALT command symbol is received from a CPU 12, the receiving router 14 will propagate a HALT command symbol from each of its transmit ports, and clear its system halt enable bit. A router 14 will ignore all HALT command symbols which are received when the system halt enable bit is in a cleared state. In this way, the system halt enable bit functions both as a software settable enable for the halt function as well as preventing the infinite cycling of HALT command symbols once the first HALT command symbol is asserted.

CPUs that receive HALT command symbols on either of their receive ports (of the interface units 24) will post an interrupt to the interrupt register 280 if the system halt interrupt is enabled (i.e., the associated disposition of mask register 282 enables the interrupt; FIG. 14A).

The CPUs 12 may be provided with the ability to disable HALT processing. Thus, for example, the configuration registers 75 of the interface units 24 can include a "halt enable register" that, when set to a predetermined state (e.g., ZERO) disables HALT processing, but reporting detection of a HALT symbol as an error.

Router Architecture

Figure 19B:
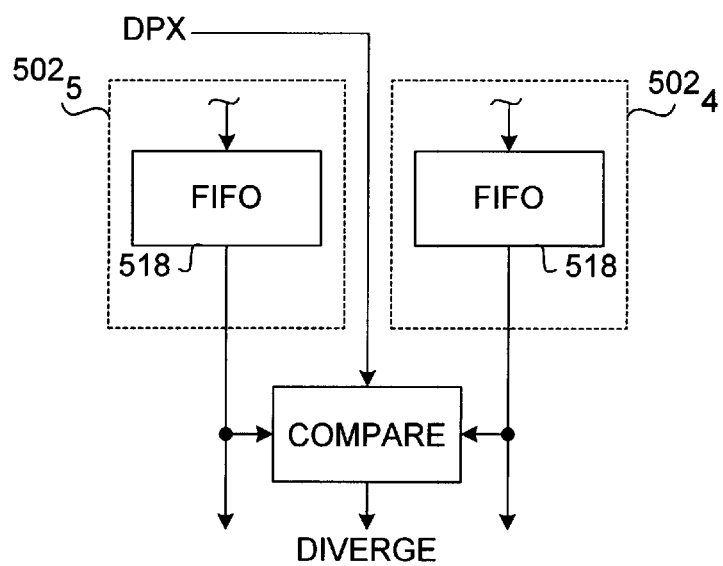
FIG. 19B illustrates comparison on two port inputs of the router unit of FIG. 19A.
Figure 19A:
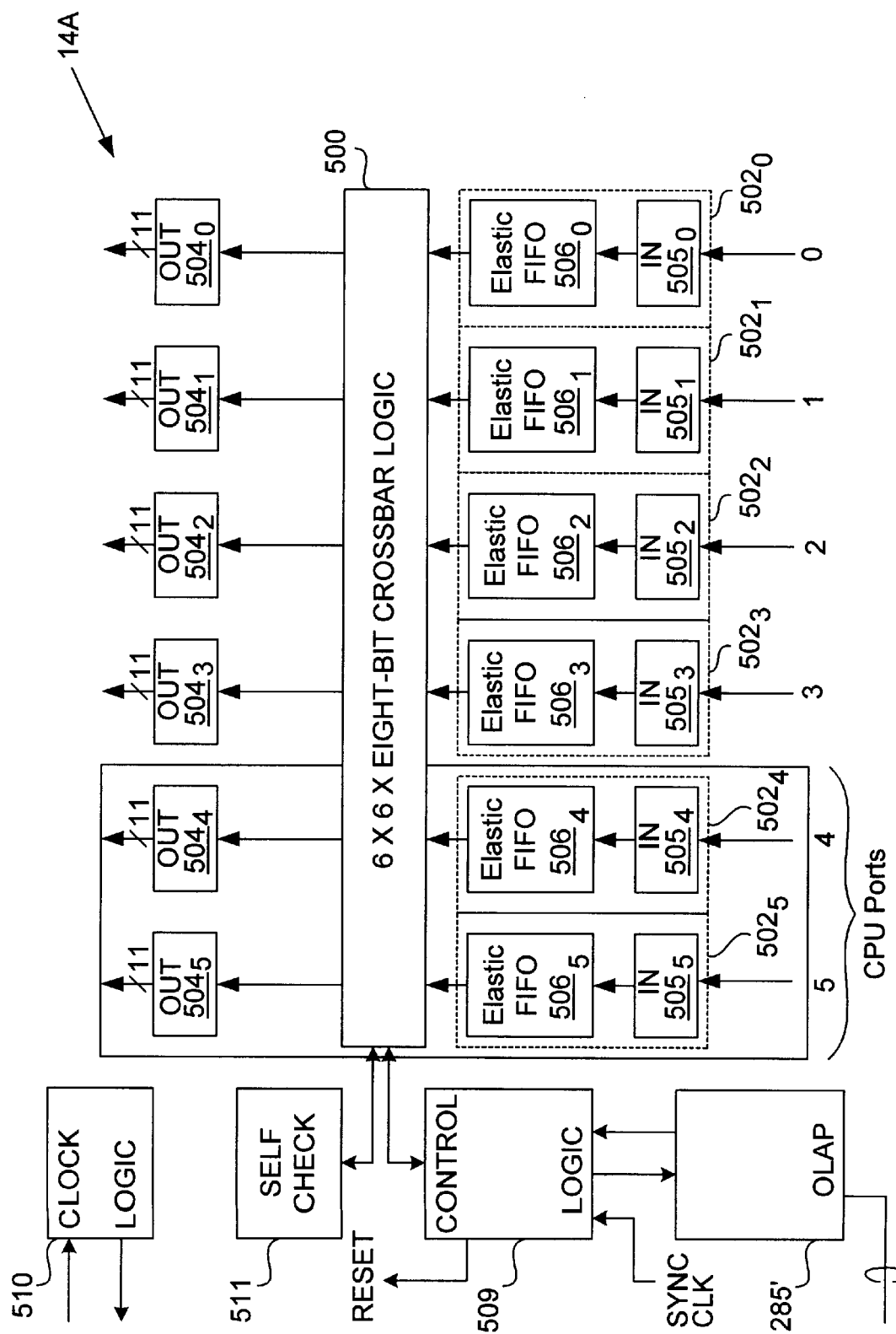
FIG. 19A is a simplified block diagram illustration of the router unit used in the area input/output networks of the processing systems shown in FIGS. 1A–1C.

Referring now to FIG. 19A, a simplified block diagram of the router 14A is illustrated. The other routers 14 of the processing system 10 (e.g., routers 14B, 14', etc.) are of substantially identical construction and, therefore, the discussion relating to router 14A will apply equally to the other routers 14.

As FIG. 19A illustrates, the router 14A includes six TNet ports 0, . . . , 5, each including a port input 502 ($502_0$, . . . , $502_5$) and an output 504 ($504_0$, . . . , $504_5$).

Each port output 504 has the 10 signal lines emanating therefrom discussed above: nine signal lines that transmit parallel 9-bit command/data symbols, and a signal line that carries the associated transmit clock (T_Clk). Similarly, each of the port inputs 502 connect to receive 10 parallel signals comprising data, receive clock (Rcv Clk). As also shown, each port input 502 includes input logic 505 and an elastic FIFO 506 to receive and buffer an incoming message packet before applying it to a crossbar switch 500. The crossbar logic 500 operates to route message packets received by port inputs 502 to a port output 504 according to information contained in the Destination ID of the message packet. The crossbar logic 500 operates as a true crossbar switch, permitting message packets received at any port input 502 to be routed to any port output 504, even that port output 504 associated with the port input 502 receiving the packet (e.g., port input $502_2$ and port output $504_2$). The crossbar logic 500 is also capable of routing two or more message packets from corresponding ones of the port inputs 502 to the port outputs 504. The crossbar logic 500 is of conventional design so that further discussion as to its construction is not necessary.

Two of the ports, 4 and 5, of the router 14A, emphasized in the Figure by the shading, are structured somewhat differently from the others; these two ports are intended to be used as those ports that connect directly (by TNet Links Lx and Ly) to a pair of CPUs 12. The port inputs $502_4$, $502_5$ for these ports 4, 5 are structured to operate in a frequency locked environment when a processing system 10 is set for duplex mode operation. In addition, when in duplex mode, a message packet that is received at any one of the input ports 0–5, and bound for either one of the CPUs 12 to which the router connects, will be replicated by the crossbar logic 500 and sent to both of the two port outputs $504_4$, $504_5$ which operate in lock-step fashion to transmit to the CPUs to which they connect the same symbols, symbol-by-symbol, at substantially the same time. When not operating in duplex mode (i.e., simplex mode), the port inputs $502_4$, $502_5$, and all other port inputs, operate in near frequency mode.

In addition, the input logic 502 for the router ports 4 and 5 also are provided a compare circuit that operates, when the CPUs 12A, 12B are in duplex mode, to perform a symbol by symbol comparison of the command/data symbols received from the two CPUs. Accordingly, as illustrated in FIG. 19B, the port inputs $502_4$, $502_5$ will receive the command/data symbols from the CPUs, pass them through the clock synchronization FIFOs 518 (discussed further below), and compare each symbol exiting the clock synchronization FIFOs with a gated compare circuit 517. When duplex operation is entered, a configuration register (not shown) in the control logic 509 is set to a state that asserts a DPX signal. That DPX signal is communicated from the control logic 509 to the gated compare circuit 517 to activate the symbol by symbol comparison of the symbols emanating from the two synchronization FIFOs 518 of the router input logic 502 for the ports 4 and 5. Of course, when the DPX bit is not set in the control logic 509, comparison is disabled.

Message traffic from the duplexed CPUs 12, which are identical symbol streams, are received by the port inputs $502_4$, $502_5$, each symbol of the stream received by one port input being identical to that received, at substantially the same time, by the other port input.

To maintain synchronization in the duplex mode, the two port outputs of the router 14A that transmit to the CPUs 12 must operate in lock-step; that is, the port outputs must operate so that the same symbols must be sent to both CPUs 12 on a cycle-to-cycle basis. Thus, referring to FIG. 2, a symbol stream received at one of the ports 0–5 (FIG. 19A) of the router 14A, and destined for the CPUs 12, must be forwarded to both CPUs 12, in duplex operation, so that identical symbols are received by the CPUs at substantially the same time. (The CPUs 12 can send self-addressed message packets which, when in duplex mode, are duplicated by the routers 14, and returned to both CPUs.) The output logic units $504_4$, $504_5$ that are coupled directly to the CPUs 12 will both receive symbols from the crossbar logic 500 (even though the Destination field of the message packet identifies only one of the duplexed CPUs 12, e.g., CPU 12A) in synchronized fashion, presenting those symbols in substantially simultaneous fashion to the two CPUs 12. Of course, the CPUs 12 (more accurately, the associated interface units 24) receive the transmitted symbols with synchronizing FIFOs of substantially the same structure as that illustrated in FIG. 7A so that, even though there may be a slight real-time phase difference with which the symbols are received by the CPUs 12, the clocking maintained between the two CPUs 12 will ensure that the same symbol is pulled from the FIFO structures by both CPUs 12 on the same instruction cycle, maintaining the synchronized, lock-step operation of the CPUs 12 required by the duplex operating mode.

As will be seen in connection with the discussion of a more detailed diagram of the port inputs 502 (FIGS. 20A and 21A), routing control is mainly effected by logic of the port inputs 502, in conjunction with configuration data written to registers contained in control logic 509 by the maintenance processor 18 (via the on-line access port 285' and serial bus 19A; see FIG. 1A).

Router 14A additionally includes self-checking logic 511 to conduct checks on the various components that make up the router 14A to ensure proper operation. Generally, self-check logic 511 performs such operations as internal parity checks, illegal state detection of state machines, and comparison of the outputs of duplicated logic. The self-checking performed is of a conventional nature.

Synchronous operation of the router 14A is conducted according to (local) clock signals generated by clock logic 510.

Each output port 504 of the router 14 is structured to implement the requirements of the flow control protocol, discussed above, for communicating symbols on the TNet links L. The input logic 505 of each port input 502 also assists in maintaining synchronization—at least for those ports sending symbols in the near-frequency environment—by removing received SKIP command symbols. The SKIP command symbol is used, in this context, as a place-holding symbol that, in effect, causes clock cycles to be skipped allowing a slower received to accept data from a faster receiver. Since devices at the ends of any TNet link L operate with different clocks, when operating in the near-frequency environment, it is relatively certain that one clock will be faster than the other by some slight amount. If left unchecked, slower-receiving element receiving symbols from a faster-sending element could overload the input clock synchronization FIFO of the slower-receiving element. That is, if a slower clock is used to pull symbols from the clock synchronization FIFO put there by a faster clock, ultimately the clock synchronization FIFO will overflow.

Figure 20A:
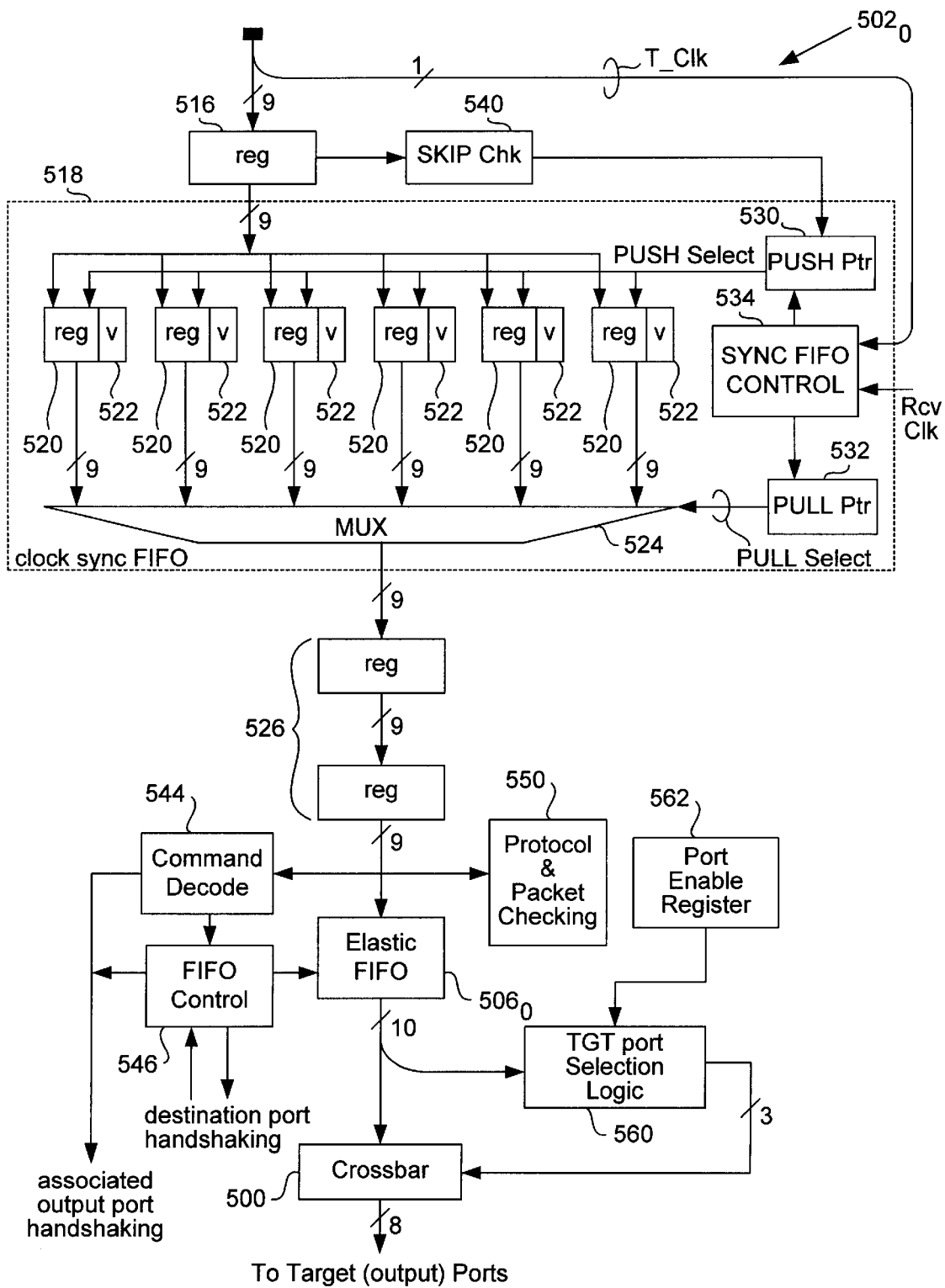
FIG. 20A is a block diagram the construction of one of the six input ports of the router unit shown in FIG. 19A.

The preferred technique employed here is to periodically insert SKIP symbols in the symbol stream to avoid, or at least minimize, the possibility of an overflow of the clock synchronization FIFO (i.e., clock synchronization FIFO 518; FIG. 20A) of a router 14 (or CPU 12) due to a T_CLK signal that pushes symbols onto the FIFO being slightly higher in frequency than the local clock used to pull symbols from the synchronization FIFO. Using SKIP symbols to by-pass a push (onto the FIFO) operation has the effect of causing the push pointer of the FIFO to stall each time a SKIP command symbol is received so that, insofar as the clock synchronization FIFO is concerned, the transmitting clock that accompanied the SKIP symbol was missing.

Thus, logic in each of the port inputs 502 will recognize, and key off receipt of, SKIP command symbols for synchronization in the near frequency clocking environment so that nothing is pushed onto the FIFO, but a symbol will be pulled. Preferably, SKIP symbols are inserted approximately every 512 transmitter clocks. Given that symbols are transmitted on links L (e.g., between a CPU 12 and a router 14, or between routers 14, or between a router 14 and an 1/0 interface unit 16A—FIG. 1) at a 50 Mhz rate, this allows for a worst case frequency difference of 2000 ppm.

The elastic FIFOs 506 of each port input 502 are of conventional design, and are used to help absorb and smooth out jitter in the symbol stream, caused by, for example, inserting flow control and command symbols into the message packet while in transit. Perhaps most importantly, the elastic FIFOs 506 allow buffering of the incoming message traffic when the output port is busy.

The router 14A, like any other element of the system 10, may experience "backpressure" when routing a received message packet to a destination device, and the destination device momentarily signals its inability to receive further symbols (for example, a BUSY command symbol). Proper implementation of backpressure requires that the elastic FIFOs 506 have a depth (i.e., have a sufficient number of storage locations) large enough to receive and hold incoming symbols after the destination device has stopped receiving until the previous device (i.e., the device supplying the message packet to the router) can respond to a BUSY symbol by supplying FILL or IDLE symbols (which are received and pushed onto the clock synchronization FIFOs, but are not passed to the elastic FIFOs). In short, each elastic FIFO 506 must have sufficient space to continue storing symbols until the sending device can temporarily stop sending.

To help reduce jitter in the symbol stream, the elastic FIFOs 506 will work with high and low "water marks." If the elastic FIFO 506 begins to fill, and reaches the high water mark, a backpressure symbol (e.g., BUSY) will be transmitted out the transmit port corresponding to the receive port receiving the symbol stream. For example, if a symbol stream is being received by the router port input $502_3$, and the FIFO control logic 546 used to control the elastic FIFO $506_3$ indicates that the FIFO is getting full (i.e., has passed the high water mark), the input port $502_3$ will signal the corresponding output port $504_3$ to cause to be transmitted a BUSY symbol. The BUSY state will be maintained by the router 14 (and the device at the other end of the TNet link L that was sending the packet) until the depth of the elastic FIFO $506_3$ is below the low water mark, as determined by the FIFO control logic 546 (FIG. 20A), at which time the port output $504_3$ will be signalled to send a READY symbol, requesting resumption of the flow of the symbol stream.

At the other end of the TNet link L, the device that was sending the message packet responds to receipt of the BUSY command symbol at the input link with FILL command symbols transmitted on the associated output command link. The sending device will continue to send FILL symbols, withholding further transmission of the message packet, until the device which sent the BUSY command symbol sends a READY symbol. Transmission of the message packet resumes until complete, or until backpressure is again asserted by the receiver.

It should be noted that not only must the elastic FIFOs 506 be large enough to handle this "backpressure" jitter, but it must also be able to store data symbols that accumulate in the FIFO while control symbols are being inserted into the symbol stream for control of the TNet links L in other directions. A BUSY/READY combination will steal two cycles from the port output 504 causing the elastic FIFO 506 supplying that port output 504 to fill up by two characters. In order to keep jitter to a minimum, the sizing of the elastic FIFOs 506 (and the placement of the high and low water marks) must allow for at least two characters to be inserted into the stream before backpressure is asserted, and preferably more. Within the environment of the system described herein, the elastic FIFOs 506 are able to temporarily store 96 symbols.

The router 14A will allow for a predetermined number of symbols to be inserted before backpressure is required (backpressure will be issued on the next symbol after the predetermined number is received and temporarily stored). The 96-symbol depth of the elastic FIFOs 506 will allow for a normal buildup of a predetermined number of symbols, and 12 cycles of backpressure delay before a port input 502 must cease (assert backpressure) accepting data, or suffer the ignominy of loss of data by overflow.

Each of the port inputs 502 are substantially identically structured so that discussion of one will apply to all. Accordingly, as illustrated in FIG. 20A, the detailed block diagram of the port input $502_0$ for port 0 is shown. The port input $502_0$ receives each 9-bit data/command symbol at an input register 516 where it is temporarily stored by the accompanying transmit clock (T_Clk). The received symbols are then communicated from the input register 516 and applied to a clock synchronization FIFO 518, also by the T_Clk. The clock synchronization FIFO 518 is logically the same as that illustrated in FIGS. 8A and 8B, used in the interface units 24 of the CPUs 12. Here, as FIG. 20A shows, the clock synchronization FIFO 518 comprises a plurality of registers 520 that receive, in parallel, the output of the input register 516. Associated with each of the registers 520 is a two-stage validity (V) bit synchronizer 522, shown in greater detail in FIG. 20B, and discussed below. The content of each of the registers 520, together with the one-bit content of each associated two-stage validity bit synchronizer 522, are applied to a multiplexer 524, and the selected register/synchronizer pulled from the FIFO, and coupled to the elastic FIFO 506 by a pair of registers 526. Selection of which register 520 receives the content of the input register 516 is determined the state of the Push Select signal provided by a push pointer logic unit 530; and, selection of which register 520 will supply its content, via the MUX 524, to the registers 526 is determined the state of a Pull Select signal provided by pull pointer logic 532. The push and pull pointer logic 530, 532 are under the control of sync FIFO control logic 534. The sync FIFO control logic 534 receives the incoming T_Clk to operate the push pointer logic 530 (as well as the input register 516) and loading of the register 520 selected by the push pointer logic 530. Similarly, the synchronization FIFO control logic 534 receives the clock signal local to the router (Rcv Clk) to control the pull pointer logic 532.

Figure 20B:
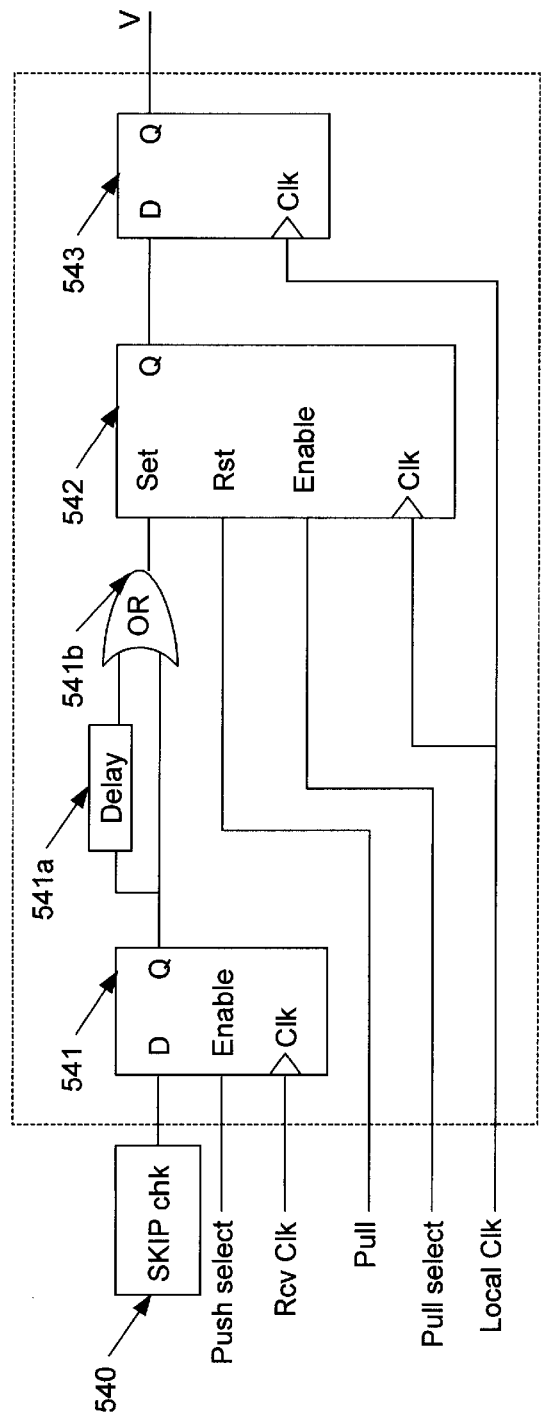
FIG. 20B is a block diagram of the synchronization logic used to validate command/data symbols received at an input port of the router unit of FIG. 19A.

Digressing for a moment, and referring to FIG. 20B, the validity bit synchronizer 522 is shown in greater detail as including a D-type flip-flop 541 with enable function, a delay element 541a, an OR gate 541b, a D-type flip-flop 542 (with set/reset/enable capability to provide the functions shown in the Truth Table shown below), and a D-type flip-flop 543. The D-type flip-flop 541 is coupled to receive the output of the SKIP check logic 540 at its data (D) input. The Enable input of the flip-flop 541 receives the decode provided by the push pointer 530, Push select, and the clock (Clk) of the flip-flop 541 receives the incoming transmit clock (T_Clk) accompanying the incoming symbols. The output (Q) of the flip-flop 541 is applied to one input of the OR gate 541b, and also to the other input through the delay element 541a. The output (Q) of the flip-flop 541 is set (to a logic "one" level) when the Push Select signal from the pointer logic 530 (FIG. 20A) selects the register 520 of the FIFO with which the validity bit synchronizer is associated for receipt of the next symbol—if not a SKIP symbol.

The delay element 541a and OR-gate 541b operate to form a pulse stretching circuit of conventional design, ensuring that the signal at the Set input of flip-flop 542 has a duration of at least one clock period. That being the case, and given the knowledge that the local (to the router) Rcv Clk and received T_Clk signals have similar, if not identical frequencies, it becomes clear that at least one active transition of the Rcv Clk will allow the flip-flop 542 to record the stretched signal by setting the output (Q) of the flip-flop (see the Truth Table, below). The D-type flip-flop 543 acts as an additional stage of synchronization, ensuring a stable level at the V output relative to the local Rec Clk. The Pull Select signal, a decode of the pull pointer 532, connects to the enable input of the flip-flop 542, allowing the Pull signal (a periodic pulse from the sync FIFO Control unit 534) to clear the validity bit on this validity synchronizer 522 when the associated register 520 has been read.

Truth Table

| Set | Rst | Enable | $Q_n$ | $Q_{n+1}$ |
|---|---|---|---|---|
| 1 | X | X | X | 1 |
| 0 | X | 0 | 0 | 0 |
| 0 | X | 0 | 1 | 1 |
| 0 | 1 | 1 | X | 0 |
| 0 | 0 | 1 | 1 | 1 |
| 0 | 0 | 1 | 0 | 0 |

In summary, the validity synchronizer 522 operates to assert a "valid" (V) signal when a symbol is loaded in a register 520 of the FIFO 518 to identify that symbol as being a valid symbol. If, on the other hand, the symbol is a SKIP symbol, the output of the SKIP check logic 540 goes LOW, causing the flip-flop 541 (i.e. the data (Q) output) to remain zero, indicating that the associated symbol is not valid, and should be disregarded.

Continuing with FIG. 20A, the content of the input register 516 is also applied to SKIP check logic 540. Receipt of a SKIP command symbol, when detected by the SKIP control logic 540, operates to inhibit operation of the push pointer logic 530, and precludes loading that symbol into the clock sync FIFO 518 for the one accompanying clock period of T_Clk. The receipt of a SKIP command symbol does not advance the push pointer 530 or cause the validity bit V to be set, in effect keeping the pull side of the FIFO ignorant of the receipt of the SKIP symbol by the push side.

Incoming data/command symbols passed from the register pipeline 526 are also applied to command decode logic 544 where any command symbols of the incoming stream are decoded and used to control the FIFO control logic 546. In addition to operating the elastic FIFO $506_0$, the FIFO control logic 546 operates to generate the necessary handshake signals to the port outputs 504 that will receive the symbols from the port input $502_0$ via the crossbar logic 500.

The command/data symbols are also applied to protocol and packet checking logic 550 which operates to verify link level and packet protocol, including the link-level "keep-alive" protocol (discussed below), the message packet termination checks, etc.

Those symbols that are not command symbols (which, when found, are extracted from the symbol stream), i.e., data symbols, are passed to and stored in the elastic FIFO $506_0$ from which, when accessed, are communicated to the crossbar logic 500. The Destination ID of the message packet is also communicated to a target port selection logic 560. The target port selection logic 560 operates to determine from the received Destination ID and information of certain of the router's configuration registers, the "target port" address of the port output 504, to which the message is to be routed for transmission. The target port selection logic 560 develops a three-bit code that is applied to and used by the crossbar logic 500 to make the appropriate cross-connection.

However, the selected port output 504 must be "enabled" to receive message packets from the port input $502_0$. For this purpose the port input $502_0$ includes a 6-bit port enable register 562, containing information as to which port outputs 504 are authorized to receive message packets from the port input $502_0$. Each bit position of the port enable register 562 corresponds to one port output 504, and depending upon the state of the particular bit position, the corresponding port output may be "enabled" to have message traffic routed to it from the port input, or "disabled," precluding message traffic being routed thereto from the port input $502_0$. For example, assume that the port input $502_0$ begins receiving a message packet having destination information that would cause the target port selection logic to identify the port output $504_4$ as the destination port. However, assume further that the state of port enable register 562 is such that the port output $504_4$ is not authorized to receive message traffic from the port input $502_0$. This being the case, the content of the port enable register 562 will operate to prohibit any selection information developed by the target port selection logic 506 from being applied to the crossbar logic 500. Rather, the packet will be dropped, and an error signal created to indicate that the router 14A had received a packet destined for a port not authorized for the port at which the packet was being received. The error is reported to the MP 18 via the OLAP 285' (FIG. 19A).

The port enable feature, therefore, operates to selectively prevent certain routing paths through the router 14. This feature can be an important mechanism in preventing deadlock conditions. A deadlock condition occurs when a network used to communicate messages contains "routing loops" formed by routing devices and interconnecting links. What happens is a message received at one routing device is blocked from being routed out a particular port because another message is already in the process of being routed out that port. However, that other message in turn is also blocked at another routing device by a third message, and so on. All messages are each blocked in a circular loop. Nothing moves because each message in the loop is blocked by, and is blocking, another message in the loop; the messages are deadlocked. Without proper design, large routing networks can give rise to the possibility of a number of environments for deadlock resulting in groups of message packets unable to make further progress through the communicating network because of such circular dependencies in which each of a group of message packets must wait for another to proceed before acquiring access to a communication link. By being able to disable certain communication paths through the router, one can eliminate any possible routing loops, and thereby the possibility of a deadlock occurring.

Of course, the first line of defense against routing loops and the possibility of deadlock would be to ensure that proper routing information is used to select the target port address so that an incoming message packet is not routed out a port of the router 14 that could be part of a routing loop. But the capability of disabling certain routing paths through the router 14, as accomplished by the port enable registers, ensures that routing or other errors do not result in deadlock conditions. Implementation of this concept is discussed in greater detail below.

Again, continuing with FIG. 20A, as the headers of incoming message packets are received, the Destination IDs are serially passed to the target port selection logic 560 and examined there on a first-come-first-served basis. The target port selection logic 560 will develop a target port address, identifying the designated port output. That address is applied to the crossbar logic 500 to make the appropriate crossbar selection that will communicate the output of elastic FIFO 506 receiving the message packet to the appropriate port output 504—provided, as indicated above, the selected port output 504 is enabled for the port input. (If the router 14 is one with TNet connection directly to the CPUs 12, and operating in duplex mode, an incoming message packet bound for the CPUs will be replicated by the crossbar logic unit by routing the message packet to both port output $504_4$ and $504_5$ at the same time.)

The target port selection logic 560 is illustrated in greater detail in FIG. 21A, and is shown as including a destination register 570 that receives, from the elastic FIFOs 506 of the port outputs 502 (FIGS. 19 and 20A), the 3-byte Destination ID of the incoming packet. The Destination ID includes the three fields discussed above with respect to FIG. 3B: Region ID, Device ID, and a 1-bit field containing the path select bit (P). The Region ID, as the name suggestions, identifies a destination by region, and the device ID is indicative of the particular device within that region. The path select bit (P) identifies which of path (X or Y) should be used for accessing two sub-processing the device.

The routers 14 provide a capability of constructing a large, versatile routing network for, for example, massively parallel processing architectures. Routers are configured according to their location (i.e., level) in the network by the information set in certain of a router's configuration registers contained in control logic 509. These configuration registers are shown in FIG. 21A as the upper region ID register $509_a$, lower region ID register $509_b$, the HiLo register $509_c$, the default port register $509_d$, the cross-link port register $509_e$, the route to default register $509_f$, the device ID compare register $509_g$, and the side register $509_h$. Two additional configuration registers are shown in FIG. 21C as the device position and with registers $509_j$ and $509_k$, respectively. The content of these various configuration registers, together with the Destination ID and accompanying path select bit (P) of a message packet, determines selection of the port output 504 to which the message packet will be routed through the crossbar logic 500.

The level of a router determines, in part, which portions of the Destination ID will be used in the selection of a target port, and whether an algorithmic address selection can be used. For this purpose, the Region ID is further divided into two overlapping 10-bit level identifications. The most significant 10-bits of the content of the Region ID defined as the an upper level, while the least significant 10-bits of the Region ID specify a lower level. Both level identifications are applied to corresponding one of two 10-bit inputs of a multiplexer 572. The multiplexer 572 selects one of the two 10-bit inputs in response to the content of the HiLo register $509_c$ which identifies router's level (upper or lower), and supplies the selected 10 bits to a routing table 584 as an address.

FIGS. 20A and 21A illustrate the port inputs 502 as each having their own, individual target port selection logic 560, and routing table 584. To minimize space, however, it will be evident to those skilled in this art that a single routing table can be shared by the target port selection logic of all six port inputs 502. The output of the multiplexer 572 may itself multiplexed to the routing table 584 (which may be contained in the status and control logic 509) on an arbitrated basis, using a conventional round robin arbitration method. The result of the access of the routing table is returned and applied to and input of the multiplexer 586. For simplicity, this arbitration and multiplexing is not shown in FIG. 21A.

The 4 most significant bits of the Region ID are also applied to a 4-bit compare circuit 574 where they are compared to the content of an upper region ID register $509_a$. The least significant 10-bits of the Region ID are coupled to a compare circuit 578 where they are compared to the content of the lower region ID register $509_b$.

The routing table 584, which may be in the form, for example, of a random access memory, operates to store a plurality of 3-bit target port identifications. When addressed by one or the other 10-bit portions of the Region ID, the three bits of target port selection information are coupled to one input of the multiplexer 586; the other input of the multiplexer 586 receives the 3-bit content of the default port register $509_d$. Selection of the output of the routing table 584 by the multiplexer 586 is made by either the content of HiLo register $509_c$, when a ONE (indicating that the router is an upper level router), or a successful compare between the content of the upper Region ID register $509_a$ and the four MSBs of the Region ID by the compare circuit 574 (indicating that the destination is in the same "high region" as this "low level router"). If neither of those conditions are satisfied, the multiplexer 586 selects instead the (3-bit) content of the default port register $509_d$ as a target port identification.

The routing table 584 may be of any size. However, as is evident to those skilled in this art, the size of the routing table 584 will be dictated by such factors as the number of addressable elements of the system in which the router is used, and the room available for the table. The target port selection logic 560 implements a novel compromise by combining the use of a table look-up technique when required, or algorithmic routing when not required, in order to save space in the routing table. This combination allows incoming messages packets to be passed to, and transmitted from, any one of the six available ports of the router 14, and provides a very diverse routing capability.

The 3-bit target port identification selected by the multiplexer 586 is communicated to one (3-bit) input of yet a further multiplexer 590 that selects between the output of multiplexer 586 and the 3-bit content of the cross-link port register $509_e$. Which of the two values is selected is determined side (i.e., X or Y) of the ultimate destination as indicated by the state of the path select bit (P) of the incoming message. The path select bit (P) of the incoming message packet is compared to the content of the side register $509_h$ by comparator 592 whose output effects the selection made by the multiplexer 590. If the router is not on the same side (X or Y) as that to which the message packet is destined, the output of the comparator 592 will effect selection of the content of the cross-link port register $509_e$. This will route the message packet to that port output 504 that will, either directly or indirectly (i.e., through another router or routers) route the message packet from the X or Y side containing the router to the other side—containing the message packet's destination.

The selection made by the multiplexer 590 is applied to an input of a multiplexer 594 whose selection input receives the output of AND gate logic 596. The multiplexer 594 selects between the port address supplied by the multiplexer 590 and a multiplexer 598. Multiplexer 598, in turn, selects between the output of algorithmic routing logic 600 and the content of the default port register $509_d$. This selection is made by the select and compare circuit 601 which receives the content of the device ID (configuration) register 509g and a selected portion of the six bits of Device ID of the incoming message. Not specifically shown is that device bit position and expansion registers $509_j$, $509_k$, respectively, of the algorithmic routing logic 600 (FIG. 21C) are also applied to the select and compare circuit 601. The values contained in the device bit position and expansion registers $509_j$ and $509_k$ operate to mask the message's Device ID bits of the message so that only the high order bits of the Device ID not used by the algorithmic routing technique are compared to the content of the device ID register 509g.

A match between the selected (masked) bits of the message's Region ID and the content of the Device ID register $509_g$ results in selecting the results of the algorithmic router 600 with the multiplexer 598 as the possible target address. For example, if the Region ID is "abcdef" (a being the high-order bit), and the values contained in the device bit position and expansion registers $509_j$ and $509_k$ are such that bits "def" are used in the algorithmic process, then bits "abc" of the Region ID are compared to the content of the Device ID register $509_g$ by the select and compare circuit 601. Conversely, if bits "cdef" are used for algorithmic routing, only bits "ab" are compared to the content of the device ID register $509_g$.

Which bits of the message's Device ID are or are not involved in algorithmic routing are also determined by the device bit position and expansion registers $509_j$, $509_k$ as discussed below with respect to FIG. 21C.

The algorithmic routing logic 600, the operation of which is discussed more fully below, receives the 6-bit Device ID and information supplied by device bit position and expansion registers $509_j$, $509_k$ (not shown in FIG. 21A for reasons of clarity, see FIG. 21C), to develop therefrom a 3-bit target port identity that may be selected in place of target port identities supplied by the routing table 584 or content of the default register $509_d$. Algorithmic routing logic 600 is used only if the router is configured as a low level router.

The selection made by the multiplexer 594 is applied to a final multiplexer 599 which passes that selection, or the 3-bit content of the default port register (depending upon the state of the content of the route to default register $509_f$) to the final stage of the selection process: check logic 602.

Check logic 602 operates to check the status of the port output identified by the product of the target port selection decision: the output of the multiplexer 599. For example, the target port identification must be valid (i.e., not 6 or 7). Other checks are also made, one of which is that the identified port output must be "enabled" for the particular port input seeking access as discussed above. It is this latter check that is used as a backup against errors that can create the routing loops, and in turn resulting in possible deadlock conditions occurring.

Check logic 602, as FIG. 21A shows, receives the content of the port enable register 562 of each of the six port outputs 502. As indicated, the content of each port enable register 562 identifies, for each input port 502, which of the output port 504 an incoming message can be routed and, of course, which cannot. Thus, for example, if port 0 receives message traffic containing a Destination ID indicating that the message is to be routed for transmission from port 3, the selection logic 560 will develop a 3-bit quantity identifying the target port as port 3, and apply that quantity to the check logic 602. Further, if it turns out that message traffic transmission from port 3 is not allowed for incoming message traffic received at port 0, the content of the port enable register 589 for port 0 will block communication of the target port address to the crossbar logic 500. The message will be routed instead to a non-existent output of the crossbar logic 500, and in effect discarded, and an error signal generated to notify the MP system 18.

On the other hand, if port 3 is enabled for message traffic routed from port 0, the check logic 602 will pass the target port identification developed by the selection logic 560 to the crossbar logic 500, causing the message to be routed to port 3.

The check logic 602 is of conventional design, comprising for example combinational logic structured to implement the checks and decisions to be made in conventional fashion.

It is for the reason, at least in part, of limiting the component count of the target port selection logic, and the size of the routing table 584, that the conceptual hierarchy of upper and lower levels has been visualized. And, it is according to that hierarchy that a router 14 may be designated an upper or a lower level router, and may be located in one or another of the sub-processing systems 10A, 10B. Whether a router is an upper level or lower level router depends upon the configuration of that router as determined by the information written to its various configuration registers of control logic 509, which also defines which portions of the region ID of the incoming message will be used to address the routing table 584.

Figure 21B:
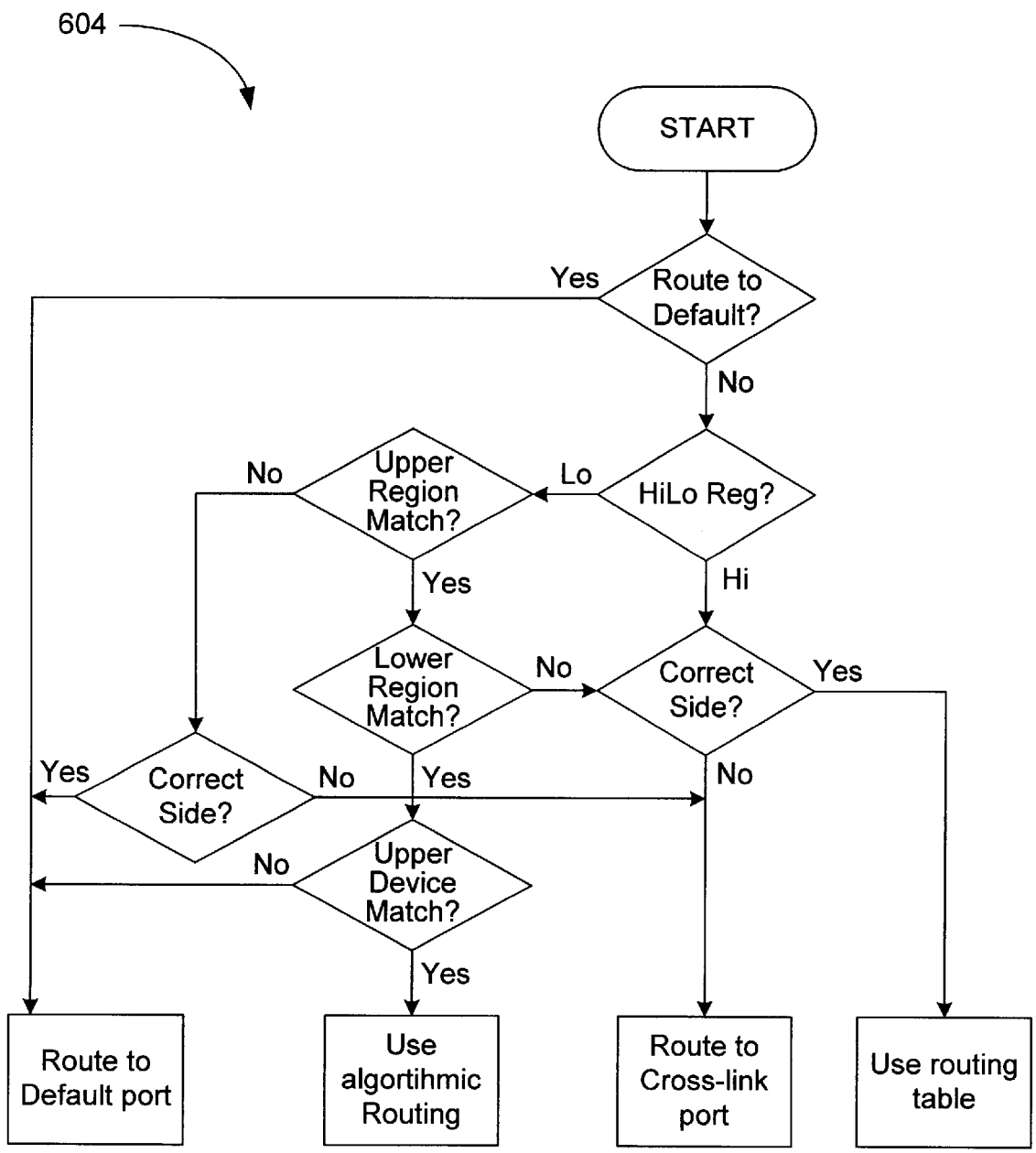
FIG. 21B is a decision chart illustrating the routing decisions made by the target port selection logic of FIG. 21A.
Figure 21C:
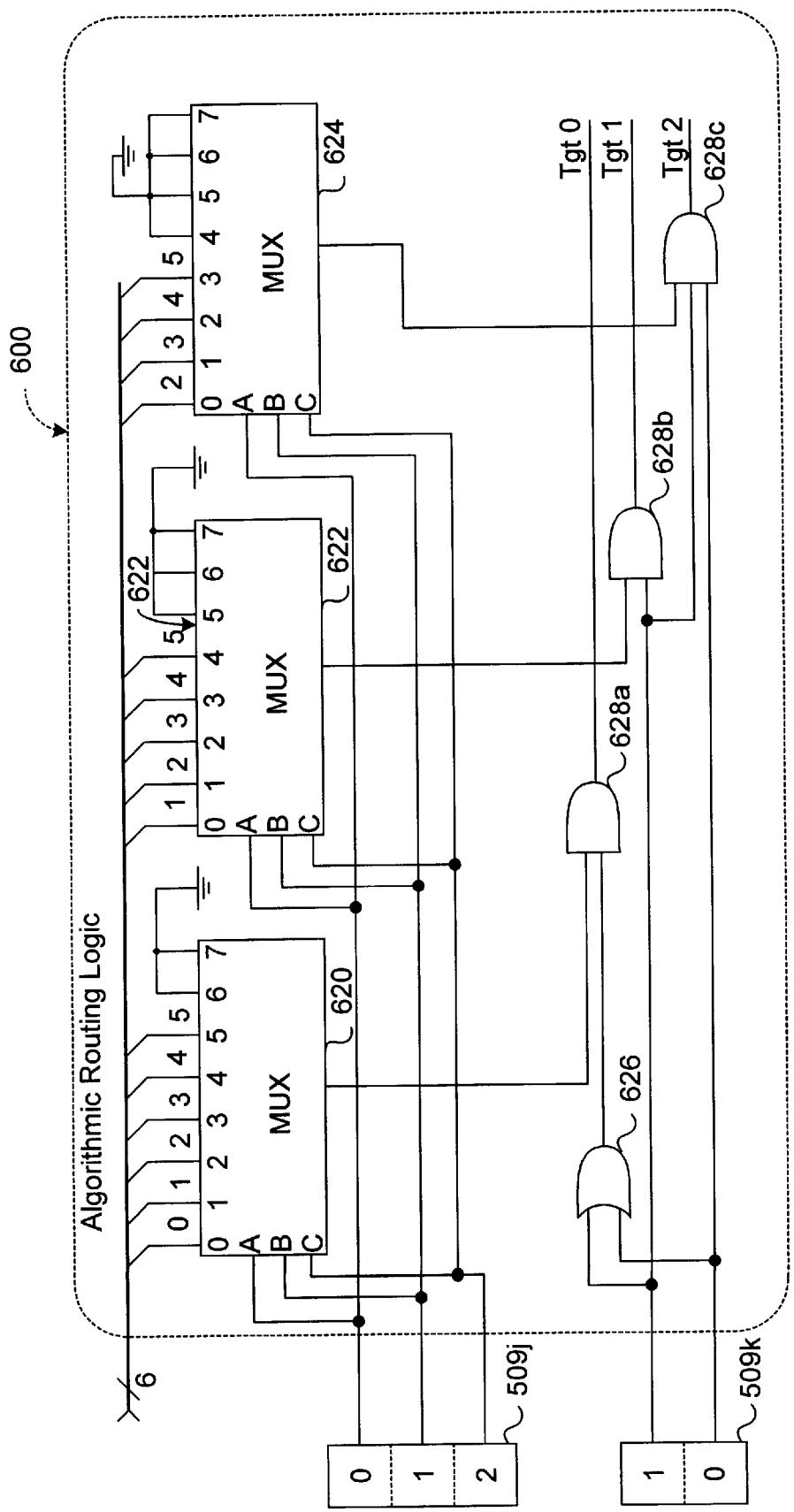
FIG. 21C is a block diagram of the algorithmic routing logic that forms a part of the target port selection logic of FIG. 21A.

With these concepts in mind, FIG. 21B shows the decision chart 604 used to select the ultimate target port address that is used to select the route of an incoming message packet through the crossbar logic 500 to the appropriate port output. The decision chart 604 illustrates the decisions made based upon the Destination ID (and path select bit P) of the incoming message packet and that router's configuration—as specified by the content of its configuration registers (i.e., registers $509_a$ . . . , $509_h$ shown in FIG. 21A).

As FIG. 21B shows, overriding all decisions is the content of the route to default register $509_f$; if set to select the content of the default port register $509_d$, all other information (Destination ID, path select bit P, the content of other configuration registers, etc.) become superfluous.

As explained above, each router is configured as either an upper or a lower level router. The router level determines which bits of the Destination ID are used to address the routing table 584 and whether algorithmic routing is to be used. High level routers (so identified by the content of HiLo register $509_c$) use either the routing table, a cross-link address, or a default address. Low level routers (HiLo register $509_c$ contains a ZERO) use table-based, default, cross-link, and algorithmic routing.

Generally, routers configured to be high level routers are used to interconnect network "clouds" (arbitrary networks) consisting of a number of routers 14 and interconnecting TNet links L communicating a number of CPUs 12 and I/O devices 16 to one another, forming a massively parallel processing (MPP) system. Other such MPP systems may exist, and it is those routers configured as high level routers that are primarily used to interconnect such the network clouds of one MPP system to other MPP systems.

Returning for the moment to FIGS. 19 and 20A, the Destination ID of incoming message packets, when received by the input logic 502 of the particular port, will be communicated to the elastic FIFO 506, and from the elastic FIFO 506 to the register 570 of the target port selection logic 560 (FIG. 21A) where it is captured. As soon as the message packet's Destination ID is so captured, the selection process begins, proceeding to the development of a target port address that will be used to direct the message packet through the crossbar logic to the proper output port - provided that output port is enabled, both generally, and for the particular input port receiving the message packet.

Turning now to FIG. 21C, the algorithmic routing logic 600 is illustrated in greater detail as comprising three 8-bit to one multiplexers 620, 622, and 624. The three selection inputs (A, B, C) of each of the multiplexers 620, 622, 624 receive the content of a 3-bit device position register $509_j$, another of the configuration registers contained in the control logic 509. The inputs (0, 1, ... ) of each multiplexer 620, 622, 624 receive predetermined ones of the six bits of the Device ID. The content of the device position register $509_j$ will control selection of which three bits to use as the target port address according to the coding of Table 4, discussed below.

The three bits of the Device ID selected by the MUXes 620, 622, 624 are not used directly. Rather, the selected bits are applied to combinational logic comprising a two-input OR gate 626 and three AND gates 628 (628a, 628b, and 628c), conditioned by the content of a 2-bit width register $509_k$, another of the configuration registers contained in the control and status logic 509 (FIG. 509). The product of the combinational logic is a 3-bit target port identification. The width field specifies the number of device field bits to use for port selection. A width field value of 0 (zero) implies that all algorithmically addressed devices connect through port 0. A width field value of three implies that algorithmically addressed devices can connect to any port.

The content of the device field width expansion register $509_k$ specifies the selection of bits to use for designating the target port address that will be applied to the crossbar logic 500. The values and meaning of the position and width bits are set forth below in Tables 4 and 5.

TABLE 4

| Device Bit Position | Device ID Bits Used |
|---|---|
| 000 | 2,1,0 |
| 001 | 3,2,1 |
| 010 | 4,3,2 |
| 011 | 5,4,3 |
| 100 | 5,4 |
| 101 | 5 |
| 110 | NA (Target Port = 0) |
| 111 | " |

TABLE 5

| Device Field Width Expansion | No. of Device ID Bits Used |
|---|---|
| 00 | 0 |
| 01 | 1 |
| 10 | 2 |
| 11 | 3 |

Table 5 shows which bits of the Device ID of the incoming message packet are selected by each of the MUXes 620, 622, 624. Thus, for example, for a (binary) value in the device bit position register $509_j$ of 000, will cause the MUXes 620, 622, and 624 to select bits 2, 1, and 0, respectively, from the Device Id of the incoming message packet. Conversely, if the content of the device bit position register $509_j$ is a binary 100, only bits 5 and 4 are respectively selected by the MUXes 620 and 622 of the Device ID; the output of the MUX 624 is forced to a ZERO for the remaining bit position. Values of 110 and 111 (binary) in the device bit position register $509_j$ will cause the outputs of the MUXes 620, 622, and 624 to be forced to ZERO, selecting target port 0.

The bits so selected by the MUXes 620, 622, and 624 are used according to the content of the device field width expansion register $509_k$. Thus, as FIG. 6 shows, a width value of 00 selects none of the bits from the MUXes 620, 622, and 624, forcing a target port address of 000. Conversely, a width value of 10 in the device field width expansion register $509_k$ will use two of the bits selected by the MUXes 620, 622, and 624.

The result is a 3-bit target port number, in many cases, with a restricted set of values. The effect is to generate a 3-bit field, starting at the bit position specified by the content of register $509_j$ with a width specified by the content of register $509_k$.

Returning again for the moment to FIGS. 19 and 21C, the output ports 504 are responsible for ordering the message packets. In general, the message packets are accepted and routed by a port output 504 on a first come, first serve basis. However, once a message packet is being transmitted from a particular port output, several others may be held up waiting for access to that port output. Thus, arbitration methods may be necessary to select between these packets. A number of conventional arbitration techniques can be used, such as round-robin arbitration. However, the preferred arbitration technique is that disclosed in co-pending U.S. patent application for Biased Routing Arbitration of Message traffic in a Communications System, Ser. No. 08/409,756, filed Jun. 6, 1995, and assigned to the Assignee of this application.

Figure 22:
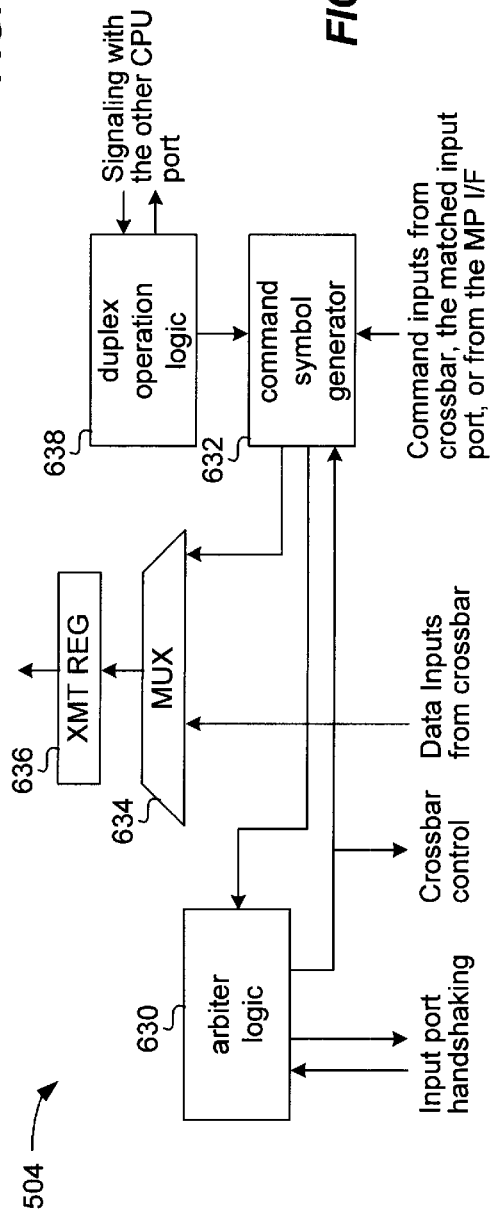
FIG. 22 is a block diagram illustration of one of the six output ports of the router unit shown in FIG. 19A.

Briefly, each port output 504 includes the autonomous arbiter logic 630 (FIG. 22). These arbiters 630 take routing requests from each of the port inputs 502, and grant such service in an order that is based on a biasing technique in which each port input 502 is in effect, provided a bias value that is representative of a ratio of the total bandwidth of any port output that it is allowed to use.

According to this arbitration technique, port inputs 502 having message traffic to be routed to one of the port outputs 504 will signal their request for access. If two or more port inputs are seeking access, the requested port output will arbitrate the port inputs by comparing the bias values of each, selecting one (e.g., the port input with the highest bias value) for access. The port input (or port inputs) losing arbitration will have their corresponding bias values modified to increase their chances during the next arbitration; the winning port input 502 also has its bias value modified, but to decrease its chance at winning the next arbitration.

Turning now to FIG. 22, there is illustrated a block diagram of the port output $504_n$ from which message packets are transmitted by the router 14A (FIG. 19A). The basic components and their functions of the port output 504 are:

arbiter logic 630 which operates to arbitrate among input ports, determining the order in which packets are transmitted by the output port.

command symbol generator 632 which operates to generate and insert command symbols (using multiplexer 634) into the symbol stream as necessary to maintain and follow protocol rules. For example, when the router 14A finds that it is unable to transmit because the receiving element is busy, the associated port output 504 must impose "backpressure" by halting message packet transmission in response to receipt of a BUSY command symbol, and inserting FILL or IDLE symbols until the transmission of the message packet can resume as indicated by receipt of a READY command symbol. It sends fill symbols if it must stop a message packet already in progress. Alternatively, if the port of the router 14A was dormant(no message packet being sent) when the BUSY command symbol was received, it will IDLE, and delay the start of a message packet until a READY command symbol is received from the system element that earlier sent the BUSY command symbol. The FILL symbols are supplied to the port output 504 by the command symbol generator 632. The protocol also requires the output logic to implement a "keep-alive" mechanism: the periodic transmission of symbols (i.e., BUSY, IDLE, in absence of a message packet) to inform the receiving element that the router 14A is still in an operating condition. The type of symbol used as the keep-alive depends upon the mode of operation then existing. For example, during periods of no message traffic, READY symbols will be used and periodically sent with each clock period or cycle of the transmit clock, T_Clk. Alternatively, if a port output has exerted backpressure, BUSY symbols will be sent. Failure to receive any symbol at all, within a prescribed amount of time (e.g., 10.24 microseconds) will result in an error that will be posted to the MP18 via the router's (or interface unit's) OLAP for action.

Digressing, it should be appreciated that these protocol rules observed by the routers 14 are also observed by the CPUs 12 (i.e., interface units 24) and I/O packet interfaces 17.

Finally, when the router 14A is in the system 10 (FIG. 1A) to communicate directly with the CPUs 12A, 12B, and duplex mode is used, a duplex operation logic unit 638 is utilized to coordinate the port output connected to one of the CPUs 12A, 12B with the other also connected to one of the CPUs 12A, 12B.

Each of the port outputs 504 of the router 14A is responsible for packet ordering. In general, the packets are routed on a first-come, first-served basis. However, once a packet is being transmitted, several others may be held up waiting. It is the function of the arbiter logic 630 of each output port output 504 to take routing requests from each of the router input logic 502, and grant the output port to each input port requesting service in the proper order based on the priority scheme discussed in the above-identified co-pending application. Each arbiter 630 of the port output 504 will signal all other arbiters 630 when it grants a request.

It is the clock sync FIFOs 518 of the input logic that receive pairs of identical symbols (in duplex operation) communicated from the two CPUs 12. Each clock sync 518 FIFO can adjust for any delay-caused skew occurring between the symbol streams from the two CPUs 12.

It will be remembered in connection with discussion of the CPUs 12, above, there was included in the MC an on-line access port (OLAP) that provided MP 18 with communication access to the CPU 12. The MP 18 was able to write instructions to the OLAP 285 that would be executed by the processors 20 to build a small memory image and routine to permit the CPU 12 to complete a boot (start-up) operation. Similar access is provided the MP 18 to the routers 14. Returning for the moment to FIG. 19A, the router 14A is illustrated as including an OLAP 285' that includes a number of configuration registers, such as the upper and lower region registers 509a, 509b (FIG. 21A) of the target port selection logic, and the device bit position and expansion registers 509j, 509k of the algorithmic routing logic 600 (FIG. 21C). During initialization of the sub-system containing 10A the router 14A, the configuration registers contained in the OLAP 285' will be written with information by the MP 18 (via the OLAP bus 287') to provide the router 14A with a configuration that will allow it to operate in one manner or another.

However, the router 14A may pass information (error indications, etc.) to the MP 18 through the OLAP 285'. For example, each message packet routed by the router 14A will have its CRC checked, as indicated above. If the CRC of the packet is determined by the router 14 to be bad, then in addition to tagging the message packet with a TPB symbol, the router flags the MP 18 by setting an error register (not shown) contained in the OLAP 285' that can later be read by the MP 18. Thus, the system is provided with a means for reporting a transmission fault through this feature.

Clocking

Figure 24:
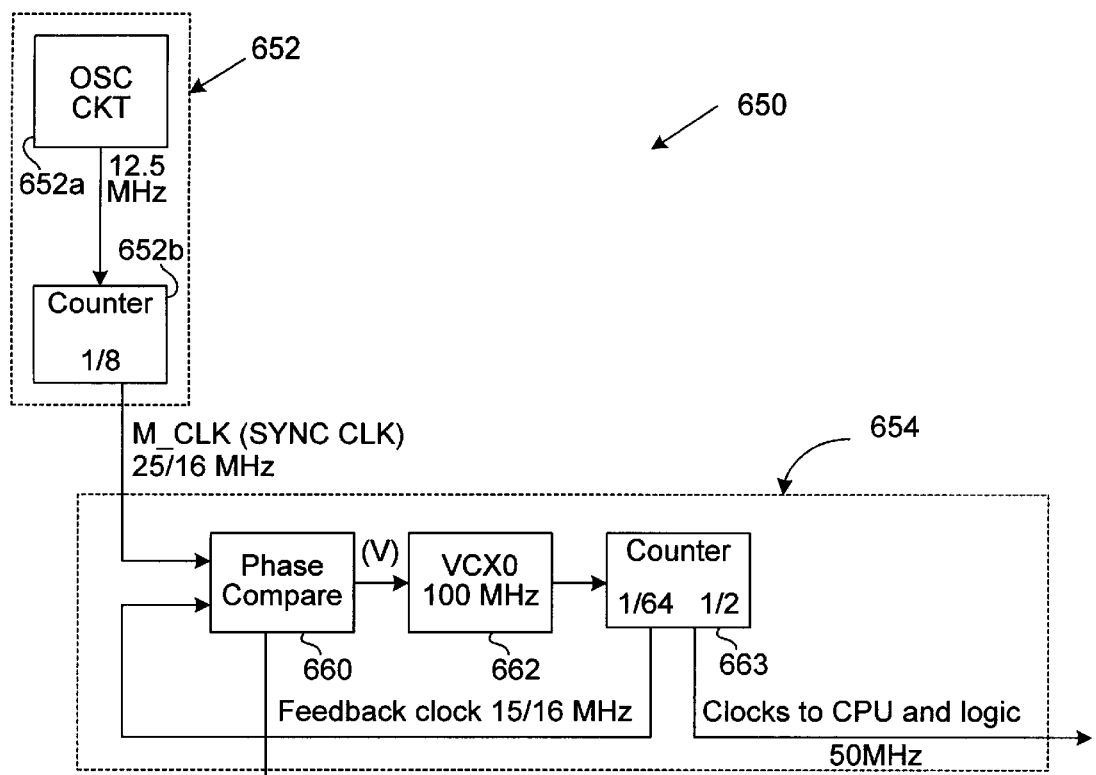
FIG. 24 is a simplified block diagram illustrating the clock generation system of each of the sub-processing systems of FIGS. 1A–1C for developing the plurality of clock signals used to operate the various elements of that sub-processing system.

Obviously, if CPUs 12 are to properly operate as synchronously matched pairs in the duplex mode, the clock signals they use must be in synchronism. FIG. 24 shows the clock generation circuit design. There will be one clock generator circuit in each sub-processor system 10A/10B (FIG. 1) to maintain synchronism. Designated generally with the reference numeral 650, the clock generator circuit includes an oscillator circuit 652 that comprises a crystal oscillator circuit 652a and a divide-by-eight counter 652b. The crystal oscillator circuit 652a produces a periodic signal with a frequency of 12.5 Mhz that is divided by 8 to develop a master clock (M_CLK) signal with a frequency of 25/16 Mhz (i.e., 1.5625 Mhz). The M_Clk signal is also applied to SYNC CLX. Applied to clock generator 654, the M_Clk signal is used to develop a number of 50 Mhz clock signals, all phase-locked to M_Clk. These 50 Mhz signals are distributed to and used by the various elements (e.g. CPU. 12, routers 14, etc.) of the sub-processor system containing the clock circuit 650 (e.g., 10A).

The clock generator 654 is shown as including a phase comparator 660 connected to receive and compare the M_CLK signal with a feedback clock signal, phase-locked replica of itself. The output of the phase comparator circuit 660, an analog voltage (V) indicative of the phase difference between the M_CLK and the feedback clock signal, is applied to a voltage controlled crystal oscillator (VCXO) 662 to maintain the lock of the 50 Mhz signals produced by the clock generator to the M_CLK signal, both in phase and frequency. If the phase comparator 660 detects a phase difference between the M_CLK and feedback signals greater than a predetermined phase range, it will de-assert a LOCK signal to indicate loss of phase lock.

The VCXO 662 (FIG. 24) is a 100 Mhz voltage controlled crystal oscillator configured to operate within tight tolerances. The product of the VCXO 662 is applied to a synchronous counter that counts down (divides) the output of the VCXO 662 by 2 to produce the 50 Mhz signals, and by 64 to produce a replica of the M_Clk signal, the feedback signal. The 50 Mhz clock signals produced by the counter 663 are distributed throughout the sub-processor system where needed.

Figure 25:
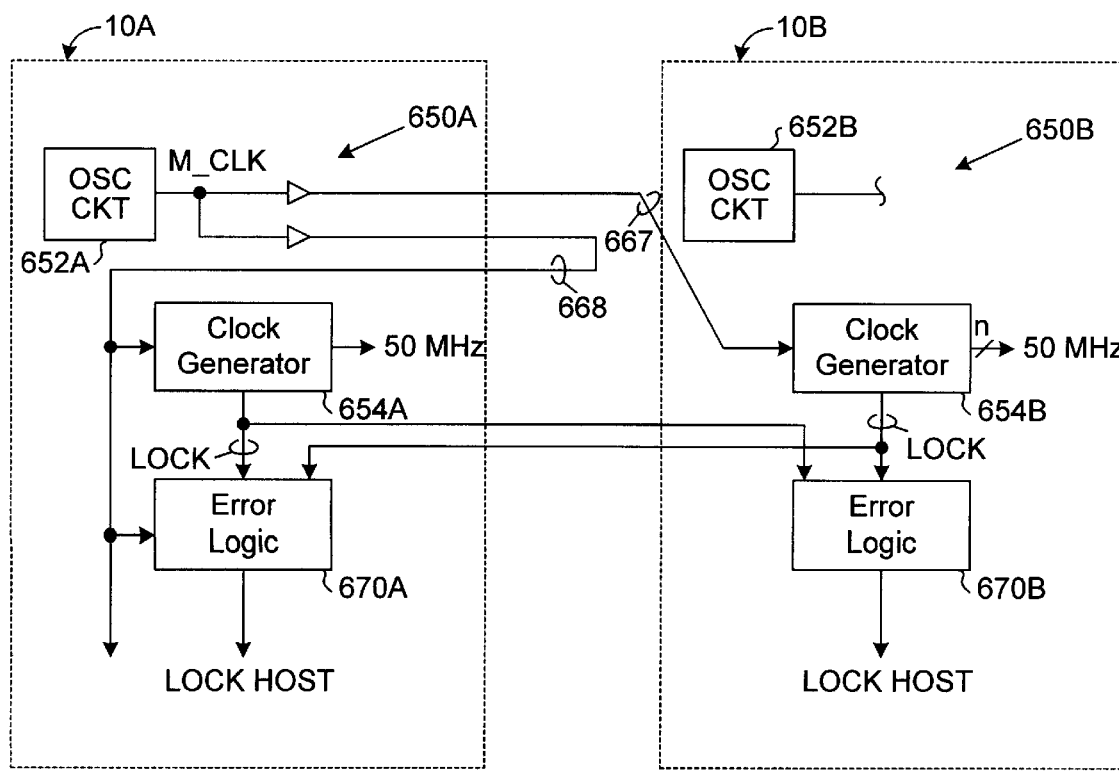
FIG. 25 illustrates the topology used to interconnect the clock generation systems of paired sub-processing systems for synchronizing the various clock signals of the pair of sub-processing systems to one another.

Turning now to FIG. 25, there is illustrated the interconnection and use of two of the clock circuits 650 used to develop synchronous clock signals for a pair of sub-processor systems 10A, 10B (FIG. 1) for frequency locked operation. As illustrated in FIG. 25, the two CPUs 12A and 12B of the sub-processor systems 10A, 10B each have a clock circuit 650, shown in FIG. 25 as clock circuits 650A and 650B, including oscillator circuits 652A, 652B. However, only the clock oscillator 652 of one of the CPUs 12 is used for developing the M_CLK signal for both CPUs 12. FIG. 25 shows the oscillator circuit 652A of the CPU 12A being used to drive the clock generators 654A and 654B of both CPUs 12. A driver and signal line 667 interconnects the two sub-processor systems to deliver the M_CLK signal developed by the oscillator circuit 652A to the clock generator 654B of the sub-processor system 10B. For fault isolation, and to maintain signal quality, the M_CLK signal is delivered to the clock generator 654A of the sub-processor system 10A through a separate driver and a loopback connection 668. The reason for the loopback connection 668 is to impose a delay between the oscillator circuit 652A and the clock generator 654A that is approximately equal to that seen by the clock generator 654B due to delay imposed by the signal interconnect 667.

Not specifically shown in FIG. 25, for reasons of clarity, is that the oscillator circuit 652 has drivers and connections that mirror those from oscillator 652A. It is the cable used to connect the CPUs 12A, 12B that establishes which oscillator circuit 652A, 652B will be the oscillator that drives the two clock generators 654A, 654B. That is, connected one way, the cable (not shown) will establish the connection shown if FIG. 25 between the sub-processor systems 10A, 10B; connected another way, the connections will be similar, but the oscillator 652B will be the oscillator used.

Continuing with FIG. 25, the M_CLK signal produced by the oscillator circuit 652A of sub-processing system 10A is used by both sub-processing systems 10A, 10B as their respective SYNC CLK signals and the various other clock signals developed from the 50 Mhz signals produced by the clock generators 654A, 654B. Thereby, the clock signals of the paired sub-processing systems 10A, 10B are synchronized for the frequency locked operation necessary for duplex mode.

The VCXOs 662 of the clock generators 654A, 654B are of conventional design, and of a type that will continue to maintain a desired frequency even when the applied analog voltage (V) from the phase comparator 660 is outside the controlling limit (indicating that the clock signals received from the phase comparator 660 are badly out of phase). This allows both clock generators 654A, 654B to continue to provide to the two sub-processing systems 10A, 10B clock signals in the face of improper operation of the oscillator circuit 652A, although the sub-processor systems may no longer be frequency-locked.

The LOCK signals asserted by the phase comparators 660 (indicating that M_CLK is present and in sync with its replica, the feedback signal) of the clock generator circuits 654A, 654B are both coupled to error logic 670A, 670B. Asserting the LOCK signal signifies that the 50 Mhz signals produced by a clock generator 654 are synchronized, both in phase and in frequency, to the M_CLK signal. Thus, if either of the LOCK signals as ZERO (i.e., de-asserted), the error logic 670 will determine which of the clock generators de-asserted its LOCK signal and notify the MP 18 via the OLAP 285. If both LOCK signals are de-asserted, the CPUs can assume therefrom that the oscillator circuit 652A driving the clock generators 654A, 654B is not operating correctly.

Constant Ratio Clocking:

As mentioned above, symbol transfers between a pair of duplexed CPUs 12 and routers 14A, 14B (FIG. 1), are done so in frequency lock mode; that is, the clock signal that accompanies the symbol stream, and is used to push symbols onto the clock synchronizing FIFO of the receiving element (router 14, or CPU 12) is substantially identical in frequency, if not phase, to that of the receiving element used to pull symbols from the clock synchronization FIFOs. For example, referring to FIG. 23, which illustrates symbols being sent from the router 14A to a pair of duplexed CPUS 12A, 12B, the clock signal originating at the router 14A (and accompanying the symbol stream, to be received at the CPUs 12A, 12B as a receive clock (Rcv Clk)) is substantially identical in frequency to the local clock (Local Clk). The former (Rcv Clk) is used to push symbols onto the clock synchronization FIFOs 126 of each CPU, whereas the latter is used to pull symbols form the FIFOs.

This technique operates fine for clock signals (T_Clk/Rcv Clk and Local Clk) that are of the same frequency, and happen to be the clock frequency used for communication on the TNet Links L. Suppose, however, that to comply with the electrical or other characteristics of the transmitting medium, i.e., the TNet Links L, the frequency of the clock signal used to transmit symbols across that medium is limited, but that the receiving entity, here CPUs 12, are able to operate with a much higher frequency clock signal. In such situations provision must be made to ensure that synchronization is maintained between the two CPUs as to symbols pulled from the clock synchronization FIFOs 126 of each.

Figure 26A:
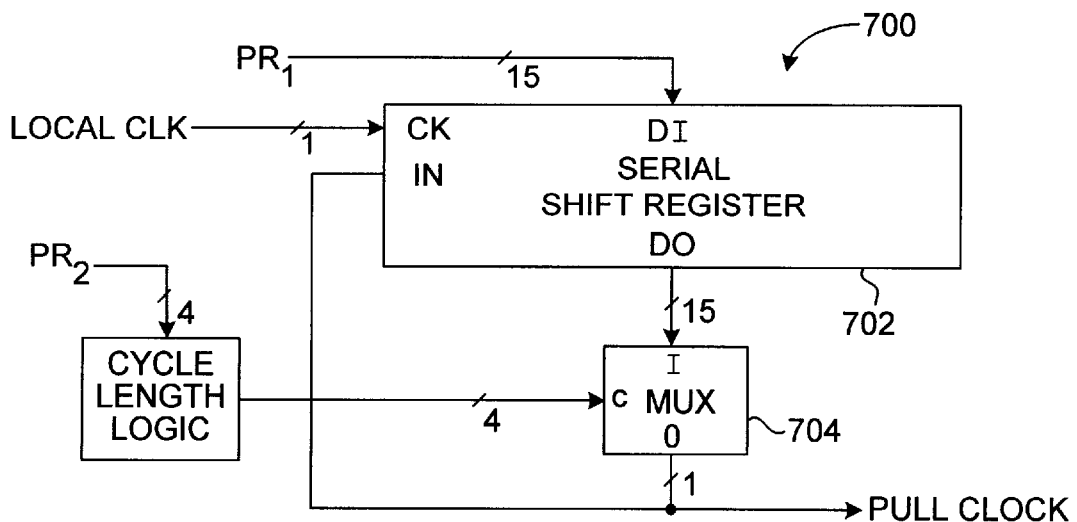
FIGS. 26A and 26B illustrates a FIFO constant rate clock control logic used to control the clock synchronization FIFO of FIGS. 8 or 20 in the situation when the two clocks used to push symbols onto and pull them off the queue of the FIFO are significantly different.

Here, a constant ratio clocking mechanism is used to control operation of the two clock synchronization FIFOs 126, providing the clock signal that pulls symbols from the two FIFOs at the same rate with which they are pushed onto the FIFOs. Referring to FIG. 26A, a constant ratio clock control mechanism is shown, designated with the reference numeral 70. As FIG. 26A illustrates, clock synchronization FIFO control mechanism 700 includes an pre-settable, multi-stage serial shift register 702, the parallel outputs of which are applied to an N-to-1 multiplexer (MUX) 704. The serial shift register 702 is operated with the faster (higher frequency) local clock signal (Local Clk) which applied to the clock (CK) input of the shift register. A 15-bit bus 701 carries a preset ($PR_1$) to the data input (DI) to preset the serial shift register 702.

It will be evident to those skilled in this art that number stages forming the serial shift register can be anything, depending, as will be seen, upon the ratio of the clock signal at which symbols are communicated and pushed onto the clock synchronization FIFOs 126 to the frequency of the clock signal used locally. Here, a 15 stages are believed sufficient.

The MUX 704 operates to select one of the 15 parallel data outputs (DO) from the shift register 702, and applied to the inputs (I) of the MUX, as the output, of the constant ratio clock control mechanism that will be used as the Local Clk signal to pull symbols from the clock synchronization FIFOs 126, and to operate (update) the pull pointer counter 130. The selected output is also coupled from the output (O) of the MUX and applied to the shift-in (SI) input of the serial shift register. Selection is made by cycle length logic 706 that is presettable with a (4-bit) preset ($PR_2$) value applied to the data input (DI) of the cycle length logic—which may be implemented by a 4-bit counter. The 4-bit output of the cycle length logic forms the selection value that is applied to the selection (C) of the MUX 704.

In essence, the constant ratio clock control operates to produce an output signal having the same number of clock excursions at the Rcv Clk over a predetermined time period. Assuming a ratio of N:M (where N>M) between the clock signal of the CPU 12 to the clock signal used to push symbols onto the clock synchronization FIFO 126, Rcv Clk, the serial shift register is preset so that M stages of the shift register hold a first digital state (e.g., a ONE), and the others hold another digital state (e.g., ZERO). The cycle length logic is preset with a value to select an output of the serial shift register that, in effect, produces a truncated serial shift register with M stages (unless, of course, the M is 15, in which case the last or 15th stage forms the feedback to the first stage). An example will make this clearer.

Figure 23:
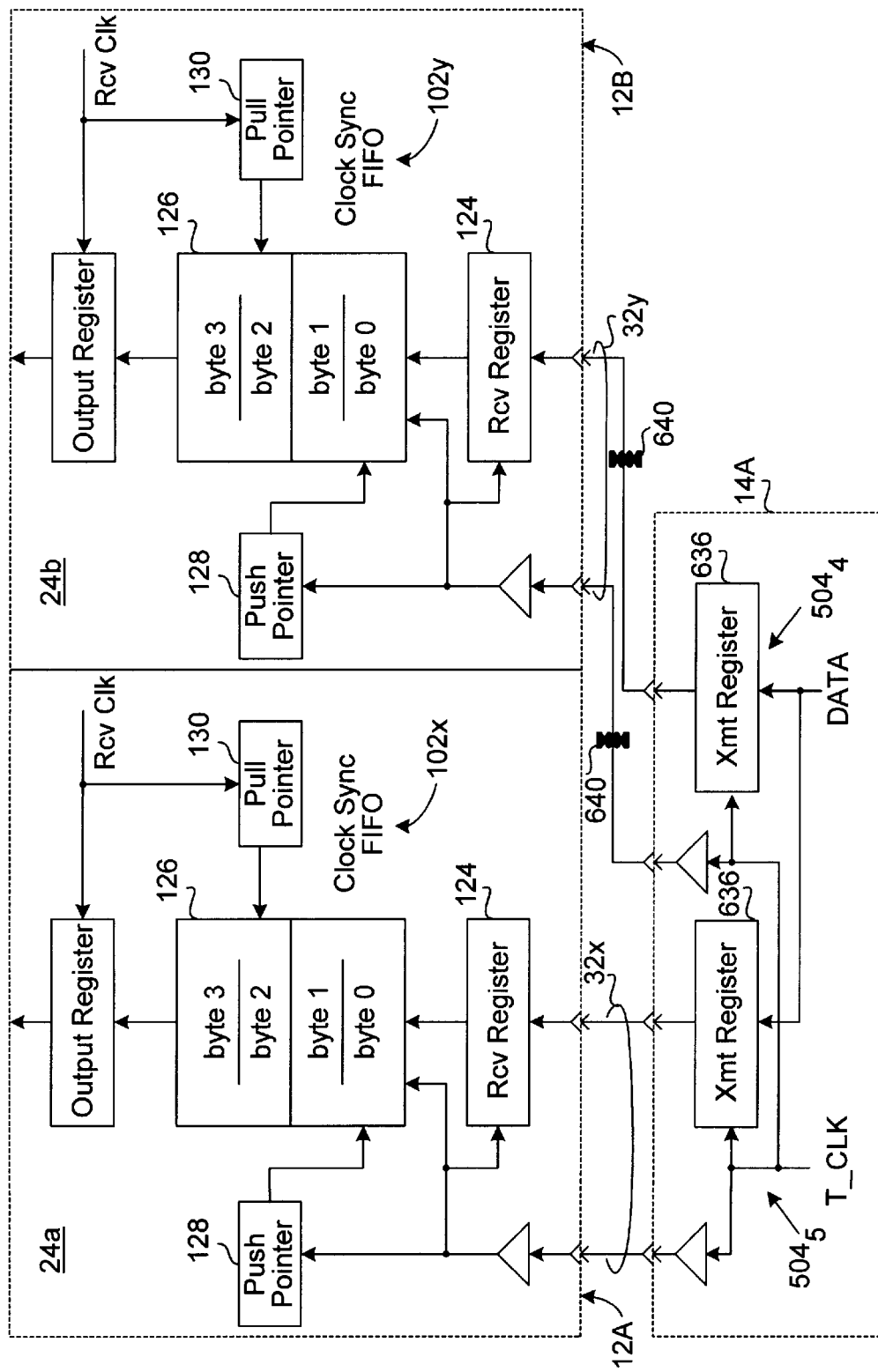
FIG. 23 is an illustration of the method used to transmit identical information to a duplexed pair CPUs of FIG. 2 in synchronized fashion when the processing system is operating in lock-step (duplex) mode, using a pair the FIFOs of FIG. 7A (one for each CPU)

Referring for the moment to FIG. 23, assume that symbols are transmitted from the router 14A to the two duplexed CPUs 12 with a 50 Mhz clock. Thus, symbols are pushed onto the clock synchronization FIFOs 126 of the CPUs at a 50 Mhz rate. Assume further that the clock signals of the CPUs is 40 Mhz. The ratio, therefore, of the local clock (80 Mhz) to the Rcv Clk signal is 8:5. The serial shift register is preset with a bit pattern in which the initial or first eight of the fifteen stages contain 5 ONEs and 3 ZEROs. The cycle length logic is preset with a value that operates selection of the eighth stage of the serial shift register by the MUX 704. Thus, the shift register and the cycle length logic are provided values that, in effect, create a serial shift register having eight stages containing, in effect, three "wait" states and five "out" states each a 100 ns period. Accordingly, the output of the MUX 704, which produces the clock signal that pulls symbols from the clock synchronization FIFOs 126, Rcv Clk, will contain, for each 100 ns period, five clock pulses. Thus, for each 100 ns period, five symbols will be pushed onto, and five symbols will be pulled from, the clock synchronization FIFOs 126.

Figure 26B:
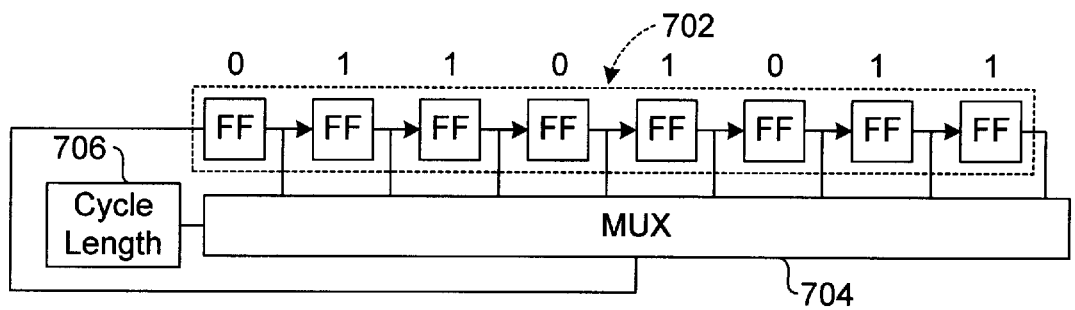
Figure 27:
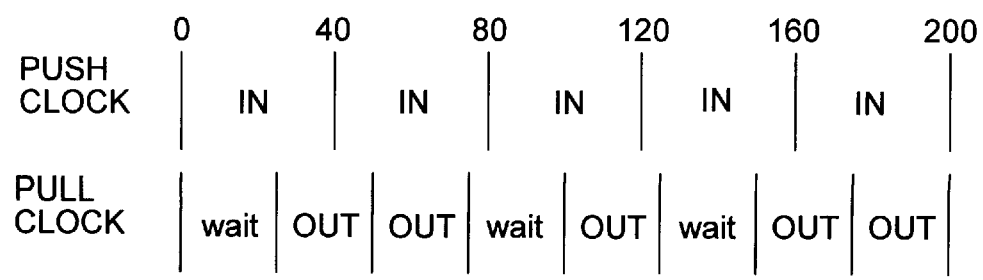
FIG. 27 is a timing diagram that illustrates the operation of the constant rate control logic of FIGS. 26A and 26B.

This example is symbolically shown in FIG. 26B, while the timing diagram shown in FIG. 27 illustrates operation of the control logic 700. For each 100 ns period, five clock pulses (labelled "IN" in FIG. 27) of the Rcv Clk will push symbols onto the clock synchronization FIFOs 126. During that same 100 ns period, the serial shift register 702 circulates a "01101011" sequence through the stage 710 selected by the MUX 704, producing a Local Clk signal having the same number of active clock pulses as the Rcv Clk signal.

It will be obvious to those skilled in this art that the number of stages of the shift register 702 may be modified to accommodate most common clock speed differentials in systems such as illustrated here. Preferably, the shift register 702 will have 15 stages, as indicated, providing the capability to cover a relatively wide range of clock ratio. As can now be seen, this technique of constant ratio clocking will never be off more than one clock. Further, it is a better implementation than, for example, counting for five clocks and holding for three clocks which would require additional storage (i.e., an increase in the size of the synchronization FIFO) and impose more latency.

The constant ratio clock circuit presented here (FIGS. 26) is used to transfer data elements from a clock regime of one frequency to a clock regime of a different, higher frequency. The use of a clock synchronization FIFO is necessary here for compensating effects of signal delays when operating in synchronized, duplexed mode to receive pairs of identical command/data symbols from two different sources. However, it will be evident to those skilled in this art that the constant ratio clock circuit disclosed here is useful for communicating data between any two disparate clock regimes, so long as there are at least two registers in the place of the clock synchronization FIFO. Transferring data from a higher-frequency clock regime to a lower frequency clock regime would use the constant ratio clock circuit 702 to transfer data elements to the input stage or register under control of the clock signal developed by the constant ratio clock circuit 702; the clock signal of the lower clock regime would be used to transfer the data elements between the two (or, as here, more) receiving register stages, and to remove data elements therefrom. Conversely, data elements transferred from a lower-frequency clock regime to that having a higher frequency would operate essentially as shown here.

This concept could be used anywhere different clock signals are used. For example, as is well known in the microprocessor art, many microprocessors are structured to insert "wait" states when a microprocessor that operates in response to clock signals of one frequency communicates with a synchronous device (e.g., a memory, or an external, system bus) that operates in response to a clock signal of a different, usually lower frequency. Typically, such microprocessor/device communication requires that the slower clock signal be an integral multiple the microprocessor clock frequency. The constant ratio clock control circuit 702 could provide a wide range of possible clock ratios.

I/O Packet Interface

Each of the sub-processor systems 10A, 10B, etc. will have some input/output capability, implemented with various peripheral units, although it is conceivable that the I/O of other sub-processor systems would be available so that a sub-processing system may not necessarily have local I/O. In any event, if local I/O is provided, the peripheral devices and or the MP 18 communicate via the a I/O packet interface 16.

The I/O packet interface 16 operates to translate the incoming message packets it receives from a TNet link L to a form more compatible or native to the attached I/O device; in turn, the I/O packet interface 16 also translates in the opposite direction, receiving "native I/O" (NIO) from the attached I/O devices, coding bytes of data in the 8B - 9B format described above (see Table 1, above), and forming the necessary packets to route the data to the destination. In addition, interrupts from the I/O devices, which would be asserted in the way most usual to the particular I/O device (e.g., a signal line) would be received by the I/O packet interface unit 16 and used to form an interrupt packet that is sent to the CPU 12 to which the interrupt is intended, where it is handled as described above. Thus, devices on the NIO bus do reads, writes, and issue interrupts via message packets routinely with data/control information passed transparently through the TNet links L and routers 14 to the memory 28 of a CPU 12.

Finally, although the I/O packet interface 16 may have connected thereto, as one of the I/O devices, an MP 18, the I/O packet interface 16 will also include an OLAP much like that (OLAP 285) contained in the MC 26 (FIG. 17B) and in the router 14 (OLAP 285'; FIG. 19A) for receiving, via the OLAP bus, configuration information.

On-Line Access Port

The MP 18 connects to the interface unit 24, memory controller (MC) 26, routers 14, and I/O packet interfaces with interface signals conforming to IEEE Standard 1149.1 (based upon IEEE 1149.1-1990, May 21, 1990, SH13144, Institute of Electrical and Electronic Engineers, 345 East 47th Street, New York, N.Y. 10017). The OLAP 258 implements that IEEE Standard, and the structure and operation of the OLAP 258 is essentially the same, regardless of what element (e.g. router 14, interface unit 24, etc.) it is used with. FIG. 28 diagrammatically illustrates the general structure of the OLAP 258 implementing the IEEE 1149.1 Standard interface. Preferably, the OLAP is formed on each integrated circuit chip used to implement certain of the elements discussed herein. For example, each interface unit 24, memory controller 26, and router 14 is implemented by an application specific integrated circuit (ASIC) that will also include an OLAP, providing the MP 18 with access to the circuitry of the ASIC. Thus, the description of the OLAP 158 shown in FIG. 28 describes the OLAP associated with the interface unit 24, the MC 26, and the router 14 of the system.

As FIG. 28 shows, the serial bus 19A comprises four 1-bit signal lines: a test clock (TCK) signal line that carries a periodic clock signal to the OLAP 258; a test command (TCM) signal line for communicating a two-state command signal, a test data in (TDI) signal line that carries data to the OLAP; and a test data out (TDO) signal line for communicating data from the OLAP. These signals are in accordance with the requirements of the IEEE 1149.1 Standard.

The OLAP 258 includes a 4-bit state machine that controls operation of the OLAP in response to clock and command signals received on the TCK and TCM lines of the serial bus 19A. Data (and/or instructions) received by the OLAP 258 are stored by a 16-bit instruction register (IR) register 802 and/or a 32-bit data register (DR) 104; data may be communicated from either of the IR, DR registers, except that only the DR 804 can be loaded with data from the associated logic (e.g., a router 14).

Associated with the OLAP 258, but not a part thereof, is a configuration register 806 in the form of a register file containing up to 64 32-bit registers that can be accessed by both the MP 18 (via the OLAP 258) and the logic circuits with which the OLAP 258 is associated. For example, certain of the registers of the configuration register 806 will form the control and status logic 509 (FIG. 19A) of a router 14. The configuration register 806 is written from the DR 804 at a (32-bit) location (i.e., a selected one of the 64 available 32-bit addresses) dictated by 10-bit instructions first supplied by the IR 802. Instructions for loading the configuration register 806 include a 4-bit portion that is decoded by instruction decode logic 810, and the resultant decode applied to a command generator 812, identifying a read or write operation. The object of the operation, i.e., the one of the 64 registers making up the configuration register 806, to be read or written, is identified by a 6-bit address that is decoded by address decode logic 814. The command generator 812 also receives the state of the state machine 800. Thus, depending upon the particular state then assumed by the state machine 800, together with the decoded command from the instruction decode logic 810, a write or read command signal will be generated by the command generator logic 812 to cause the configuration register 806 to perform a read or a write at the one of the 64 registers identified by the 6-bit address of the instruction (as decoded by the address decode logic 814).

Data supplied by the MP 18 (FIG. 1A) is written to the DR 804 through a multiplexer 816. The logic using the OLAP 258 may write the DR 804 from two separate sources, providing 32-bit registers at those sources that are selectively coupled and written to the DR 804 by the MP 18, using instruction information earlier written to the IR 802, and operation of the state machine 800 by signalling carried by the TCK and TCM signal lines of the serial bus 19A. The 32-bit DR 804 is accessed by stepping the state machine 800 through the states described in 1149.1 as "CAPTURE-DR," "SHIFT-DR," and "UPDATE-DR" together with use of an appropriate 1149.1 instruction. Additional bits in the instruction allow the DR 804 to read selected values within the chip containing the chip status information by the CAPTURE-DR state. Other 1149.1 instructions allow the UPDATE-DR state to copy the register contents to selected registers for configuration and initialization purposes. The contents of the DR 804 are exchanged with the MP 18 (via the serial bus 19A) using the 1149.1 SHIFT-DR state. For further information on the construction and operation of the OLAP 258, the IEEE 1149.1 Standard (IEEE 1149.1-1990, May 21, 1990, SH13144) may be consulted.

Asymmetric Variables

"Asymmetric variables" are values which are, or may be, different in one of a pair CPUs 12 from that of the other. Examples of asymmetric variables can include a serial number assigned and kept in a CPU-readable location, for example a register outside memory 28, which will be different from that of any other CPU, or a content of a register used to track the occurrence of correctable memory or cache errors (assuming that detecting, correcting and reporting the error does not cause the duplexed CPUs to lose lock-step synchronism).

In duplex mode, careful handling of asymmetric variables is essential to ensure that multiple copies of system memory (maintained in the memory 28 of each CPU 12), assumed to be logically equivalent, contain identical data at all times. If an asymmetric variable was simply read by each of the two duplexed CPUs 12, then written to the memory, the contents of each CPU's memory 28 would thereby differ by at least the value read by each.

Figure 30A:
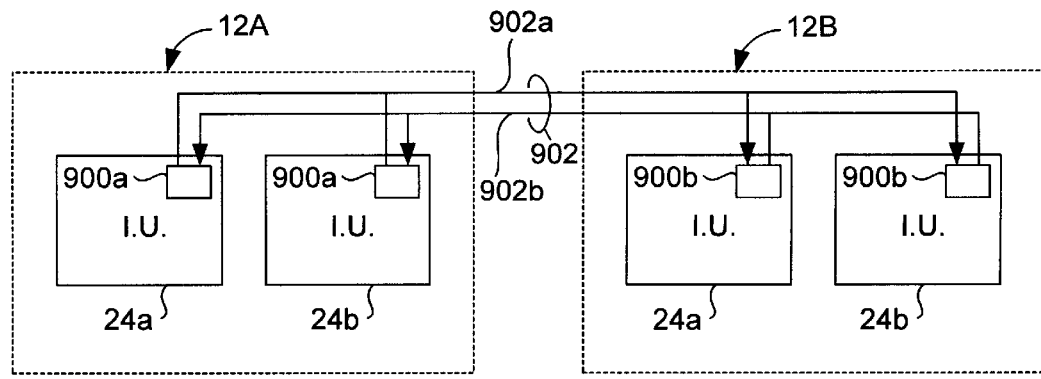
FIGS. 30A and 30B illustrate the soft-flag logic used to handle asymmetric variables between the CPUs of paired sub-processing systems operating in duplex mode.

In order permit a pair of CPUs 12, operating in duplex mode, to handle asymmetric variables, a "soft-vote" (SV) logic element 900 (FIG. 30A) is provided each interface unit 24 of each CPU 12. As FIG. 30 illustrates, the SV logic elements 900 of each interface unit 24 are connected to one another by a 2-bit SV bus 902, comprising bus lines 902a and 902b. Bus lines 902a carry one-bit values from the interface units 24 of CPU 12A to those of CPU 12B. Conversely, bus line 902b carries one-bit values from the SV logic elements 900 of CPU 12B to those of the CPU 12A.

Figure 30B:
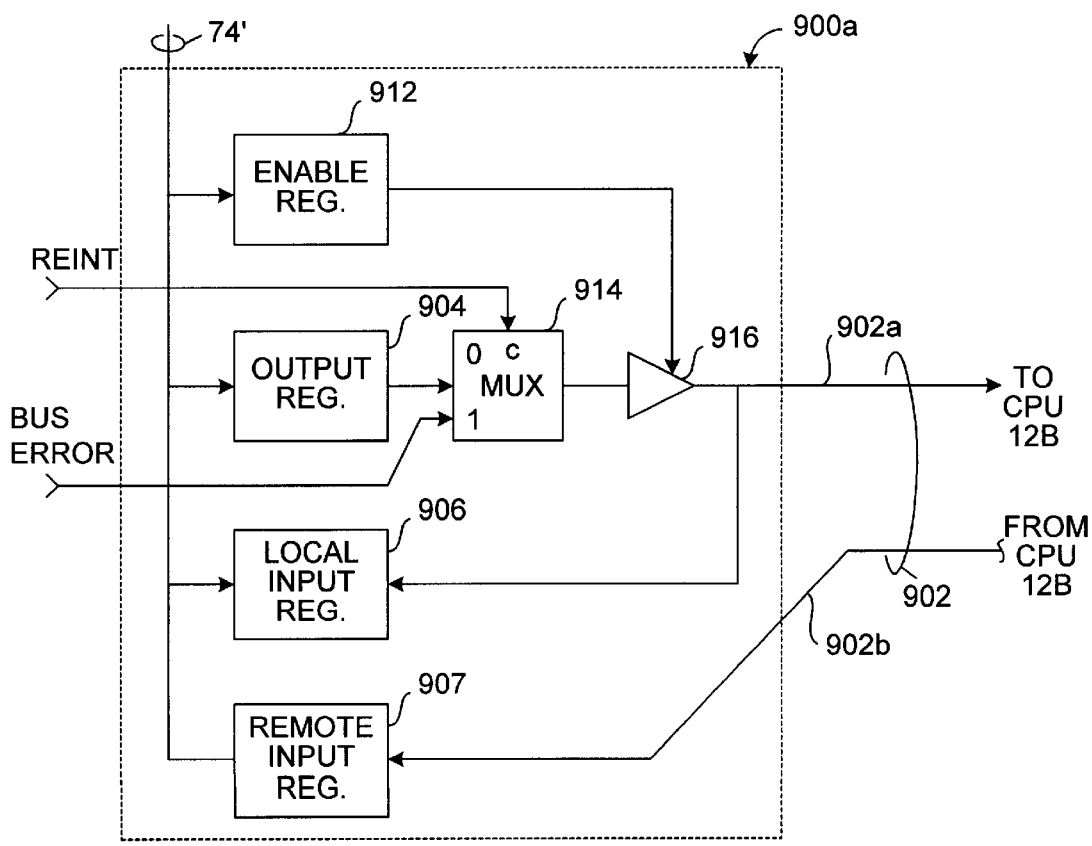

Illustrated in FIG. 30B, is the SV logic element 900a of interface unit 24a of CPU 12A. Each SV logic element 900 is substantially identical in construction and function to each other SV logic element 900 so that a description of the logic element 900a should be understood as applying equally to the other logic elements 900a (of interface unit 24b, CPU 12A), and 900b (of the interface units 24a, 24b of CPU 12B) unless noted otherwise. As FIG. 30B illustrates, the SV logic element 900a includes four one-bit registers: an output register 904, a local input register 906, a remote input register 907, and an output enable register 912. The output register 904 is coupled, via a multiplexer (MUX) 914 and a three-state driver 918, to the shared bus line 902a. Only the logic elements 900a of CPU 12A drive the bus line 902a, and then only one of two logic elements will drive the bus line. Which one depends upon the content of the enable register 912. The logic elements 900b of CPU 21B only receive on bus line 902a. The bus line 902a, therefore, communicates the output registers 904 of the logic elements 900a to the remote input registers 907 of each of the logic elements 900b of the CPU 12B. The bus line 902a will also communicate the output register 904 (via the multiplexer 914 and driver 916) of one of the logic elements 900a to the local input registers of the other of the logic elements 900a (as well as its own). In this manner the two interface units 24a, 24b of the CPU 12A can communicate asymmetrical variables to each other.

In a similar fashion, the output register 904 of logic elements 900b of CPU 12B are communicated by the bus line 902b to the remote register 907 of logic element 902a (and that of the other interface unit 24b).

The logic elements 902 form a part of the configuration registers 74 (FIG. 5). Thus, they may be written by the processor unit(s) 20 by communicating the necessary data/address information over at least a portion of the address/data bus 74 (shown as bus 74' in FIG. 30B) to select and write the output register 904 and/or enable register 912, or to select and read the input local and remote registers 906 and 907.

The MUX 914 operates to provide each interface unit 24 of CPU 12A with selective use of the bus line 902a for the SV logic elements 900a, or for communicating a BUS ERROR signal if encountered during the reintegration process (described below) used to bring a pair of CPUs 12 into lock-step, duplex operation. The output enable register is written with a bit that will enable (or disable) the three-state driver, so that it will drive the bus line 902a with the content of the SV output register 904.

As mentioned above, the SV logic elements 900 allow the CPUs 12A, 12B to implement a bit-by-bit exchange of asymmetrical variables when operating in duplex mode. Remember that when the CPUs 12A, 12B are in duplex mode they are both executing the same instruction of identical instruction streams at substantially the same virtual moment in time, if not the same moment in time. The exchange of asymmetric variables between them is as follows. Both CPUs will, in response to the instruction stream, and at essentially the same time, write the enable registers 912 of the logic element 900 of both interface units 24 of each CPU. One of the two logic elements 900 of each CPU will be written with a state that will enable the associated driver 916; the other is written with a state that places the output of the driver in a high impedance state.

Assume that it is the output enable registers 912 associated with the logic elements 900 of interface units 24*a* of both CPUs 12A, 12B that are written to enable the associated drivers 916. Thus, the output registers 904 of the interface units 24*a* of each CPU will be communicated to the bus lines 902; that is, the output register 904 associated with the logic element 900*a* of interface 24*a* (CPU 12A) is communicated to the bus line 902*a*, while the output register associated with logic element 900*b*, interface unit 24*a* of CPU 12B is communicated to bus line 902*b*. The CPUs 12 will both write a bit of the asymmetric variable to their respective output registers 904, followed by a read, after allowing for maximum clock skew, of the associated remote input registers 907 of each. The output registers 904 are again written by each CPU, followed again by reading the remote input registers 907. This process is repeated, one bit at a time, until the entire variable is communicated from the output register 904 of each CPU 12 to the remote input register of the other. Note that both interface units 24 of CPU 12B will receive the bit of asymmetric information.

One example of use of the soft-vote mechanism is the exchange of serial numbers. One of the configuration registers 74 is a one-bit register (not shown) that is set at start-up to identify each of the two CPUs that may be duplexed with one another, and to distinguish them from one another. Thus, the one-bit register of one CPU will be set to a state different from that of the other CPU. This may be followed, still during start-up, with other configuration registers be loaded with the serial number assigned that CPU. Which of the configuration registers for serial numbers is loaded depends upon the state of the one-bit identity register. Thus, the two CPUs will each have two identical registers containing their serial numbers, except that one register, call it "R1" (not shown) in one CPU will have the its own serial number, while the other CPU will have its serial number in a configuration register "R2" (not shown). Before these values can be written to memory by the duplexed CPUs, the R1, R1 configuration registers must be "harmonized," using the soft-vote mechanism.

The SV logic elements 900 are also used to communicate bus errors that may occur during the reintegration process to be described. When reintegration is being conducted, a REINT signal will be asserted. As FIG. 30B shows, the REINT is applied to the control (C) input of the MUX 914. Thus, when REINT is asserted, a BUS ERROR signal is selected by the MUX 914 and communicated to the bus line 902*a*.

Synchronization

Proper operation of the sub-processing systems 10A, 10B (FIGS. 1A, 2) whether operating independently (simplex mode), or paired and operating in synchronized lock-step (duplex mode), requires assurance that data communicated between the CPUs 12A, 12B and the routers 14A, 14B will be received properly, and that any initial content of the clock synchronization FIFOs 102 (of CPUs 12A, 12B; FIG. 5) and 519 (of routers 14A, 14B; FIG. 20A) is not erroneously interpreted as data or commands. The push and pull pointers of the various clock synchronization FIFOs 102 (in the CPUs 12) and 518 (in the routers 14) need to be initialized for at least near frequency operation. Normally, this is done in conventional fashion by a power-on signal (not shown) when power is first applied, setting the push and pull pointer counters some nominal distance apart, and presetting the associated FIFO queues to some known state. This done, all clock synchronization FIFOs are initialized for near frequency operation. Thus, when the system 10 is initially brought on-line (i.e., powered up), operation of communication links between the CPUs 12A, 12B and the routers 14A, 14B will be in near frequency mode.

However, when the CPUs 12A, 12B are switched to duplex mode operation, more is required. First, the clocking used to deliver data between the CPUs 12A, 12B and routers 14A, 14B on each TNet link must be switched to frequency locked operation. Then, in order to properly implement the lock-step operation of duplex mode operation, the clock synchronization FIFOs must be synchronized to operate with the particular source from which they receive data in order accommodate any delay in one path not found in another path. For example, remember that duplex mode operation requires that paired CPUs 12 execute each instruction of an identical instruction stream at the same virtual time. (By "virtual" time it is meant that although the actual real time execution of an identical instruction by paired CPUs 12 may be different by a small amount, their actions as viewed by the outside world are exactly the same.) Incoming data from the routers 14A and 14B must be received by the two CPUs near simultaneously, in the context of the lock-step operation. Any delay in the communications path from one or another of the routers 14A, 14B to the CPUs 12A, 12B must be accounted for. It is the clock synchronization FIFOs 102 of the paired CPUs 12 that operate to receive message packet symbols, adjust for any delay that may be imposed in the communications path, and present symbols to the two CPUs in a simultaneous manner to maintain lock-step synchronization necessary for duplex mode operation.

In similar fashion, each symbol received by the routers 14A, 14B from one of the CPUs 12 must be compared to that from the other to check for possible divergence of the CPUs (which is discussed further hereinafter). Again, it is the function of the clock synchronization FIFOs 518 of the routers 14A, 14B that receive message packets from the CPUs 12 that adjust to accommodate any delays in the communications path so that the symbols received from the two CPUs 12 are retrieved from the clock synchronization FIFOs simultaneously.

Before discussing how the clock synchronization FIFOs of the CPUs and routers are reset, initialized, and synchronized, an understanding of their operation to maintain synchronous lock-step duplex mode operation is believed helpful. Thus, referring for the moment to FIG. 23, the clock synchronization FIFOs 102 of the CPUs 12A, 12B that receive data, for example, from the router 14A are shown. FIG. 23 illustrates the port outputs 504$_4$ and 504$_5$ of router 14A connected to the 10-bit busses 32$_x$ and 32$_y$ that, in turn, respectively couple data/command symbols and clock from the router 14A to the two duplexed CPUs 12A, 12B. Remember that although a message packet may have a single destination address identifying a CPU 12, the packet will be replicated by the router 14A, symbol by symbol, and transmitted substantially simultaneously to both CPUs 12A and 12B.

It may be that the two CPUs 12A, 12B are located so that a symbol received by one of the CPUs (e.g., CPU 12B) from the router 14A will experience a delay of an unknown (but maximum) amount relative to receipt of the identical symbol (as replicated by the router) by the other CPU (CPU 12A). This delay is represented at 640 in the bus 32$_y$ that communicates the symbol and accompanying transmitter clock, T_Clk, from the router 14A to the CPU 12B.

Consider operation of the clock synchronization FIFOs $102_x$, $102_y$, to receive identical symbol streams during duplex operation. Table 6, below, illustrates that operation. For simplicity, Table 6 assumes that the delay 640 is no more than one period of the transmit clock (T_Clk). If, however, the delay 640 is greater than one clock time of T_Clk, then the depth of the queue 126 will have to be increased accordingly to provide for an increased distance between the content of the push and pull pointer counters 128 and 130. For example, if the delay 640 is such that the arrival at the CPU 12B of a symbol is as much as three T_Clk periods greater than the arrival of the same symbol at the CPU 12A, then the distance between the push and pull pointer counters should be at least four. Thus, the depth of the queue 126, in such a case, will be six symbol locations, or greater.

TABLE 6

| Item | RST | clk 1 | clk 2 | clk 3 | clk 4 | clk 5 | clk 6 | clk 7 |
|---|---|---|---|---|---|---|---|---|
| CPU 12A values | | | | | | | | |
| push ptr | 0 | 1 | 2 | 3 | 0 | 1 | 2 | 3 |
| pull ptr | 2 | 3 | 0 | 1 | 2 | 3 | 0 | 1 |
| byte 0 | IDLE | A | A | A | A | E | E | E |
| byte 1 | IDLE | IDLE | B | B | B | B | F | F |
| byte 2 | IDLE | IDLE | IDLE | C | C | C | C | G |
| byte 3 | IDLE | IDLE | IDLE | IDLE | D | D | D | D |
| OUT reg | IDLE | IDLE | IDLE | A | B | C | D | E |
| CPU 12B values | | | | | | | | |
| push ptr | 0 | 0 | 1 | 2 | 3 | 0 | 1 | 2 |
| pull ptr | 2 | 3 | 0 | 1 | 2 | 3 | 0 | 1 |
| byte 0 | IDLE | IDLE | A | A | A | A | E | E |
| byte 1 | IDLE | IDLE | IDLE | B | B | B | B | F |
| byte 2 | IDLE | IDLE | IDLE | IDLE | C | C | C | C |
| byte 3 | IDLE | IDLE | IDLE | IDLE | IDLE | D | D | D |
| OUT reg | IDLE | IDLE | IDLE | A | B | C | D | E |

The rows of the top half of Table 6 show the values held by the push and pull pointer counters 128, 130 for the CPU 12A (interface unit 24a), and the content of each of the four storage locations (byte 0 . . . , byte 3) of the queue 126, and the content of the output register 132 for an initial reset (RST) period and following clock cycles of the transmitter clock, T_Clk. The rows of the lower half of Table 6 show the same thing for the FIFO $102_y$ of CPU 12B interface unit 24a for each symbol of the duplicated symbol stream.

Assuming the delay 640 is no greater than one T_Clk period, the push and pull pointers (maintained in the counters 128, 130) will point to locations of the queue 126 two locations apart. The push pointer counters 128 each point to the next location of the queue 126 at which a received symbol will be stored, and the pull pointer counters 130 will each point to location from which a symbol will be pulled from the queue.

Referring to Table 6, and FIG. 23, assume now that the router 14A, adhering to the protocol which has it previously sending a stream of "IDLE" symbols, begins sending a symbol stream (message packet), starting with symbol A. As Table 6 illustrates, the symbol A arrives at CPU 12B one cycle later than its arrival at CPU 12A due to the delay 640. But note that the content of the push pointer counter 128 for the CPU 12B follows that of the CPU 12A, also delayed one cycle. Thus, even though the symbol A arrives at the CPU 12B one cycle later than its arrival at CPU 12A, both are stored at "byte 0" locations of the queues 126. This is because (1) the FIFOs 102 have been synchronized to operate in synchronism (a process described below), and (2) the push pointer counters 128 are clocked by the clock signal produced by the source of the symbols, i.e., the T_Clk from the router 14A, and that clock signal encounters the same delay 640 as that experienced by the symbols. The pull pointer counters 130, on the other hand, always match one another because they are clocked by the local receiver clocks (Rcv Clk) produced by the packet receivers 94 of the CPUs 12. Further, these local receiver clocks are frequency and phase locked when in the duplex mode of operation; they do not experience any delay.

Another way of viewing the delay 640 is to think of it as a part of a pipeline in the communication path (bus $32_y$) between the router 14A and CPU 12B. The delay 640 may be of any value, as long as the maximum delay allows the symbols to enter the storage queue 126 at least one clock cycle before that symbol is pulled from the queue. The symbols communicated to the CPU 12A, in effect, wait one extra cycle before being pulled from the queue 126 at the same time its replica is pulled from the queue 126 of CPU 12B. It is in this manner that each symbol of the symbol stream transmitted by the router 14A will be pulled from the clock synchronization FIFOs 102 of the CPUs 12A, 12B simultaneously, maintaining the required synchronization of received data when operating in duplex mode. In effect, the depths of the queues 126 of the CS FIFOs 102 adjust to give the two paths from the router 14A to the CPUs 12A, 12B the same delay.

In order to achieve the operation just described with reference to Table 6, the reset and synchronization process shown in FIG. 31A is used. The process not only initializes the clock synchronization FIFOS 102 of the CPUs 12A, 12B for duplex mode operation, but also operates to adjust the clock synchronization FIFOs 518 (FIG. 19A) of the CPU ports of each of the routers 14A, 14B for duplex operation. The reset and synchronization process uses the SYNC command symbol to initiate a time period, delineated by the SYNC CLK signal 970 (FIG. 31B), to reset and initialize the respective clock synchronization FIFOs of the CPUs 12A and 12B and routers 14A, 14B. (The SYNC CLK signal is developed by the clock generator 654 (FIG. 24) for distribution to the elements of the system 10, particularly the routers 14A, 14B and the CPUs 12A, 12B. It is of a lower frequency than that used to receive symbols by the clock synchronization FIFOs, T_Clk. For example, where T_Clk is approximately 50 MHz, the SYNC CLK signal is approximately 3.125 MHz.)

Turning now to FIG. 31A, the reset and initialization process begins at step 950 by switching the clock signals used by the CPUs 12A, 12B and routers 14A, 14B as the transmit (T_Clk) and the unit's local clock (Local Clk) clock signals so that they are derived from the same clock signal. The T_Clk and Local Clk signals will be substantially the same frequency, albeit not necessarily the same phase due to delays inherent in communicating the various clock signals. In addition, configuration registers in the CPUs 12A, 12B (configuration registers 74 in the interface units 24) and the routers 14A, 14B (contained in control logic unit 509 of routers 14A, 14B) are set to the FreqLock state.

The following discussion involves step 952, and makes reference to the interface unit 24 (FIG. 5), router 14A (FIG. 19A) and FIGS. 31A and 31B. With the clock in frequency locked operation, the CPU 12A will send a message packet to the off-line CPU 12B to command it to begin sending SLEEP command symbols. The CPU 12A will then also begin sending SLEEP command symbols to the router 14A, replacing READY command symbols that may otherwise be sent followed by a self-addressed message packet. Any message packet in the process of being received and retransmitted when the SLEEP command symbols are received and recognized by the router 14A will be allowed to complete. However, any further message packets will be held off, with one exception: the self-addressed message packets from the CPU 12A. Those message packets will be received, and returned by the router 14A back to the CPU 12A (per the destination address). The SLEEP command symbol operates to "quiece" router 14A for the synchronization process. The self-addressed message packet sent by the CPU 12A, when received back by the CPU 12A, informs the CPU that the router 14A is in a quieced state, since the self-addressed message packet sent after the SLEEP command symbol would necessarily have to be the last processed by the router 14A.

At step 954 the CPU 12A checks to see if it has received back the self-addressed message packet it sent following the initiation of sending SLEEP command symbols. When it does see the return of that message packet, and is thereby assured that the router 14A will be temporally handling no further message packets, CPU 12A enters step 956 to send to the router 14A a SYNC command symbol. When that SYNC command symbol is received by the router, and recognized as such by the command decode logic 544 (FIG. 20A), the control logic 509 is notified. The control logic 509 waits for the next rising edge of SYNC CLK 970 (time $t_1$—FIG. 31B) to signal the command symbol generator 632 (FIG. 22) of port outputs $504_4$, $504_5$, to generate SYNC command symbols that are echoed back to the CPUs 12A, 12B (step 958).

Next, at step 960 (and time $t_2$ of SYNC CLK 970), the control logic 509 of the router will assert a RESET signal 972 that is applied to the two clock synchronization FIFOs 518 contained in the input logic $505_4$, $505_5$ of the router that receive symbols directly from CPUs 12A, 12B. RESET, while asserted, will hold the two clock synchronization FIFOs 518 in a temporarily non-operating reset state with the push and pull pointer counters 530, 532 (FIG. 20A) set to known states to point at locations of the storage queue 518 a predetermined number apart (two, in this example) of locations apart from one another, as discussed above in connection with the power-on reset procedure.

Similarly, the SYNC symbols echoed back to the CPUs 12 by the routers 14A, 14B. As each of the CPUs 12 receive SYNC symbols are detected by the storage and processing units of the packet receivers 96 (FIGS. 5 an 6) cause the RESET signal to be asserted by the packet receivers 96 (actually, storage and processing elements 110; FIG. 6) of each CPU 12. The RESET signal is applied to the clock sync FIFOs 102 (FIG. 6) of the CPUs 12. This CPU RESET signal will likewise hold the CPU clock sync FIFOs 102 of both CPUs 12 in a reset state, placing their storage queues 126 (FIG. 7A), and push and pull counters 128, 130 in known states.

At step 962, time $t_3$ of the SYNC CLK 970 signal, the transmitter clock signals (T_Clk) that accompany symbol transmission between the CPUs 12A, 12B and routers 14A, 14B are halted temporarily. At step 963 (time $t_4$), CPUs 12 and routers 14A, 14B de-assert the RESET signals, and the clock synchronization FIFOs of the CPUs 12A, 12, and routers 14A, 14B are released from their reset condition. At step 964 ($t_5$), the router 14A and the CPUs 12 resume transmission to the T_CLK and begin a short configurable delay that allows for adjustment for the maximum expected delay on the links. At the end of the delay, the router 14A and CPUs 12 resume pulling data from their respective clock synchronization FIFOs and resume normal operation. The clock synchronization FIFOs of the router 14A begin pulling symbols from the queue (previously set by RESET to IDLE symbols), and the T_Clk begins pushing symbols onto the queue. Note that the first symbol received from the CPU 12A with the T_Clk will be pushed onto the clock synchronization FIFO at, for example, queue location 0 (or whatever other location pointed to by the value to which the push pointer counter was reset) with the accompanying T_Clk signal. Similarly, the first symbol from the CPU 12B will be placed in a location of the FIFO queue also at location 0 (or whatever other location the push pointer was set to by RESET). The clock synchronization FIFOs of the router 14A are now synchronized to accommodate whatever delay 640 may be present in one communications path, relative to the other, between the router 14A and the CPUs 12A, 12B.

Similarly, at the same virtual time, operation of the clock synchronization FIFOs 102 of both CPUs 12A, 12B is resumed, synchronizing them to the router 14A. Also, the CPUs 12A, 12B quit sending the SLEEP command symbols in favor of READY symbols, and resume message packet transmission, as appropriate.

That completes the synchronization process for the router 14A. However, the process must also be performed for the router 14B. Thus, the CPU 12A returns to step 952 and performs steps 952–966 again, this time with router 14B instead of router 14A, after which all CPUs 12A, 12B and routers 14A, 14B are initialized to operate in frequency locked mode. What remains for duplex mode operation is to place the two CPUs 12A, 12B in the same operating state, and have them executing the same instructions at essentially the same moments in time. Placing two CPUS 12 in the same state, referred to a reintegration, is described below. First, however, assuming that the CPUs 12A, 12B are operating in duplex mode, the method and apparatus used to detect and handle a possible error, resulting in divergence of the CPUs from duplex operation is described.

Divergence Detection and Handling

Duplex mode operation implements fail-functional fault-tolerance at the CPU level. Each of a pair of duplexed CPUs (e.g., CPUs 12A, 12B of system 10—FIG. 1A) is substantially an identical copy of the other, including state and memory content, and both are executing identical instructions, at substantially the same time, of an identical instruction stream, forming a logical, fault-tolerant CPU. A failure of one or the other CPUs 12A, 12B will not halt, or even slow down, operation of the system 10—so long as that fault is detected and properly handled. Detection of a faulty is CPU uses the obvious consequence of duplex mode operation: the I/O output of both CPUs 12A, 12B are symbol-by-symbol identical for proper duplex operation. Thus, all that need be done to confirm proper continuing duplex operation is to compare the I/O output, symbol-by-symbol, of the duplexed CPUs. A failing CPU will diverge from the state of operation of the other, and ultimately that divergence will manifest itself in the I/O output of the CPUs.

Figure 32:
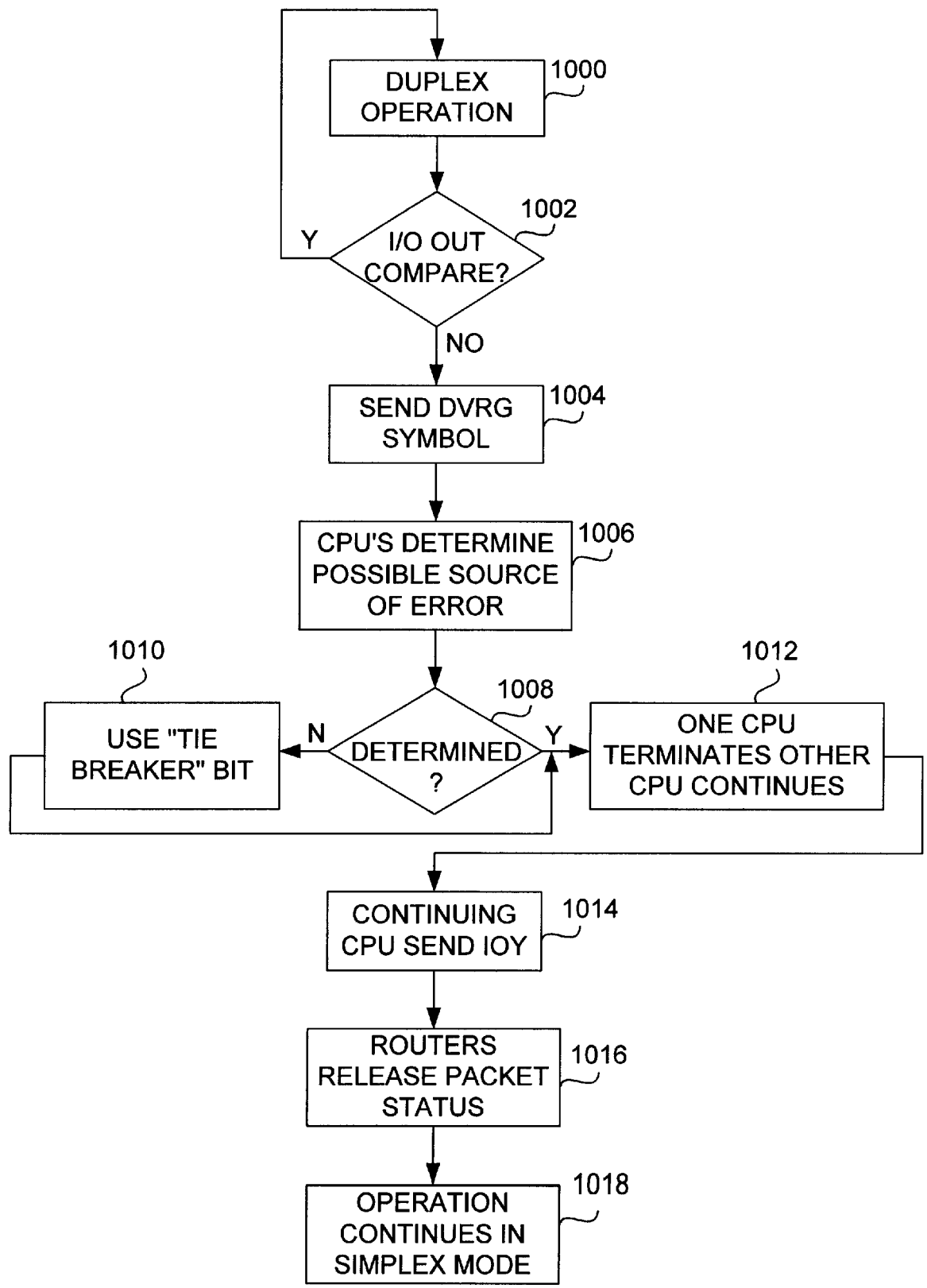
FIG. 32 is a flow diagram, broadly illustrating the procedure used to detect and handle divergence between two CPUs operating in duplex mode.

FIG. 32 illustrates the procedure used to first detect divergence at the routers 14A, 14B (steps 1000, 1002), and then handle that divergence in a graceful manner to terminate the failing CPU as soon as possible, and preclude it from propagating bad data into the rest of the system 10. Thus, step 1000 of FIG. 32 has the duplexed pair of CPUs 12A, 12B (FIG. 1A) operating in lock-step synchronism as one logical CPU. Periodically, CPUs 12 will transmit I/O data via a message packet destined for a peripheral device of one or the other sub-processor systems 10A, 10B. Depending upon the destination of the outgoing message packet, step 1002 will see one of routers 14A or 14B receiving that I/O data and as it is received comparing each symbol of the message packet from the CPU 12A with that from CPU 12B. The comparison is made at the outputs of the input logic 505 of port inputs $502_4$ and $502_5$ connected to receive I/O from the CPUs 12A, 12B by a compare circuit (not shown) of conventional design. If the received symbols are the same, the procedure remains in steps 1000 and 1002—indicating proper operation.

Should the comparing step 1002 detect different symbols, the compare circuit (not shown) of the router 14 will issue an ERROR signal to the router control logic 509, causing the process to move to step 1004 where the router 14 detecting divergence will transmit a DVRG command symbol to both CPUs 12A, 12B. Preferably, the router will wait as long as possible before sending the DVRG symbol to minimize the time between reporting divergence and knowing which CPU will be the one that continues.

Digressing for a moment, it may be beneficial at this point to describe several contrasting goals sought to be achieved by this technique of detecting divergence:

First, the routers 14A or 14B need to take immediate action to prevent the propagation of errors to the rest of the system. Thus, although a divergence is detected, the routers will continue or send the message packets on to its designated route, but with the exception of the terminating symbol of the message packet: the status symbol, a "this packet bad" (TPB) or "this packet good" (TPG) status symbol. Without this symbol, downstream destinations will not use a received message packet.

Second, as few message packets as possible must be disrupted. As will be discussed further below, one of the CPUs 12A, 12B will be designated a "favorite" or primary CPU, and when the CPUs are operating in duplex mode, only message traffic from a router's favorite CPU is transmitted on. Disruption is minimized by permitting a router to finish transmitting a message packet, in the face of detecting a divergence, until a determination can be made, if any, of which CPU may be at fault. If not the favorite CPU, the message packet is released by transmission of the terminating symbol—in this case a TPG symbol.

Third, a router detecting divergence needs to determine accurately what errors have transpired to create the divergence. It does this be looking for simple link errors, loss of link-level "keep-alive" symbols, and CRC errors. The CPUs 12 allow enough time after they receive the DVRG symbol for any link-level keep-alive time outs to occur. A router detecting divergence (without also detecting any simple link error) buys itself time to check the CRC of the received message packet by waiting for the end of the message packet before reporting divergence with the DVRG symbol.

Finally, and fourth, the system 10 must complete divergence handling in a short bounded time period in order to avoid causing TNet transaction timeouts or unsupportable I/O delays. This goal conflicts somewhat with the holding of release of the message packet (by withholding transmission of the terminating status symbol), as waiting for the conclusion of a message packet from a CPU may take a large amount of time. However, such a delay cannot cause a TNet timeout if the worst case time for a CPU to transmit a message packet is guaranteed.

The CPUs 12, upon receipt of the DVRG symbol, will each start a timer that is used to establish a predetermined time period within which the CPUs 12 will attempt to determine which of them has failed, and must terminate operation, and which of them is to continue (step 1006). Additionally, both CPUS 12A, 12B will echo the DVRG command symbol back to both routers 14A, 14B. If a router 14A, 14B, receiving this echoed DVRG symbol has not detected divergence, or has not previously seen a DVRG symbol, it will also echo a DVRG symbol back to the CPUs. Echoing the DVRG command symbols in this manner ensures that the CPUs 12 and the routers 14A, 14B have all seen a DVRG symbol and are aware of a possible divergence.

Once it is clear to all concerned (CPUs 12A, 12B and routers 14A, 14B) that a divergence has been detected, indicating a failure of one of the CPUs (or a router), care must be taken to ensure that any consequences of that failure, in the form of bad data, not be propagated to the rest of the system 10. At the same time, the system 10 must be tolerant of the fault and continue running. Thus, any outgoing (from the CPUS) packet transmissions must continue, at least in part, until it can be decided whether any message packet coming from the CPUs at the same time the router detects divergence, is good or bad.

In addition, the divergence-causing CPU must be determined, and transparently (i.e., without outside intervention) removed from the system. This latter task is the responsibility of the CPUs 12, for once the divergence and any errors have been reported to the CPUs 12, they must decide among themselves which of them will continue operation, and which will terminate further operation and thereby effectively remove itself from the system 10.

Thus, step 1006 of the divergence routine has each of the CPUs 12A, 12B analyzing the various error indications provided them; this error-analysis will be discussed further, below.

For the moment, however, the function of the router(s) 14 that detected divergence to limit the propagation of bad data needs explanation. After the DVRG symbol is issued from a router 14, or received, all further message packets received from the CPUs and in the process of being routed when divergence was detected, or the DVRG symbol received, will be passed through the router with the exception of the status symbol that terminates the packet; i.e., the TPG (This Packet Good) or TPB (This Packet Bad) status indicator symbols. During duplex operation, as explained briefly above, each of the routers 14A, 14B is configured to have a "favorite" CPU by a bit position set in the configuration register (not shown) contained in the control logic 509 (FIG. 19A). In duplex operation, the router will re-transmit the message packet received from this favorite CPU; the message packet from the other or "non-favorite" CPU is used only for divergence detection. The routers must await the decision made by the CPUs as to which one of them will continue operation, of which the routers 14A, 14B are notified (step 1012), before "releasing" the packet by appending the TPG/TPB status indicator symbol (step 1014). When the router is notified that the favorite CPU 12 is the one determined to continue, the router will release the message packet by adding and sending the TPG status indicator symbol. Conversely, if the router is notified otherwise, i.e., that it is not the favorite CPU that continues, the message packet is discarded by adding the TPB symbol.

In order to limit the amount of data lost (second goal above), the two routers are configured with different favorites (e.g. router 14A's favorite is CPU 12A, router 14B's favorite is CPU 12B).

Continuing, once the detected divergence has been broadcast to the CPUs 12A, 12B and the routers 14A, and 14B (step 1004), each of the CPUs 12A, 12B begin assessing the situation at step 1006 in an effort to each independently determine where the fault of the divergence lies. Once it is determined which of the CPUs 12A, 12B has failed (step 1008), that CPU will terminate operation on its own (step 1012), leaving the other to continue operation albeit in simplex mode. In the event the CPUs 12A, 12B cannot determine from any detected or reported errors which of them may be at fault, they will resort to a "tie-breaker" bit (step 1010) contained in a one of the configuration registers 74 (FIG. 5) of the interface unit 24 of each CPU.

Returning for the moment to step 1006, the determination of which may be the faulty one of the CPUs 12A, 12B is based principally upon what errors may be detected on the communications paths linking the CPUs 12A, 12B and the routers 14A, 14B. After the routers 14A, 14B have become aware of a divergence, each of them will, as indicated above, continue normal operation: any single message packet being received by a router 14A, 14B from the CPUs 12A, 12B when the symbol difference indicating divergence was detected, or received thereafter, will be passed through the router with the exception of the concluding status indicator symbol. Both routers 14A, 14B continue to monitor the communication paths (TNet links L) interconnecting the particular router 14 to the CPUs 12 for possible link protocol errors and/or violations such as, for example, a detected CRC error, command symbol errors, or other types of link errors. If such an error/violation is detected on a link L (e.g., link Lx—FIG. 1A), the detecting router 14A, 14B will send back to the CPU on that link (Lx) a This Link Bad (TLB) symbol. At the same time, the detecting router will also send to the other CPU 12 (on the other link, Ly) an Other Link Bad (OLB) symbol. Thereby, both CPUs 12 are made aware of the fact that a communications path (link connection Lx) to one of the routers 14A, 14B, or something associated with that link, may be faulty and unreliable. It is this information that the CPUs use, at step 1006, to attempt to determine which CPU should terminate operation, leaving the other CPU to continue functioning, albeit in simplex mode. The CPUs accumulate this error information, developing a table similar to that shown in Table 7, below.

TABLE 7

| | Local ROUTER | Remote ROUTER | ACTION of LOCAL CPU |
|---|---|---|---|
| (1) | No Error | No Error | Primary Continue; alternate terminates. |
| (2) | No Error | TLB or Error | Terminate. |
| (3) | No Error | OLB | Continue; other CPU terminates. |
| (4) | TLB or Error | Any Status | Terminate. |
| (5) | OLB | Any Status | Continue; other CPU terminates |

Table 7 lists the five possible conditions that may be detected by or reported a CPU, and upon which a CPU may determine what to do in a the face of being notified of a divergence. As used in Table 7, "local" is meant to refer to the router 14A, 14B contained in the same sub-processor system 10A, 10B as the CPU. For example, referring to FIG. 1A, router 14A is "local" to CPU 12A, but "remote" to CPU 12B. "Primary," as used in Table 7, refers to the tie-breaker bit mentioned above: the bit contained in one of the configuration registers 74 of interface unit 24( FIG. 5) of each CPU. When set to a first state, that particular CPU 12 is thereby identified as the primary, and conversely the other CPU 12 must have its same configuration bit set to an opposite state to indicate that it is the "alternate." These bits are used during divergence handling to select one of the CPUs to continue when the CPUs otherwise are unable to make that determination. Note that in all cases in which the local router reports no errors, the CPU will delay making a decision. This allows for the possibility that the other CPU might have detected errors and self-checked, and that the local router will subsequently detect the loss of keep-alive symbols, and report the error to the local CPU by an OLB symbol.

"Any Status" refers to just that: irrespective of the reporting (an indication of an error, or no indication of error) from the remote router, the local CPU will take the action indicated under the heading "Action of Local CPU." "Action of Local CPU" represents the action taken by the particular one of the CPUs 12A, 12B, given the conditions seen by that particular CPU as indicated in one of the rows of the Table. For example, if the conditions set forth in row 4 are seen by CPU 12A (router 14A has reported, or the CPU 12A has detected, an error) the CPU 12A will make the determination that it should terminate operation in favor of allowing the other of the duplexed pair, CPU 12B, to continue operations. Conversely, the conditions of row 4 indicate that the other CPU 12B will have received from its "remote" router (router 14A) an OLB symbol, reporting the fact that the communications path between router 14A and CPU 12A is suspect. From the viewpoint of the CPU 12B, this must be the condition represented by row 3 or 5. If only one of the routers 14A, 14B detected an error (in this case router 14A), a row 3 indication is presented to CPU 12B. In the case where both routers 14A, 14B detect errors, each reports a TLB to the CPU 12A and an OLB to the CPU 12B. CPU 12B sees the OLB from the router 14B, matches this to the row 5 condition, issues an IOY symbol to the router 14B, and continues.

Note that rows 4 and 5 of the Table 7 could allow for some problems. For example, if the router 14A reported a TLB to the CPU 12A and the router 14B reported a TLB to the CPU 12B, both CPUs would kill themselves (freeze). If it is assumed, however, that at most only one fault will happen at any given time, such that a case in which both local routers develop errors cannot happen, which is not an unusual assumption, the conditions of Table 7 are acceptable. Otherwise, the system need not survive if multiple errors on more than one link between the routers 14 and the CPUS 12 are occurring. Similarly, if both routers reported OLBs to their local CPUs, both CPUs might try to take over. This would tend to indicate a clock failure. The clock circuits should detect such errors and freeze the failing CPU.

Table 7, therefore, represents the error indications that the CPUs 12 and routers 14A, 14B can detect. Generally, if a CPU 12 receives an error indication from its local router, it will terminate operation in favor of allowing the other of the pair to continue.

Resorting to the primary/alternate designations will only arise when neither CPU receives any error indication of any kind (row 1, Table 7) at the expiration of each CPU's timer (initiated upon receipt of the DVRG command symbol). In this instance the tie is broken by resort to the primary configuration bit of each CPU. The one identified as the primary will continue and assume that the other has terminated; the CPU identified as the alternate by its own configuration bit will terminate its operation.

Thus, the CPUs 12 make the decision (step 1008) of who continues, and who does not, and then continue to step 1012 where one CPU terminates according to the decision made in one of the steps 1006, 1010.

The CPU 12 that terminates will do so by inducing a self-check and freezing. The continuing CPU will send to the routers 14A, 14B an IOY symbol (I Own You) to inform them that the routers should look only to the continuing CPU, and ignore all transmissions from the other CPU. In response, the state machines (not shown) within the control and status unit 509 (FIG. 19A) changes the "favorite" bits described above.

A few examples may facilitate understanding the concept of divergence. Again referring to FIG. 1A, assume that the CPUs 12A, 12B are operating in duplex operation mode, and CPU 12A sustains a fault so that all subsequent I/O operations will be different from that of CPU 12B. Accordingly, at the next I/O transmission, one of the routers 14A, 14B (the one to which data will be directed; or both if the failure has CPU 12A directing I/O to a destination different from that of CPU 12B) will detect a divergence. They will wait, however, as indicated above, until the entire packet is received to determine if the present message packet CRC check passes, or until any simple errors are encountered, at which time each router will transmit a DVRG symbol on both links L. Assume both routers see protocol errors. Detected protocol errors will immediately result in the routers 14A, 14B sending a DVRG symbol to both CPUs 12, and a This Link Bad (TLB) symbol back on the links L upon which the errors were detected, i.e., the links Lx, Ly connecting the routers 14A, 14B, respectively, to the CPU 12A. At the same time as they send the TLB symbol, both routers 14A, 14B will send Other Link Bad (OLB) symbols to the CPU 12B. CPU 12A, upon receipt of the DVRG symbol will echo that symbol to the routers 14A, 14B, start its internal divergence process timer, and begin determination of whether to continue or terminate. Having received a TLB symbol from its local router 14A, the CPU 12A immediately determines that it must terminate in favor of allowing continuation of the CPU 12B (row 4, Table 7).

Further, in this scenario the CPU 12B has received OLB symbols from both routers 14A, 14B and determined from those reports that it is the CPU that should continue. Accordingly, it will issue IOY symbol to both routers 14A, 14B. In response, the routers 14A, 14B will configure themselves so that only packet transmissions with CPU 12B will be conducted, and any transmissions from the CPU 12A will be ignored.

Divergence detection may also detect a failing router. Assume, for example, that the router 14A fails in a manner that causes it to perform divergent actions, causing the two CPUs 12A, 12B to diverge. The good router, router 14B, detects this divergence, and reports it with a DVRG symbol to each of the CPUs. Each CPU echoes the DVRG symbol to both routers 14A, 14B. Depending upon the specific failure of router 14A, it may or may not echo the DVRG symbol back to the CPUs. The CPU 12A discovers that it has errors on its local link connecting it to the failed router 14A, so it determines that it must self-check and terminate. Conversely, the router 14B will detect this termination, and return a TLB symbol to the CPU 12A, and an OLB symbol to the CPU 12B. The CPU 12B then issues an IOY command symbol to both routers.

Described above was a "clean" divergence in which one or the other or both routers 14A, 14B detect divergence, issuing a DVRG symbol to the CPUs, but in which neither the CPUs 12A, 12B or the routers 14A, 14B detect any error. Accordingly, the "primary" CPU, as previously set in the configuration registers during initialization, will determine that it must continue and issue an IOY symbol to both routers 14A, 14B. At the same time, the "alternate" CPU 12B self checks, and terminates.

Types of errors or faults that can cause divergence, in addition to those described above, include:

Uncorrectable memory errors, causing the CPU to immediately freeze operation in order to foreclose possible propagation of the error. The CPU will appear dead to the routers 14A, 14B, causing them to send a TLB symbol to the faulty CPU, and an OLB to the other (working) CPU. The working CPU will determine that is to continue, and send IOY symbols to both routers 14A, 14B.

A software defect which causes the CPUs 12 to diverge with no errors reported. This can happen only if software (running on the processors 20) uses known divergent data to alter state. For example, suppose each CPU 12 has a different serial number (e.g., kept in a read-only or programmable read-only area of the address space). The serial number of the CPU 12A will differ form that of the CPU 12B. If the processors use the serial number to change the sequence of instructions executed (say, by branching if the serial number comes after some value) or to modify the value contained in a processor register, the complete "state" of the CPUs 12 will differ. In such cases, the "asymmetrical variable" mechanisms (e.g., the soft vote mechanism) are used. This allows the two CPUs 12 to exchange information, so that they can then make identical decisions and perform identical operations based upon identical data. In this example the CPUs would exchange the values of their serial numbers such that both would have a copy. Then, they could execute code for if CPU 12A's serial number comes after some value, perform this sequence, etc. The predetermined configuration, and ultimate selection, of the primary CPU simply allows one CPU, and thereby the system 10, to continue processing without software intervention.

An error at the output of the interface unit 24 of a CPU 12 will be detected by the router 14A, 14B, depending upon the link L at or on which the error occurs as a divergence, and a TLB/OLB status will be returned to the CPUs, following the DVRG symbol. CRC errors, and command symbol corruptions will be similarly detected and handled.

An error on the output of a router 14A, 14B that connects to a CPU 12 will be detected by the interface unit 24 of the affected CPU. The CPU will send a TLB symbol to the faulty router 14, which will be detected as a divergence by that router to initiate the divergence handling routine of FIG. 31. The CPU detecting the error will terminate, and the continuing CPU will send IOY symbols to both routers.

Divergence allows the system 10 (FIG. 1A), when operating in duplex mode operation, to detect a possible failure and, without external intervention, and transparently to the system user, remove the failing unit (CPU 12A or 12B, or router 14A or 14B) from the system to obviate or limit propagation of errors to the system without halting user operations. If it was a CPU 12 that failed, the CPU is taken off line, and can be replaced with a tested, functioning CPU. To bring that replacement back on-line, and in duplex operation is the subject of the next section: reintegration.

Reintegration

Overview

This section describes the procedure used to bring two CPUs 12 into lock-step, duplex mode operation through "reintegration." The discussion will refer to the CPUs 12A, 12B, routers 14A, 14B, and maintenance processor 18A, 18B shown forming parts of the processing system 10 illustrated in FIG. 1A. In addition, discussion will refer to the processors 20a, 20b, the interface units 24a, 24b, and the memory controllers 26a, 26b (FIG. 2) of the CPUs 12A, 12B as single units, since that is the way they function.

Reintegration is used to place two CPUs in duplex mode operation when first brought on line, or after operating in simplex mode for a time, or after a prior duplex mode operation of the system 10 resulted in a divergence, and the failing element (e.g., one of the CPUs) has been removed and replaced.

Reintegration must begin with one of the CPUs 12 still operating (i.e., in an on-line state), most likely performing user applications since reintegration is performed in background, without external intervention, and is therefore substantially transparent to a user. The other CPU 12 will be in an off-line state, in the sense that it will not be running user code; it will be running sufficient code to allow it to perform the minimal tasks required for its initialization and reintegration. This initialization involves placing a pair of CPUs 12 in virtually the same state for duplex mode operation so that they will be able to execute the same instruction of identical instruction streams at virtually the same time, taking the same action as a result. Reintegration also results in that the routers 14A, 14B being configured for duplex mode operation so that divergence detection can be implemented, and message traffic bound for the CPUs 12 will be delivered to both of the paired CPUs at virtually the same time.

The major steps in the process for changing from simplex mode operation of the one on-line CPU to duplex mode operation of two CPUs, which are outlined in somewhat greater detail by the flow diagrams of FIGS. 33A–33D, generally are:

1. Setup and synchronize the two CPUs (one on-line, the other off-line) and their connected routers to a delayed ("shadow") frequency-lock, duplex mode operation, executing distinct instruction streams;
2. Copy the memory of the on-line CPU to the off-line CPU, maintaining a tracking process that monitors changes in the memory of the on-line CPU that have not been made, and may need to be copied over to, the off-line CPU;
3. Setup and synchronize the CPUs to run a delayed (slave) duplex mode from the same instruction stream (lock-step operation);
4. Copy all remaining memory locations from the on-line CPU to the off-line CPU (This step reads each location of the on-line memory, and copies only those memory locations that are suspected as being different from those of the off-line CPU until all memory has been read.); and
5. Initiate full lock-step, duplex operation of the two CPUS.

Setup

Figure 33A:
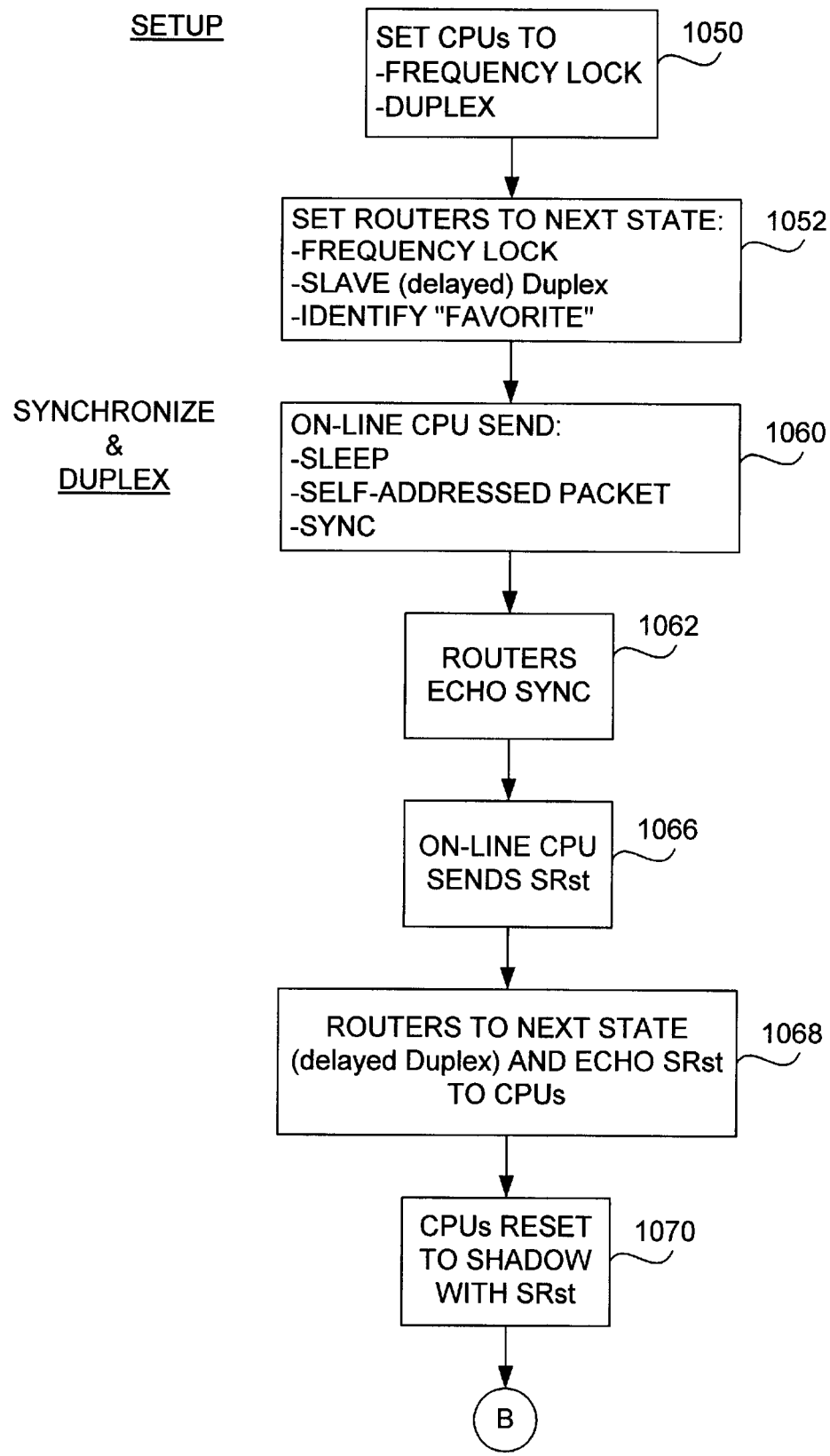
FIGS. 33A–33D generally illustrate the procedure used to bring an one of the CPUs of processing system shown in FIG. 1A into lock-step, duplex mode operation with the other of the CPUs without measurably halting operation of the processing system.

Turning now to FIG. 33A, before the reintegration procedure is entered, the CPUs 12A, 12B and their first line routers (i.e., those that connect directly to the CPUs) 14A, 14B must be setup. This involves the use of the MP 18A. At step 1050 the MP 18A will write the predetermined registers (not shown) of the control registers 74 in the interface units 24 of CPUs 12A and 12B, to a next state (after a soft operation) in which although both CPUs are in frequency locked mode, one (the off-line CPU) operates in delayed or "shadow" fashion, operating a number (e.g., 8) of clock cycles behind the other. This mode of operation of the CPUs and routers is hereinafter referred to as the "shadow mode." Configuration registers (not shown) of the router are also similarly set by the MP 18A in step 1052. In addition, a configuration register is written by the MP 18A to identify the on-line CPU 12A to the router 14A, 14B as the "favorite." This will cause the routers 14A, 14B to look to only the CPU 12A for transmissions when in shadow mode, ignoring all transmissions that may emanate from the off-line CPU 12B.

Next, a sequence is entered (steps 1060–1070) that will synchronize the clock synchronization FIFOs of the CPUs 12A, 12B and routers 14A, 14B in much the same fashion as described above, and then move them into a shadow mode operation. The shadow mode operation is one in which the two CPUs 12A, 12B will receive the same message packets and other TNet symbols from the routers 14A, 14B, in much the same fashion as when functioning in true duplex mode operation, except that transmissions sent to the off-line CPU 12B are a number of T_Clk clocks behind (e.g., eight) those sent to the on-line CPU 12A on a symbol-by-symbol basis. That is, a symbol that is transmitted from one of the routers 14A, 14B will be received by the on-line CPU 12A eight T_Clk clocks before that same symbol is received by the off-line CPU 12B.

Steps 1060 and 1062 perform basically the same steps described above in connection with the discussion of FIGS. 31A, 31B to synchronize the clock synchronization FIFOs.

The on-line CPU 12A will send the sequence of a SLEEP symbol, self-addressed message packet, and SYNC symbol which, with the SYNC CLK signal, operates to synchronize CPUs and routers. Once so synchronized, the on-line CPU 12A then, at step 1066, sends a Soft Reset (SRST) command symbol, which operates to move first the routers into the next state set by the MP 18A in step 1052. The routers 14A, 14B are now in delayed duplex mode so that all traffic routed to the on-line CPU 12A will be duplicated and also routed to the off-line CPU 12B, but 8 clocks behind that sent to the on-line CPU 12A. In addition, the routers 14A, 14B are set to look to only the on-line CPU 12A for receiving message packets, and will disregard any transmissions from the off-line CPU 12B.

The SRST symbol will be echoed back to the CPUs 12A, 12B (with the SRST symbol to the off-line CPU 12B 8 clocks later). Upon receipt by the CPUs 12A, 12B, the CPUs are moved to the next state operating mode set by the MP 18A: shadow mode.

The procedure now moves to step 1080 (FIG. 33B) to setup the monitoring of memory and state (e.g., registers, cache, etc.) that is done while memory is being copied from the on-line CPU 12A to the off-line CPU 12B. The step of copying the state of the on-line CPU to the off-line CPU could be accomplished merely by halting all on-going operation of the on-line CPU, writing the state of all configuration registers and control registers (e.g., configuration registers 74 of the interface units 24) cache, and the like to memory 28 of the on-line CPU, copying the entire content of the memory 28 to the off-line CPU, and vectoring both CPUs to a reset routine that will bring them up together. However, for large systems, this could take tens of seconds or more to accomplish, an unacceptable amount of time to have the system 10 off-line for reintegration. For that reason, the reintegration process is performed in a manner that allows the on-line CPU to continue executing user application code while most of the operation copying state over to the off-line CPU is done in background.

However, since the on-line CPU continues executing user application code, it is more likely than not that during the copying of state to the off-line CPU, sections of memory 28 of the on-line CPU will have changed after being copied, so that at the conclusion of a first pass of copying memory, the on-line CPU memory will not match that of the off-line CPU. The reason for this is that normal processing by the processor 20 of the on-line CPU can change memory content after it has been copied over to the off-line CPU. (I/O writes to the memory 28 of the on-line CPU 12A will not affect the copying procedure to make the content of the memories of the CPUs 12A, 12B inconsistent since they are also made to the off-line CPU 12B.) Two mechanisms are used to handle this problem during reintegration: First, when a memory location is written in the on-line CPU 12A during the reintegration process it is marked as "dirty;" second, all copying of memory to the off-line CPU is performed by an "AtomicWrite" mechanism that monitors the memory locations being copied to protect against the data of the on-line memory from being written before the copy is confirmed (which, as will be seen, overwrites the copied memory location). Both mechanisms are used only during the reintegration procedure, and an understanding of both may facilitate proper understanding of the memory pre-copy and subsequent copying of state from the on-line CPU to the off-line CPU.

Memory Marking

Marking memory "dirty" involves the use of one of the ECC check bits specifically for this purpose. It will be remembered that 64 bit data words are stored with 8 bits of ECC code to provide single-bit error correction, double-bit error detection for each stored word. Use of one of the 8 bits of ECC will not effect the one-bit correction capability. It may, however, limit the ability to detect two-bit errors. But, since the memory copying process will last for a only relatively short period of time, this risk is believed acceptable.

During reintegration, each write operation to a memory location by the on-line CPU 12A inverts one bit of the ECC check code to cause a later read operation of that same memory location to elicit a predetermined ECC syndrome that is interpreted as marking the location dirty. (There are exceptions: The first is writes of incoming I/O, since the off-line memory is also written with the same I/O data. The second is the write operation ("Write Conditional") operation associated with the AtomicWrite mechanism.) In this manner, changes in the content of the memory 28 of the on-line CPU 12A that may not be seen by the memory 28 of the off-line CPU 12B are marked, and are made "clean" by subsequently copying those locations over to the memory 28 of the off-line CPU 12B.

Which of the bits of ECC is used for marking really does not matter all that much, as long as whatever bit is used is used consistently.

AtomicWrite Mechanism

The copying of state of the on-line CPU 12A over to the off-line CPU involves the use of message packet transmissions using the TNet structure via one of the routers 14A, 14B. However, since the routers 14A, 14B are set for duplex mode operation so that I/O writes to the memory 28 of the on-line CPU 12A are also made to the memory of the off-line CPU 12B, the transfer of message packets containing on-line state will be similarly transferred to both CPUs 12A, 12B, but put to good use: receipt of the state-containing message packet by the on-line CPU 12A confirms its error-free receipt and re-transmission by the router 14 (14A or 14B, whichever was used). Also, it is the write operation of the AtomicWrite that will mark a memory location clean. Thus, the copied memory locations are not marked clean until data they contained are received back in the message packet that transferred them to the off-line CPU, and written (returned) to the memory from whence it came. In this manner confirmation is made that the locations were successfully copied to the memory of the off-line CPU.

However, suppose that between the reading of a memory location of the on-line CPU 12A for copying over to the off-line CPU 12B, and the subsequent writing back of the copied data to the on-line memory another write operation to the memory location in CPU 12A is made (either an incoming I/O write, or a processor write operation). The returning data (that was copied over to the off-line CPU) would be written to the location from where it originally came, overwriting whatever new value the location then contained, marking the location good, and destroying data that may be needed in the ongoing operation of the on-line CPU 12A. To obviate this problem the AtomicWrite mechanism was fashioned.

The AtomicWrite mechanism uses the memory controller 26 (FIG. 2) of the on-line CPU to monitor memory locations in the process of being copied over to the off-line CPU 12B. The memory controller uses a set of registers and a control state machine that are put into operation during reintegration to track, in those registers, the addresses of those memory locations that have been read for copying over to the off-line CPU 12B, but have not yet been written with the return data to mark them clean. Should there be an intervening write of data (other than that being returned) to a location on the list before the return to the CPU of the copied data, the list will be marked accordingly. When the copied data is returned to the on-line CPU, before it is written to memory the list is checked. If locations are marked as being written in the interim, the returned data is discarded, and the memory locations left marked dirty. If, on the other hand, the memory locations have not been written since being read for the copying to the off-line CPU 12B, the returned copied data will be written back to the locations and those locations marked clean.

Essentially, the AtomicWrite mechanism utilizes two operations: a "ReadLinked" memory operation and a "WriteConditional" operation. The ReadLinked memory operation functions to read the locations of the on-line CPU 12A memory 28 to be copied over to the off-line CPU 12B, save the address of that operation in a link table maintained by the MC 26, and install the data to be copied in a queue of the BTE 88 where it will be assembled and sent as a message packet to the off-line (as well as on-line) CPU. Saving the address of the ReadLinked operation "links" it to a future WriteConditinal operations, which returns the data to the memory location and clears the entry in the link table.

Typically, the operation will be a conventional block read, producing a block of data from a number of memory locations. The address that is written to the link table is that of the memory location at the head or end of the block of memory locations. When the message packet containing data read from a block of copied memory locations is received back by the on-line CPU 12A, it is written to the memory 28 with a WriteConditional operation. Before the data is written back, however, the MC 26 will check the link table. If the memory location within the block had been written by another operation (e.g., a write by the processor 20, an I/O write, etc.), that prior write operation will flag the location in the link table (as well as marking dirty the memory locations written). The MC 26 will note the flag, and discard the WriteConditional data without writing it, leaving the memory locations marked dirty, indicating that they still must be copied over to the off-line CPU 12B.

Figure 33B:
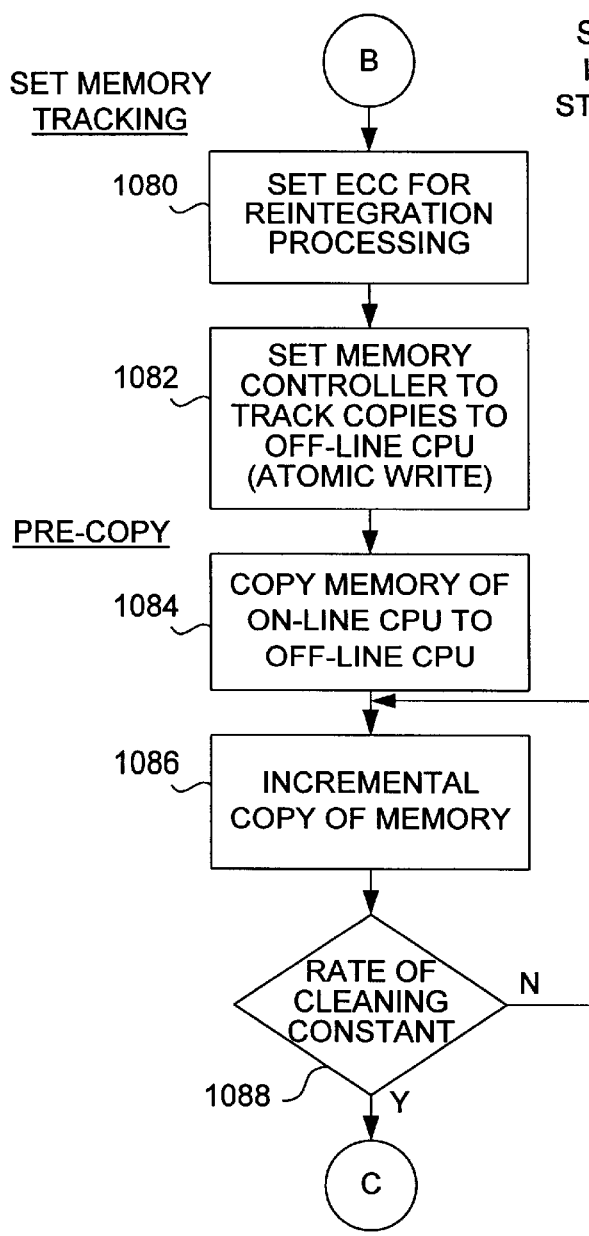

Returning to the reintegration process, and now to FIG. 33B, the memory tracking (AtomicWrite mechanism and using ECC to mark memory locations) are enabled in steps 1080 and 1082. This entails writing a reintegration register (not shown; one of the configuration registers 74 of interface unit 24—FIG. 5) to cause a reintegration (REINT) signal to be asserted. The REINT signal is coupled to the ECC logic 85 of each memory interface 70 (FIG. 10) to invert the one of the eight bits of ECC produced by ECC logic 85 for all write operations other than WriteConditionals, and all I/O write operations, so that when subsequently read, the data with this bit inverted will produce a syndrome identifying the memory locations as being marked dirty.

With memory tracking so enabled, the reintegration procedure moves to a "pre-copy" sequence (steps 1084–1088) in which content of the on-line memory 28 are copied over to the memory of the off-line CPU 12B in a first pass, from bottom to top (or top to bottom, if desired) (step 1084). Memory locations written later by write operations other than incoming I/O and the AtomicWrite mechanism will use the ECC bit to mark the written location (or locations as the case may be) dirty. Memory writes to a location after being copied by a ReadLinked operation, but before a subsequent writeConditional operation, are also marked.

After the entire content of memory 28 has been run through once and copied to the off-line memory, the sequence moves to steps 1086 and 1088 to now perform an incremental copy of any on-line memory locations that may be inconsistent with that of the off-line memory, i.e., memory locations that remain marked dirty at the conclusion of the step 1084. Incremental copying involves several passes through the entire on-line memory, reading each location to check the resultant syndrome: is the location marked thereby dirty or clean. If marked dirty, the location is copied to the off-line CPU, and marked clean. If the location is marked clean, it is left alone. Throughout the incremental copy operations, the normal actions of the on-line processor will mark some memory locations dirty.

Several passes of incremental copying will need to be completed in step 2052 until a point is reached where the rate at which dirty memory locations are being copied and cleaned will substantially equal the rate at which memory is being dirtied. To do this, counters are included in the MC 26 for ReadLinked, WriteConditional, failed ReadLinked, and failed WriteConditional operations. By noting the number of successful WriteConditional operations at the end of each pass through memory, the processors 20 can determine the effect of a given pass compared to the previous pass. When the benefits drop off, the processors 20 will give up on the precopy operations. At this point the reintegration process is ready to place the two CPUs 12A, 12B into lock-step operation.

Figure 33C:
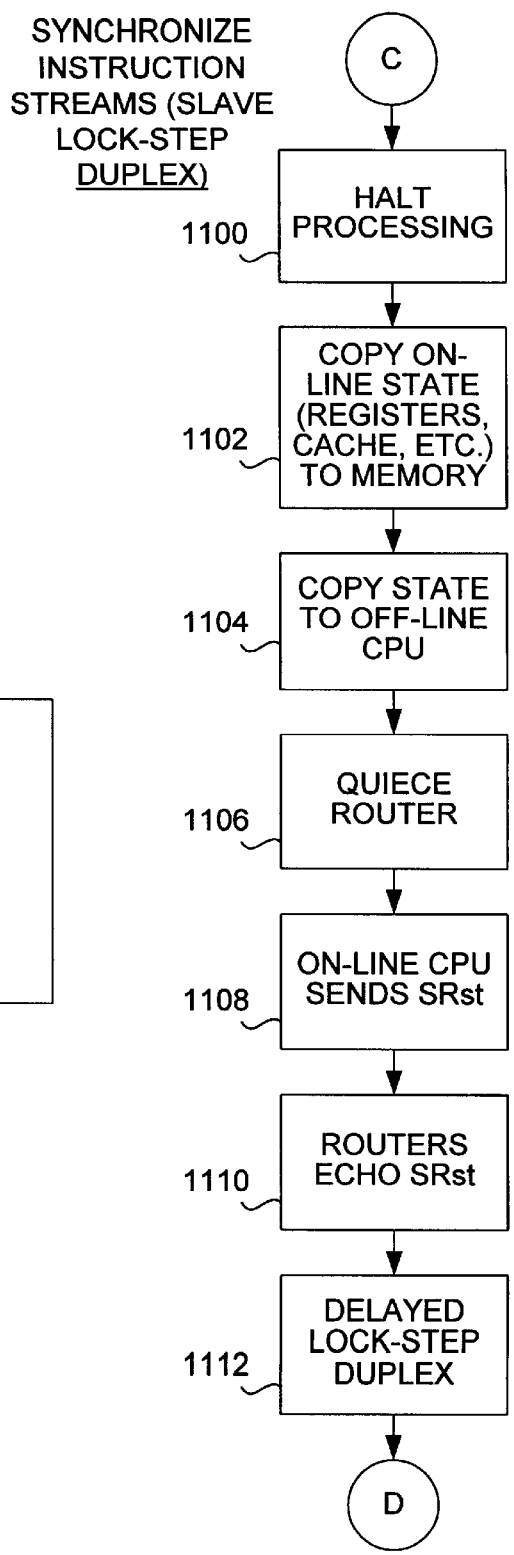

Thus, the reintegration procedure moves to the sequence of steps illustrated in FIG. 33C, where at step 1100, the on-line CPU 12A momentarily halts foreground processing, i.e., execution of a user application. The remaining state (e.g., configuration registers, cache, etc.) of the on-line processors 20 and its caches is then read and written to a buffer (series of memory locations) in the memory 28 (step 1102). That state is then copied over to the off-line CPU 12B, together with a "reset vector" that will direct the processor units 20 of both CPUs 12A, 12B to a reset instruction.

Next, step 1106 will quiesce the routers 14A, 14B by a SLEEP symbol, followed by a self-addressed message packet to ensure that the FIFOs of the routers are clear, that the FIFOs of the processor interfaces 24 are clear, and no further incoming I/O message packets are forthcoming. At step 1108 the on-line CPU 12A transmits an SRST command symbol to the routers 14A, 14B which will echo the SRST symbol back to both CPUs 12A, 12B. Since the echoing router is still operating in the slave duplex mode described above, the SRST echoed to the off-line CPU 12B will still be the 8 clocks after that echoed to the on-line CPU 12A. The echoed SRST symbol will be received and acted upon by both CPUs 12A, 12B, to cause the processor units 20 of each CPU to jump to the location in memory 28 containing the reset vector and initiate a subroutine that will restore the stored state of both CPUs 12A, 12B to the processor units 20, caches 22, registers, etc. The CPUs 12A, 12B will then begin executing the same instruction stream.

Thus, at step 1112 the CPUs 12A, 12B are still in a shadow mode operation, i.e, although both are executing the same instruction stream, the CPU 12B is doing so 8 clock cycles behind the CPU 12A, and the routers 14 are still configured to disregard transmissions from the CPU 12B. The CPU 12A returns to an on-line state to resume execution of the user application.

Figure 33D:
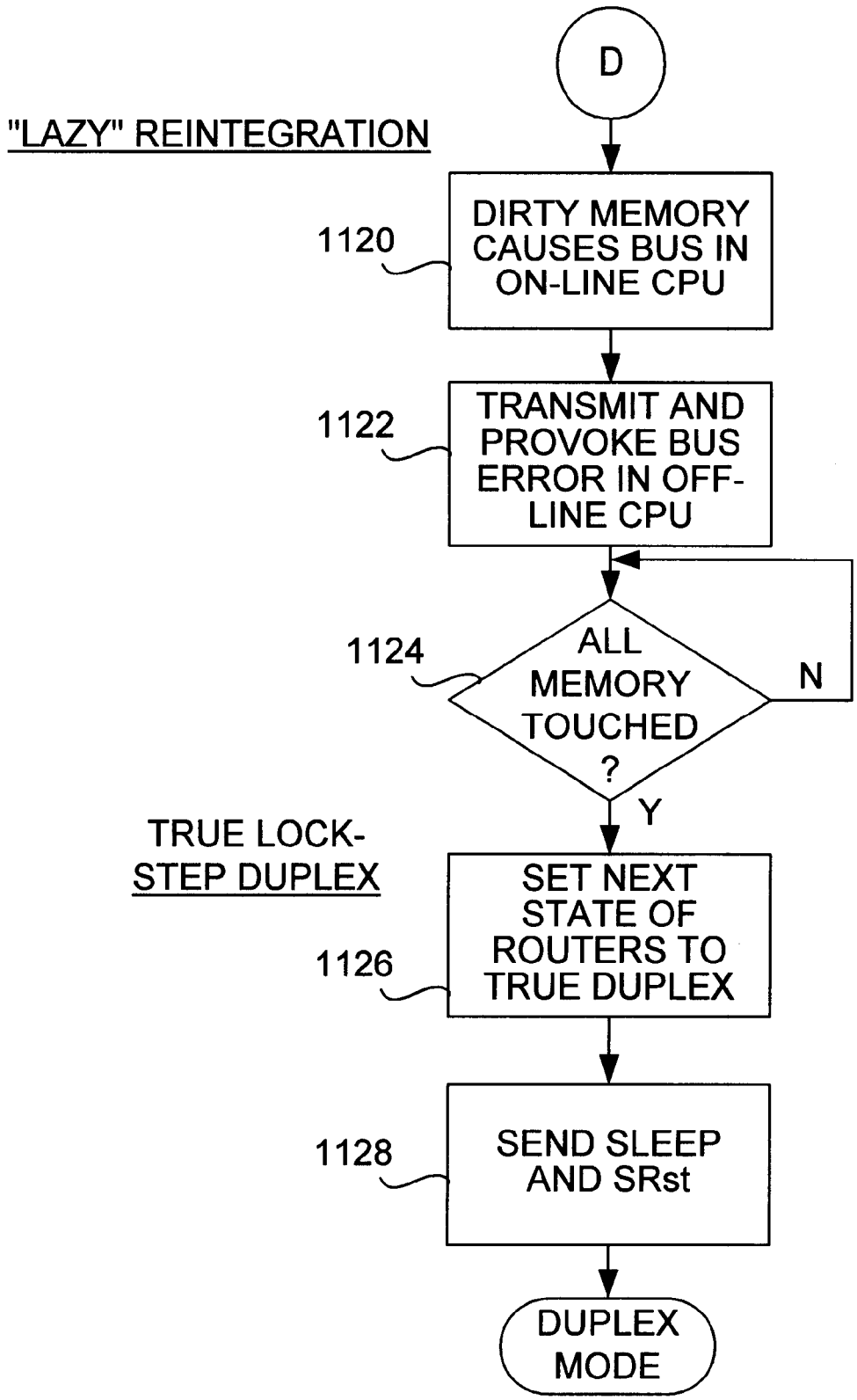

The reintegration procedure now enters the final stages of reintegration, referred to as "lazy reintegration," as illustrated in FIG. 33D. The enabling of the ECC bit to mark dirty locations must now be disabled, since the processors are doing the same thing to the same memory. During this stage of the reintegration procedure, when the on-line CPU 12A encounters any location of memory 28 that is marked dirty when reading memory when executing any instructions (which the off-line CPU 12B is also executing—albeit by a delay of 8 clocks), it will initiate a "bus error" (step 1120). An indication of this bus error will be transmitted to the CPU 12B (step 1122), using the selection logic 920 of the "soft-flag" logic element 900 (FIG. 30B) to force a bus error in the off-line CPU 12B for the same instruction. Referring for the moment to FIG. 30B, it can be seen that asserting the REINT selects, via the MUX 914, the BUS ERROR signal to the CPU 12B to notify CPU 12B that a bus error was encountered by CPU 12A.

Meanwhile, the bus error in the CPU 12A will cause the processor unit 20 to be forced into an error-handling routine to determine (1) the cause of the error and (2) how to handle the error if possible. In this instance, it will be determined that the error was caused by an attempt to read a memory location marked dirty. Accordingly, the processor unit 20 will initiate (via the BTE 88—FIG. 5) the AtomicWrite mechanism to copy the content of the memory location over to the CPU 12B. The CPU 12A will then re-execute the instruction that caused the bus error, and proceed.

The CPU 12B, operating 8 clock steps behind the CPU 12A will also have a bus error forced by the communication of that error from the CPU 12A via the bus 902, prior to execution of the same instruction that caused the bus error in CPU 12A. By the time the CPU 12B executes that instruction, however, the indication of bus error will have been communicated to the CPU 12B and will be correlated with the same instruction of the CPU 12*b* 8 clocks later. This correlation is accomplished by matching the delay in passing the bus error signal from the on-line CPU 12A to the off-line CPU 12B with the eight clock delay introduced by the router transmissions to the CPUs (i.e., the eight clock delay of shadow mode). The CPU 12B is, however, forced to go through the same bus error handling routine that CPU 12A initiated. To stay in lock-step synchronous operation, the off-line CPU 12B executes the exact same sequence of operations as the on-line CPU 12A, including the bus error routine and transmitting the data from the "dirty" memory locations to the router. Mind, the routers ignore the CPU 12B's transmission, but the CPU 12B must take the same amount of time to do the same operation as is taken by the CPU 12A.

In the mean time, the on-line CPU 12A allocates some time to making one last pass through the entire memory of the CPU 12A, copying over those memory locations that may still be marked dirty, while continuing execution of a user's application program. During this last stage of reintegration, the entire memory is read to check every memory location. Every location that is checked and found to be marked dirty is copied to the off-line CPU, CPU 12B. Ultimately, the states of the CPUs 12A, 12B will be consistent so that the two CPUs can be placed in a true, non-delayed lock-step operation.

Thus, once it is determined in step 1124 that, indeed, all memory has been checked, and copied if need be, at step 1128 the MP 18 will set the routers 14A to a next mode state of duplex by writing to the configuration registers contained in the control logic 509. The CPU 12A then issues the SLEEP, self-addressed message packet sequence as before. When the CPU 12A is assured that the router is in a quiescent state, the CPU 12A sends to both routers 14A, 14B (simultaneously) an SRST symbol. Receipt of that symbol by the routers 14A, 14B will move them into duplex mode so that when it echoes the SRST symbol back to the two CPUs 12B, 12B, they will both be echoed simultaneously. When the SRST symbols are now received by the CPUs 12A, 12B, they will cause both processor units 20 of the CPUs to be reset to start from the same location with the same state at the same virtual time. The CPUs 12A, 12B are now in lock-step operation.

Additional Features

Reduced Cost Duplex System

Considering FIG. 1 for the moment, as pointed out the CPUs 12A, 12B may be used either separately, or as a duplexed pair. In the former case, the redundancy used in the design of each independently operating CPU provides a fail-fast architecture. CPUs may be paired (not duplexed) so that one CPU is designated a "primary" CPU, and the other CPU "secondary" CPU to implement a software approach to fault tolerance. Thus, the secondary CPU will have available a user application that is running on the primary CPU, and the primary CPU will periodically update, e.g., a database or audit file that is indicative of the processing of the primary CPU up to that point in time of the update. Should the primary CPU fail, the secondary CPU will activate the backup application and take over for the failed CPU from the point in time the database or audit file was last updated. This is the software fault-tolerance approach.

Figure 34:
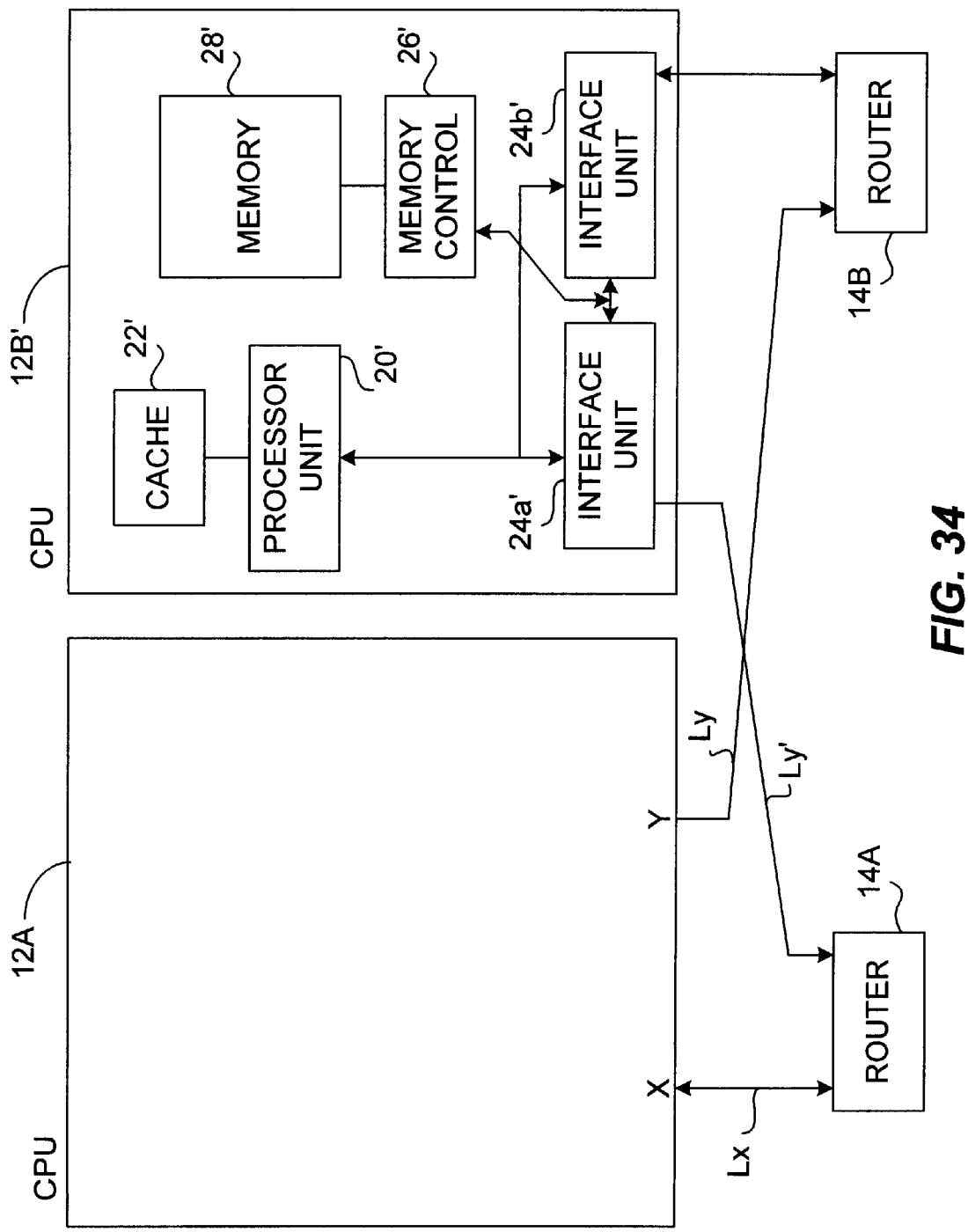
FIG. 34 illustrates a reduced cost architecture incorporating teachings of the invention.

Software fault-tolerance approaches are typically implemented by operating systems. For those operating systems not as robust and, therefore, not having this capability, the duplexed mode of operation described above (see FIG. 1) is presented, using two CPUs 12 operating to execute identical instructions of the same instruction stream. Shown in FIG. 34 is a reduced cost duplexed pair of CPUs, one of which does not have the redundancy of the other.

However, referring to FIG. 1, note that the CPU 12A can operate in error-checking redundancy to the CPU 12B, in the same manner that the individual processor units 20a, 20b of the CPU 12A provide fail-fast, fault tolerance for the CPU— when both are duplexed and operating in lock-step mode. Thus, for duplexed operation, a reduced cost system is applicable, as illustrated in FIG. 34. As shown in FIG. 34, a processing system 10' includes the CPU 12A and routers 14A, 14B structured as described above. The CPU with which CPU 12A is paired, shown here as CPU 12B' is, however, structured as a single microprocessor-based CPU system. Connections between the routers 14A, 14B and the CPUs are also the same.

Thus, the CPU 12B' comprises only a single processor unit 20' and associated support components, including the cache 22', interface unit (IU) 24', memory controller 26', and memory 28'. Thus, while the CPU 12A is structured in the manner shown in FIG. 2, with cache processor unit, interface unit, and memory control redundancies, approximately one-half of those components are needed to implement CPU 12B'.

In operation, the CPUs 12A, 12B' would be operated in duplex mode, each executing the same instruction, at substantially the same time, of an identical instruction stream. CPU 12A is designed to provide fail-fast operation through the duplication of the processor unit 20 and other elements that make up the CPU. In addition, through the duplex operation and checks made by the routers 14A, 14B for divergence the CPU 12A also provides a check up to its companion CPU, CPU 12B'. The logical CPU formed by the pair provides fail-functional operation in that should a divergence be detected by one of the routers, 14A, 14B, and that detection of divergence be acted upon as described above to halt the failing CPU, the remaining CPUs can carry on the application.

If the remaining CPU is 12A, there is still a modicum of data integrity by the duplicated components that make up the CPU 12A. Should the surviving CPU be CPU 12B', it will be recognized that except for error-checking implemented in conventional fashion (i.e, parity checks at various interfaces), data integrity is missing.

FIG. 34 illustrates the processing system 10' as including a pair of routers 14A, 14B to perform the comparing of data output from the two CPUs 12A and 12B'. It will be evident to those skilled in this art, however, that only one router 14 (e.g., router 14A) need be used if only divergence checking is to be performed. In fact, the use of a router could be replaced with nothing more than a simple comparator circuit to perform the necessary checking for divergence, provided the two inputs connected to receive the data output from the CPUs 12A and 12B' have clock synchronization FIFOs as described above to receive the somewhat asynchronous receipt of the data output, pulling that received data output from the FIFOs in synchronous fashion.

Standby Sparing

Referring for the moment to FIGS. 1A–1C, an important feature of the architecture of the processing system illustrated in these Figures is that each CPU 12 has available to it the services of every I/O Packet Interface 16, and any I/O device attached, without the assistance of any other CPU 12 in the system. Many prior parallel processing systems provide access to or the services of I/O devices only with the assistance of a specific processor or CPU. In such a case, should the processor responsible for the services of an I/O device fail, the I/O device becomes unavailable to the rest of the system. Other prior systems provide access to I/O through pairs of processors so that should one of the processors fail, access to the corresponding I/O is still available through the remaining I/O. Of course, if both fail, again the I/O is lost.

Also, requiring the resources of a processor in order to provide any other processor of a parallel or multi-processing system imposes a performance impact upon the system.

The ability to allow every CPU of a multiprocessing system access to every peripheral, as done here, operates to extend the "primary"/"backup" process taught in the above-identified U.S. Pat. No. 4,228,496. There, a multiple CPU system may have a primary process may running on one CPU, while a backup process resides in the background on another of the CPUs. Periodically, the primary process will perform a "check-pointing" operation in which data concerning the operation of that primary process is stored at a location accessible to the backup process. If the CPU running the primary process fails, that failure is detected by the remaining CPUs, including the one on which the backup resides. That detection of CPU failure will cause the backup process to be activated, and to access the check-point data. Using the check-point data, the backup process can resume the operation of the former primary process from the point of the last check-point operation. The backup process now becomes the primary process, and from the pool of CPUs remaining, one (in fact, virtually anyone) is chosen to have a backup process of the new primary process. Accordingly, the system is quickly restored to a state in which another failure can be tolerated even before the original fault (i.e., failed CPU) has been repaired.

Thus, it can be seen that the method and apparatus for interconnecting the various elements of a the processing system 10 provides every CPU with access to every I/O element of that system, as well as to every CPU of the system. Each CPU can access any I/O without the necessity of using the services of another processor. Thereby, system performance is enhanced and improved over systems that do require a specific processor to be involved in accessing I/O.

Further, should a CPU 12 fail, or be taken off line, that action will not affect in any way any other CPU's access to any I/O of the system.

Transaction Sequence Protocol and Barrier Transactions:

As explained above, the header field of a packet includes a four bit Transaction Sequence Number (TSN) field; see FIGS. 3A and 3B. Elements of the processing system 10 (FIG. 1) which are capable of managing more-than one outstanding request, such as the CPUs 12 or certain of the I/O devices, will supply a unique sequence number for each outstanding request in the TSN field. When the destination element generates a response packet for the specific request, the TSN field in the response packet will contain the same TSN value as in the request packet that prompted the response. The system element that receives the response can then match the TSN in the response to determine to which request the response corresponds.

The TSN allows a system element to determine if the response answers a request that no longer exists. For example, as here, some systems will require responses to requests be received within a predetermined period of time. If no response is received as expected, the system element that initiated the request will simply issue a second (repeat)

request. If the response to the earlier request is subsequently received, the system element can determine from the TSN which request (the earlier, voided, request, or the later valid request) the response answers. If the former, the response is discarded.

TSNs also assist in handling the so-called "stale packet" problem. When an error occurs, message packets in transit may be stuck somewhere in the network. If there is no way to remove these stale message packets, they can show up later and possibly disrupt operation after the system recovers from the original problem. A TSN of a received response message packet allows the receiver to determine whether or not the response is current by comparing the TSN carried by the response with the TSN of the message packet that prompted the response.

Using a small TSN gives rise to the possibility that a stale response will show up late with a TSN that could match a request currently outstanding. But, a large TSN field will tend to either require that each of the communicated message packets to be much larger, or that the data fields to be reduced accordingly.

The present invention solves this problem through a mechanism termed a "Barrier Transaction." Although TSNs continue to be used, the Barrier Transaction mechanism reduces the necessary size of a TSN to a field of only four bits.

Briefly, a Barrier Transaction is used to check the integrity of a communication route between a sending node and a receiving node. A Barrier Transaction is initiated primarily by a CPU, although it could be issued by an I/O Interface 16. It is used primarily when an expected response to a prior issued request message packet bound for an I/O unit 17 or a CPU 12 is not received within a predetermined allotted period of time. A CPU 12 can check the route by creating and sending a Barrier Transaction message packet in the form of a HADC packet (FIG. 3A), containing the usual header, address, data, and CRC fields. The data carried by the Barrier Transaction message packet uniquely identifies the transaction, and a copy of that data is saved by the CPU for later comparison by the CPU.

The system element (e.g., one of the I/O Interfaces 16, although it could also be another CPU) receiving a Barrier Transaction message packet is required to generate and send a Barrier Transaction response. Before doing so, however, the Barrier Transaction respondent is required to complete or discard all requests (from the system element that issued the request) received prior to receipt of the Barrier Transaction message packet before it can respond to the Barrier Transaction. The Barrier Transaction response is of the HDC form (FIG. 4B), containing the same data that was carried in the Barrier Transaction request. When the Barrier Transaction response is received by the CPU that initiated the transaction, the data in the response is compared to the data that was in the earlier sent Barrier Transaction message packet (earlier saved by the CPU) to determine, among other things, which Barrier Transaction the response corresponds to (there may be a number of Barrier Transactions outstanding).

Because there is only one valid route between any system element and any other system element (e.g. CPU 12A and I/O 17$_n$; FIG. 1), and since no message packet can pass any other message packet en route to its destination, the sequence of message packet receipt will match the sequence in which they were sent. Thus, the Barrier Transaction operates to clear the route between the system element issuing the Barrier Transaction and the system element receiving and responding to the Barrier Transaction. Receipt of a Barrier Transaction response informs the system element that issued the Barrier Transaction that either all requests send prior to the Barrier Transaction have been answered, or are not forthcoming. Thus, unanswered requests may be reissued, knowing that if a response is finally received it is the result of the reissued request, and not a delayed response to the earlier (and previously unanswered) request. It can be seen that the Barrier Transaction mechanism permits the use of only a few TSN numbers. (Here, a TSN field of only four bits is used, as opposed to prior systems which may have need of fields somewhat larger.)

Figure 35:
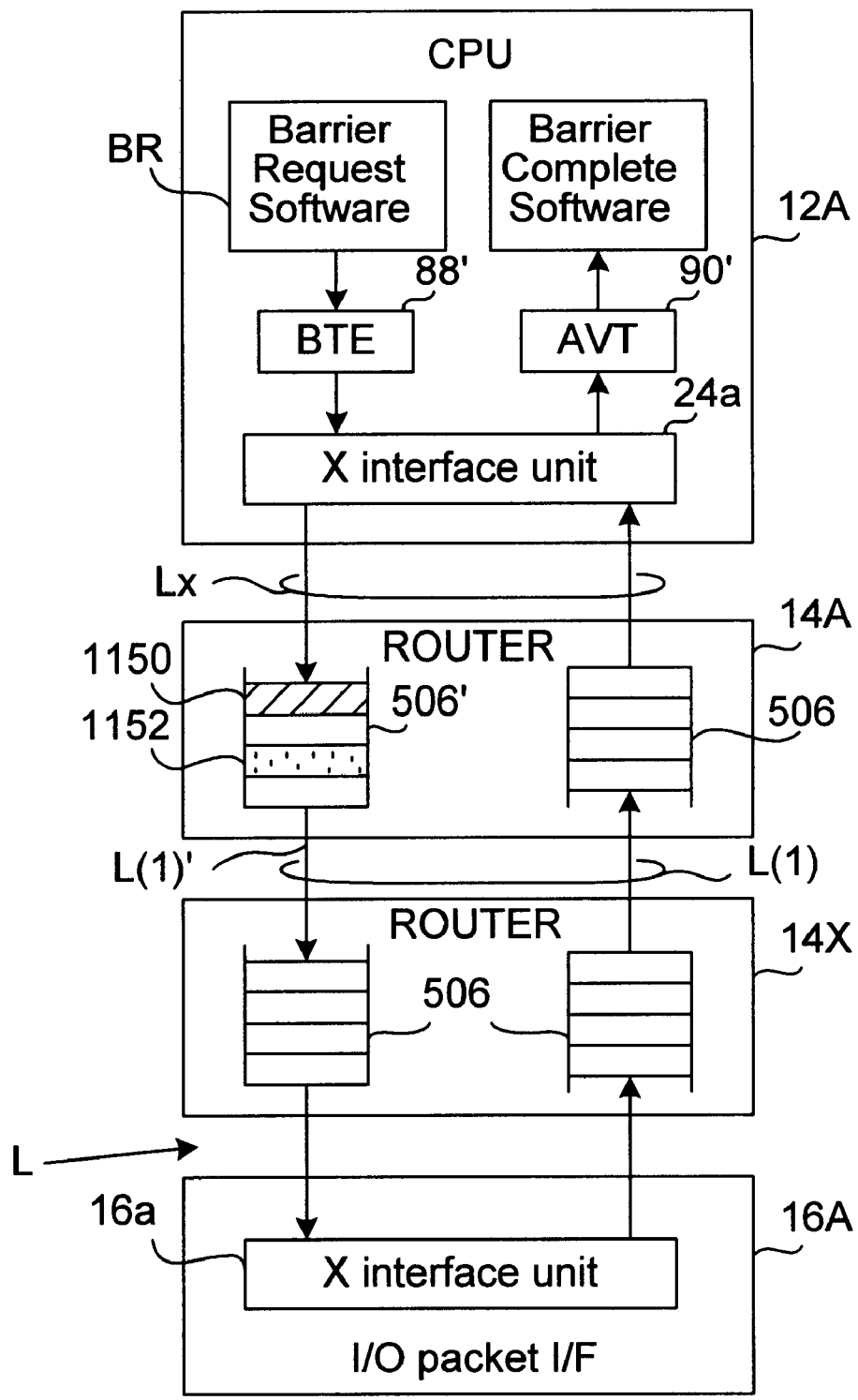
FIG. 35 illustrates operation of a Barrier Transaction to check and verify a communication path between a CPU of FIG. 1A (or FIGS. 1B, 1C) and an input/output device.

Operation of the barrier transaction is illustrated in FIG. 35 which shows a CPU 12A coupled to an I/O Packet Interface 16A by an X path that includes cascaded routers 14A and 14X, and the TNet links L (i.e., links L$_x$, L(1), and L). As described above, each router has a port input 502 that includes elastic FIFOs 506. Only the elastic FIFO is needed, and therefore shown, for this discussion.

Assume that the outbound section of the link L(1) between the routers 14A and 14X, link section L(1)' becomes unusable, as indicated by the dashed line in FIG. 35. This could occur for a number of reasons: faulty connectors, a dislocated cable, etc. Outbound message traffic from the router 14A to the router 14X ceases. Any message packet transactions initiated by the CPU 12A that are en route to the I/O packet interface 16A, but still upstream of the faulty link section L(1)', will not be responded to, and will therefore time out to indicate a fault in the communication path. An interrupt will be generated internally, and the processors 20 (20a, 20b—FIG. 2) will initiate execution of a barrier request (BR) routine. That barrier request routine (BR) will first disable the path by clearing the PEX bit in the permissions field (FIG. 13B) of each AVT entry (FIG. 13A) for each issued transaction (message packet) that times out for lack of response. This assures that if the response message packet prompted by the outstanding transaction shows up late, it will be rejected when the AVT entry is accessed and checked for that response; that is, message packets that are not stalled by reason of a fault in a link, but get lost temporarily before they finally reach a destination.

At some later time the link L(1) will be repaired, and will release now-stale message packets, such as that indicated at 1152 in the elastic FIFO 506' of router 14A. The reestablishment of the link L(1) will be reported to the CPU 12A by the MP 18 so that the CPU 12A is now cognizant of the possibility that the X path from it to the I/O packet interface 16A is now back in operation. However, the CPU cannot yet enable that path (by resetting the PEX bits in the appropriate AVT entries corresponding to the I/O packet interface 16A). The reason is the possibility of stale transaction message packets, such as that indicated at 1152 in the elastic FIFO 506', continuing to flow to its original destination (I/O packet interface) to cause the I/O packet interface 16A to misinterpret it as a totally different message packet, and respond accordingly.

To prevent this problem, and before the X path is again used for normal traffic by the CPU 12A, the BR subroutine executing in the CPU 12A uses the BTE logic 88 (see also FIGS. 5 and 15) to initiate a Barrier Transaction by sending a "Barrier Request" message packet to the I/O packet interface 16A. The Barrier Request message packet is so identified by a subfield of source field contained in the header of the message packet (see FIGS. 3A and 3B). As noted above, the data field of the Barrier Request message packet will contain a data value unique to that particular transaction.

When the Barrier Request message packet (i.e., 1150) is received by the X interface unit 16a of the I/O packet interface 16A, it will formulate a response message packet, the data section of which will contain the same identical, unique data value that was contained in the received Barrier Request message packet 1150. The I/O packet interface 16A will then transmit the response back to the CPU 12A, via the routers 14X, 14A.

When the response to the barrier request message packet is received by the CPU 12A it is processed through the AVT logic 901 (see also FIGS. 5 and 11). The barrier response uses an AVT entry with the "B" field set in the corresponding permissions field of the entry to allow barrier responses, but not other types of transactions, to complete. (When the Barrier Transaction was sent, an AVT entry was then created by the CPU for use in verifying the response.)

As explained above, each barrier transaction includes a data value that is returned to the sender in the response. This unique value allows the CPU (i.e., the BR routine) to compare the data value sent with that received in the response, assuring that the response was not part of a different barrier transaction. Once the barrier response makes it back to the CPU 12A, there is no longer a possibility that any stale packets remain in the FIFO buffers along this path. Also, the CPU 12A has established that the previously disabled path can now be used again for normal traffic. Accordingly, the CPU 12A will re-enable the path by setting the PEX permissions field in all AVT entries that use that path.

While a full and complete disclosure of the invention has been made, it will become evident to those skilled in this art that various alterations and modifications can be made to various aspects of the invention without departing from the true scope of the claims which follow. For example, there has been disclosed a scheme for providing detection of errors that may occur in the transmission of the command/data symbols in the form of a 8-bit/9-bit code that can detect certain errors. It should be evident to those skilled in this art that the concept can be carried further to other similar codes, such as a 9-bit/10-bit code, or multiple bytes wide. Further, routers 14 could be configured to have any number of ports; the command/data packet formats could be different (with more or fewer bits in the header, and other, fields); routing topologies can, using the routers 14, be formed as rings, trees, hypercube, and the like.

What is claimed is:

1. A central processor unit, comprising:
   a memory for storing instructions and data;
   a pair of processors operating in lock-step synchronism with each other to execute each instruction of an instruction stream and to periodically write identical N-bit data words comprising first and second portions to the memory at substantially the same moment in time;
   first and second interface elements receiving the N-bit data words from corresponding ones of the pair of processors for communication to the memory such that the first portion of the N-bit data word is written to the memory by the first interface element together with the second portion of the N-bit data from the second interface element;
   the first interface element including first compare means for receiving and comparing the second portion of the N-bit data word from the second interface element with the second portion of the N-bit data word received from the corresponding one of the pair of processors to assert an first error signal if a miscompare is detected; and
   the second interface element including means for receiving and comparing the first portion of the N-bit data word from the first interface element with the first portion of the N-bit data word received from the corresponding one of the pair of processors to assert a second error signal if a miscompare is detected.

2. The central processor unit of claim 1, wherein the first and second portions are each N/2 bits.

3. The central processor unit of claim 1, the memory comprising a first memory half and a second memory half, and including a first memory controller coupled to communicate the first portion of the N-bit data words between the first memory half and the first interface element, and a second memory control coupled to communicate the second portion of the N-bit data words between the second memory half and the second interface element,.

4. The central processor unit of claim 1, the first and second interface elements each including an error circuit for receiving and producing therefrom an M-bit error code for each N-bit word written to memory.

5. The central processor unit of claim 4, wherein the first interface element writes the first portion of the N-bit word to the memory in association with a first portion of the M-bit error code, and the second interface element writes the second portion of the data word to the memory in association with a second portion of the M-bit error code.

6. The central processor unit of claim 5, the error circuit of each of the first and second interface elements being coupled to receive from the memory the N-bit data words and the M-bit error code for checking the N-bit data words for error.

7. The central processor unit of claim 6, wherein the M-bit error code is an error-correcting code that corrects single-bit errors in the N-bit data word and detects double-bit errors in the N-bit data word.

8. The central processor unit of claim 1, wherein the first and second interface elements each include error code generating means to receive the N-bit data words for producing therefrom an M-bit error code, the first and second interface elements respectively writing first and second portions of the M-bit error code to memory in association with the first and second portions of the N-bit data word.

9. A processor unit, comprising:
   first and second processor elements operating in lock-step synchronism with each other to execute each instruction of an instruction stream, and to periodically produce identical N-bit data words comprising first and second portions, at substantially the same moment in time;
   a memory for storing the N-bit data words;
   a first interface unit coupling the first processor element to the memory to create an M-bit error code from N-bit data words received from the first processor and to communicate the first portion for storage in the memory in associate with a first part of the M-bit error code;
   a second interface unit coupling the second processor element to the memory to create the M-bit error code from N-bit data words received from the second processor to communicate the second portion for storage in the memory in associate with a second part of the M-bit error code; and
   the first and second interface units each including an error circuit for receiving N-bit data words from memory together with the associated M-bit error code to check the N-bit data word for errors.

10. The processor unit of claim 9, wherein the first interface unit includes a first compare circuit receiving the second portion of the N-bit data word from the second interface unit for comparison with the second portion of the N-bit data word received from the first processor element to produce an error indication when a miscompare is detected.

11. The processor unit of claim 10, wherein the second interface unit includes a second compare circuit receiving the first portion of the N-bit data word from the first interface unit for comparison with the first portion of the N-bit data word received from the second processor element to produce an error indication when a miscompare is detected.

12. In a data processing system having first and second data processor elements operating in substantially lock-step synchronism to sequential execute an identical series of instructions, instruction by instruction, to each periodically produce, at substantially the same time, N-bit data elements, each N-bit data element have first and second portions, the data processing system having a memory for storing the N-bit data elements; a method for checking operation of the first and second data processor elements, including the steps of:

communicating the first portion of the N-bit data element from the first data processor element to the memory for storage;

communicating the second portion of the N-bit data element from the second data processor element to the memory for storage in association with the corresponding first portion; and comparing the first portion and second portions of each of the N-bit data words from the first data processor element with the first and second portions of the corresponding N-bit data words from the second data processor element; and producing an error indication when a miscompare is detected.

13. The method of claim 12, including creating first and second M-bit error codes for each N-bit data word from each of the first and second data processor elements, respectively, the first and second error codes having first and second parts, and storing in memory the first part of the first M-bit error code in association with the first portion of the N-bit data word from the first processor unit, and storing in memory the second part of the second M-bit error code in association with the second portion of the N-bit data word from the second data processor element.

* * * * *

UNITED STATES PATENT AND TRADEMARK OFFICE
CERTIFICATE OF CORRECTION

PATENT NO. : 6,233,702 B1
DATED : May 15, 2001
INVENTOR(S) : William Bunton et al.

It is certified that error appears in the above-identified patent and that said Letters Patent is hereby corrected as shown below:

<u>Title page,</u>
Item [75], reads:
"Inventors: Robert W. Horst, Saratoga; David J. Garcia, Los Gatos, both of CA (US); William Patterson Bunton, Austin, TX (US); William F. Bruckert, Austin, TX (US); Daniel L. Fowler, Georgetown, TX (US); Curtis Willard Jones Jr., Austin, TX (US); David Paul Sonnier, Austin, TX (US); William Joel Watson, Austin, TX (US); Frank A. Williams, Austin, TX (US)".

Item [75], should read:
-- Inventors: William P. Bunton, Austin, TX (US); William F. Bruckert, Austin, TX (US): Daniel L. Fowler, Georgetown, TX (US): David J. Garcia Los Gatos, CA (US); Robert W. Horst, Saratoga, CA (US); Curtis W. Jones Jr., TX (US); David P. Sonnier, Austin, (US); William J. Watson, Austin TX (US); Frank A. Williams, Austin, TX. --

After Item [22], add:
-- Related U.S. Application Data
[60]   Co-pending U.S. Application Ser. Nos. 08/485,217, 08/482,618, 08/481,749, 08/474,772, 08/485,053, 08/473,541, 08/474,770, 08/472,222, 08/477,807, 08/484,281, 08/482,628, 08/479,473, 08/485,062, 08/485,446 and 08/483,748, all of which were filed on June 7, 1995, concurrently with this application.

[63]   Continuation-in-part of Ser. No. 07/992,944, December 17, 1992, abandoned. --

UNITED STATES PATENT AND TRADEMARK OFFICE
CERTIFICATE OF CORRECTION

PATENT NO.     : 6,233,702 B1
DATED          : May 15, 2001
INVENTOR(S)    : William Bunton et al.

It is certified that error appears in the above-identified patent and that said Letters Patent is hereby corrected as shown below:

Column 1,
Line 3, add new line:
--      This is a Continuation-in-part of Ser. No. 07/992,944, filed December 17, 1992, now abandoned. --

Signed and Sealed this

Twelfth Day of November, 2002

Attest:

JAMES E. ROGAN
Attesting Officer     Director of the United States Patent and Trademark Office